US012490649B2

(12) United States Patent
Song et al.

(10) Patent No.: US 12,490,649 B2
(45) **Date of Patent: *Dec. 2, 2025**

(54) ORGANIC LIGHT EMITTING DIODE AND ORGANIC LIGHT EMITTING DEVICE INCLUDING THE SAME

(71) Applicant: LG DISPLAY CO., LTD., Seoul (KR)

(72) Inventors: In-Bum Song, Paju-si (KR); Seung-Hee Yoon, Paju-si (KR); Shin-Han Kim, Paju-si (KR); So-Young Jang, Paju-si (KR); Jin-Ho Park, Paju-si (KR); Dong-Hyeok Lim, Paju-si (KR); Yoon-Deok Han, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/744,577

(22) Filed: Jun. 14, 2024

(65) Prior Publication Data

US 2024/0341172 A1 Oct. 10, 2024

Related U.S. Application Data

(63) Continuation of application No. 17/292,128, filed as application No. PCT/KR2019/018227 on Dec. 21, 2019, now Pat. No. 12,082,494.

(30) Foreign Application Priority Data

Dec. 28, 2018 (KR) ........................ 10-2018-0172062

(51) Int. Cl.
*H01L 51/50* (2006.01)
*H10K 85/30* (2023.01)
(Continued)

(52) U.S. Cl.
CPC ......... *H10K 85/626* (2023.02); *H10K 85/322* (2023.02); *H10K 85/6574* (2023.02);
(Continued)

(58) Field of Classification Search
None
See application file for complete search history.

(56) References Cited

U.S. PATENT DOCUMENTS

2011/0057173 A1 3/2011 LeCloux et al.
2011/0285274 A1 11/2011 Hamada et al.
(Continued)

FOREIGN PATENT DOCUMENTS

CN 102369256 A 3/2012
CN 105679794 A 6/2016
(Continued)

OTHER PUBLICATIONS

International Search Report dated Apr. 6, 2020, issued in International Patent Application No. PCT/KR2019/018227.
(Continued)

*Primary Examiner* — Gregory D Clark
(74) *Attorney, Agent, or Firm* — Morgan, Lewis & Bockius LLP

(57) ABSTRACT

The present disclosure relates to an OLED that includes a first electrode; a second electrode facing the first electrode; and a first emitting material layer including a first host, a second host and a first blue dopant and positioned between the first and second electrodes, wherein the first host is an anthracene derivative, and the second host is a deuterated anthracene derivative.

18 Claims, 7 Drawing Sheets

(51) Int. Cl.
*H10K 85/60* (2023.01)
*H10K 50/13* (2023.01)
*H10K 101/00* (2023.01)

(52) U.S. Cl.
CPC ......... *H10K 50/131* (2023.02); *H10K 85/658* (2023.02); *H10K 2101/90* (2023.02)

(56) References Cited

U.S. PATENT DOCUMENTS

| | | | |
|---|---|---|---|
| 2016/0164042 | A1 | 6/2016 | Cho et al. |
| 2016/0211457 | A1 | 7/2016 | Ito et al. |
| 2018/0076418 | A1 | 3/2018 | Cho et al. |
| 2018/0301629 | A1 | 10/2018 | Hatakeyama et al. |
| 2019/0207112 | A1 | 7/2019 | Hatakeyama et al. |
| 2019/0312207 | A1 | 10/2019 | Hatakeyama et al. |
| 2020/0091431 | A1 | 3/2020 | Hatakeyama et al. |
| 2020/0136053 | A1 | 4/2020 | Heo et al. |

FOREIGN PATENT DOCUMENTS

| | | | |
|---|---|---|---|
| KR | 10-2009-0086015 | A | 8/2009 |
| KR | 10-2011-0126950 | A | 11/2011 |
| KR | 10-2016-0069468 | A | 6/2016 |
| KR | 10-2017-0123062 | A | 11/2017 |
| KR | 10-2017-0130434 | A | 11/2017 |
| WO | 2017188111 | A1 | 11/2017 |
| WO | 2018150832 | A1 | 8/2018 |

OTHER PUBLICATIONS

Office Action issued in corresponding Korean Patent Application No. 10-2024-0065228, dated Nov. 8, 2024.

Office Action Report dated Aug. 18, 2023, issued in Korean Patent Application No. 10-2018-0172062.

Office Action issued Feb. 8, 2024 for Chinese Patent Application No. 201980050122.2 (See English Translation).

ORGANIC LIGHT EMITTING DIODE AND ORGANIC LIGHT EMITTING DEVICE INCLUDING THE SAME

CROSS-REFERENCE TO RELATED APPLICATION(S)

This application is a continuation application of co-pending U.S. patent application Ser. No. 17/292,128, filed on May 7, 2021, which is a National Stage Entry of PCT/KR2019/018227, filed on Dec. 21, 2019, which in turn claims the benefit of and priority to Korean Patent Application No. 10-2018-0172062, filed on Dec. 28, 2018. The entirety of the above U.S. application Ser. No. 17/292,128 is hereby incorporated herein by reference as if fully set forth herein.

TECHNICAL FIELD

The present disclosure relates to an organic light emitting diode (OLED), and more specifically, to an OLED having enhanced emitting efficiency and lifespan and an organic light emitting device including the same.

BACKGROUND ART

As requests for a flat panel display device having a small occupied area have been increased, an organic light emitting display device including an OLED has been the subject of recent research and development.

The OLED emits light by injecting electrons from a cathode as an electron injection electrode and holes from an anode as a hole injection electrode into an emitting material layer (EML), combining the electrons with the holes, generating an exciton, and transforming the exciton from an excited state to a ground state. A flexible substrate, for example, a plastic substrate, can be used as a base substrate where elements are formed. In addition, the organic light emitting display device can be operated at a voltage (e.g., 10V or below) lower than a voltage required to operate other display devices. Moreover, the organic light emitting display device has advantages in the power consumption and the color sense.

The OLED includes a first electrode as an anode over a substrate, a second electrode, which is spaced apart from and faces the first electrode, and an organic emitting layer therebetween.

For example, the organic light emitting display device may include a red pixel region, a green pixel region and a blue pixel region, and the OLED may be formed in each of the red, green and blue pixel regions.

However, the OLED in the blue pixel does not provide sufficient emitting efficiency and lifespan such that the organic light emitting display device has a limitation in the emitting efficiency and the lifespan.

DISCLOSURE

Technical Problem

Accordingly, the present disclosure is directed to an OLED and an organic light emitting device including the OLED that substantially obviate one or more of the problems due to the limitations and disadvantages of the related art.

An object of the present disclosure is to provide an OLED having enhanced emitting efficiency and lifespan and an organic light emitting device including the same.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

Technical Solution

According to an aspect, the present disclosure provides an OLED that includes a first electrode; a second electrode facing the first electrode; and a first emitting material layer including a first host, a second host and a first blue dopant and positioned between the first and second electrodes, wherein the first host is an anthracene derivative, and the second host is a deuterated anthracene derivative.

As an example, in the first emitting material layer, a weight % ratio of the first host to the second host is 1:9 to 9:1.

As an example, in the first emitting material layer, the weight % ratio of the first host to the second host is 1:9 to 7:3.

As an example, in the first emitting material layer, the weight % ratio of the first host to the second host is 3:7.

As an example, in the first emitting material layer, the weight % ratio of the first host to the second host is 7:3.

The OLED may include a single emitting part or a tandem structure of a multiple emitting parts.

The tandem-structured OLED may emit blue color or white color.

According to another aspect, the present disclosure provides an organic light emitting device comprising the OLED, as described above.

For example, the organic light emitting device may be an organic light emitting display device or a lightening device.

It is to be understood that both the foregoing general description and the following detailed description are examples and are explanatory and are intended to provide further explanation of the disclosure as claimed.

Advantageous Effects

An emitting material layer of an OLED of the present disclosure includes a first host of an anthracene derivative and a second host of a deuterated anthracene derivative such that an emitting efficiency and a lifespan of the OLED and an organic light emitting device including the OLED are improved.

DESCRIPTION OF DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

MODE FOR INVENTION

Reference will now be made in detail to aspects of the disclosure, examples of which are illustrated in the accompanying drawings.

Figure 1:
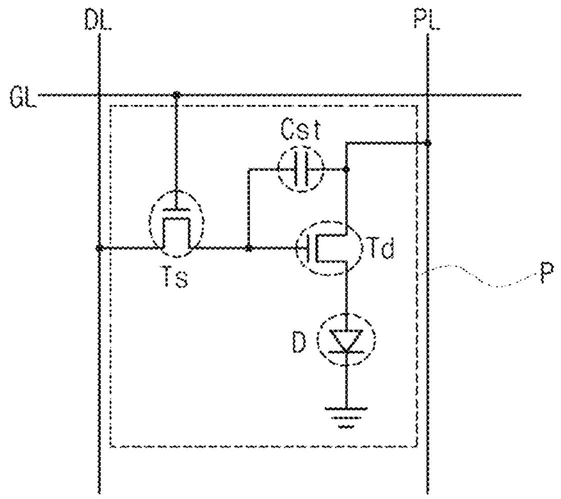
FIG. 1 is a schematic circuit diagram illustrating an organic light emitting display device of the present disclosure.

FIG. 1 is a schematic circuit diagram illustrating an organic light emitting display device of the present disclosure.

As illustrated in FIG. 1, a gate line GL and a data line DL, which cross each other to define a pixel (pixel region) P, and a power line PL are formed in an organic light display device. A switching thin film transistor (TFT) Ts, a driving TFT Td, a storage capacitor Cst and an OLED D are formed in the pixel region P. The pixel region P may include a red pixel, a green pixel and a blue pixel.

The switching thin film transistor Ts is connected to the gate line GL and the data line DL, and the driving thin film transistor Td and the storage capacitor Cst are connected between the switching thin film transistor Ts and the power line PL. The OLED D is connected to the driving thin film transistor Td. When the switching thin film transistor Ts is turned on by the gate signal applied through the gate line GL, the data signal applied through the data line DL is applied a gate electrode of the driving thin film transistor Td and one electrode of the storage capacitor Cst through the switching thin film transistor Ts.

The driving thin film transistor Td is turned on by the data signal applied into the gate electrode so that a current proportional to the data signal is supplied from the power line PL to the OLED D through the driving thin film transistor Tr. The OLED D emits light having a luminance proportional to the current flowing through the driving thin film transistor Td. In this case, the storage capacitor Cst is charge with a voltage proportional to the data signal so that the voltage of the gate electrode in the driving thin film transistor Td is kept constant during one frame. Therefore, the organic light emitting display device can display a desired image.

Figure 2:
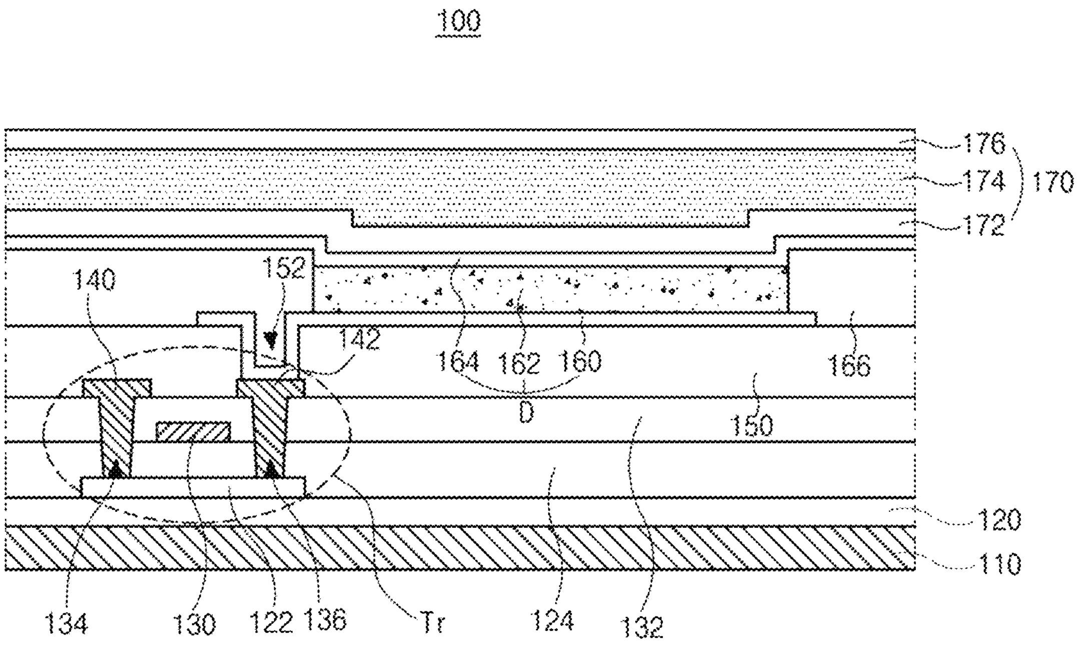
FIG. 2 is a schematic cross-sectional view illustrating an organic light emitting display device according to a first embodiment of the present disclosure.

FIG. 2 is a schematic cross-sectional view illustrating an organic light emitting display device according to a first embodiment of the present disclosure.

As illustrated in FIG. 2, the organic light emitting display device 100 includes a substrate 110, a TFT Tr and an OLED D connected to the TFT Tr. For example, the organic light emitting display device 100 may include a red pixel, a green pixel and a blue pixel, and the OLED D may be formed in each of the red, green and blue pixels. Namely, the OLEDs D emitting red light, green light and blue light may be provided in the red, green and blue pixels, respectively.

The substrate 110 may be a glass substrate or a plastic substrate. For example, the substrate 110 may be a polyimide substrate.

A buffer layer 120 is formed on the substrate, and the TFT Tr is formed on the buffer layer 120. The buffer layer 120 may be omitted.

A semiconductor layer 122 is formed on the buffer layer 120. The semiconductor layer 122 may include an oxide semiconductor material or polycrystalline silicon.

When the semiconductor layer 122 includes the oxide semiconductor material, a light-shielding pattern (not shown) may be formed under the semiconductor layer 122. The light to the semiconductor layer 122 is shielded or blocked by the light-shielding pattern such that thermal degradation of the semiconductor layer 122 can be prevented. On the other hand, when the semiconductor layer 122 includes polycrystalline silicon, impurities may be doped into both sides of the semiconductor layer 122.

A gate insulating layer 124 is formed on the semiconductor layer 122. The gate insulating layer 124 may be formed of an inorganic insulating material such as silicon oxide or silicon nitride.

A gate electrode 130, which is formed of a conductive material, e.g., metal, is formed on the gate insulating layer 124 to correspond to a center of the semiconductor layer 122.

In FIG. 2, the gate insulating layer 124 is formed on an entire surface of the substrate 110. Alternatively, the gate insulating layer 124 may be patterned to have the same shape as the gate electrode 130.

An interlayer insulating layer 132, which is formed of an insulating material, is formed on the gate electrode 130. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 122. The first and second contact holes 134 and 136 are positioned at both sides of the gate electrode 130 to be spaced apart from the gate electrode 130.

The first and second contact holes 134 and 136 are formed through the gate insulating layer 124. Alternatively, when the gate insulating layer 124 is patterned to have the same shape as the gate electrode 130, the first and second contact holes 134 and 136 is formed only through the interlayer insulating layer 132.

A source electrode 140 and a drain electrode 142, which are formed of a conductive material, e.g., metal, are formed on the interlayer insulating layer 132.

The source electrode 140 and the drain electrode 142 are spaced apart from each other with respect to the gate electrode 130 and respectively contact both sides of the semiconductor layer 122 through the first and second contact holes 134 and 136.

The semiconductor layer 122, the gate electrode 130, the source electrode 140 and the drain electrode 142 constitute the TFT Tr. The TFT Tr serves as a driving element. Namely, the TFT Tr may correspond to the driving TFT Td (of FIG. 1).

In the TFT Tr, the gate electrode 130, the source electrode 140, and the drain electrode 142 are positioned over the semiconductor layer 122. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, the gate line and the data line cross each other to define the pixel, and the switching TFT is formed to be connected to the gate and data lines. The switching TFT is connected to the TFT Tr as the driving element.

In addition, the power line, which may be formed to be parallel to and spaced apart from one of the gate and data lines, and the storage capacitor for maintaining the voltage of the gate electrode of the TFT Tr in one frame may be further formed.

A passivation layer 150, which includes a drain contact hole 152 exposing the drain electrode 142 of the TFT Tr, is formed to cover the TFT Tr.

A first electrode 160, which is connected to the drain electrode 142 of the TFT Tr through the drain contact hole 152, is separately formed in each pixel. The first electrode 160 may be an anode and may be formed of a conductive material having a relatively high work function. For example, the first electrode 160 may be formed of a transparent conductive material such as indium-tin-oxide (ITO) or indium-zinc-oxide (IZO).

When the OLED device 100 is operated in a top-emission type, a reflection electrode or a reflection layer may be formed under the first electrode 160. For example, the reflection electrode or the reflection layer may be formed of aluminum-palladium-copper (APC) alloy.

A bank layer 166 is formed on the passivation layer 150 to cover an edge of the first electrode 160. Namely, the bank layer 166 is positioned at a boundary of the pixel and exposes a center of the first electrode 160 in the pixel.

An organic emitting layer 162 is formed on the first electrode 160. The organic emitting layer 162 may have a single-layered structure of an emitting material layer including an emitting material. To increase an emitting efficiency of the OLED D and/or the organic light emitting display device 100, the organic emitting layer 162 may have a multi-layered structure.

The organic emitting layer 162 is separated in each of the red, green and blue pixels. As illustrated below, the organic emitting layer 162 in the blue pixel includes a first host of an anthracene derivative (compound) and a second host of a deuterated anthracene derivative such that the emitting efficiency and the lifespan of the OLED D in the blue pixel are improved.

A second electrode 164 is formed over the substrate 110 where the organic emitting layer 162 is formed. The second electrode 164 covers an entire surface of the display area and may be formed of a conductive material having a relatively low work function to serve as a cathode. For example, the second electrode 164 may be formed of aluminum (Al), magnesium (Mg) or Al—Mg alloy.

The first electrode 160, the organic emitting layer 162 and the second electrode 164 constitute the OLED D.

An encapsulation film 170 is formed on the second electrode 164 to prevent penetration of moisture into the OLED D. The encapsulation film 170 includes a first inorganic insulating layer 172, an organic insulating layer 174 and a second inorganic insulating layer 176 sequentially stacked, but it is not limited thereto. The encapsulation film 170 may be omitted.

A polarization plate (not shown) for reducing an ambient light reflection may be disposed over the top-emission type OLED D. For example, the polarization plate may be a circular polarization plate.

In addition, a cover window (not shown) may be attached to the encapsulation film 170 or the polarization plate. In this instance, the substrate 110 and the cover window have a flexible property such that a flexible display device may be provided.

Figure 3:
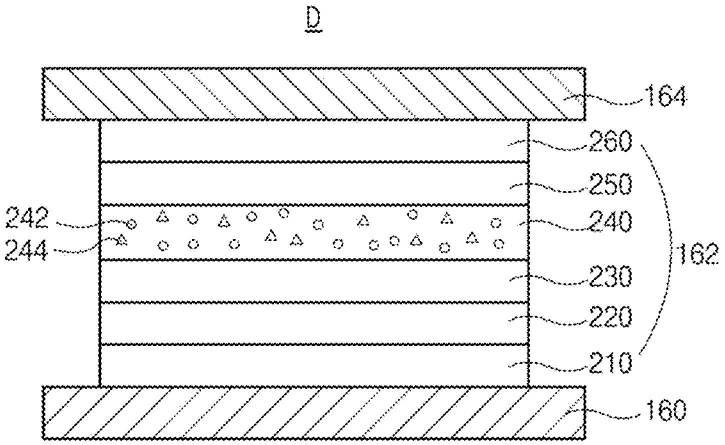
FIG. 3 is a schematic cross-sectional view illustrating an OLED having a single emitting part for the organic light emitting display device according to the first embodiment of the present disclosure.

FIG. 3 is a schematic cross-sectional view illustrating an OLED having a single emitting unit for the organic light emitting display device according to the first embodiment of the present disclosure.

As illustrated in FIG. 3, the OLED D includes the first and second electrodes 160 and 164, which face each other, and the organic emitting layer 162 therebetween. The organic emitting layer 162 includes an emitting material layer (EML) 240 between the first and second electrodes 160 and 164.

The first electrode 160 may be formed of a conductive material having a relatively high work function to serve as an anode. The second electrode 164 may be formed of a conductive material having a relatively low work function to serve as a cathode.

The organic emitting layer 162 may further include an electron blocking layer (EBL) 230 between the first electrode 160 and the EML 240 and a hole blocking layer (HBL) 250 between the EML 240 and the second electrode 164.

In addition, the organic emitting layer 162 may further include a hole transporting layer (HTL) 220 between the first electrode 160 and the EBL 230.

Moreover, the organic emitting layer 162 may further include a hole injection layer (HIL) 210 between the first electrode 160 and the HTL 220 and an electron injection layer (EIL) 260 between the second electrode 164 and the HBL 250.

In the OLED D of the present disclosure, the HBL 250 may include a hole blocking material of a pyridine derivative. The hole blocking material has an electron transporting property such that an electron transporting layer may be omitted. The HBL 250 directly contacts the EIL 260. Alternatively, the HBL may directly contact the second electrode without the EIL 260. However, an electron transporting layer may be formed between the HBL 250 and the EIL 260.

The organic emitting layer 162, e.g., the EML 240, includes the first host 242 of an anthracene derivative, the second host 244 of a deuterated anthracene derivative and a blue dopant (not shown) and provides blue emission.

The compound of the first host 242 may be represented by Formula 1:

Formula 1

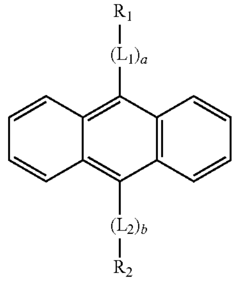

In Formula 1, each of $R_1$ and $R_2$ is independently $C_6$~$C_{30}$ aryl group or $C_5$~$C_{30}$ heteroaryl group, and each of $L_1$ and $L_2$ is independently $C_6$~$C_{30}$ arylene group. Each of a and b is an integer of 0 or 1, and at least one of a and b is 0.

For example, $R_1$ may be phenyl or naphthyl, $R_2$ may be naphthyl, dibenzofuranyl or fused dibenzofuranyl. Each of $L_1$ and $L_2$ may independently be phenylene.
In an exemplary embodiment, the first host 242 may be a compound being one of the followings in Formula 2:
Formula 2
Host 1
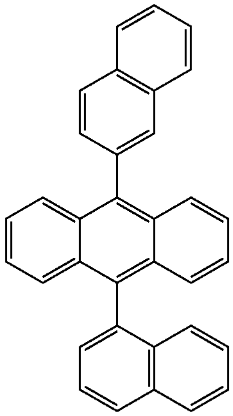
Host 2
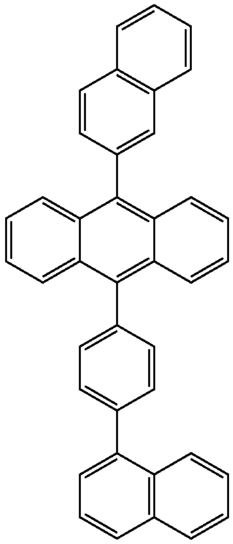
Host 3
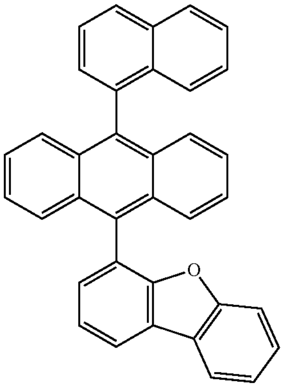
-continued
Host 4
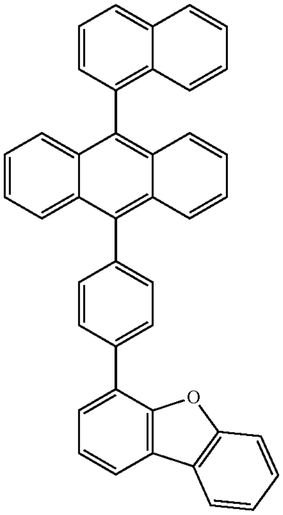
Host 5
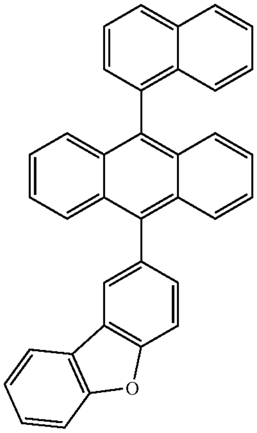
Host 6
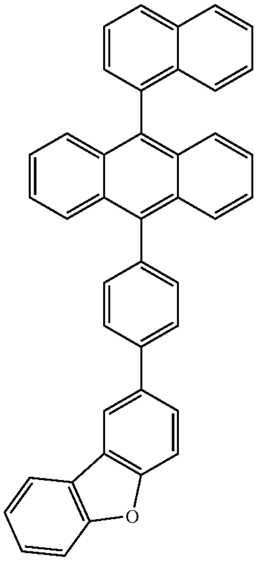

-continued
Host 7
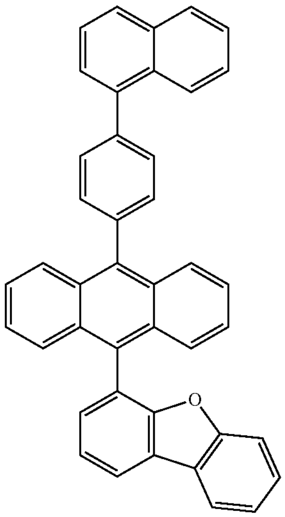
Host 8
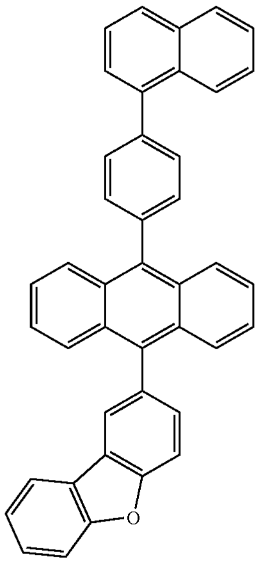
Host 9
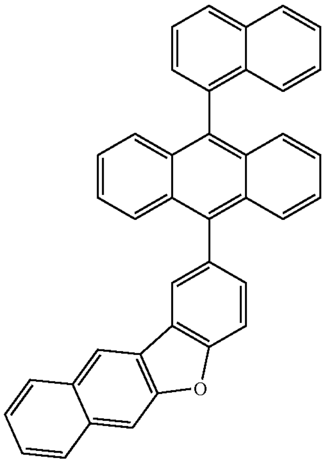
-continued
Host 10
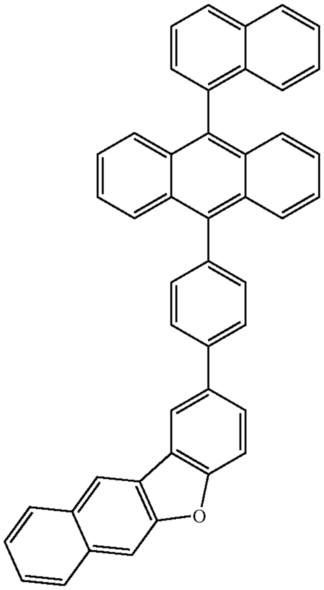
Host 11
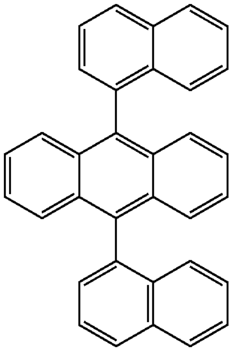
Host 12
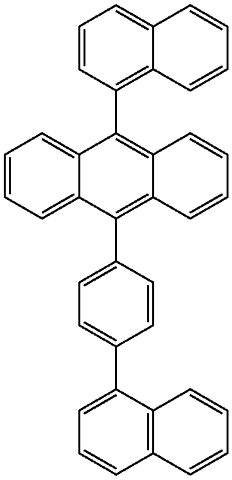

-continued
Host 13
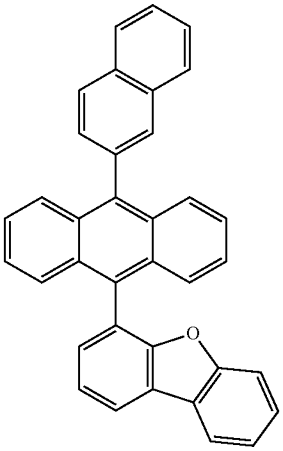
Host 14
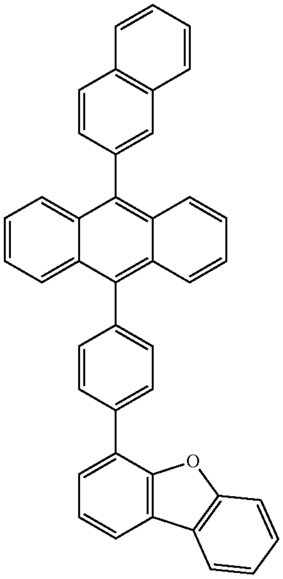
Host 15
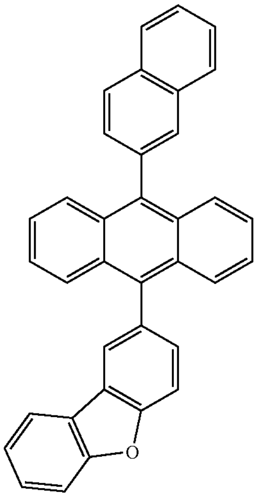
-continued
Host 16
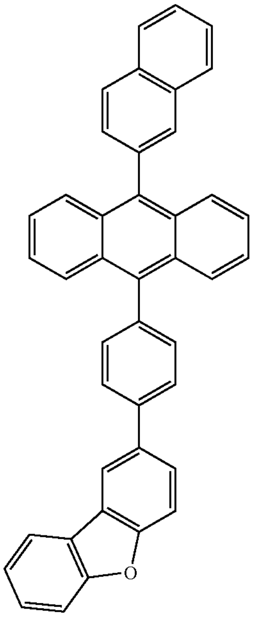
Host 17
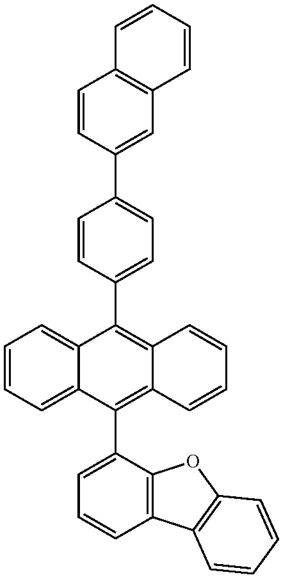

-continued
Host 18
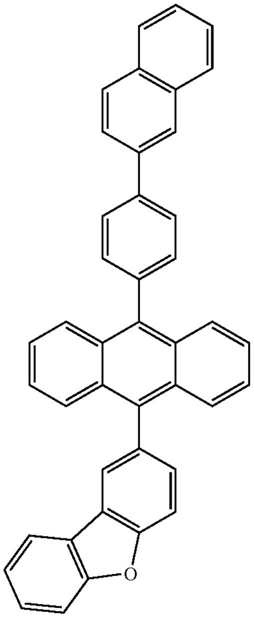
Host 19
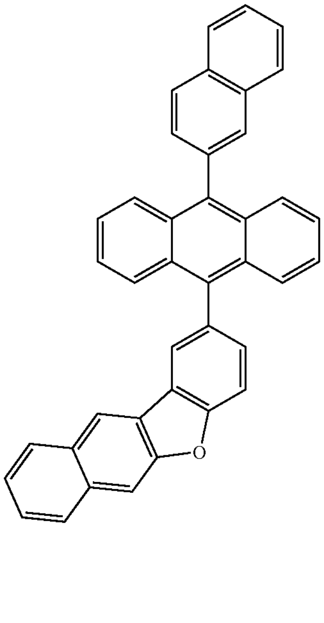
-continued
Host 20
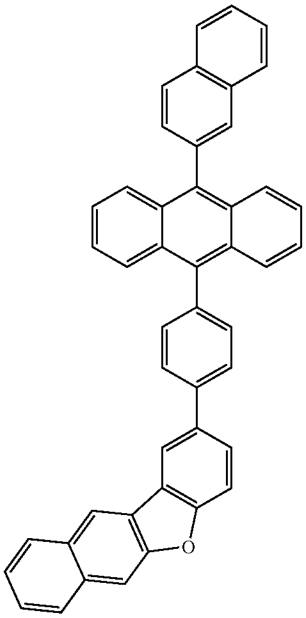
Host 21
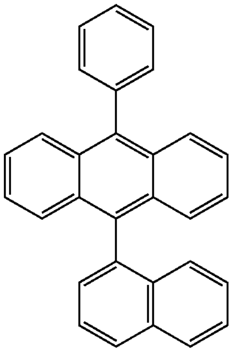
Host 22
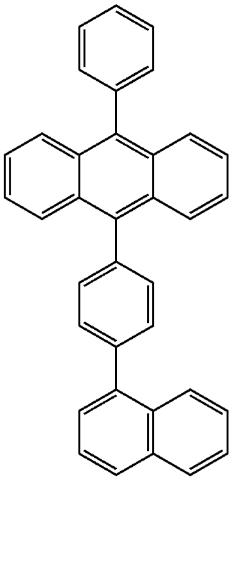

-continued
Host 23
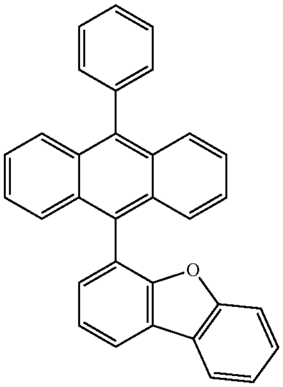
Host 24
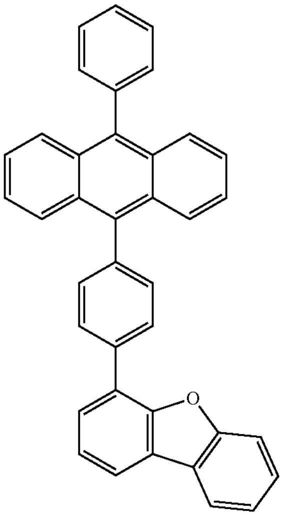
Host 25
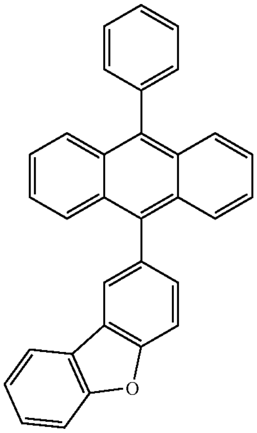
-continued
Host 26
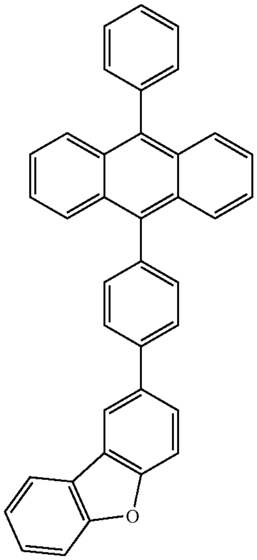
Host 27
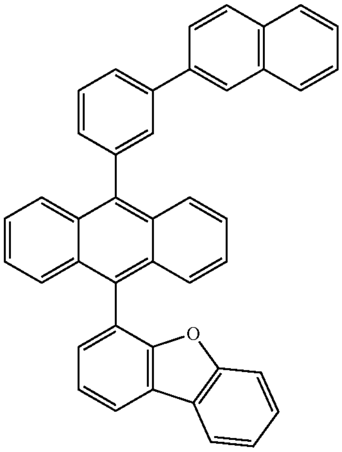
Host 28
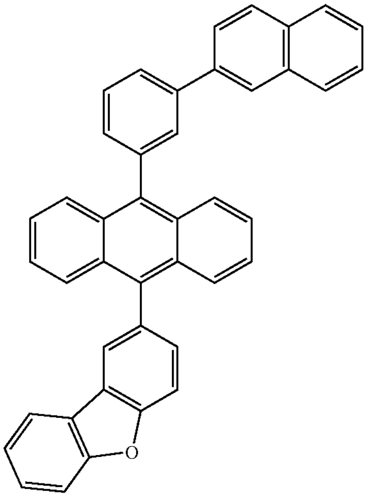

-continued

Host 29

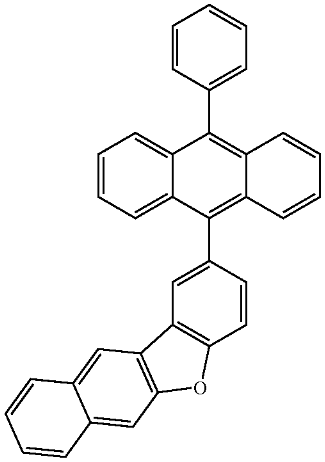

Host 30

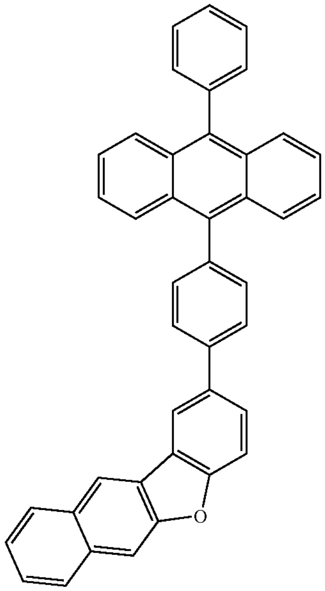

The second host 244 may be a deuterated compound of the first host 242. Namely, a hydrogen atom of the first host 242 may be substituted by a deuterium atom to form the second host 244. A part or all of the hydrogen atoms of the compound of the first host 242 may be substituted by the deuterium atom.

For example, the compound of the second host 244 may be represented by Formula 3:

Formula 3

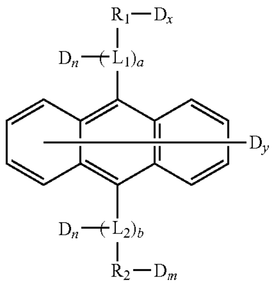

In Formula 3, the definition of $R_1$, $R_2$, $L_1$, $L_2$, a and be is same as Formula 1. In Formula 3, Dx, Dy, Dm and Dn denote a number of the deuterium atom, and each of x, y, m and n is independently a positive integer. For example, a summation of x, y, m and n may be 15 to 29.

In an exemplary embodiment, the second host 244 of Formula 3 may be a compound being one of the followings in Formula 4:

Formula 4

Host 31

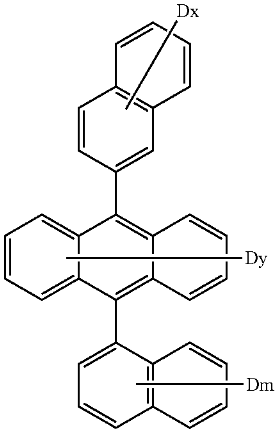

(x + y + m = 20-22)

Host 32

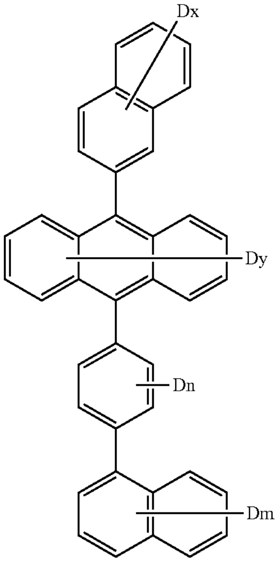

(x + y + n + m = 21-23)

-continued
Host 33
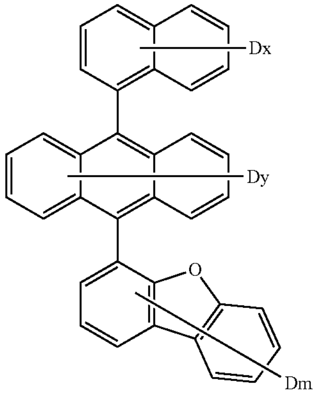
(x + y + m = 20-22)
Host 34
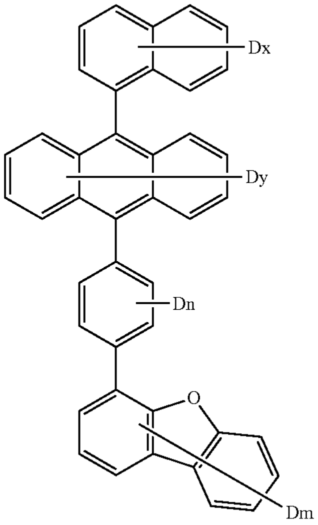
(x + y + n + m = 21-23)
Host 35
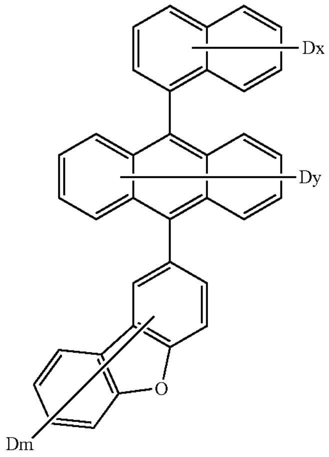
(x + y + m = 20-22)
-continued
Host 36
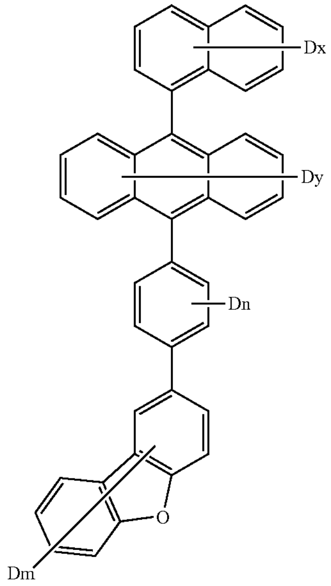
(x + y + n + m = 21-23)
Host 37
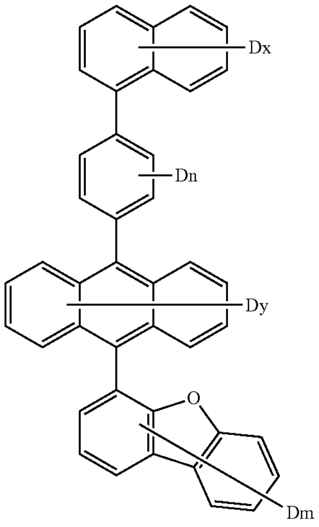
(x + y + n + m = 21-23)

-continued
Host 38
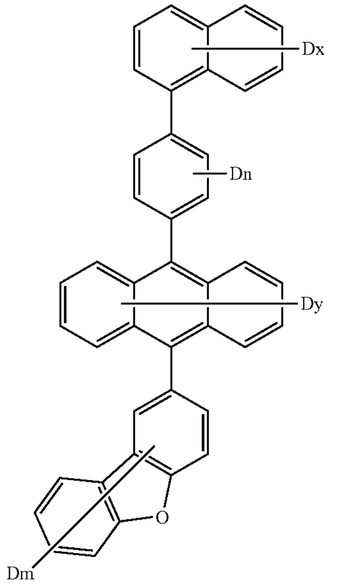
(x + y + n + m = 21-23)
Host 39
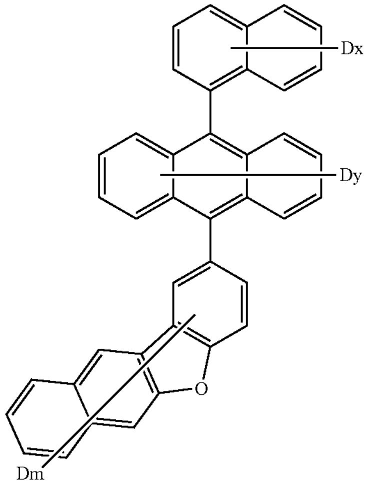
(x + y + m = 22-24)
-continued
Host 40
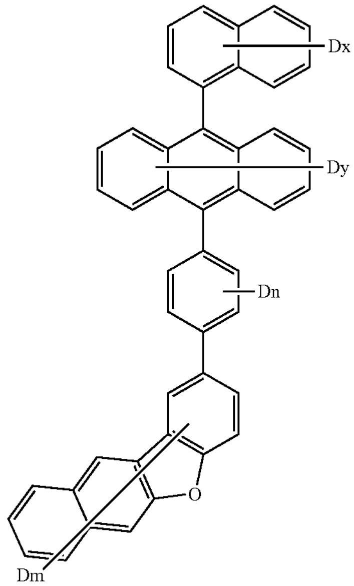
(x + y + n + m = 23-25)
Host 41
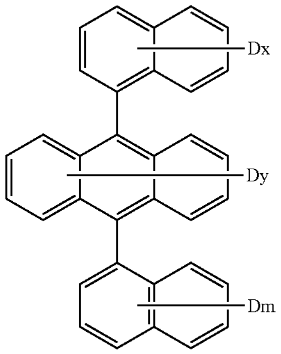
(x + y + m = 20-22)
Host 42
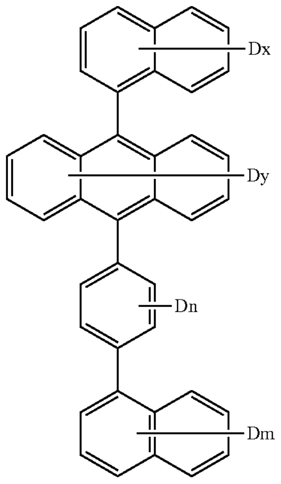
(x + y + n + m = 21-23)

-continued
Host 43
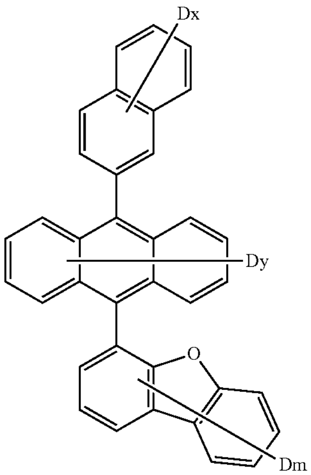
(x + y + m = 20-22)
Host 44
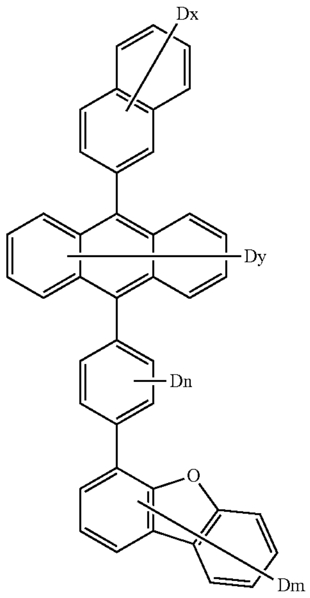
(x + y + n + m = 21-23)
-continued
Host 45
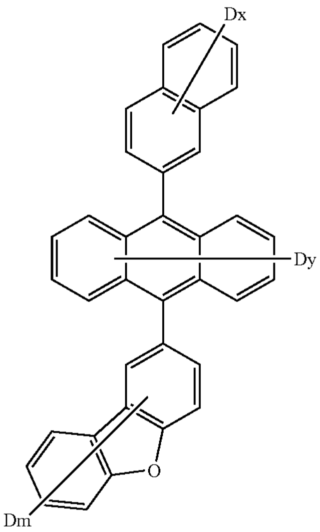
(x + y + m = 20-22)
Host 46
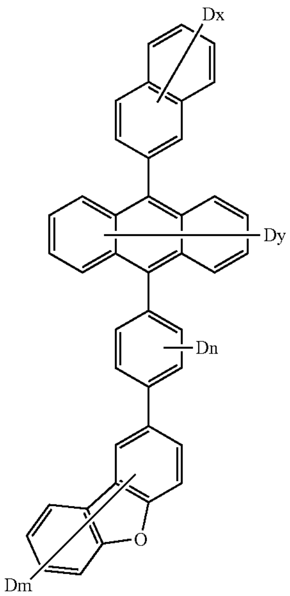
(x + y + n + m = 21-23)

-continued
Host 47
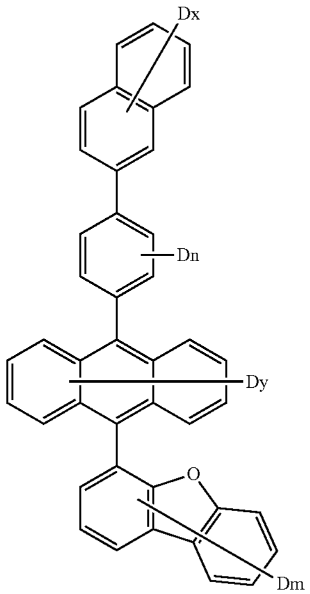
(x + y + n + m = 21-23)
Host 48
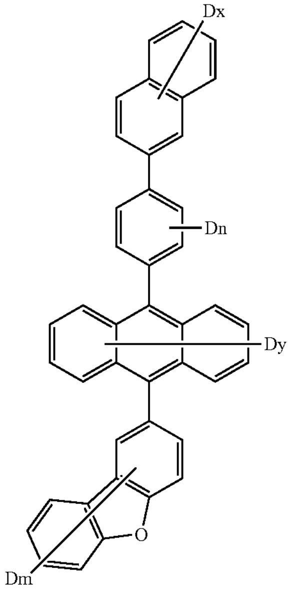
(x + y + n + m = 21-23)
-continued
Host 49
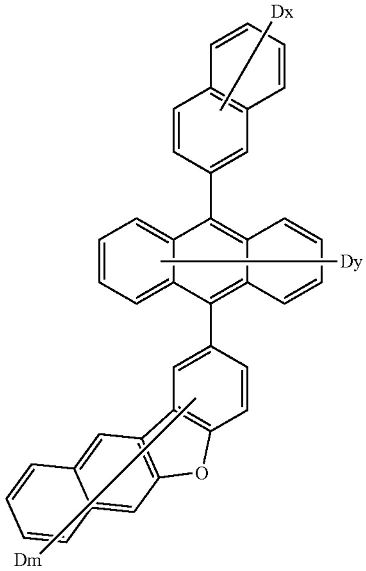
(x + y + m = 22-24)
Host 50
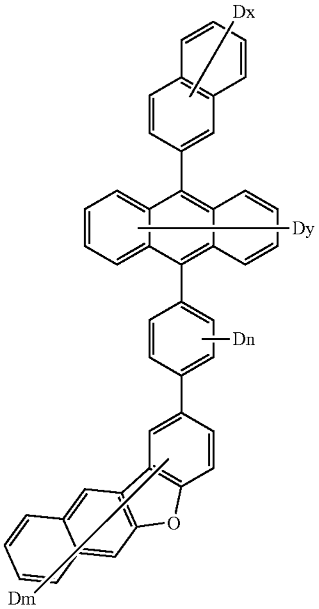
(x + y + n + m = 23-25)
Host 51
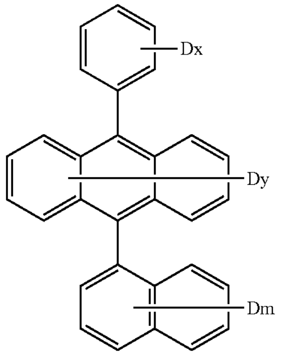
(x + y + m = 18-20)

-continued
Host 52
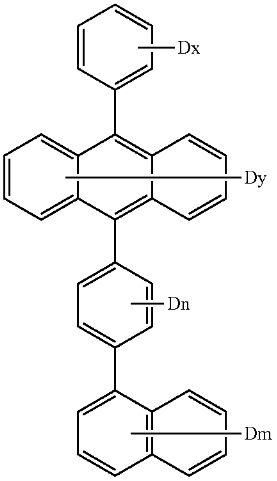
(x + y + n + m = 19-21)
Host 53
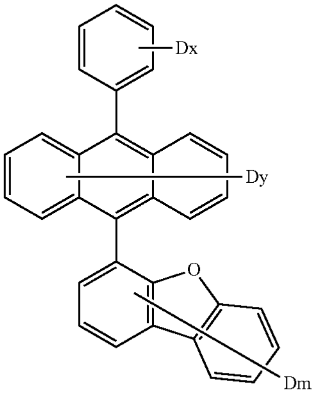
(x + y + m = 18-20)
Host 54
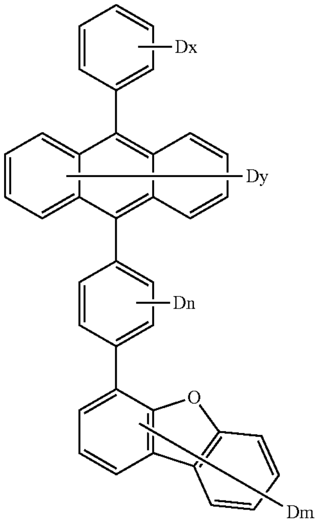
(x + y + n + m = 19-21)
-continued
Host 55
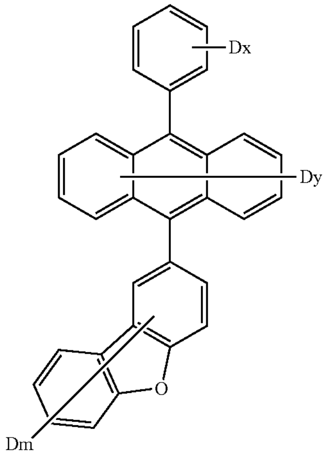
(x + y + m = 18-20)
Host 56
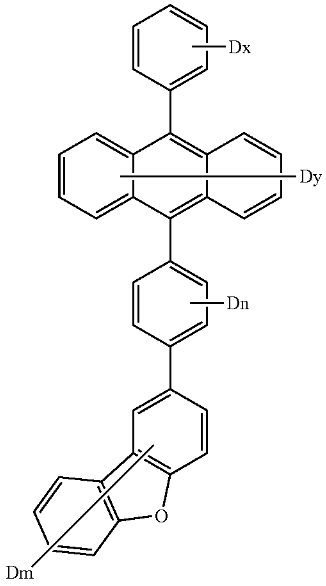
(x + y + n + m = 18-20)
Host 57
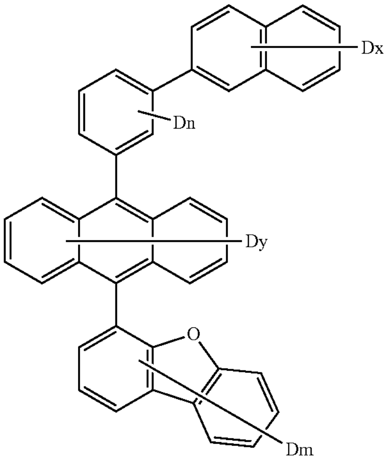
(x + y + n + m = 18-20)

-continued

Host 58

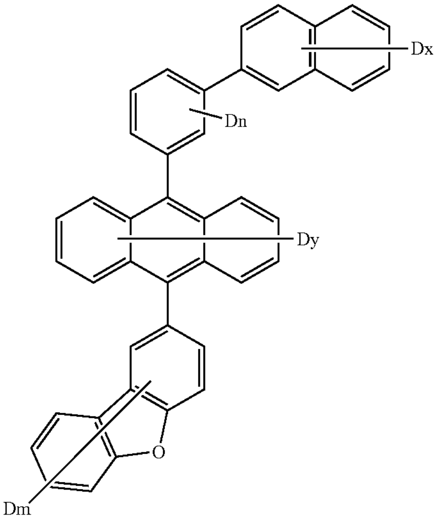

(x + y + n + m = 21-23)

Host 59

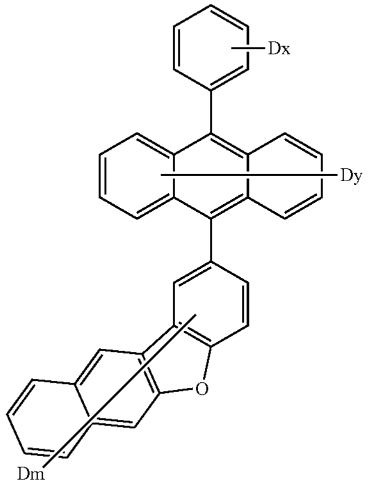

(x + y + m = 20-22)

-continued

Host 60

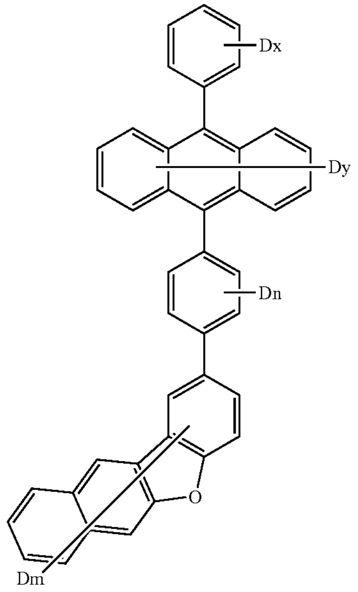

(x + y + n + m = 21-22)

A compound of the blue dopant may be represented by Formula 5-1 or Formula 5-2, but it is not limited thereto.

Formula 5-1

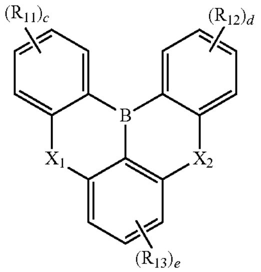

In Formula 5-1, each of c and d is independently an integer of 0 to 4, and e is an integer of 0 to 3. Each of $R_{11}$ and $R_{12}$ is independently selected from the group consisting of $C_1$~$C_{20}$ alkyl group, $C_6$~$C_{30}$ aryl group, $C_5$~$C_{30}$ hetero aryl group and $C_6$~$C_{30}$ aryl amino group, or adjacent two among $R_{11}$ or adjacent two among $R_{12}$ form a fused aromatic ring or a hetero-aromatic ring. $R_{13}$ is selected from the group consisting of $C_1$~$C_{10}$ alkyl group, $C_6$~$C_{30}$ aryl group, $C_5$~$C_{30}$ hetero aryl group and $C_5$~$C_{30}$ aromatic amino group. Each of $X_1$ and $X_2$ is independently oxygen (O) or $NR_{14}$, and $R_{14}$ is $C_6$~$C_{30}$ aryl group.

Formula 5-2

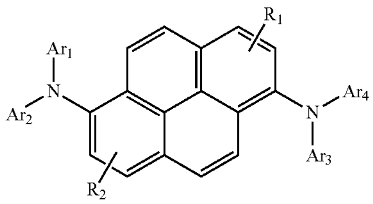

In Formula 5-2, each of $Ar_1$, $Ar_2$, $Ar_3$ and $Ar_4$ is independently selected from the group consisting of $C_6$~$C_{30}$ aryl group and $C_5$~$C_{30}$ hetero aryl group, and each of $R_1$ and $R_2$ is independently selected from the group consisting of hydrogen, $C_1$~$C_{20}$ alkyl group and $C_6$~$C_{30}$ aryl group. For example, each of $Ar_1$, $Ar_2$, $Ar_3$ and $Ar_4$ may be independently selected from the group consisting of phenyl, dibenzofuranyl, naphthyl and biphenyl and may be substituted by trifluoromethyl, cyano or fluorine (F). Each of $R_1$ and $R_2$ may be independently selected from the group consisting of hydrogen, iso-propyl and phenyl.

For example, the blue dopant in Formula 5-1 may be a compound being one of the followings in Formula 6-1:

Formula 6-1

Dopant 1

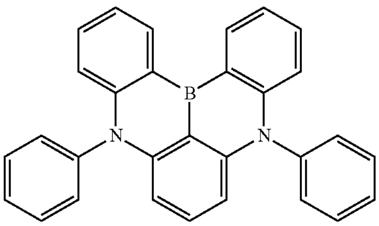

Dopant 2

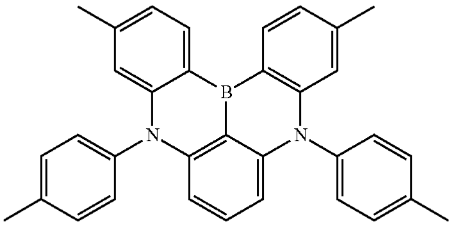

Dopant 3

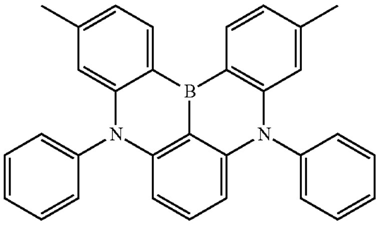

Dopant 4

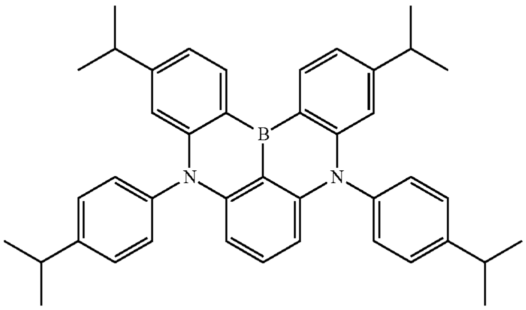

-continued

Dopant 5

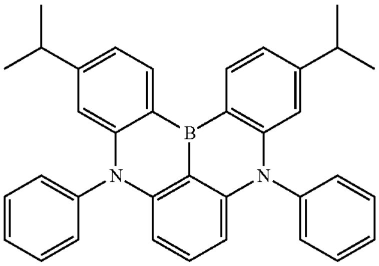

Dopant 6

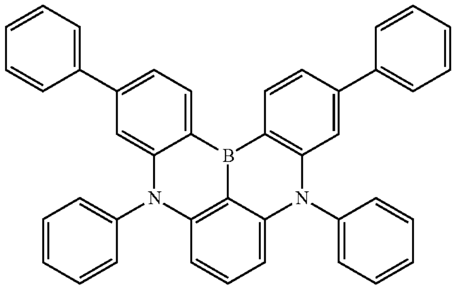

Dopant 7

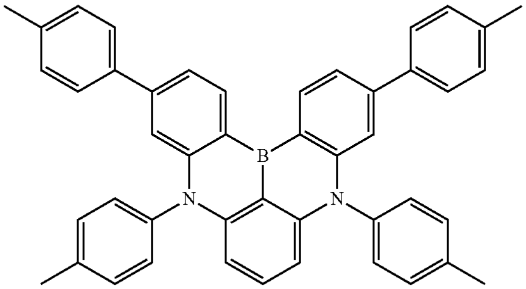

Dopant 8

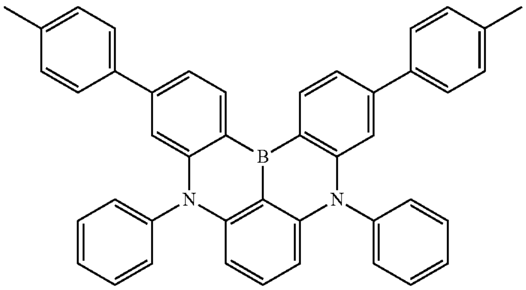

Dopant 9

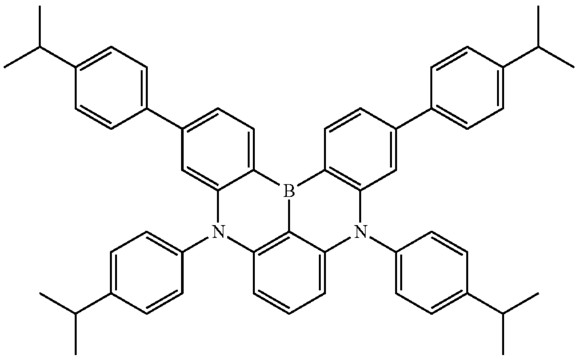

-continued
Dopant 10
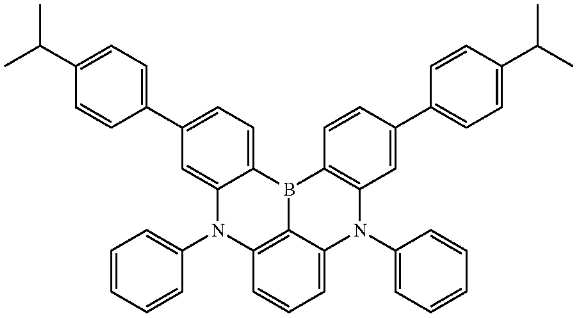
Dopant 11
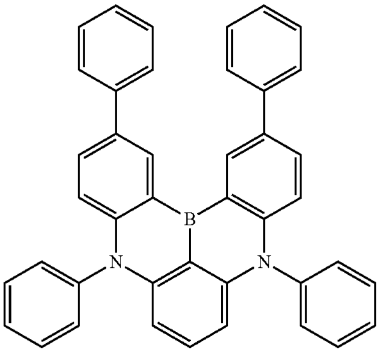
Dopant 12
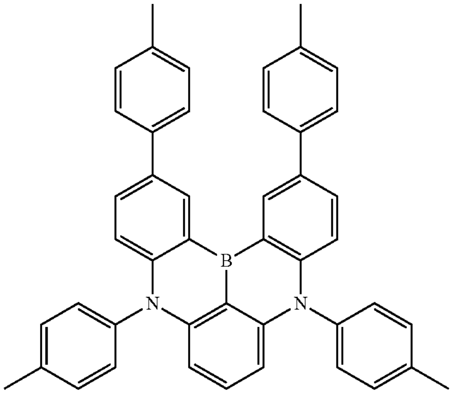
Dopant 13
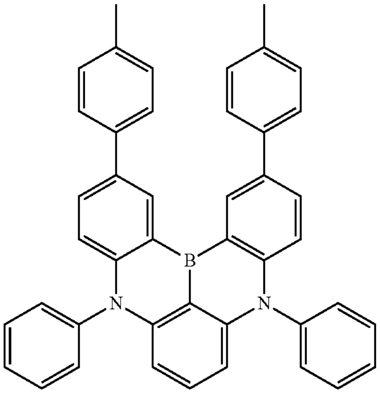
-continued
Dopant 14
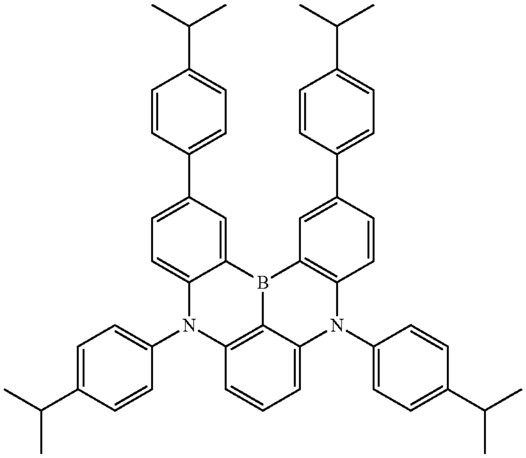
Dopant 15
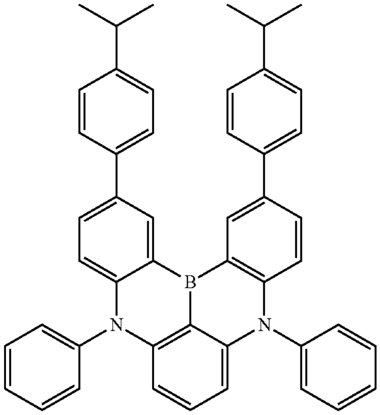
Dopant 16
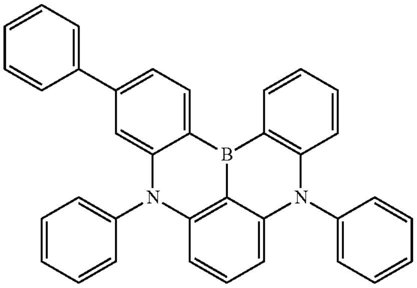
Dopant 17
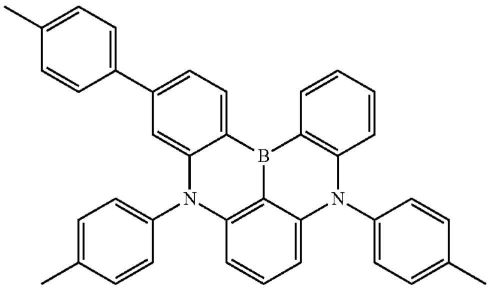

-continued
Dopant 18
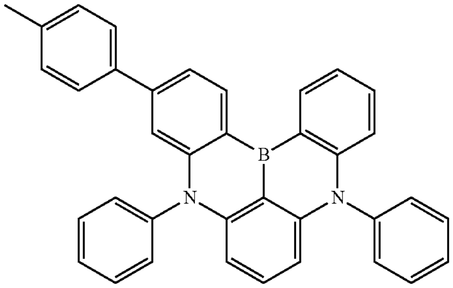
Dopant 19
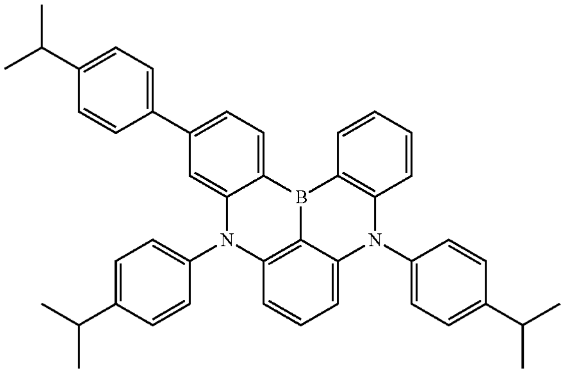
Dopant 20
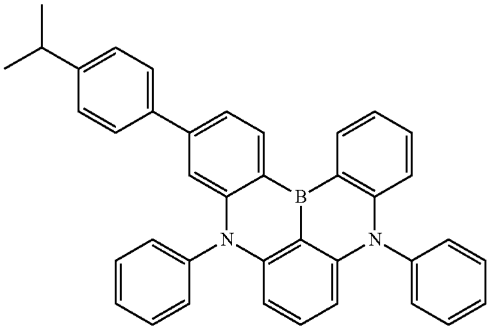
Dopant 21
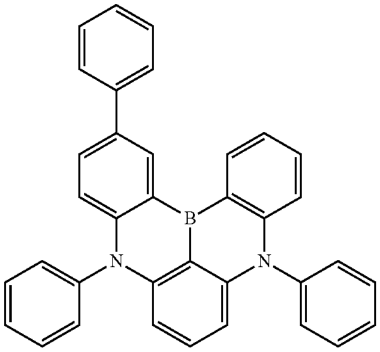
-continued
Dopant 22
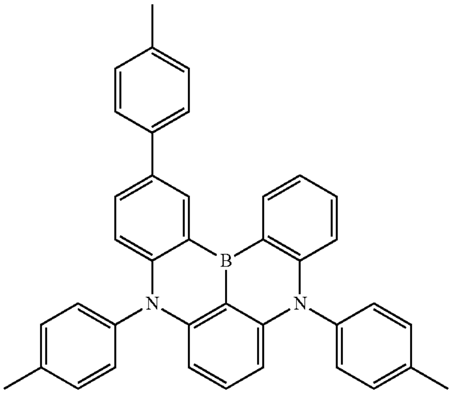
Dopant 23
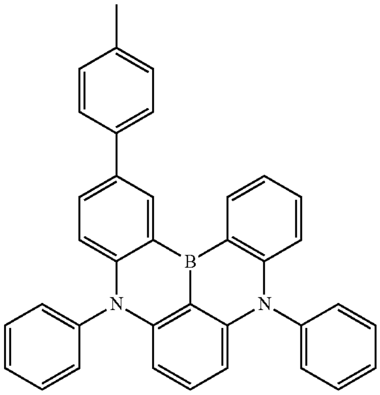
Dopant 24
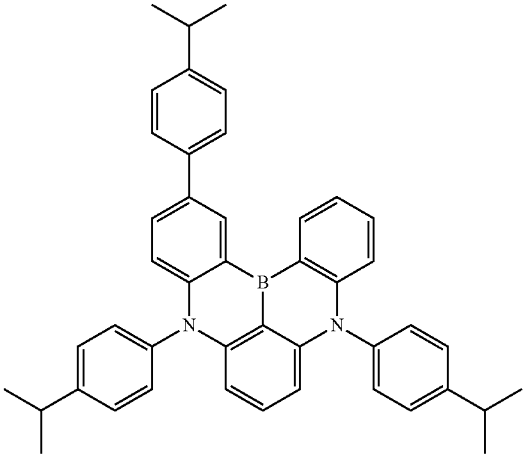

-continued
Dopant 25
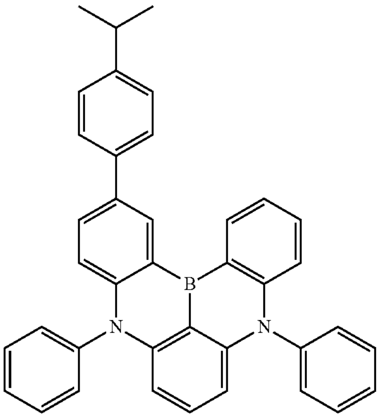
Dopant 26
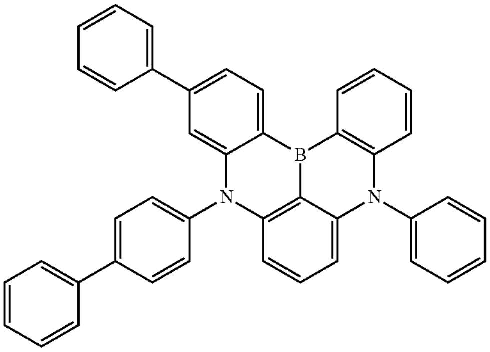
Dopant 27
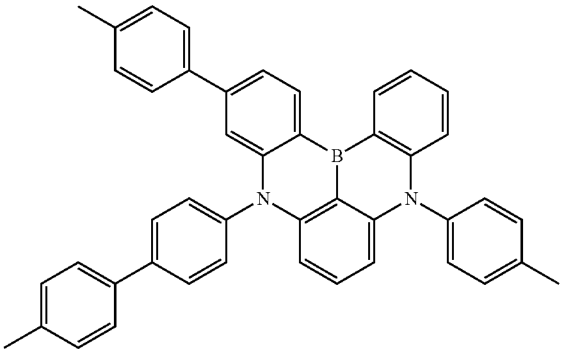
Dopant 28
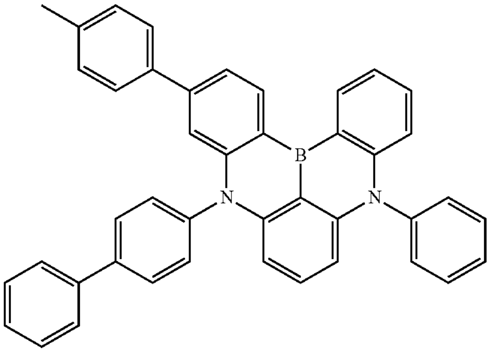
-continued
Dopant 29
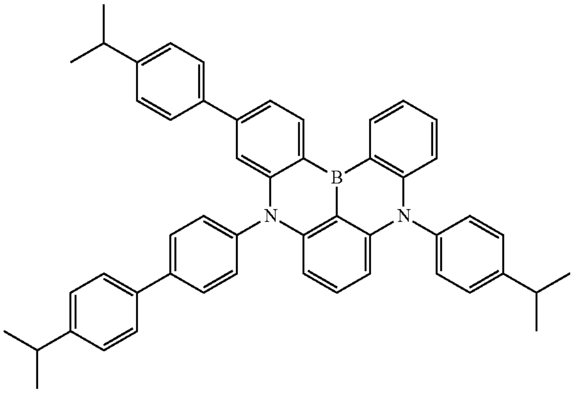
Dopant 30
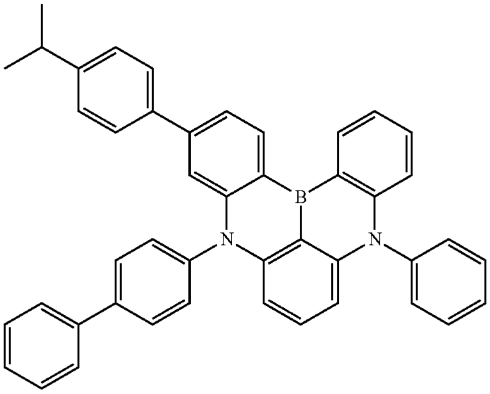
Dopant 31
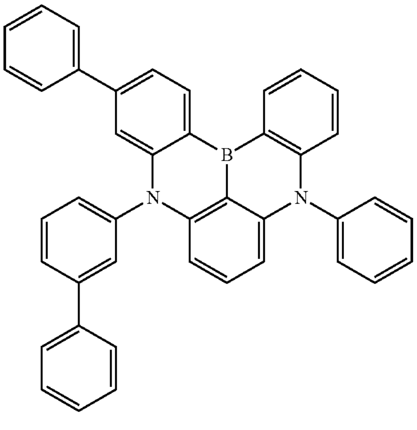

-continued
Dopant 32
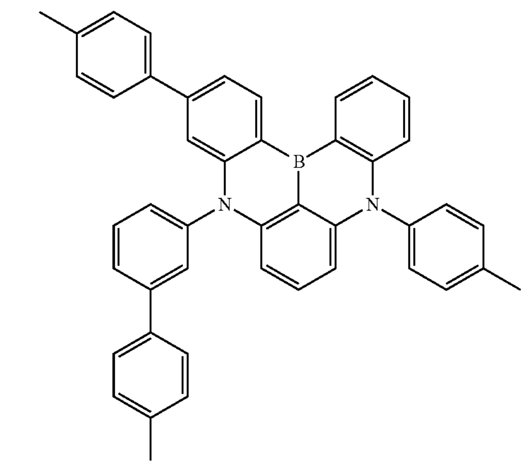
Dopant 33
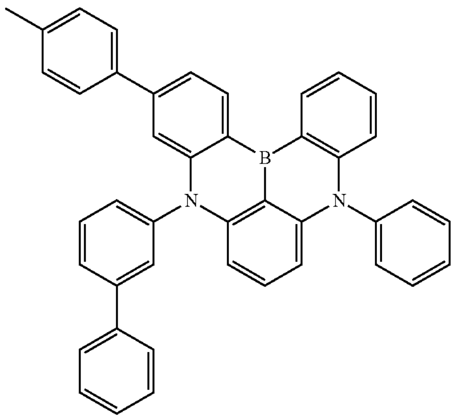
Dopant 34
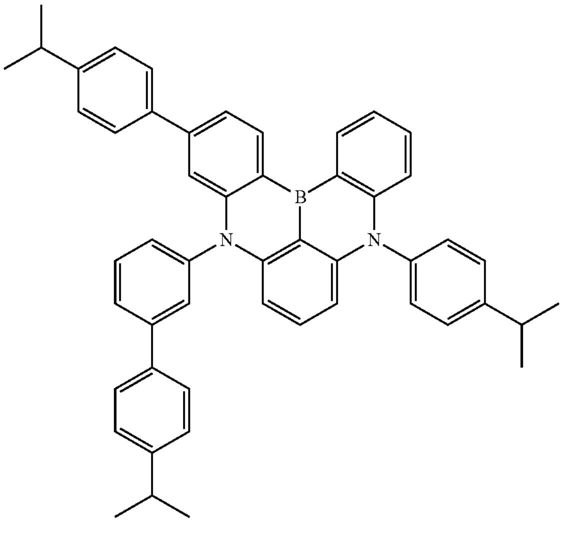
-continued
Dopant 35
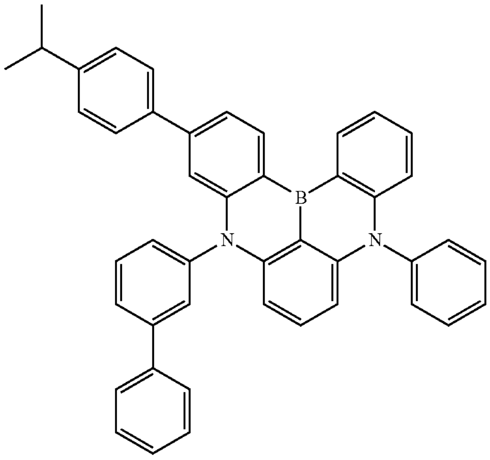
Dopant 36
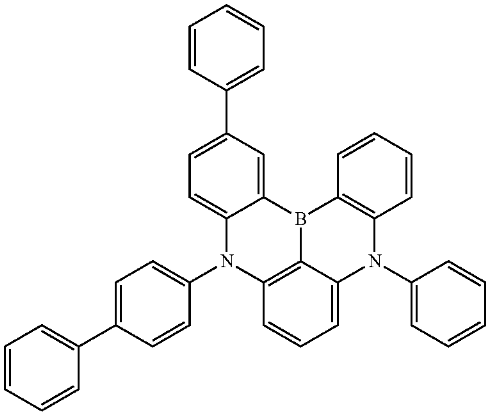
Dopant 37
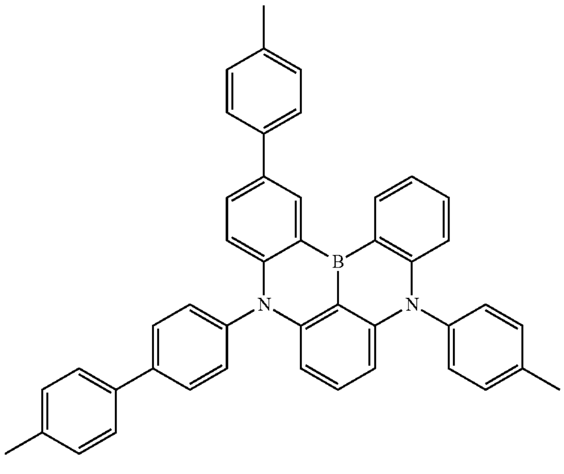

-continued
Dopant 38
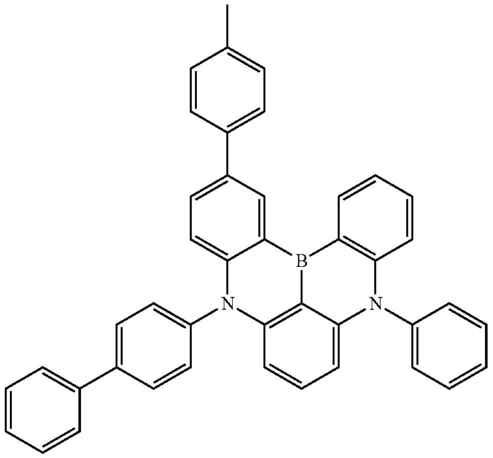
Dopant 39
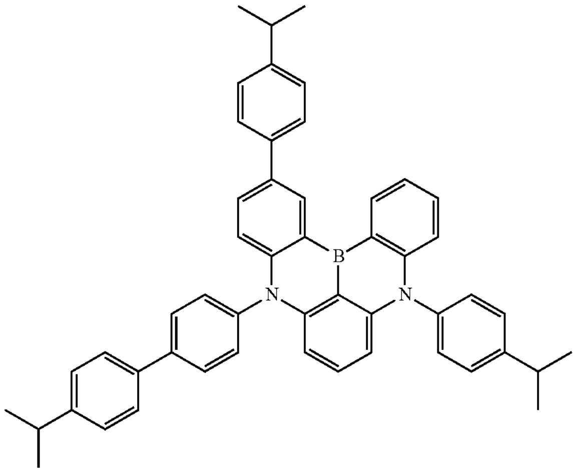
Dopant 40
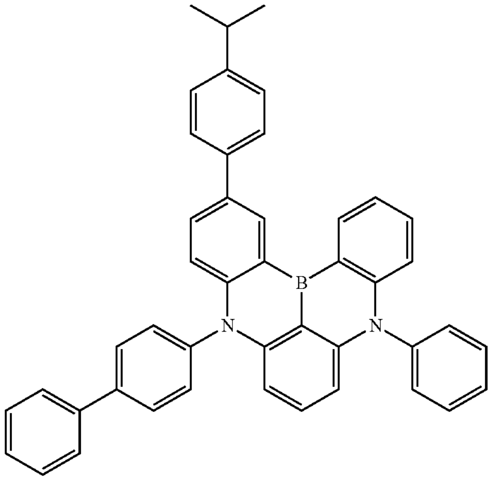
-continued
Dopant 41
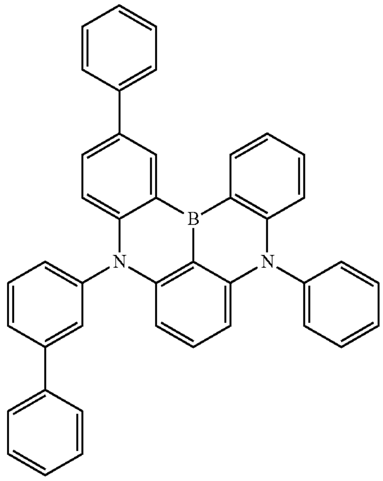
Dopant 42
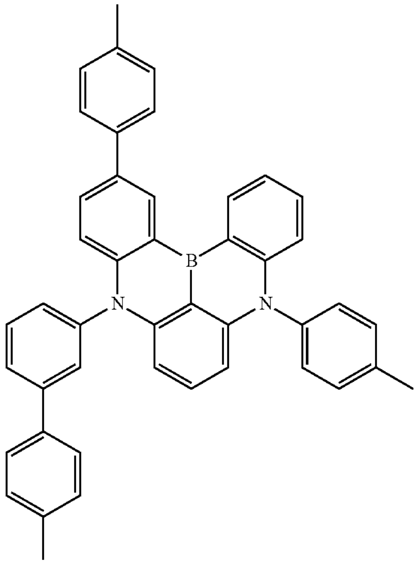
Dopant 43
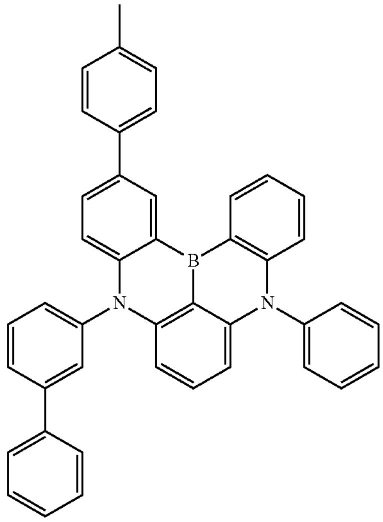

-continued
Dopant 44
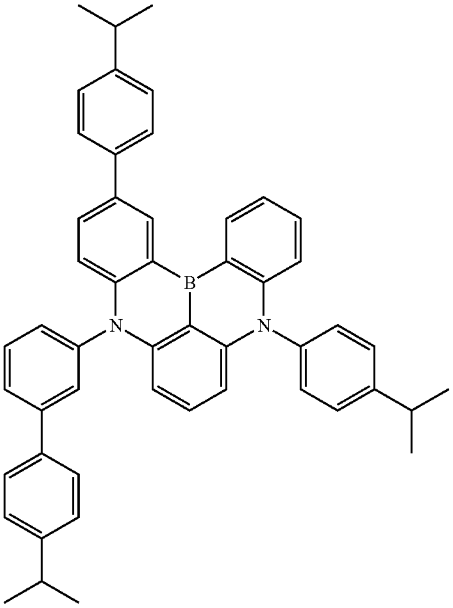
Dopant 45
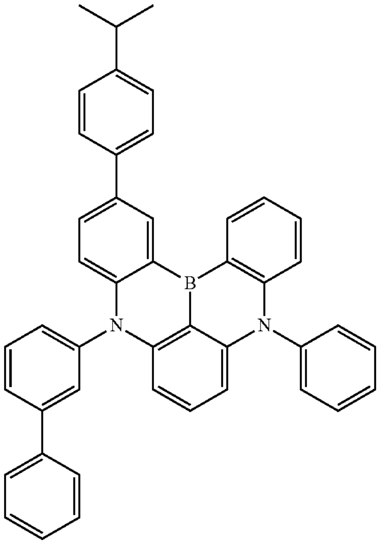
Dopant 46
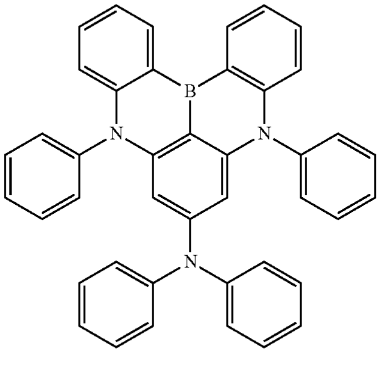
-continued
Dopant 47
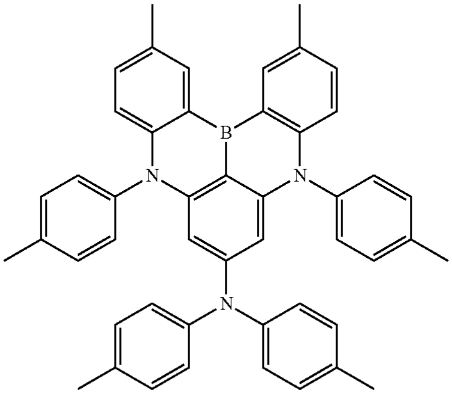
Dopant 48
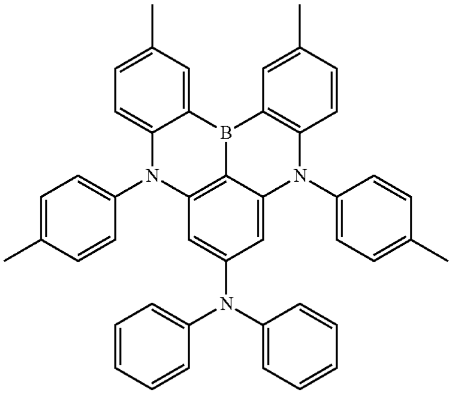
Dopant 49
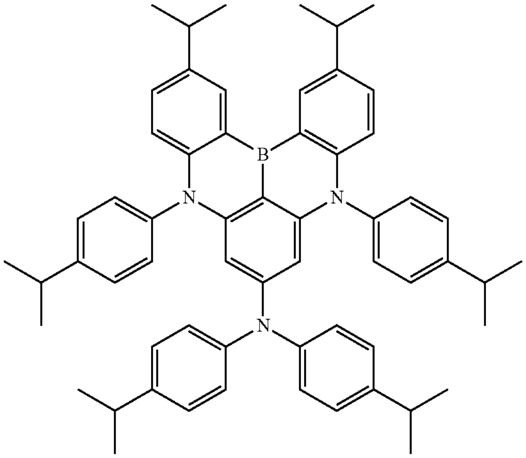

Dopant 50
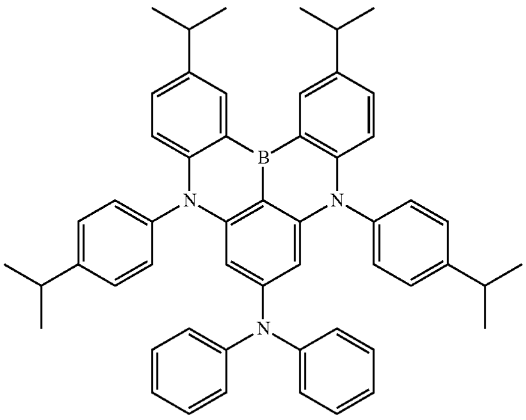
Dopant 51
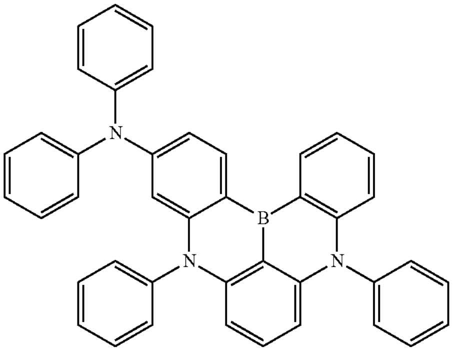
Dopant 52
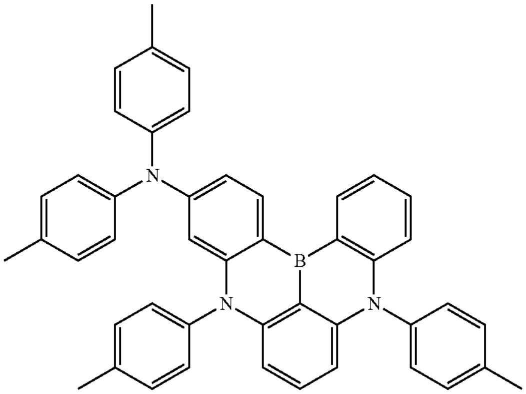
Dopant 53
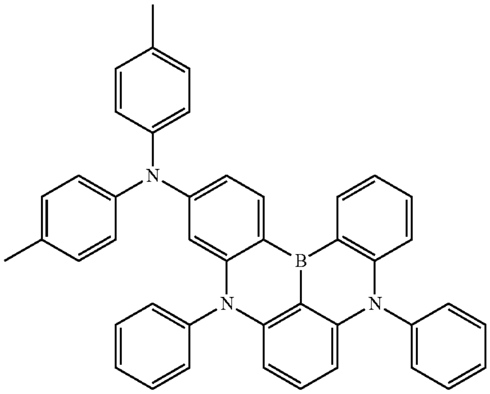
Dopant 54
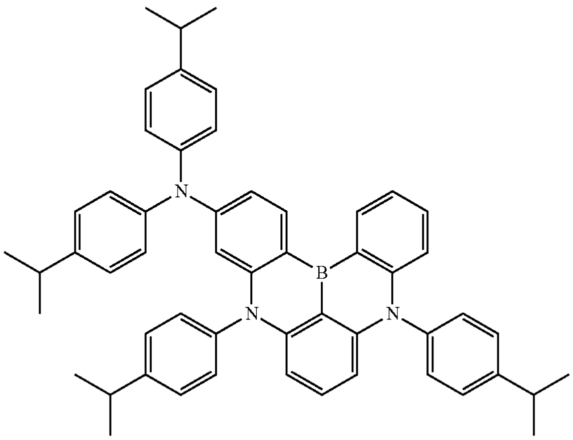
Dopant 55
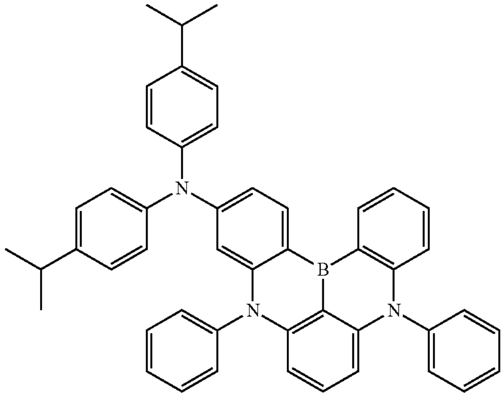
Dopant 56
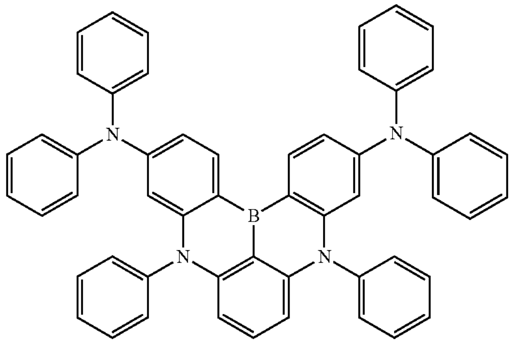
Dopant 57
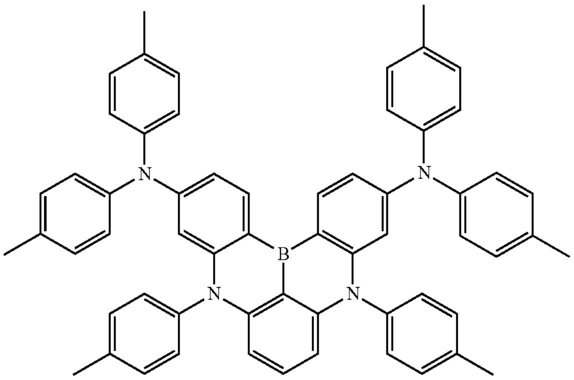

-continued
Dopant 58
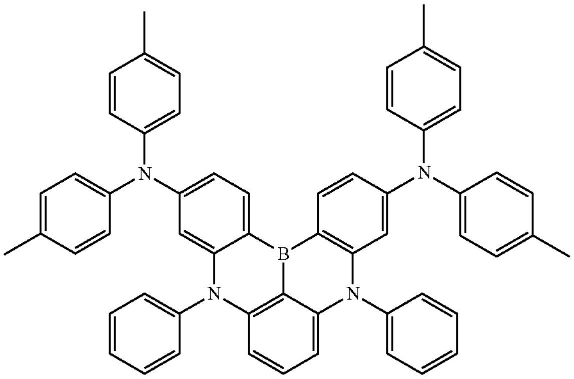
Dopant 59
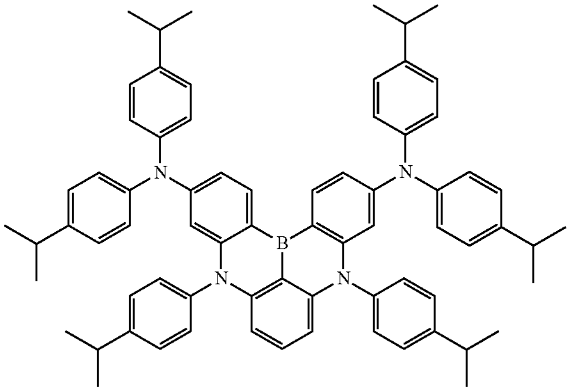
Dopant 60
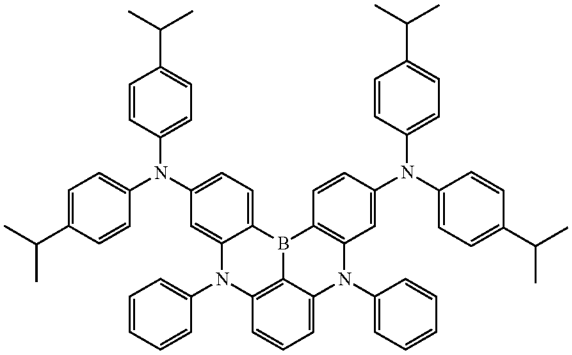
Dopant 61
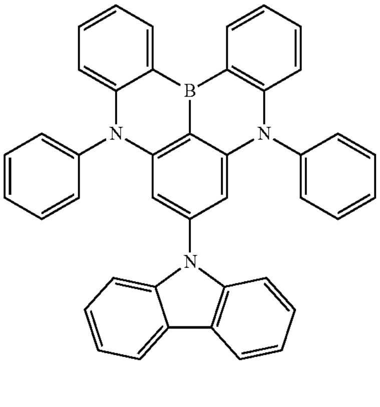
-continued
Dopant 62
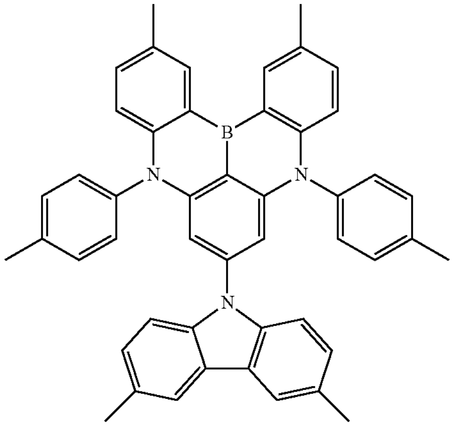
Dopant 63
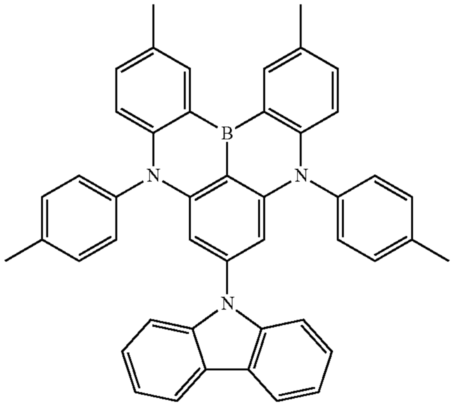
Dopant 64
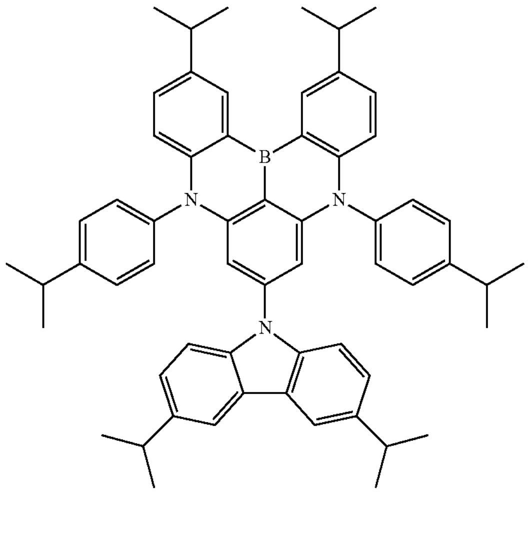

-continued
Dopant 65
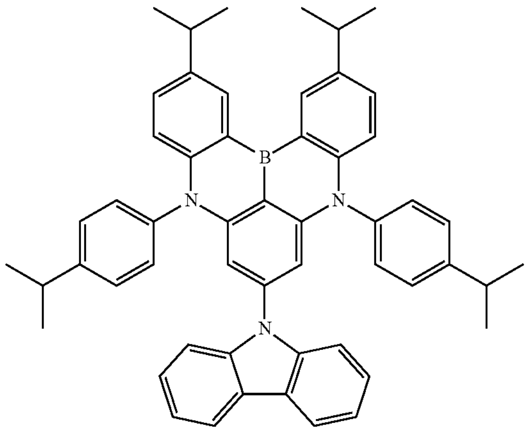
Dopant 66
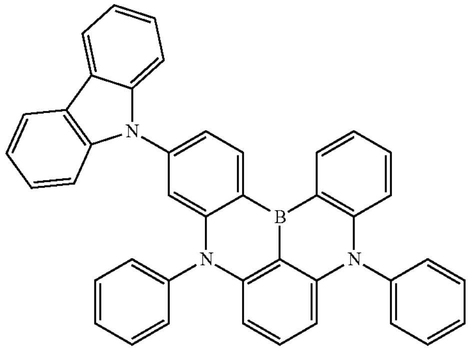
Dopant 67
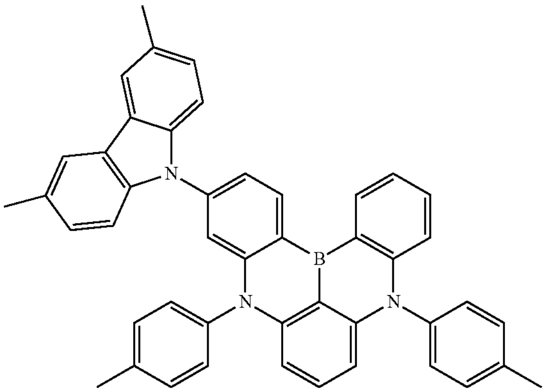
Dopant 68
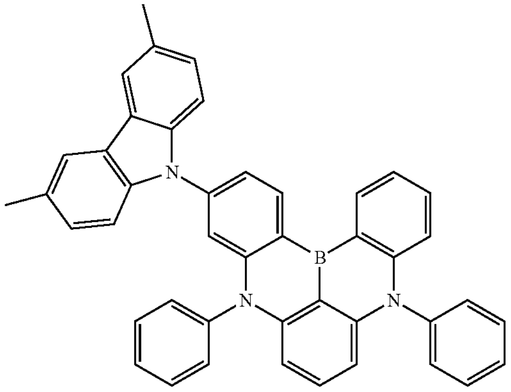
-continued
Dopant 69
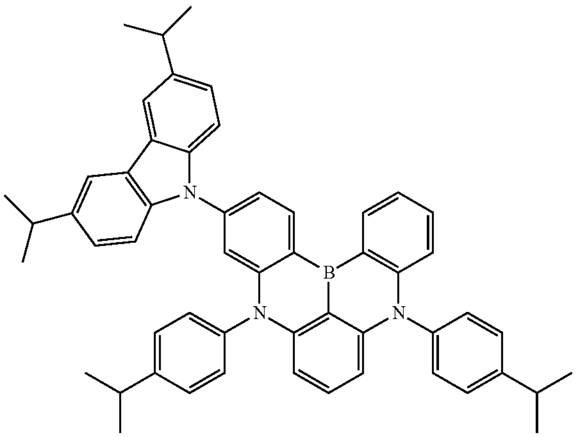
Dopant 70
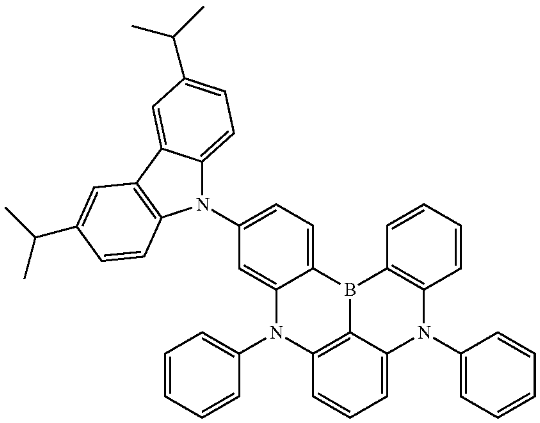
Dopant 71
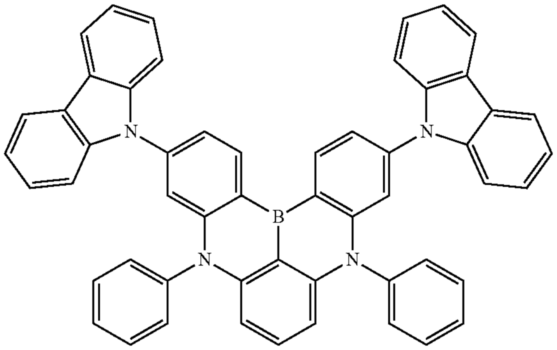
Dopant 72
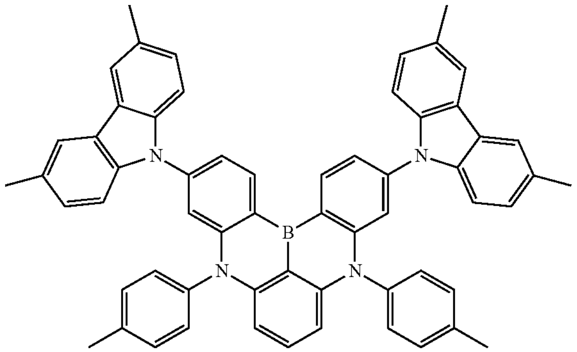

-continued
Dopant 73
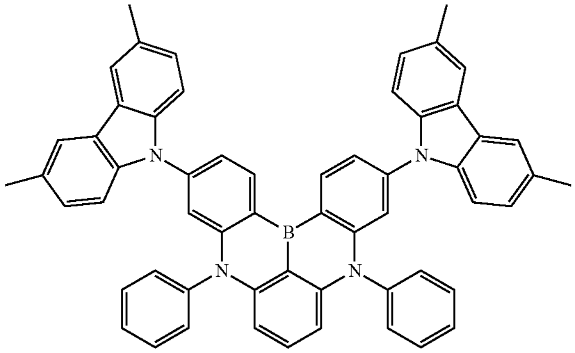
Dopant 74
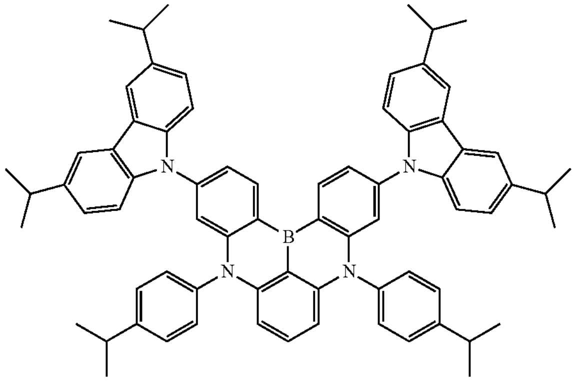
Dopant 75
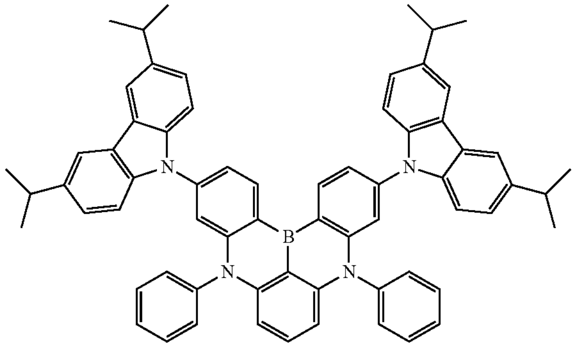
Dopant 76
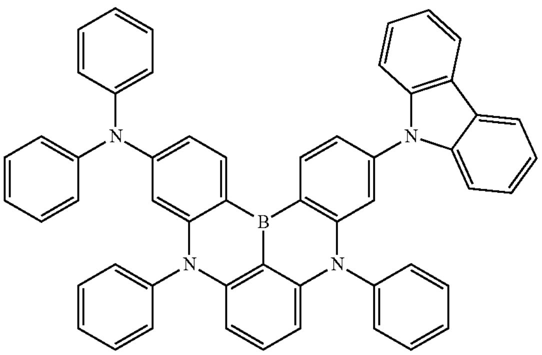
-continued
Dopant 77
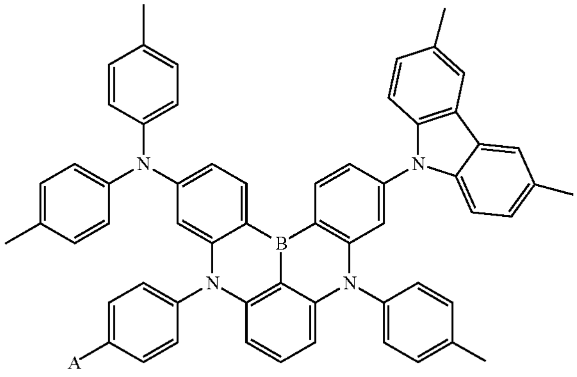
Dopant 78
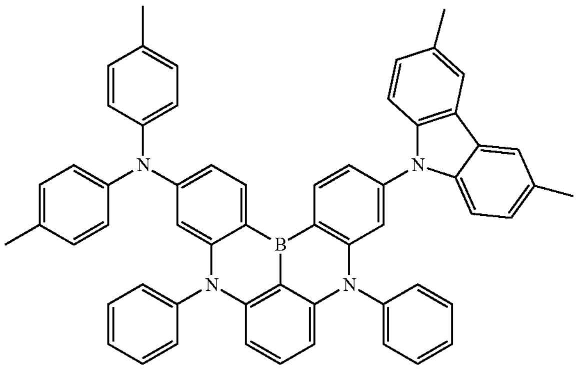
Dopant 79
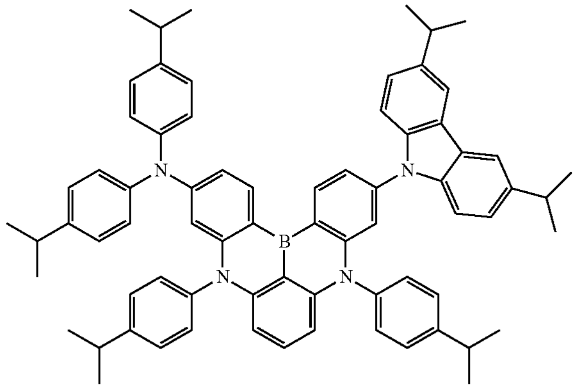
Dopant 80
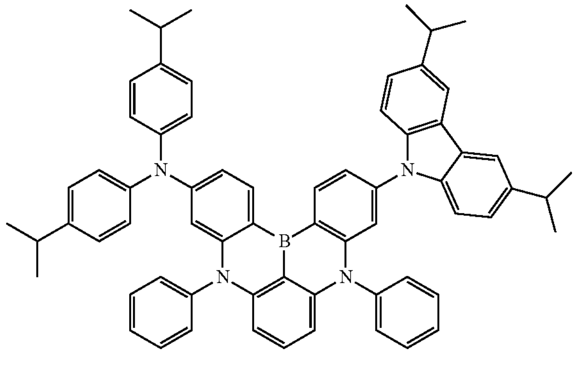

Dopant 81
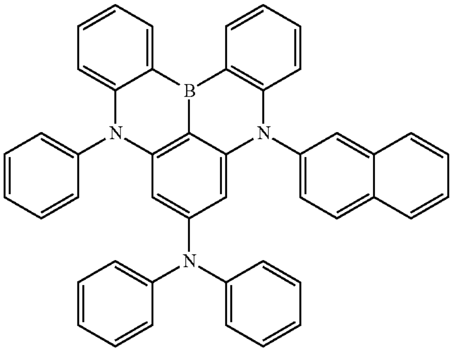
Dopant 82
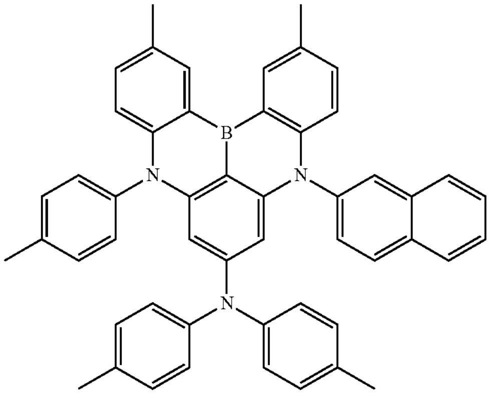
Dopant 83
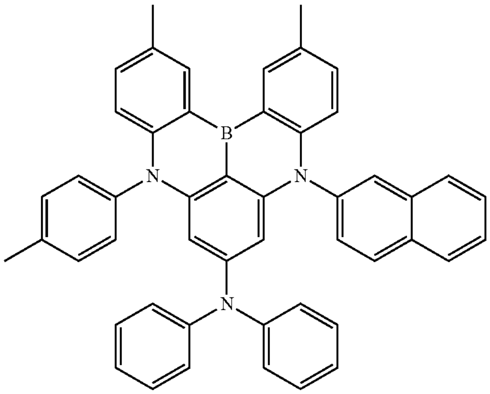
Dopant 84
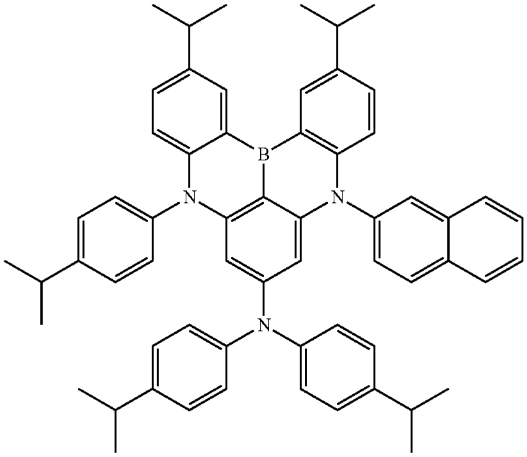
Dopant 85
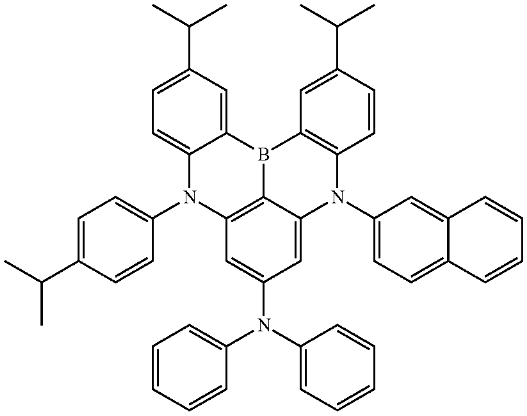
Dopant 86
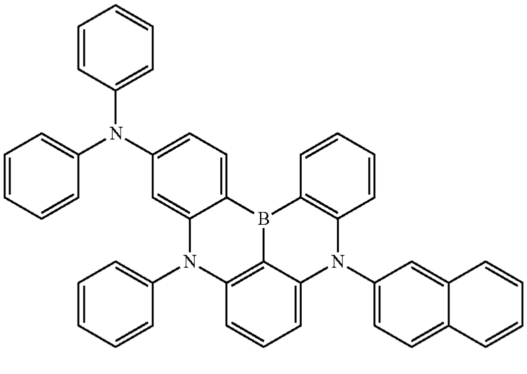

-continued
Dopant 87
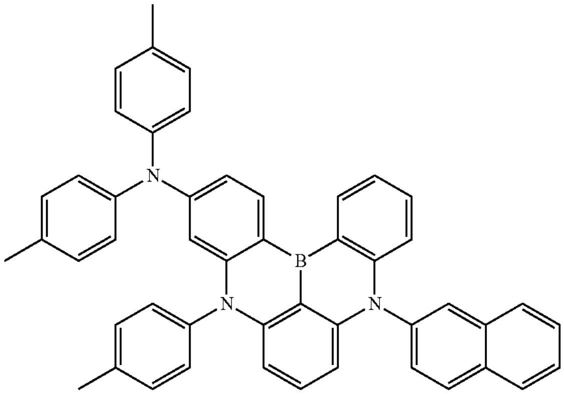
Dopant 88
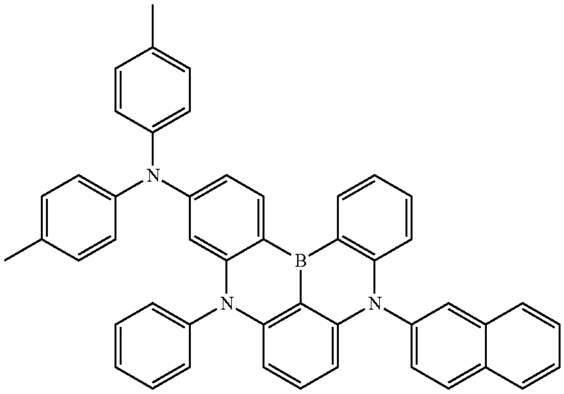
Dopant 89
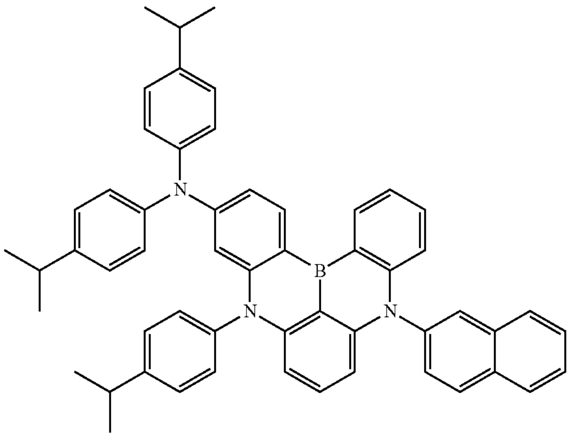
-continued
Dopant 90
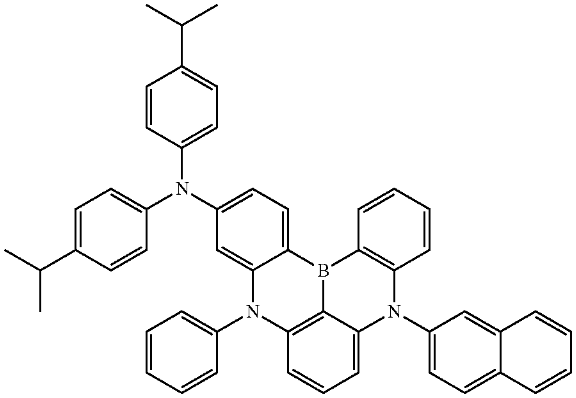
Dopant 91
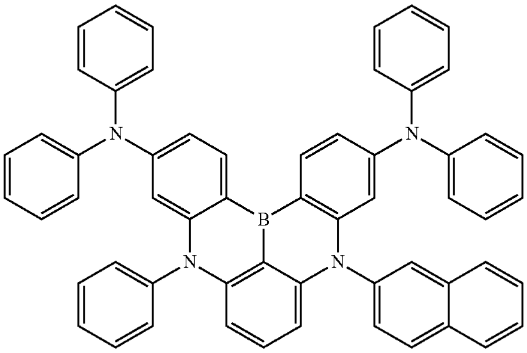
Dopant 92
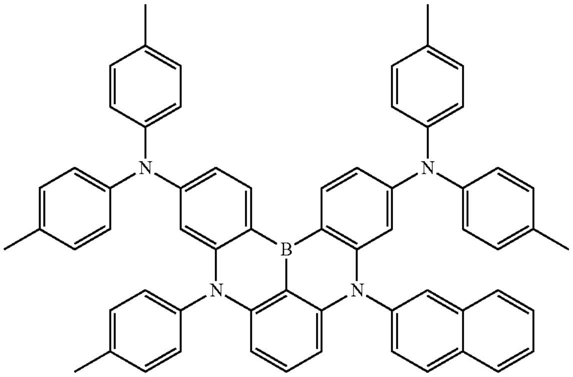
Dopant 93
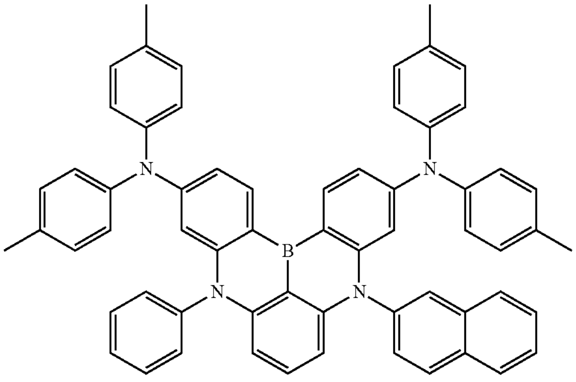

-continued
Dopant 94
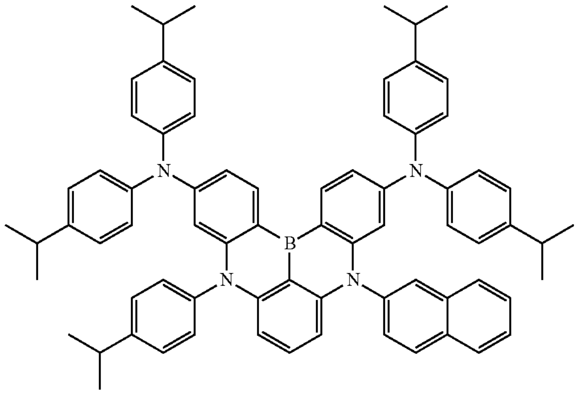
Dopant 95
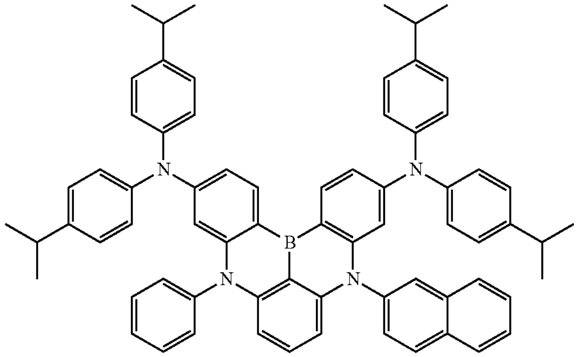
Dopant 96
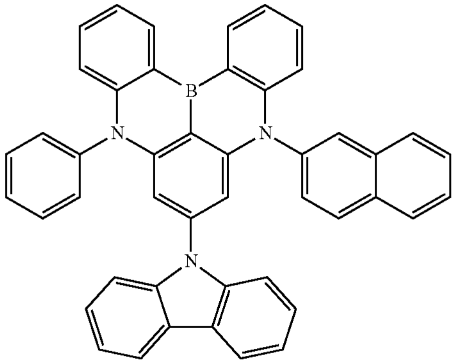
Dopant 97
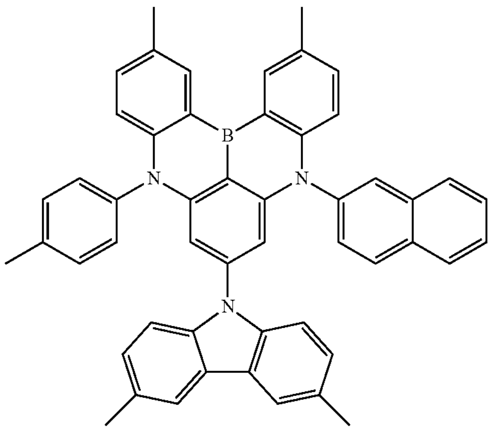
-continued
Dopant 98
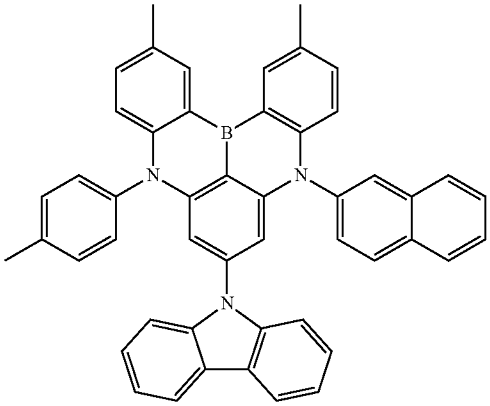
Dopant 99
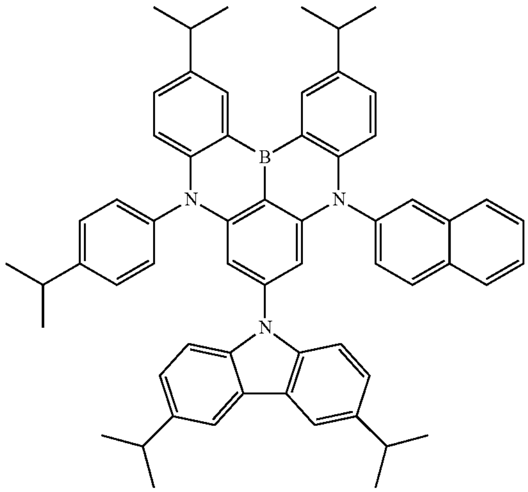
Dopant 100
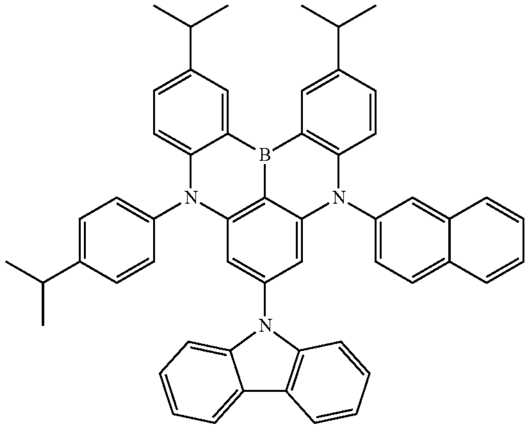

-continued
Dopant 101
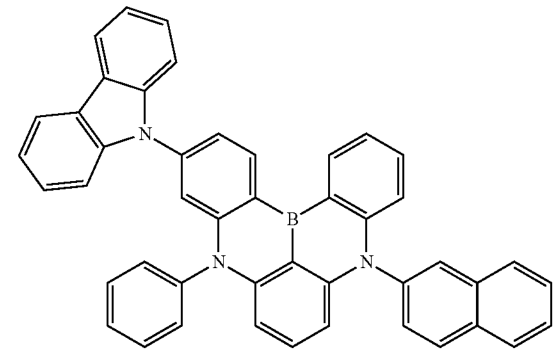
Dopant 102
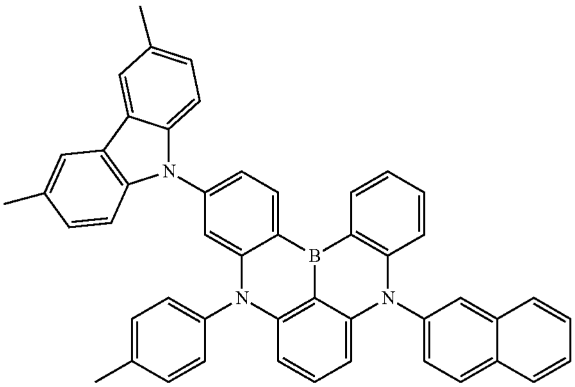
Dopant 103
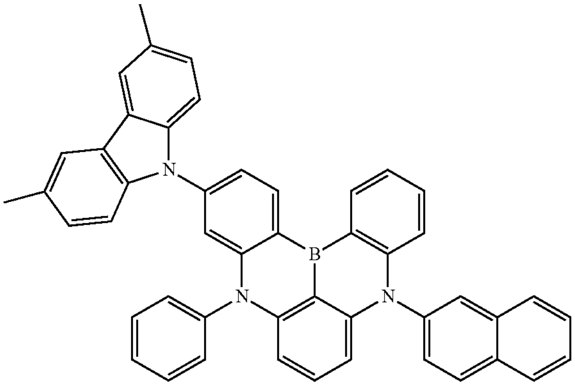
Dopant 104
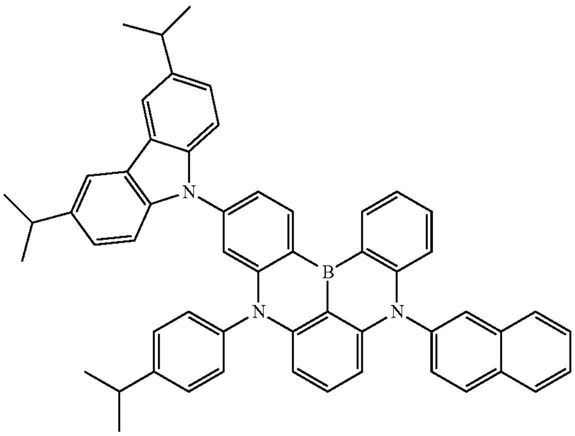
-continued
Dopant 105
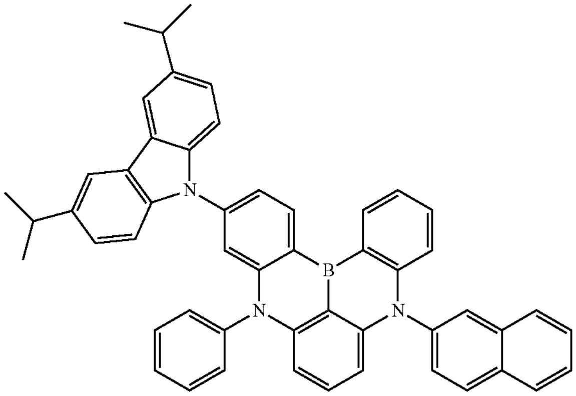
Dopant 106
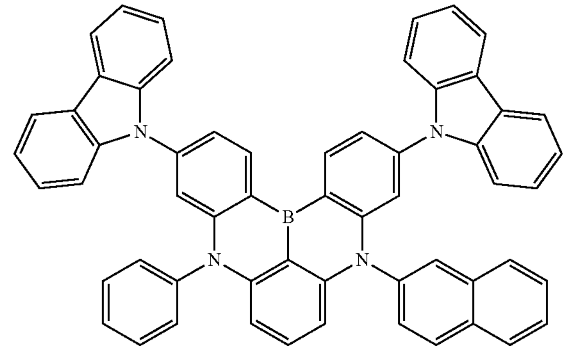
Dopant 107
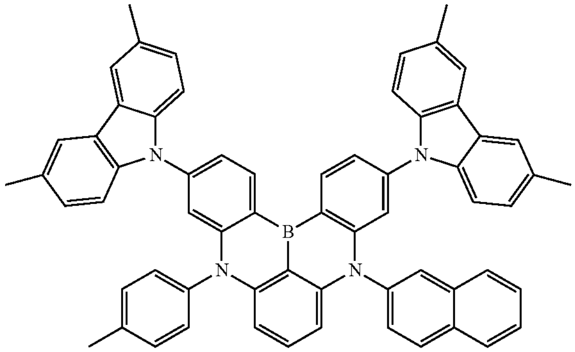
Dopant 108
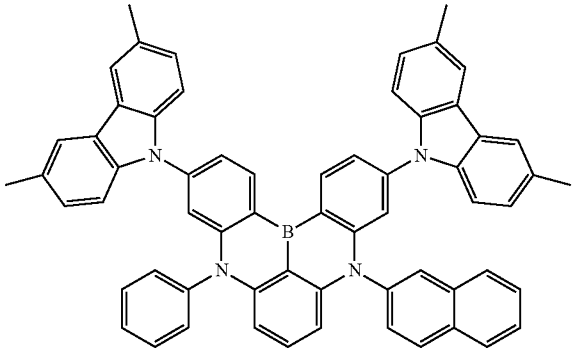

-continued
Dopant 109
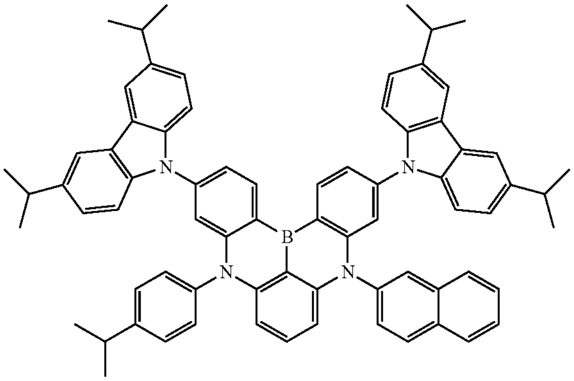
Dopant 110
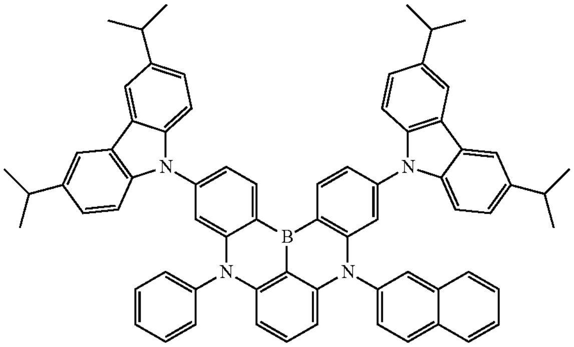
Dopant 111
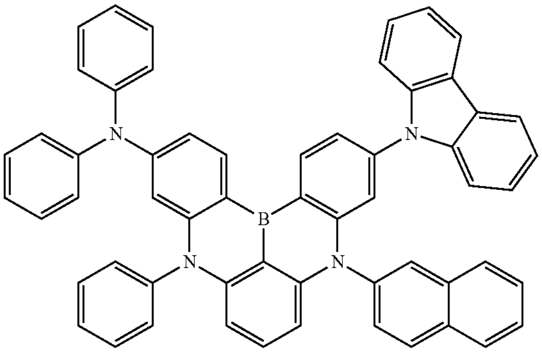
Dopant 112
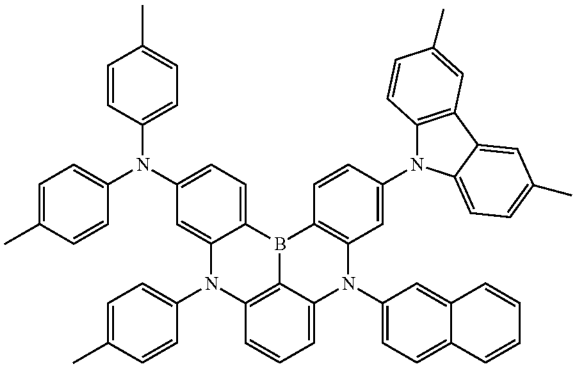
-continued
Dopant 113
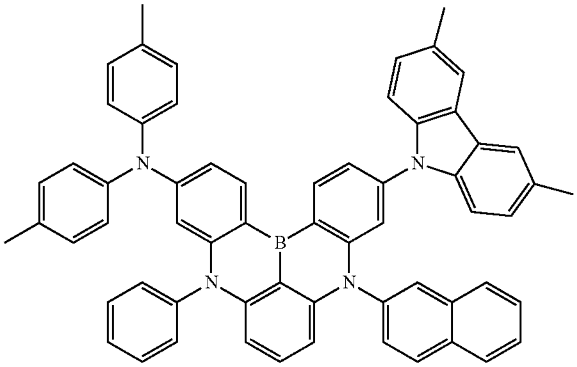
Dopant 114
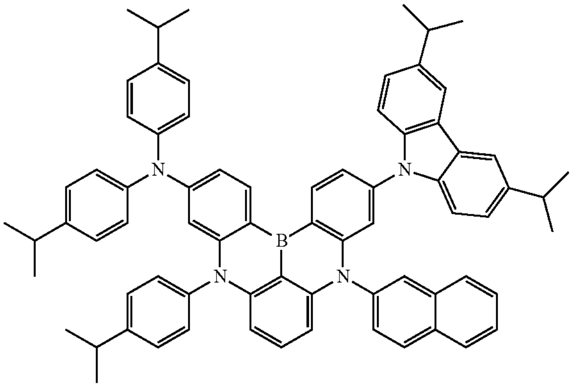
Dopant 115
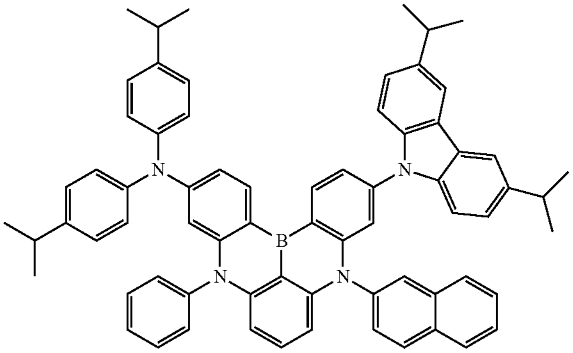

-continued
Dopant 116
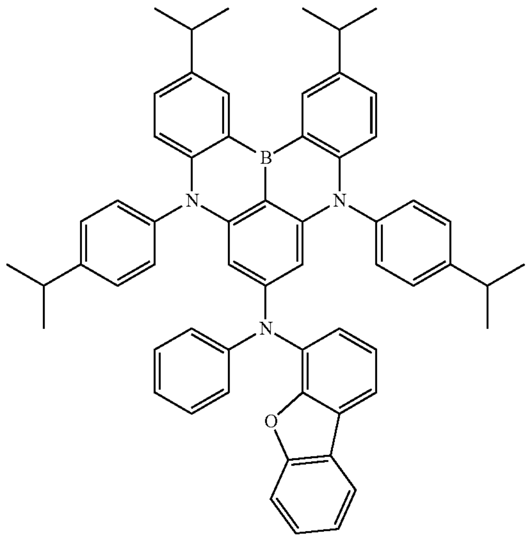
Dopant 117
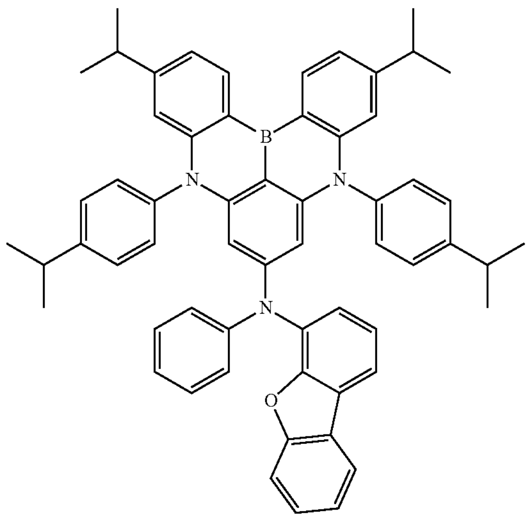
Dopant 118
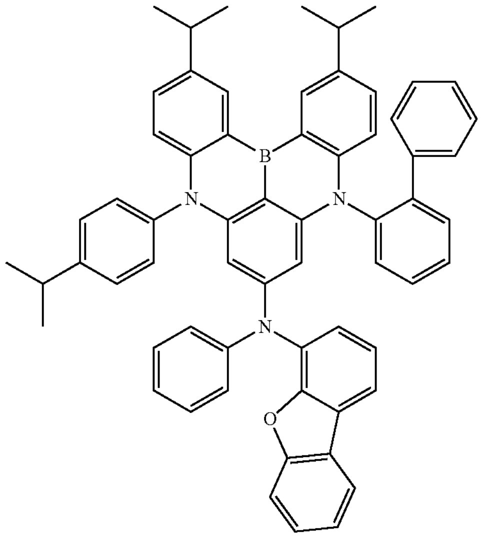
-continued
Dopant 119
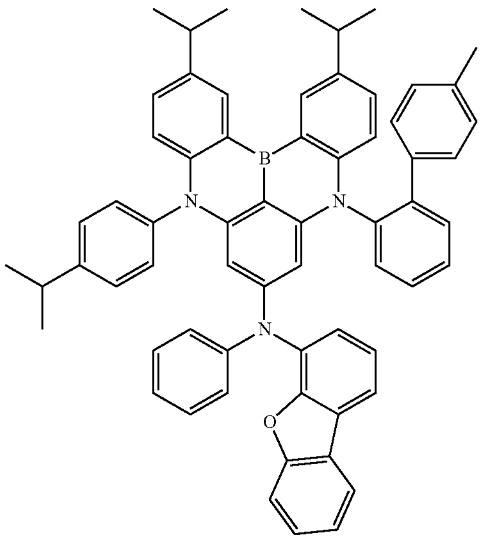
Dopant 120
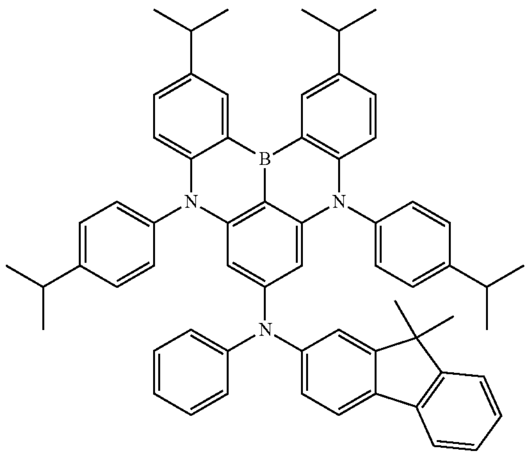
Dopant 121
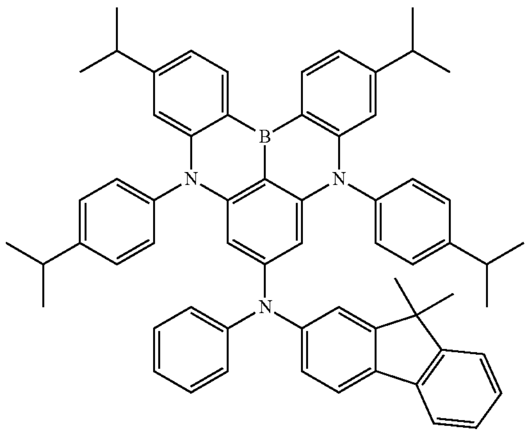

-continued
Dopant 122
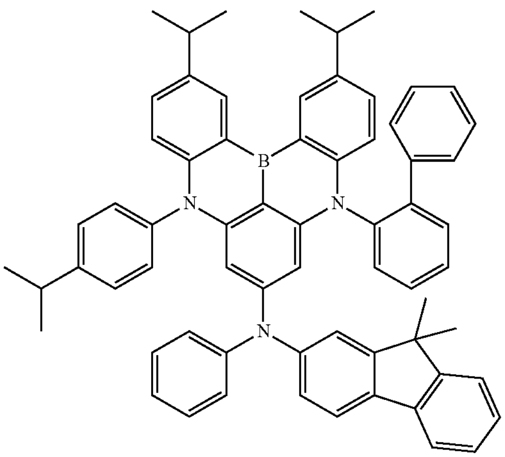
Dopant 123
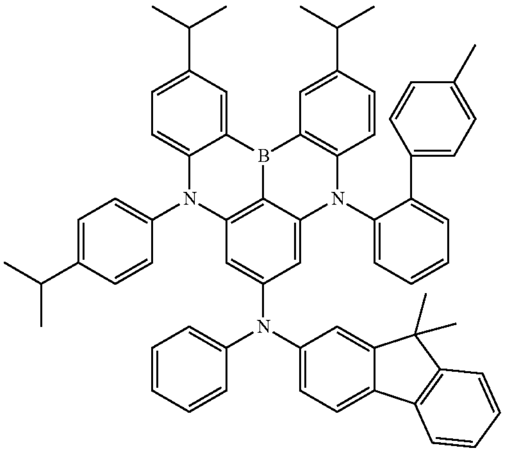
Dopant 124
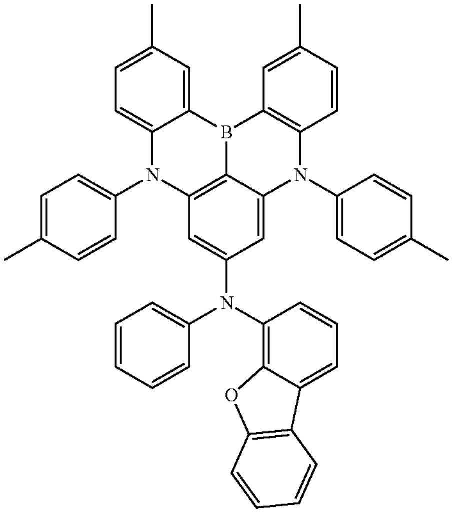
-continued
Dopant 125
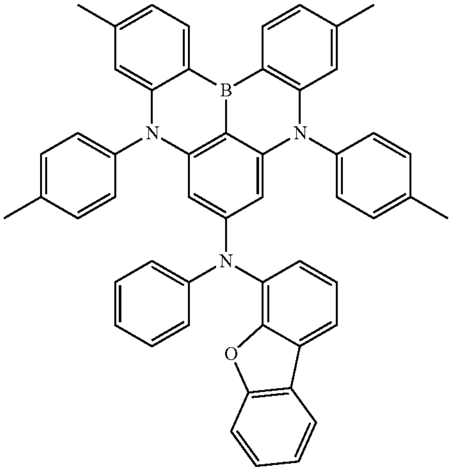
Dopant 126
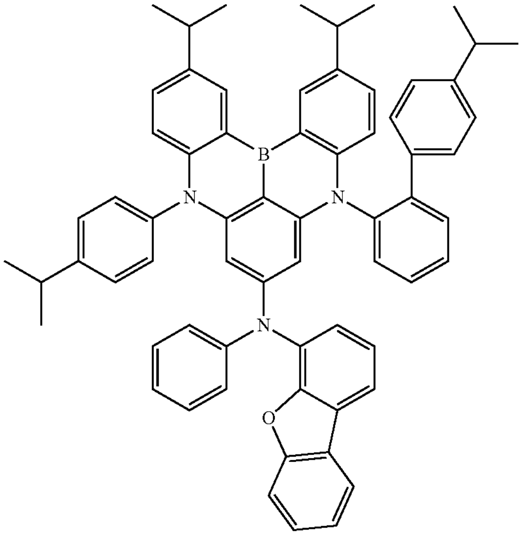
Dopant 127
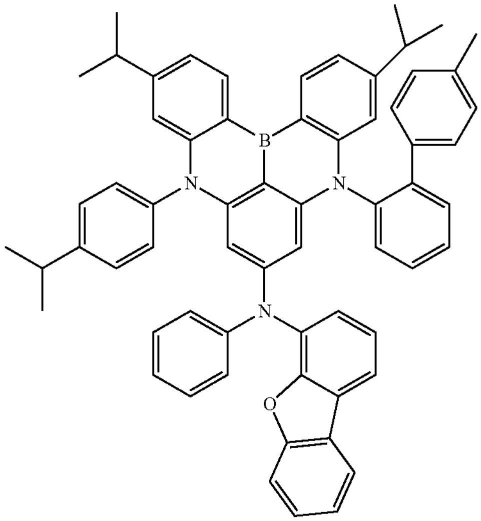

-continued
Dopant 128
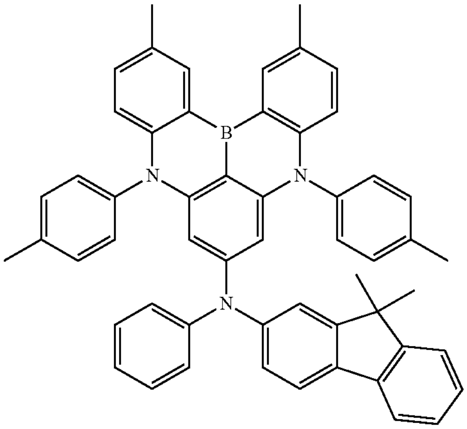
Dopant 129
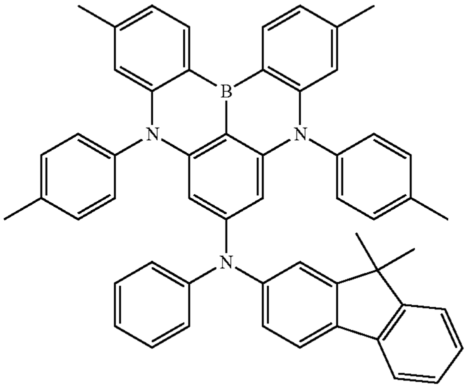
Dopant 130
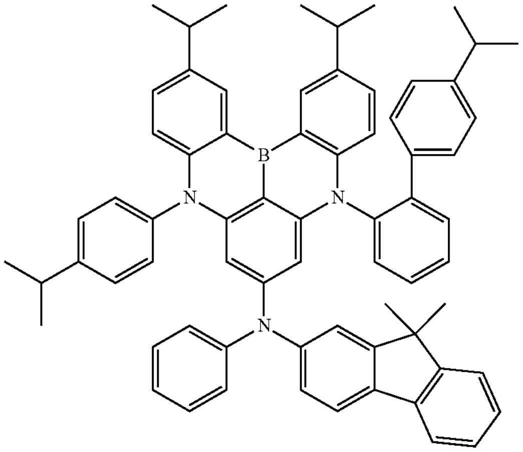
-continued
Dopant 131
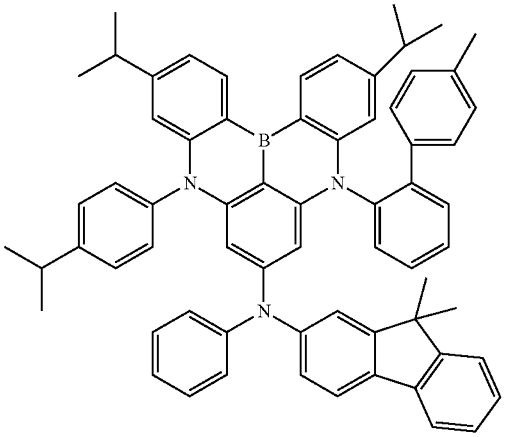
Dopant 132
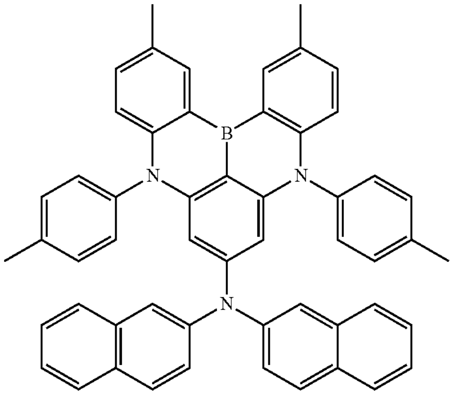
Dopant 133
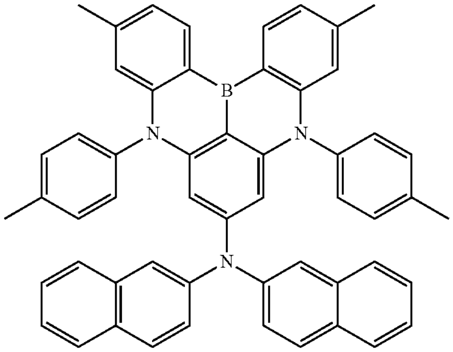

-continued
Dopant 134
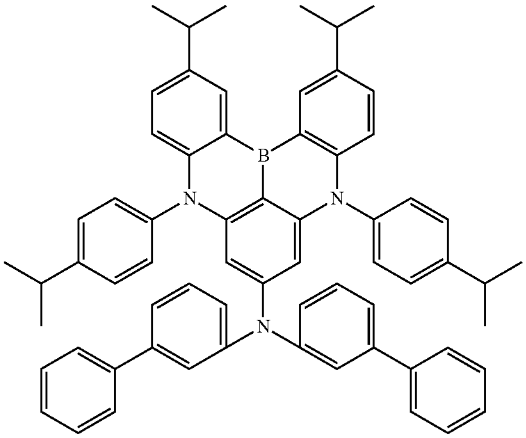
Dopant 135
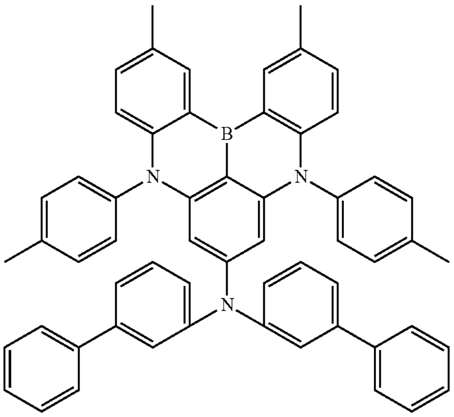
Dopant 136
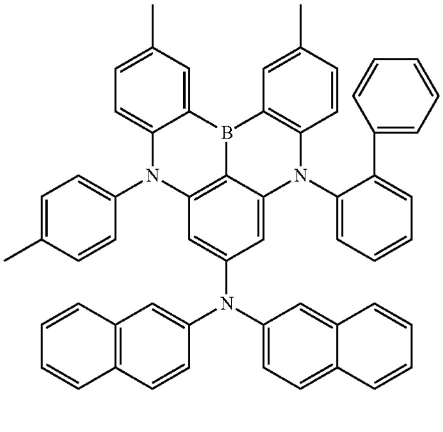
-continued
Dopant 137
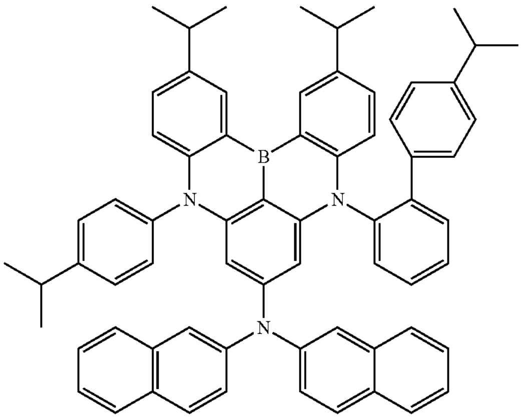
Dopant 138
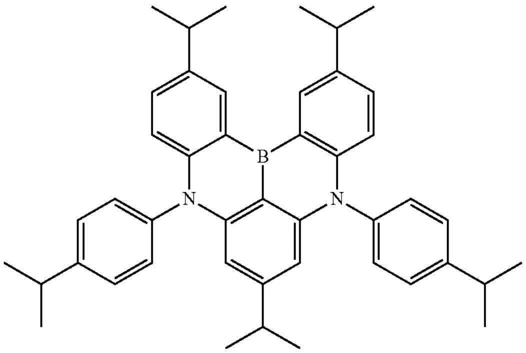
Dopant 139
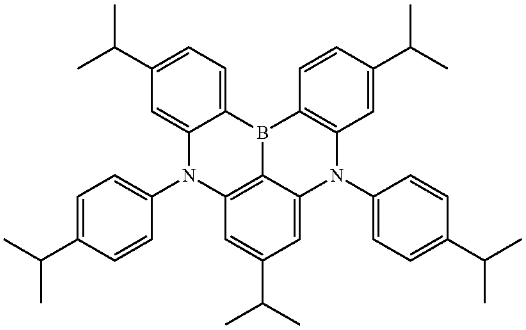
Dopant 140
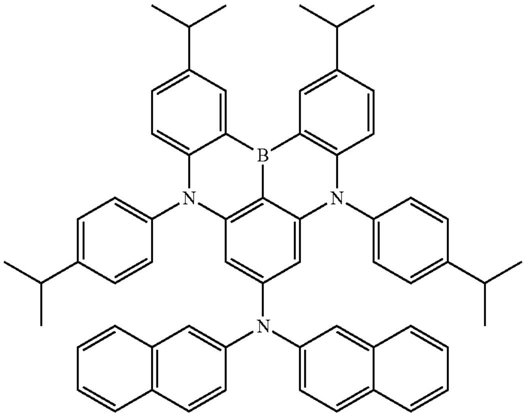

-continued
Dopant 141
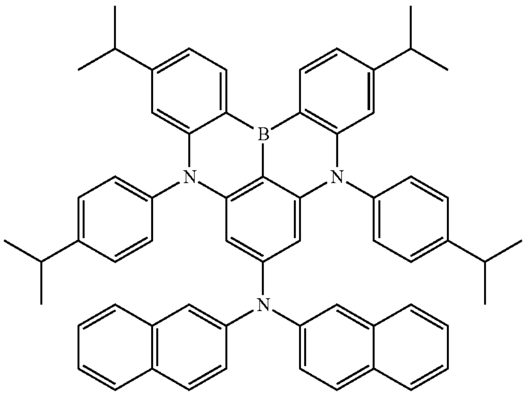
Dopant 142
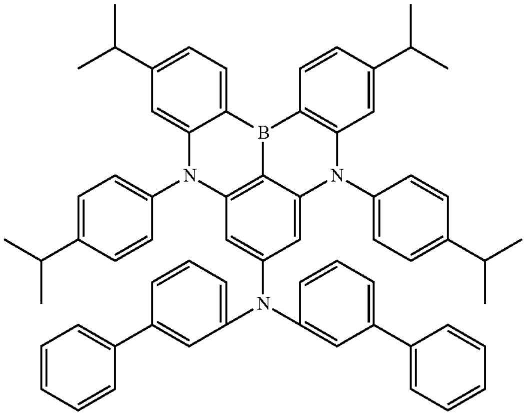
Dopant 143
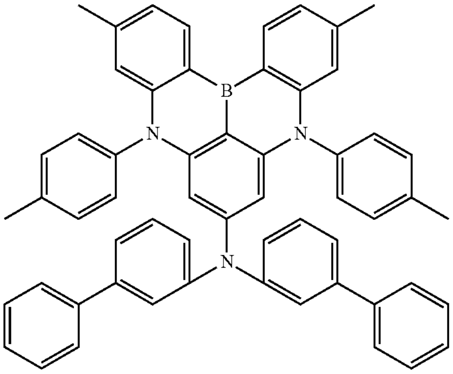
Dopant 144
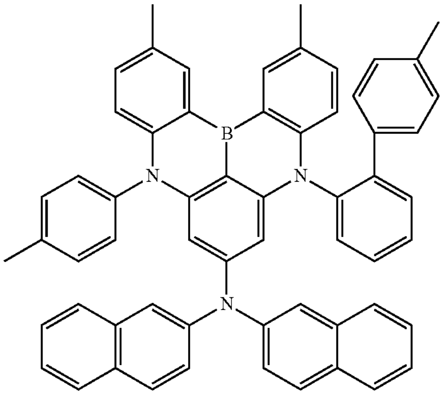
-continued
Dopant 145
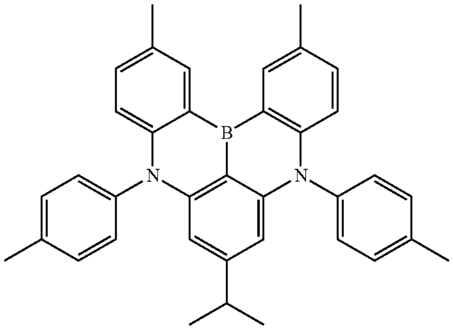
Dopant 146
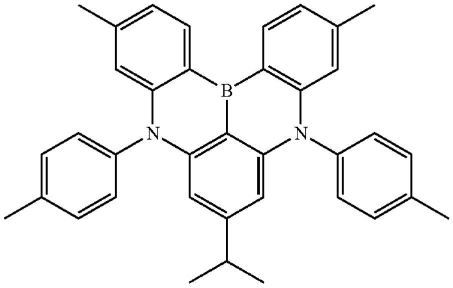
Dopant 147
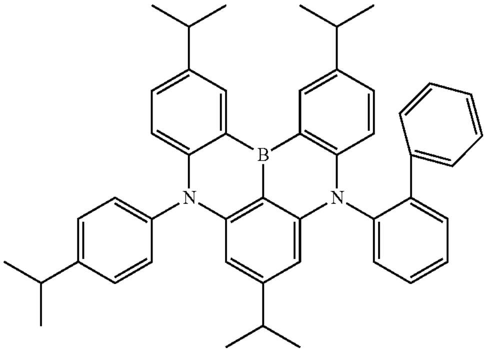
Dopant 148
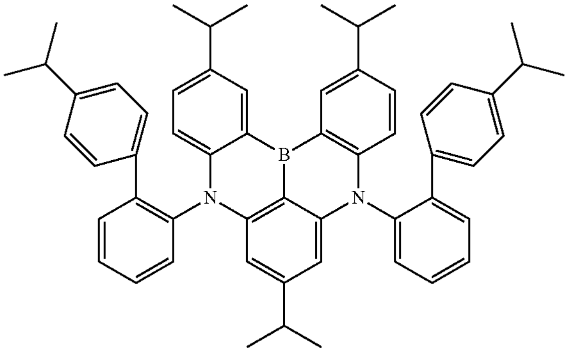

-continued
Dopant 149
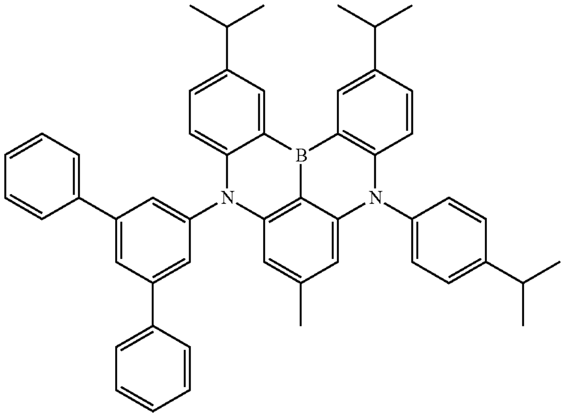
Dopant 150
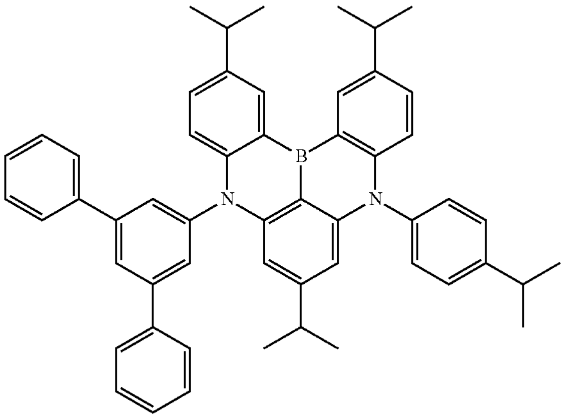
Dopant 151
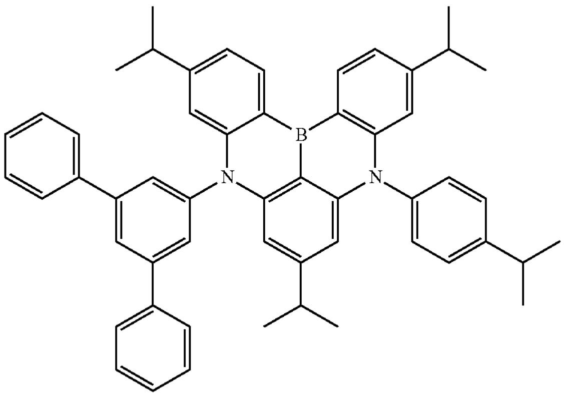
-continued
Dopant 152
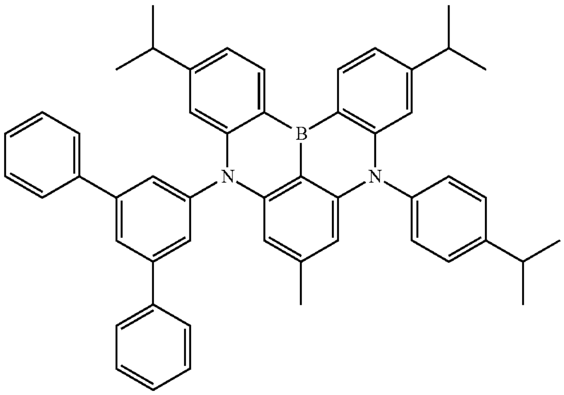
Dopant 153
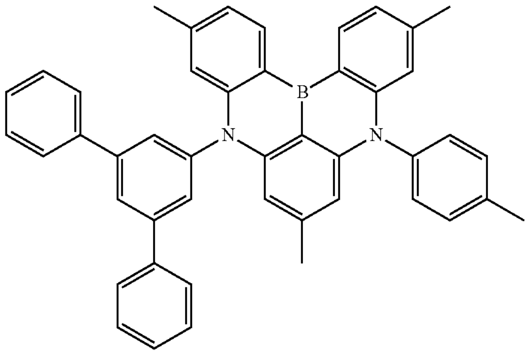
Dopant 154
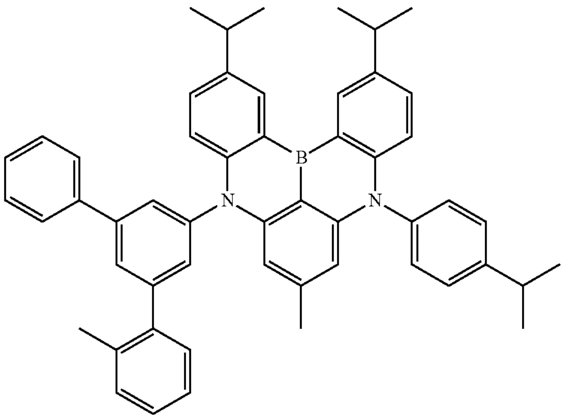

-continued
Dopant 155
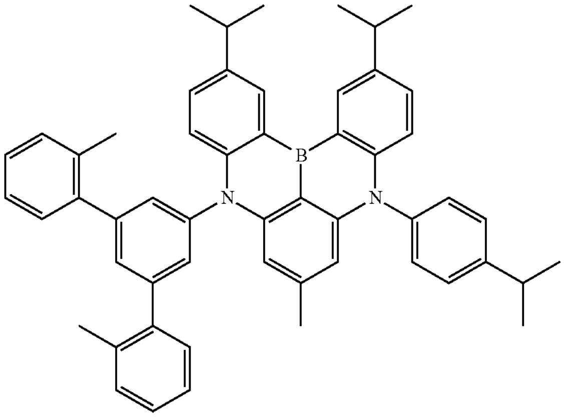
Dopant 156
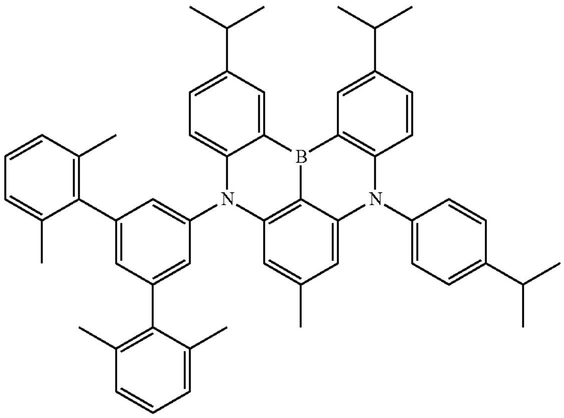
Dopant 157
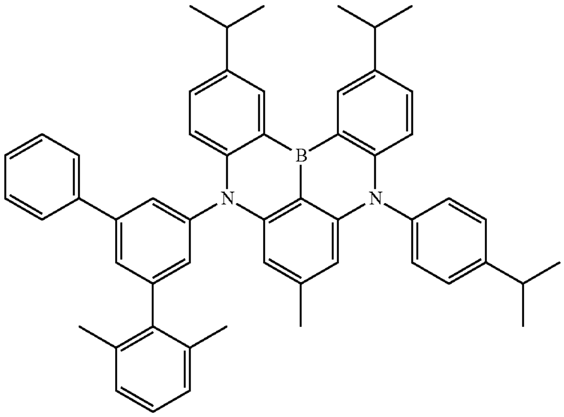
-continued
Dopant 158
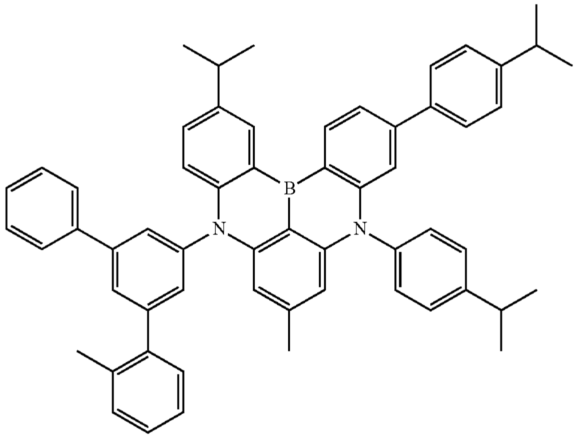
Dopant 159
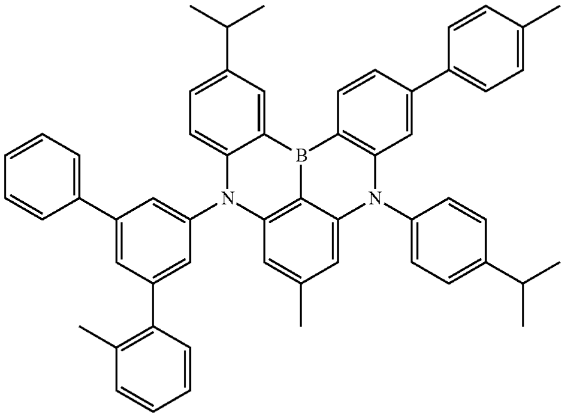
Dopant 160
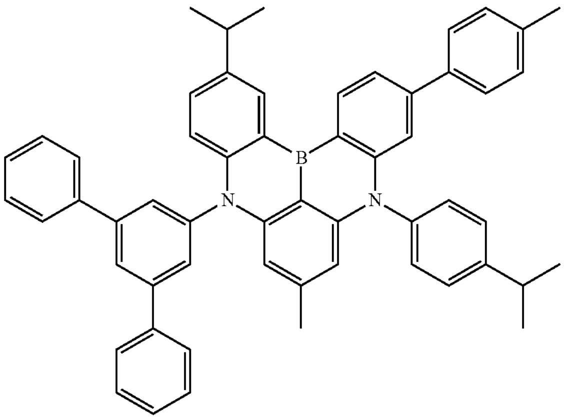

-continued
Dopant 161
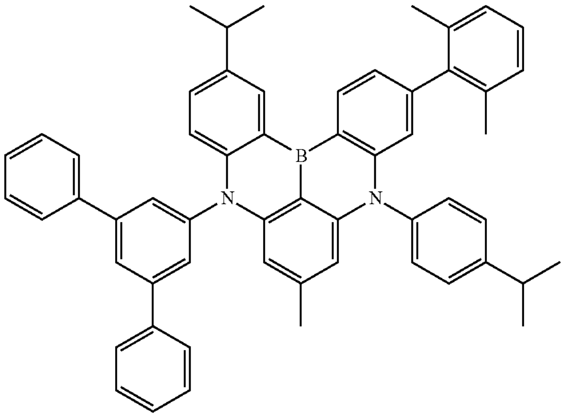
Dopant 162
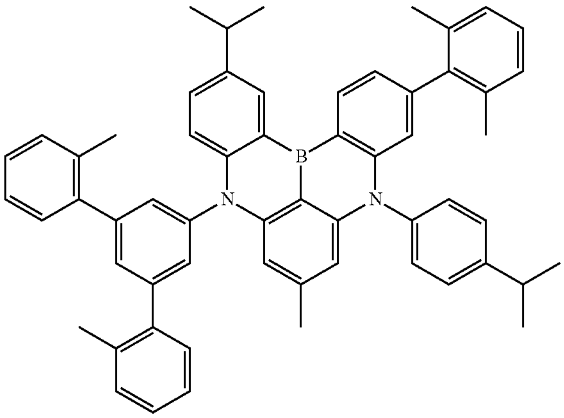
Dopant 163
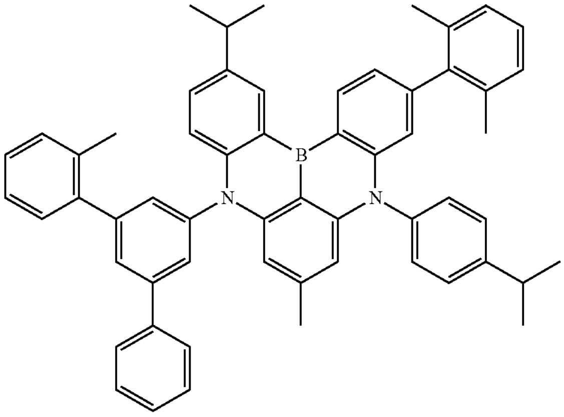
-continued
Dopant 164
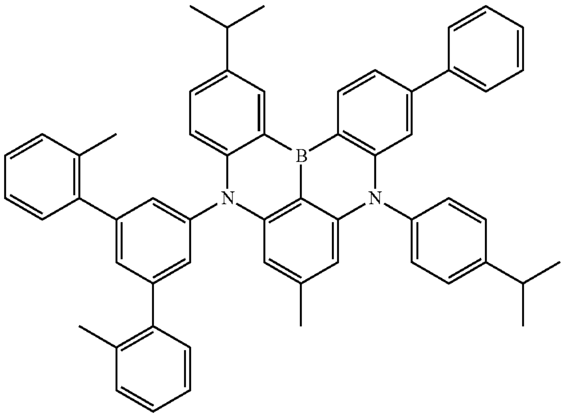
Dopant 165
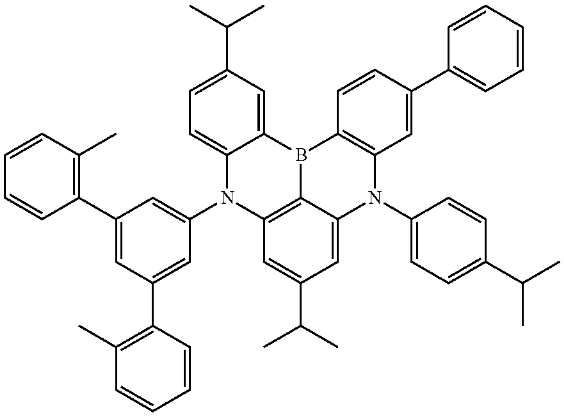
Dopant 166
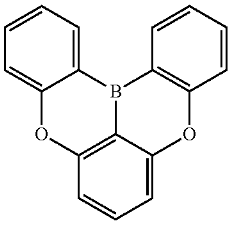
Dopant 167
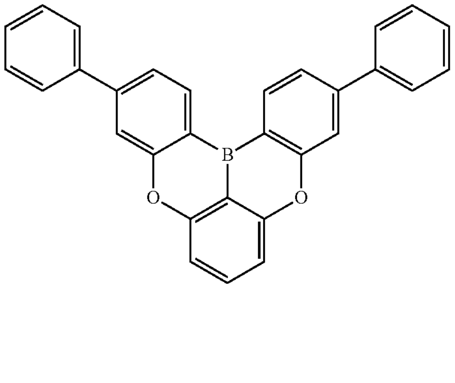

-continued
Dopant 168
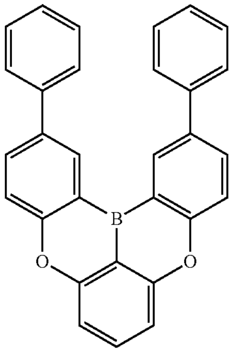
Dopant 169
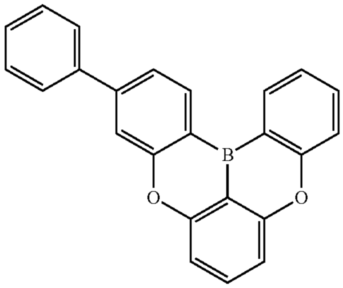
Dopant 170
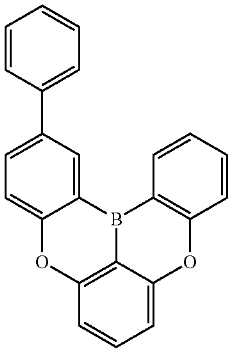
Dopant 171
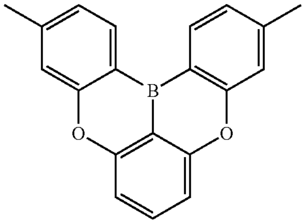
Dopant 172
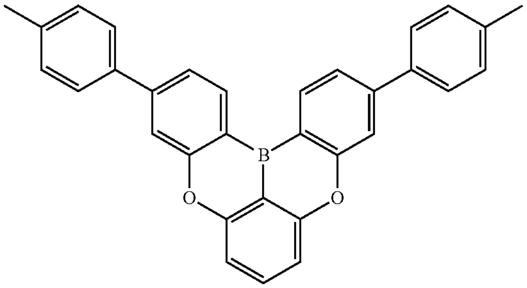
-continued
Dopant 173
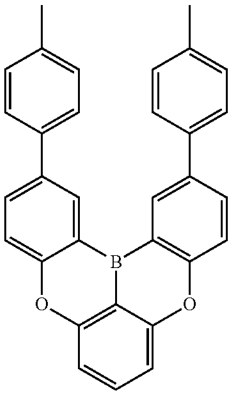
Dopant 174
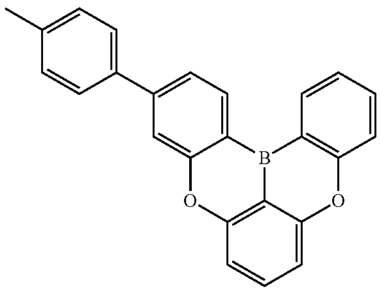
Dopant 175
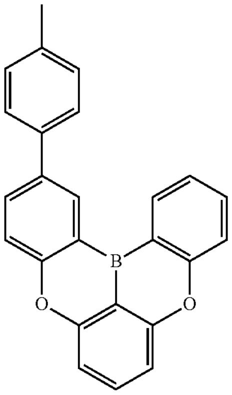
Dopant 176
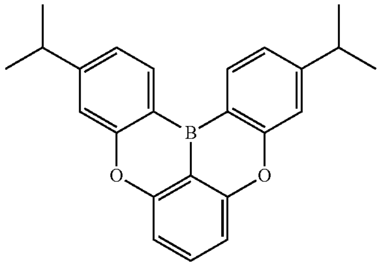

-continued
Dopant 177
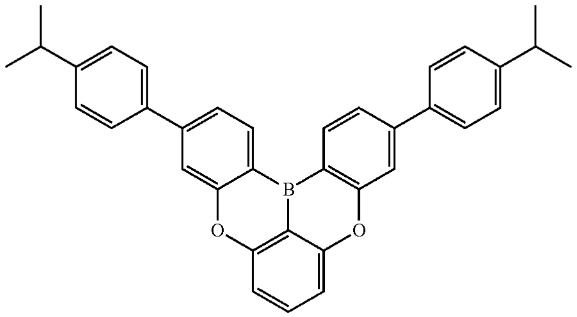
Dopant 178
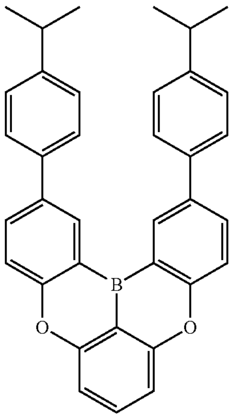
Dopnat 179
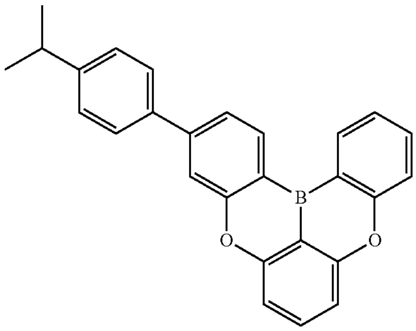
Dopant 180
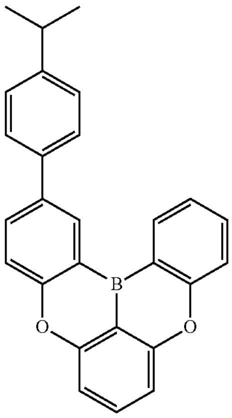
-continued
Dopant 181
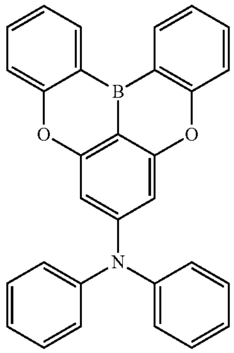
Dopant 182
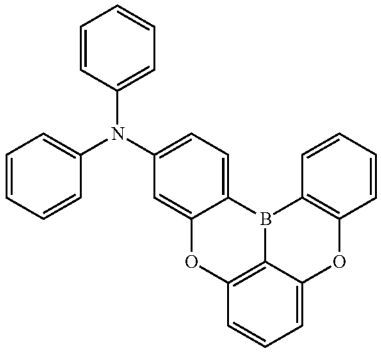
Dopant 183
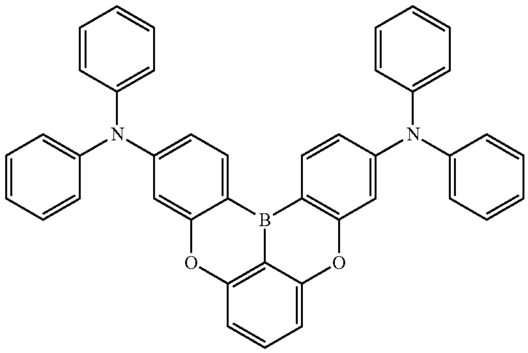
Dopant 184
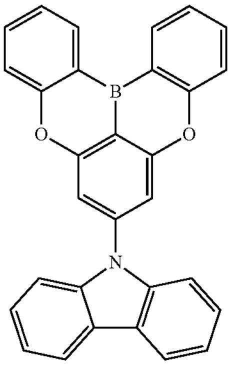

-continued
Dopant 189
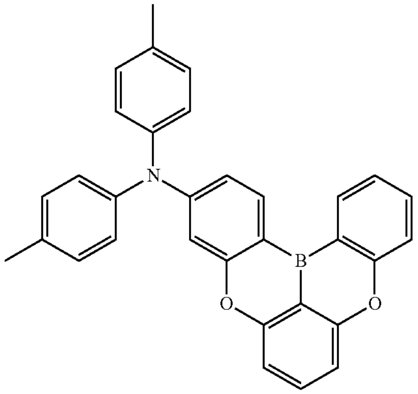
Dopant 190
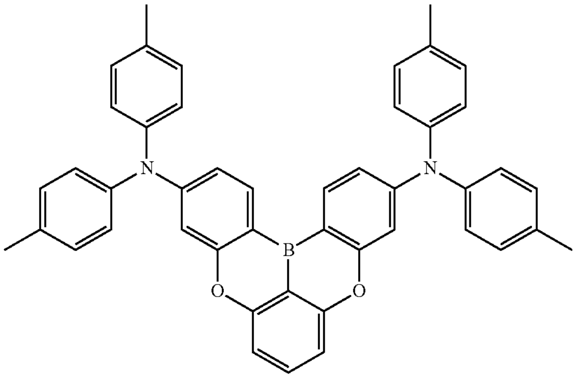
Dopant 191
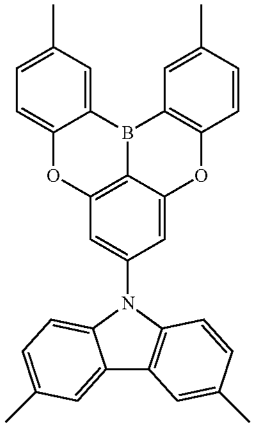
Dopant 192
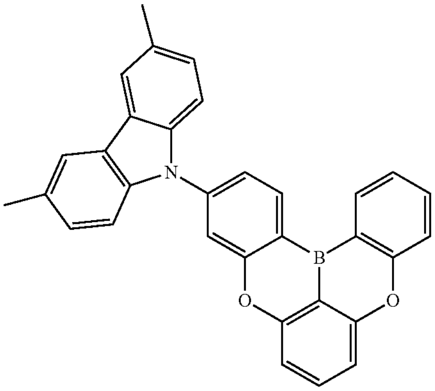
-continued
Dopant 193
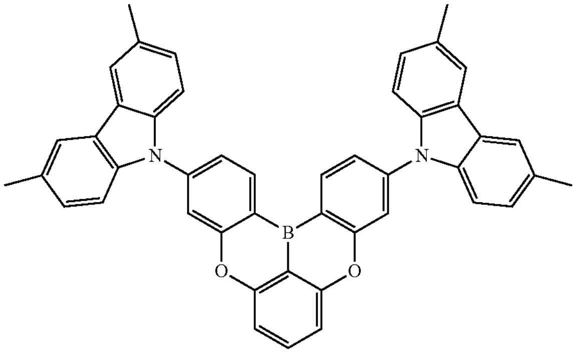
Dopant 194
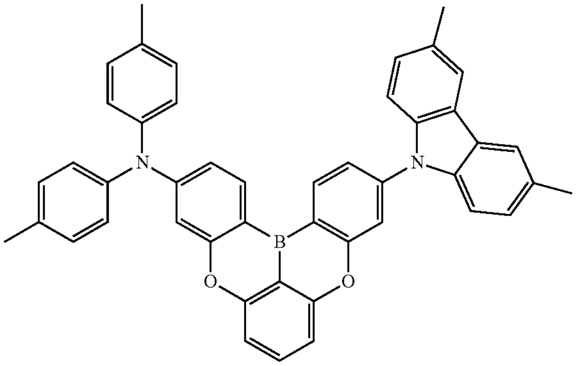
Dopant 195
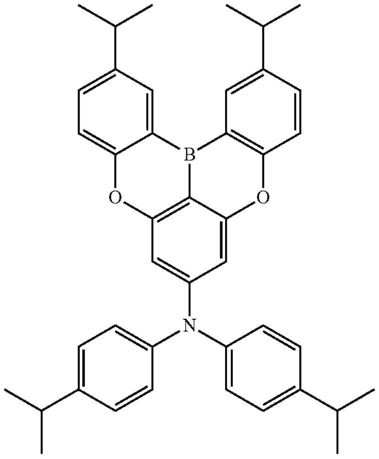

-continued
Dopant 196
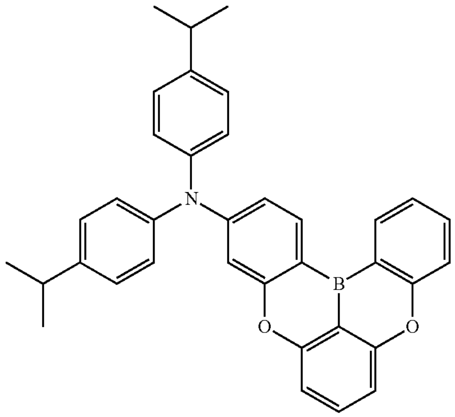
Dopant 197
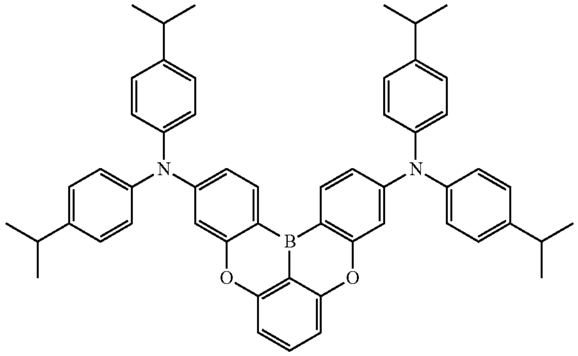
Dopant 198
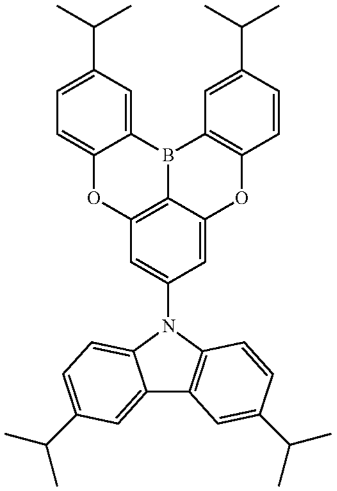
-continued
Dopant 199
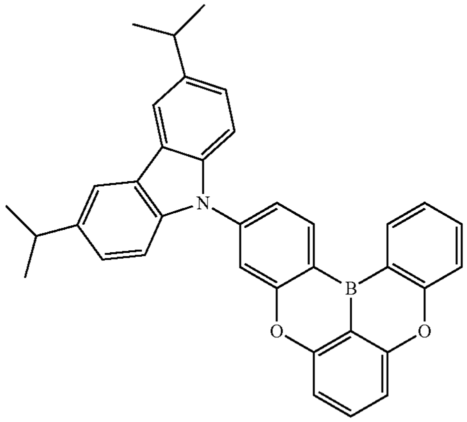
Dopant 200
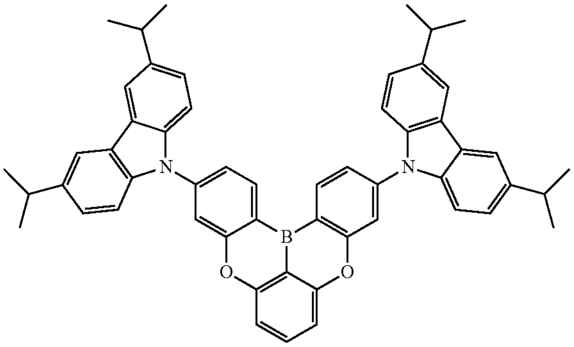
Dopant 201
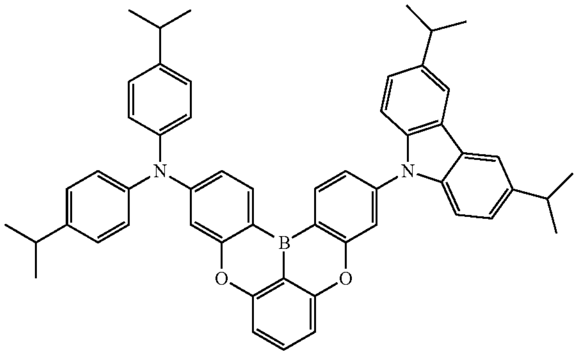
Dopant 202
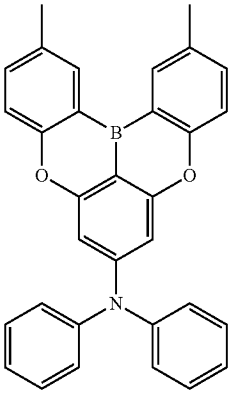

Dopant 203
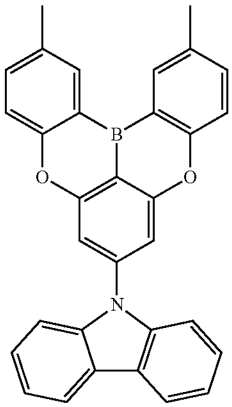
Dopant 204
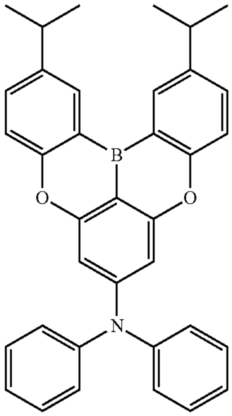
Dopant 205
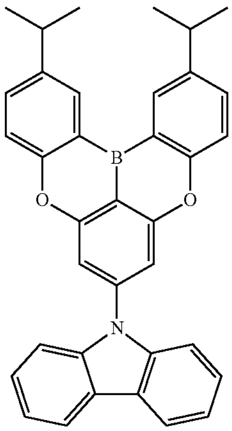
Dopant 206
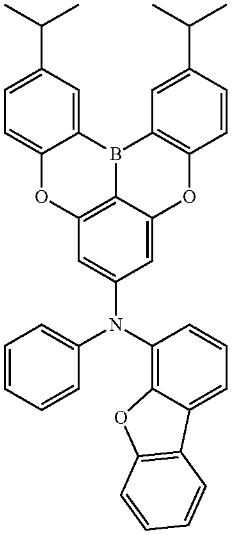
Dopant 207
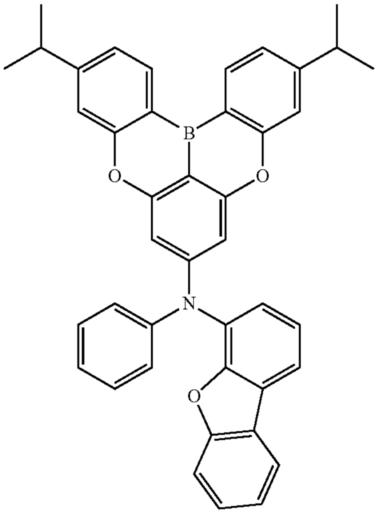
Dopant 208
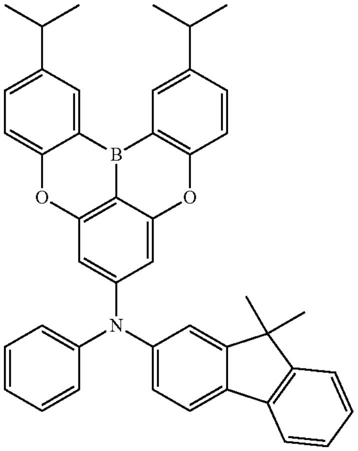

-continued
Dopant 209
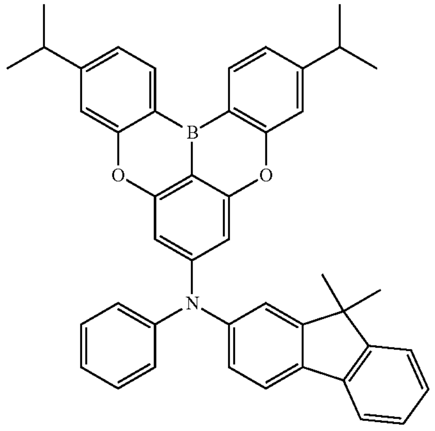
Dopant 210
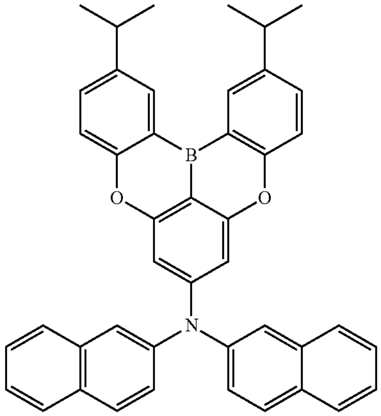
Dopant 211
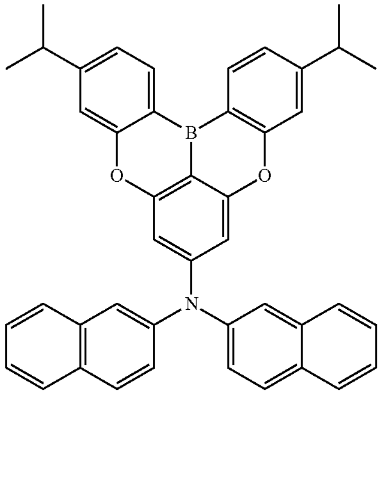
-continued
Dopant 212
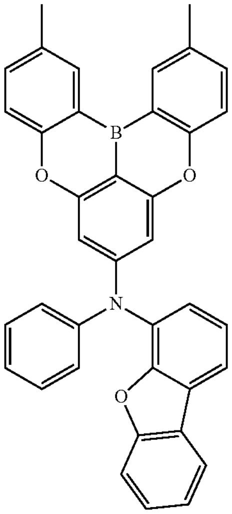
Dopant 213
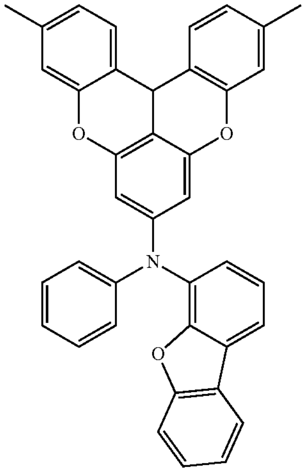
Dopant 214
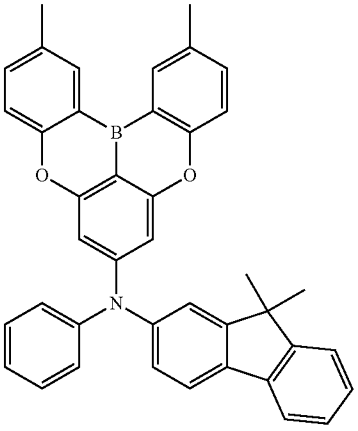

-continued
Dopant 215
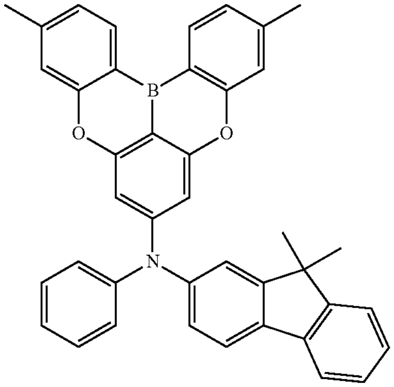
Dopant 216
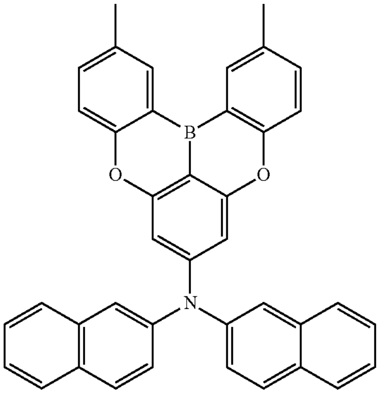
Dopant 217
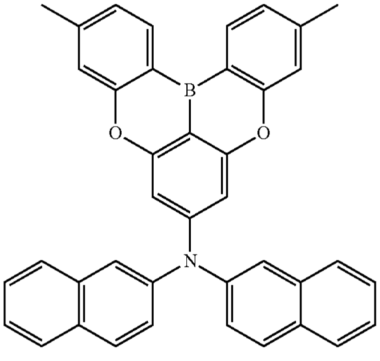
Dopant 218
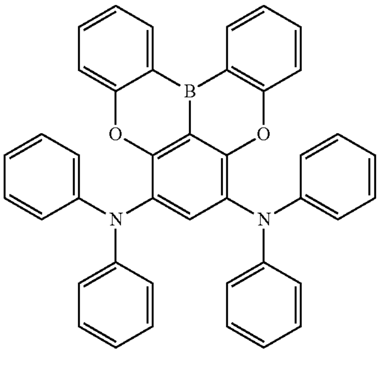
-continued
Dopant 219
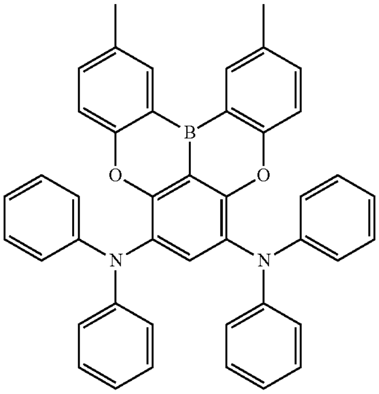
Dopant 220
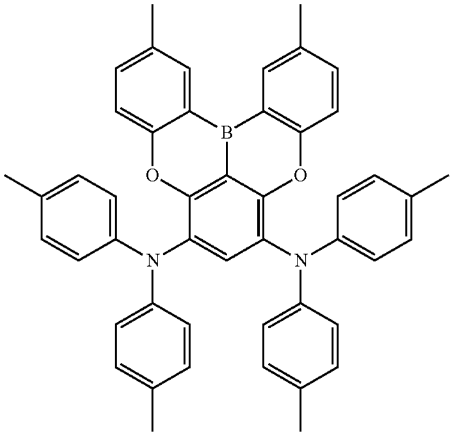
Dopant 221
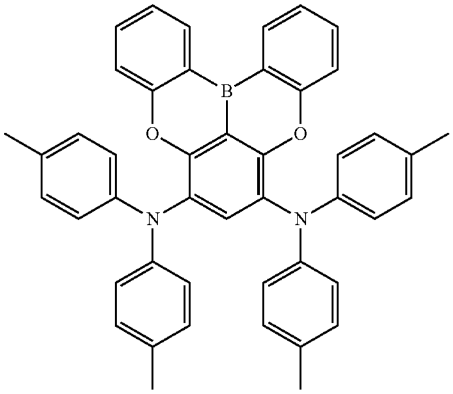
Dopant 222
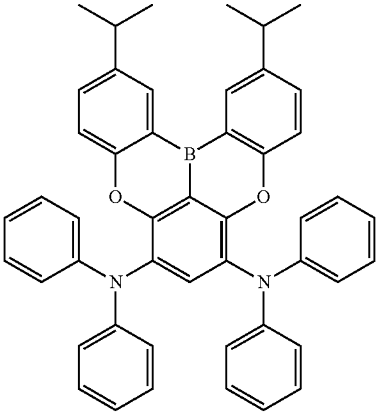

-continued
Dopant 223
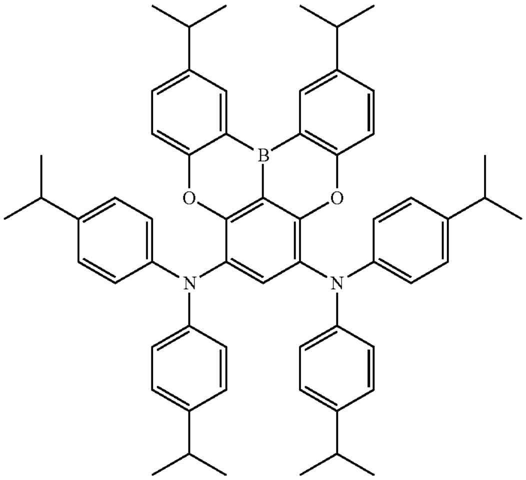
Dopant 224
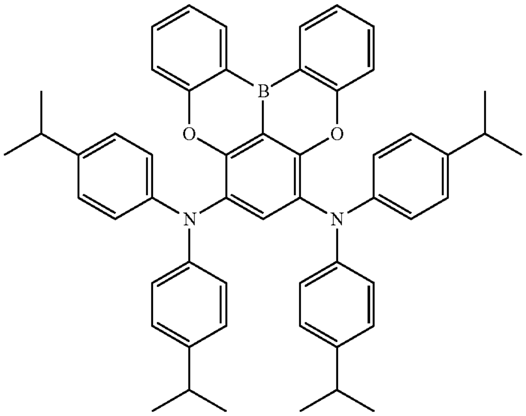
Dopant 225
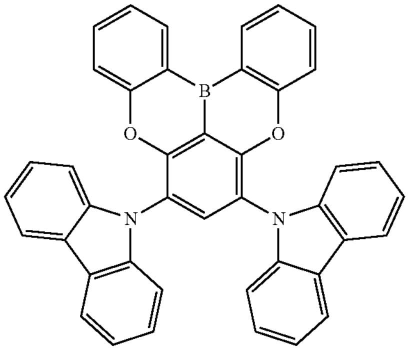
-continued
Dopant 226
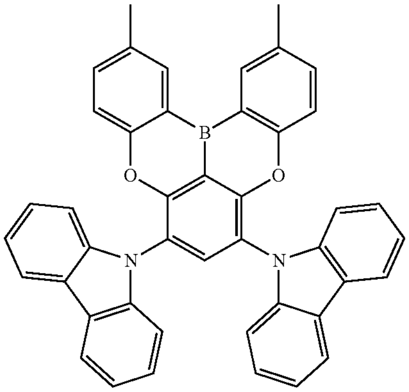
Dopant 227
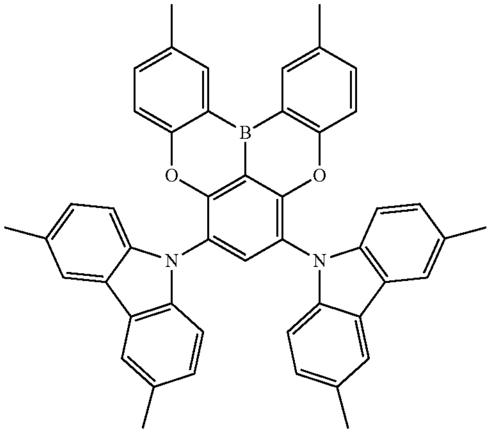
Dopant 228
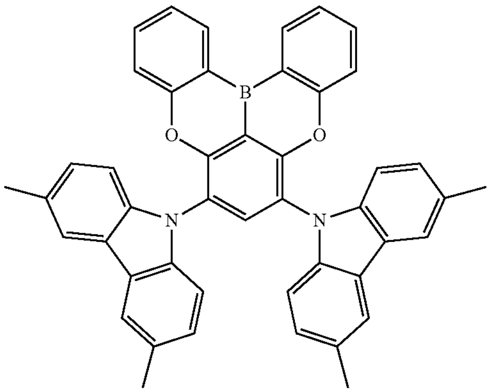

-continued
Dopant 229
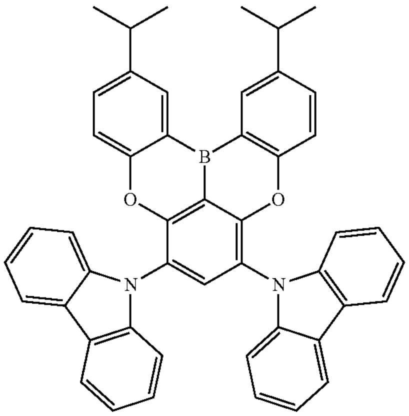
Dopant 230
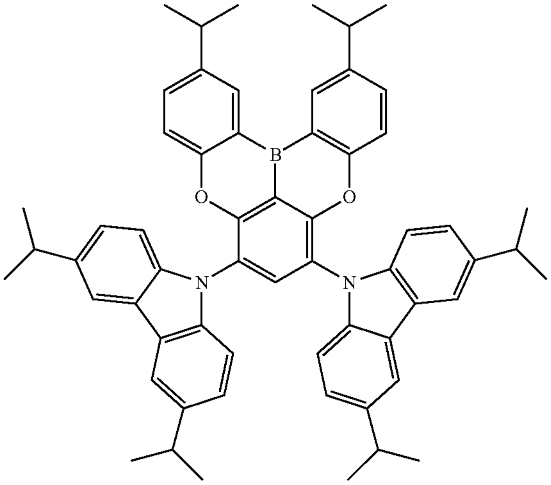
Dopant 231
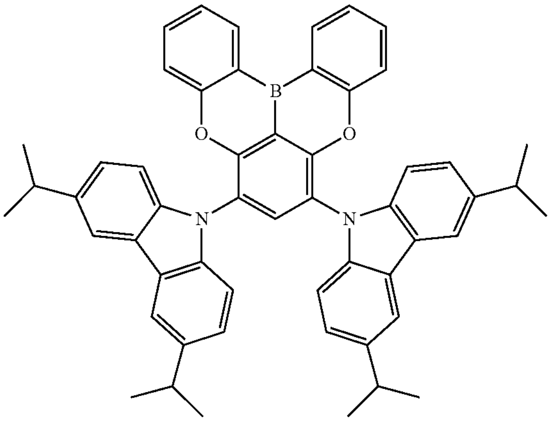
Dopant 232
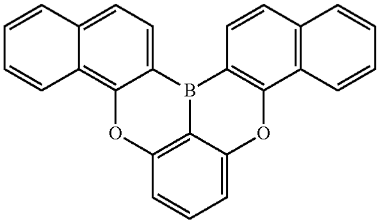
-continued
Dopant 233
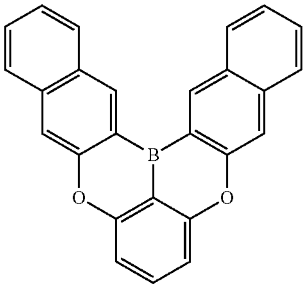
Dopant 234
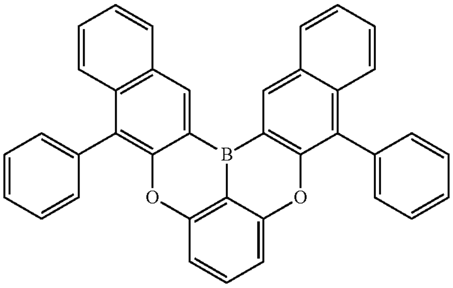
For example, the blue dopant of Formula 5-2 may be a compound being one of the followings in Formula 6-2:
Formula 6-2
Dopant 1
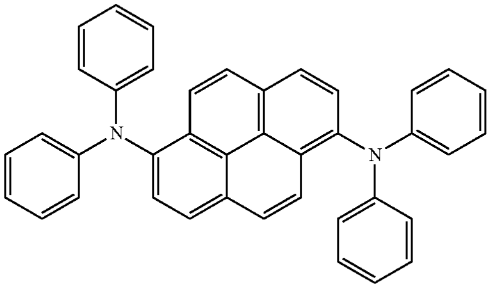
Dopant 2
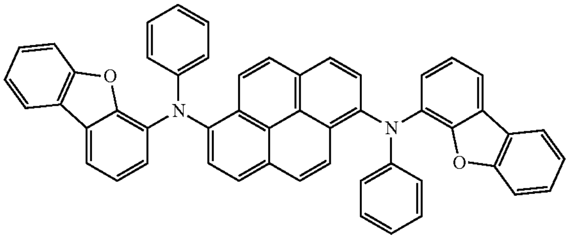

-continued
Dopant 3
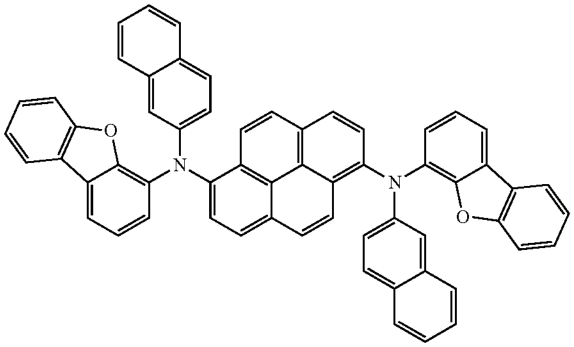
Dopant 4
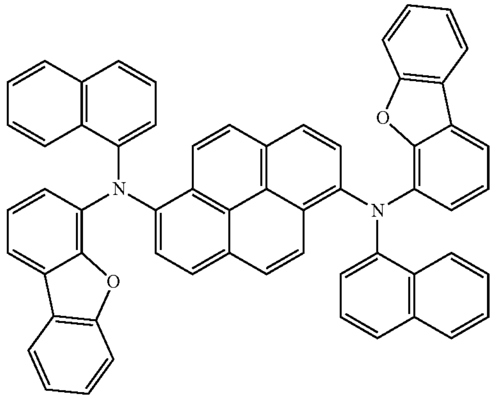
Dopant 5
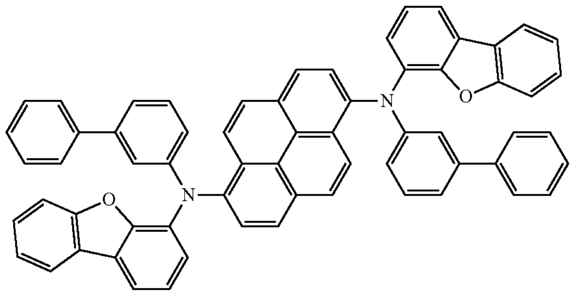
Dopant 6
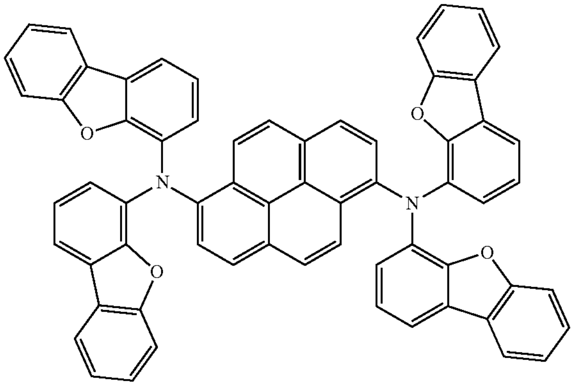
-continued
Dopant 7
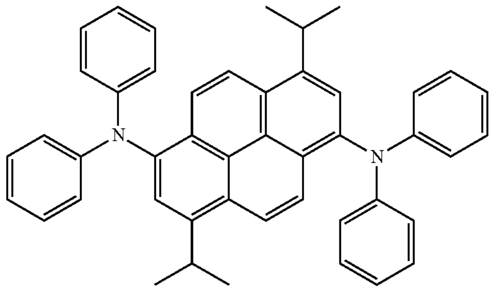
Dopant 8
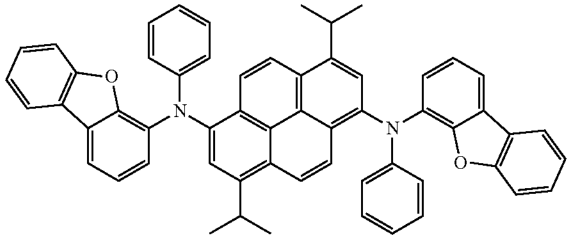
Dopant 9
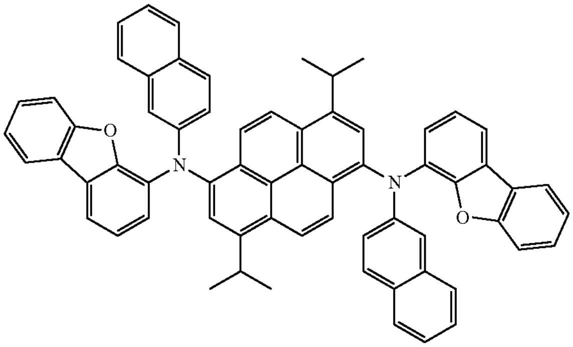
Dopant 10
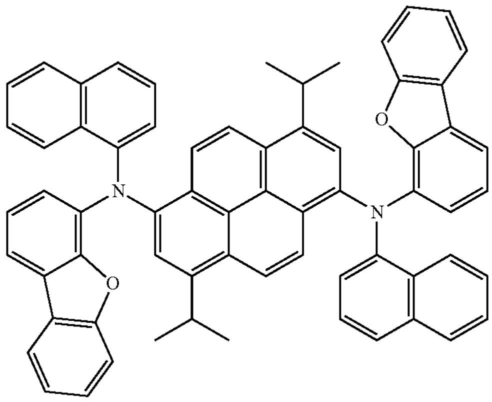

-continued
Dopant 11
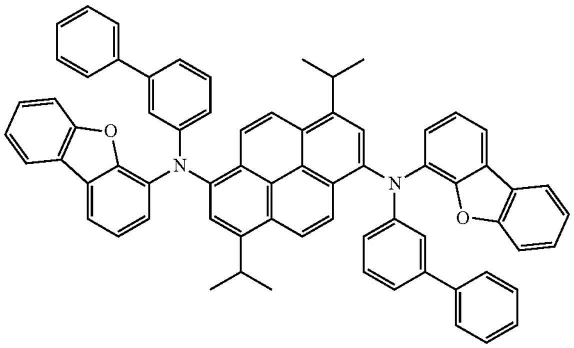
Dopant 12
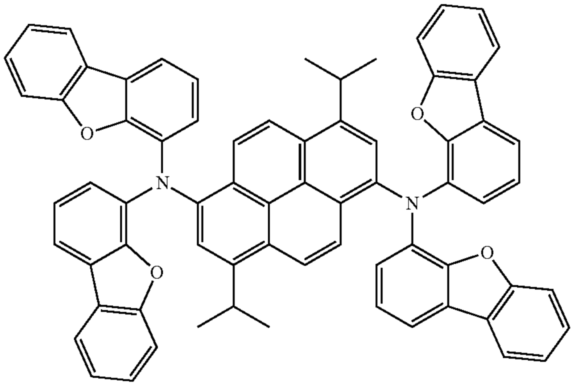
Dopant 13
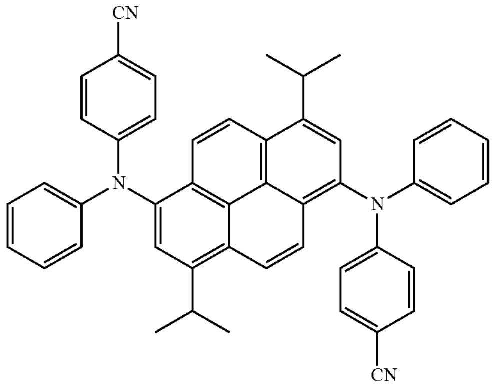
Dopant 14
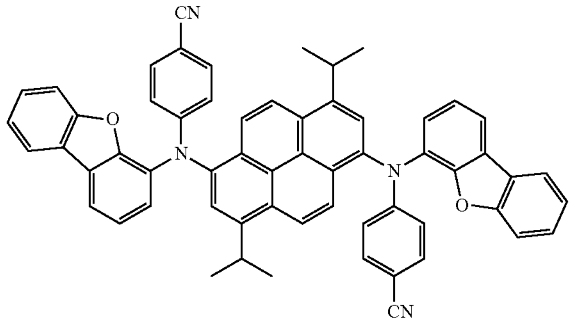
-continued
Dopant 15
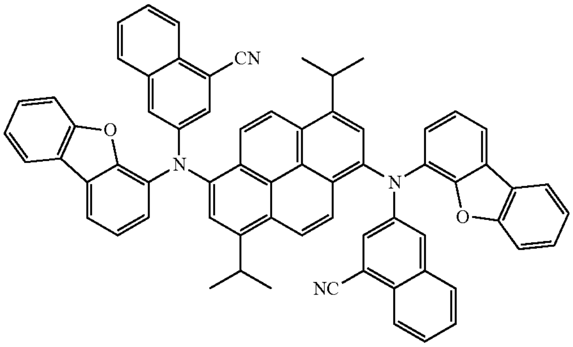
Dopant 16
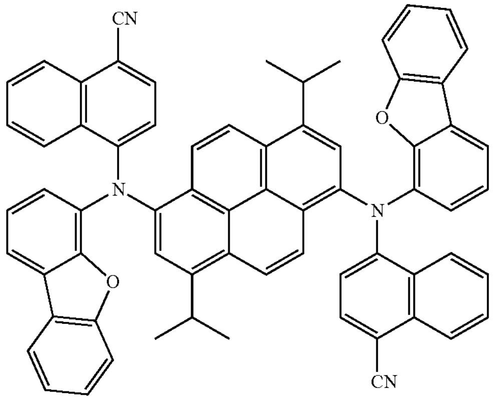
Dopant 17
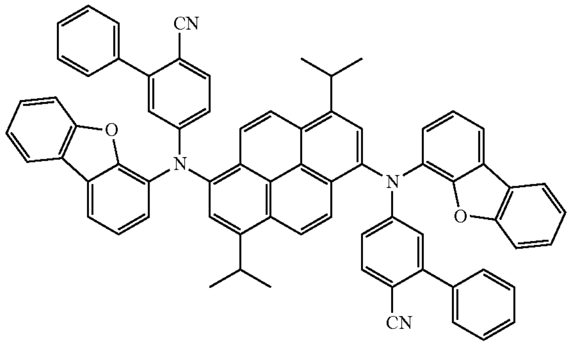
Dopant 18
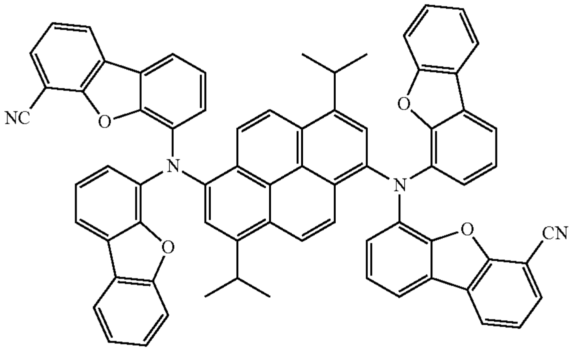

-continued
Dopant 19
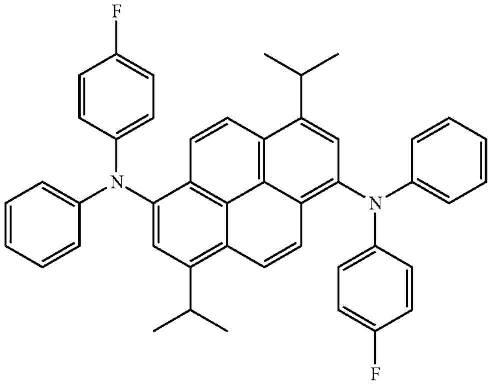
Dopant 20
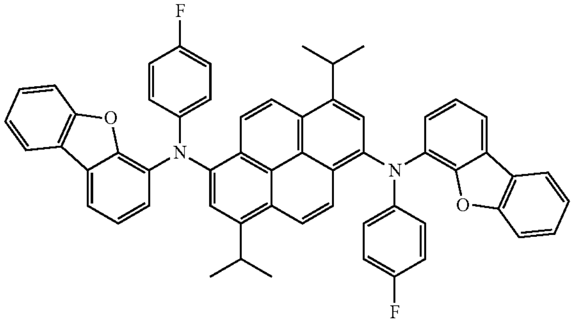
Dopant 21
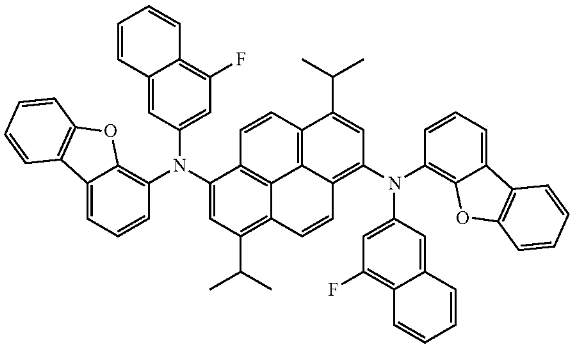
Dopant 22
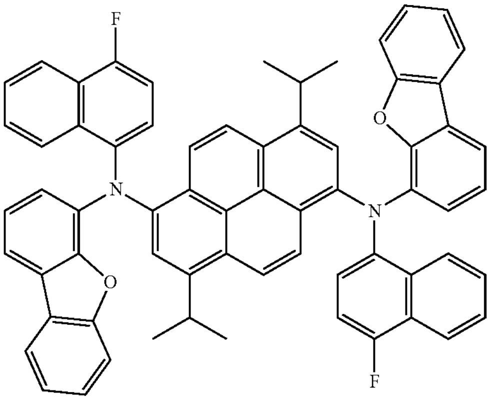
-continued
Dopant 23
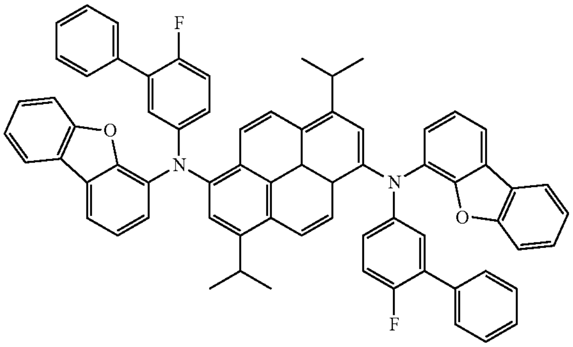
Dopant 24
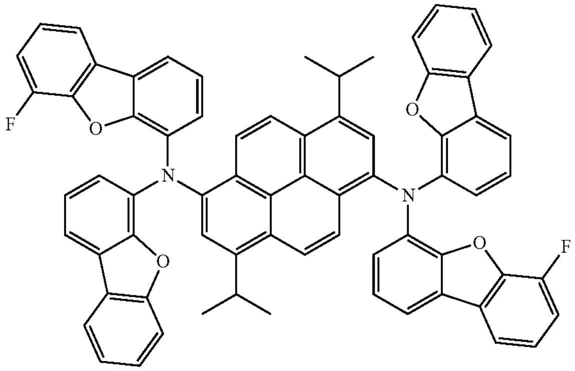
Dopant 25
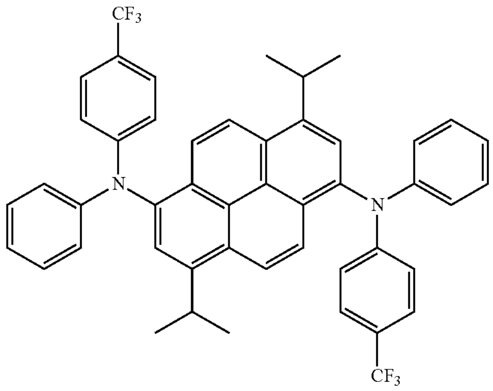
Dopant 26
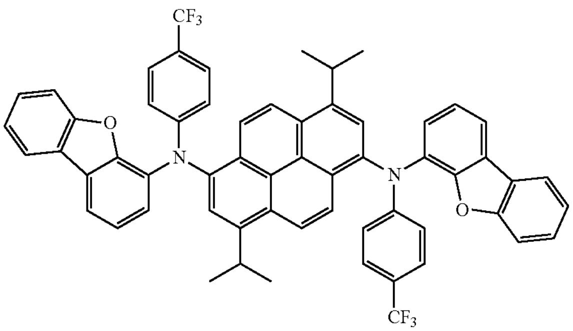

-continued
Dopant 27
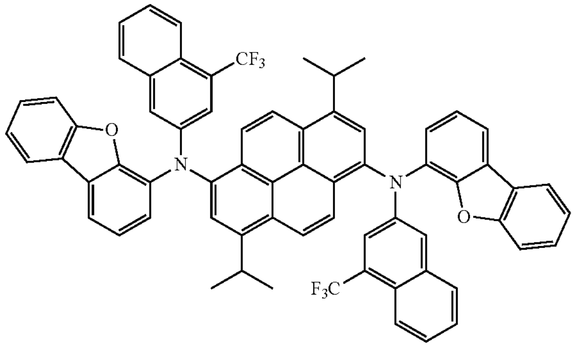
Dopant 28
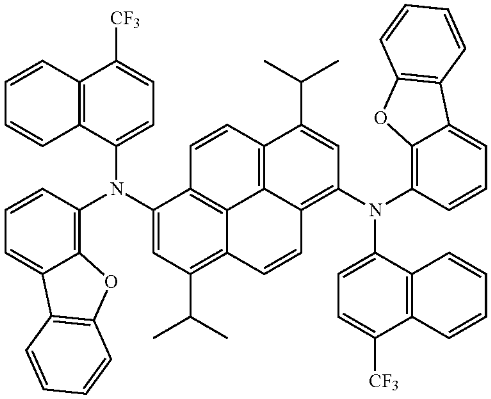
Dopant 29
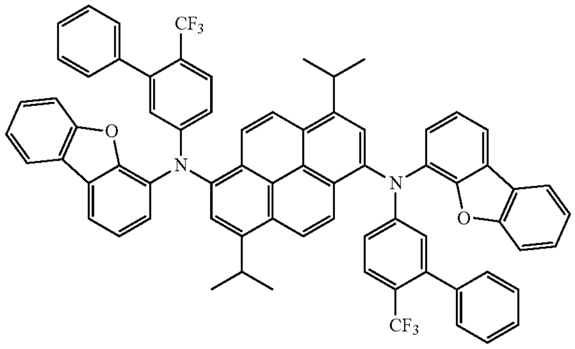
Dopant 30
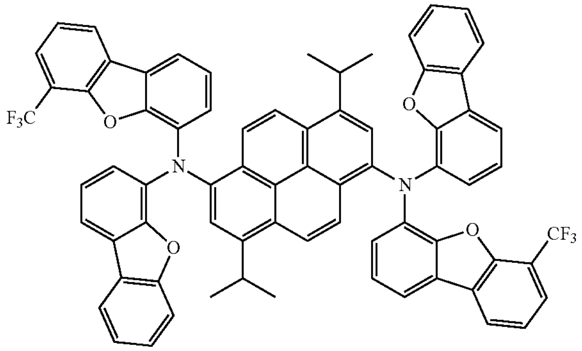
-continued
Dopant 31
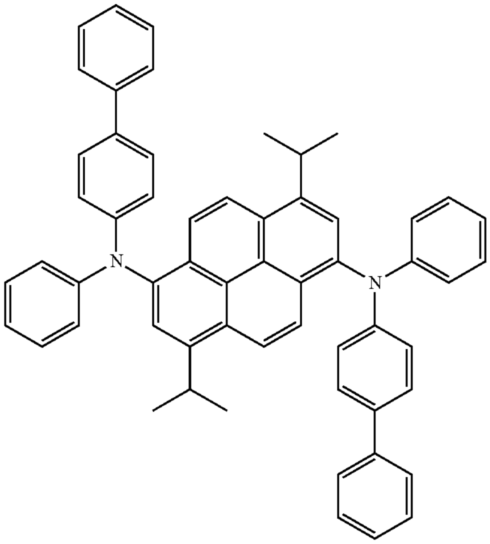
Dopant 32
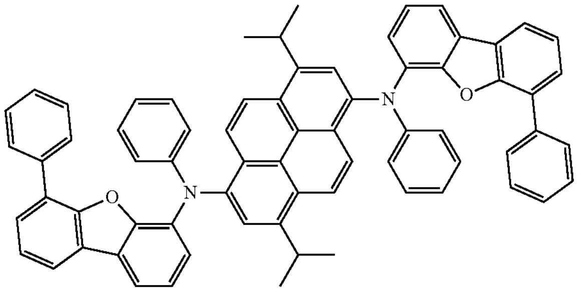
Dopant 33
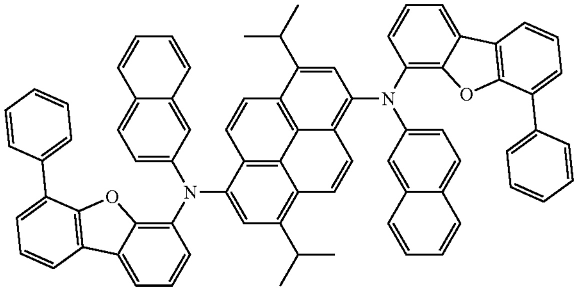

-continued
Dopant 34
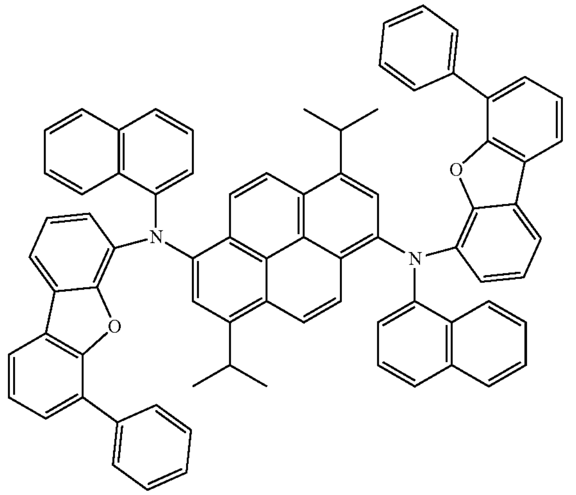
Dopant 35
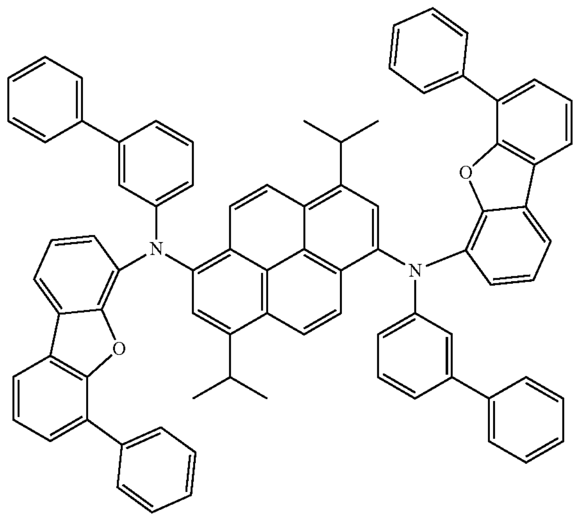
Dopant 36
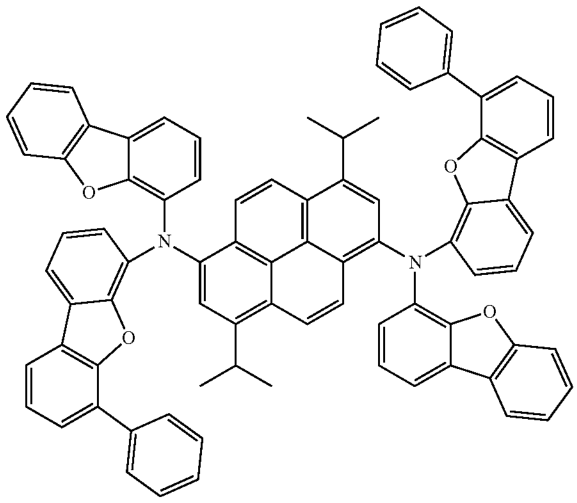
-continued
Dopant 37
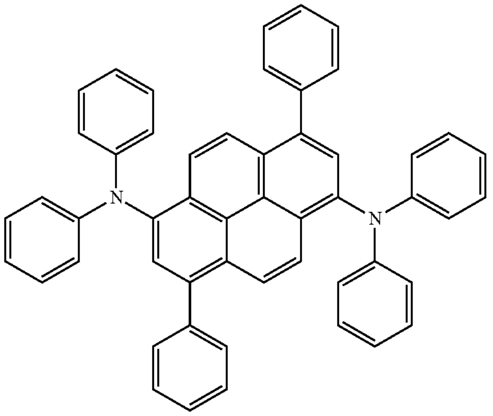
Dopant 38
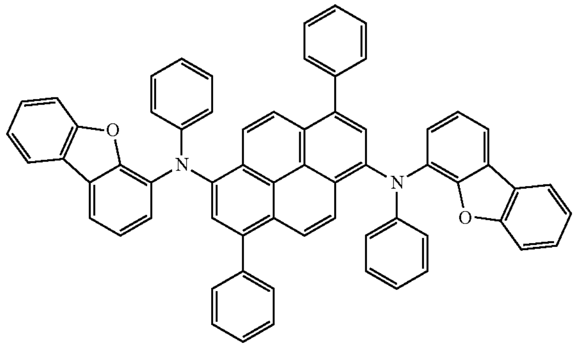
Dopant 39
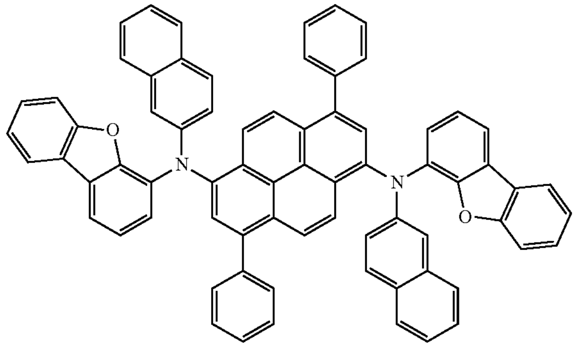
Dopant 40
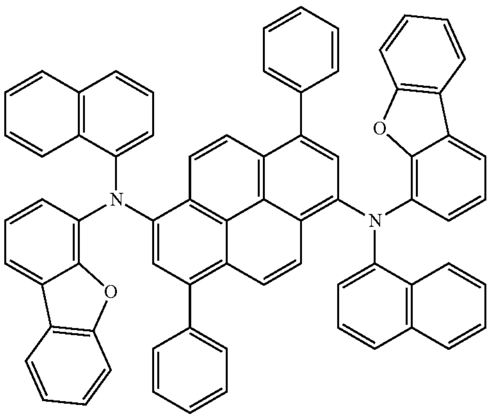

-continued
Dopant 41
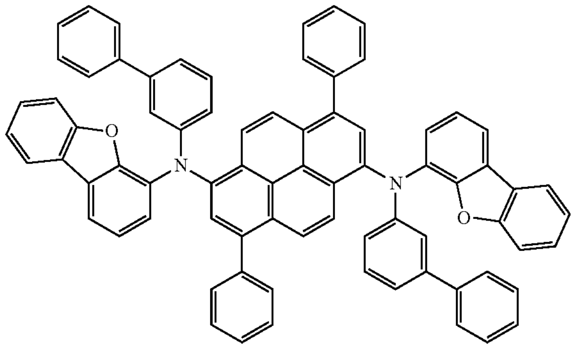
Dopant 42
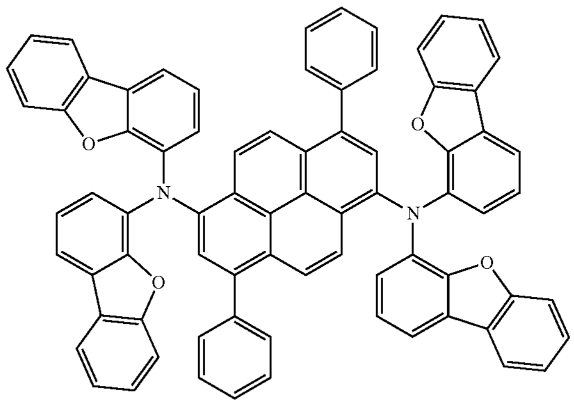
Dopant 43
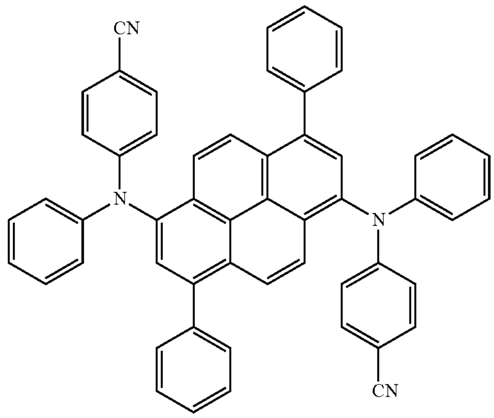
Dopant 44
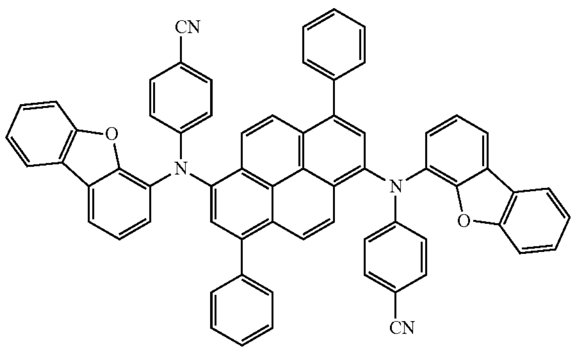
-continued
Dopant 45
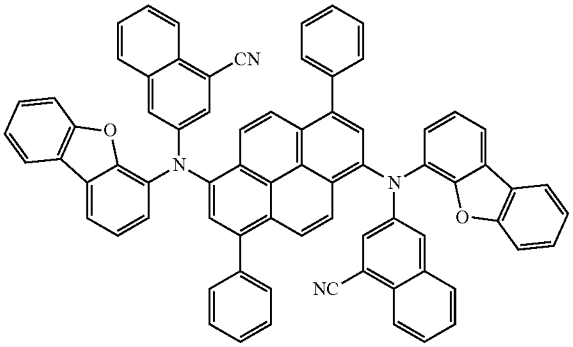
Dopant 46
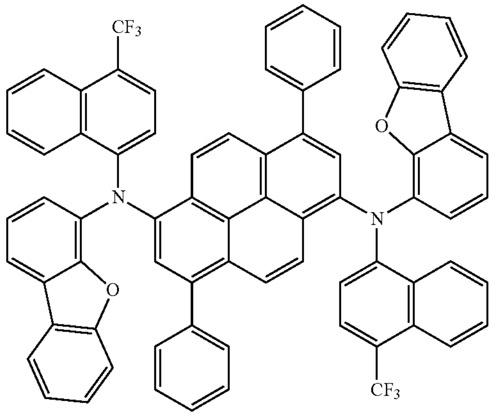
Dopant 47
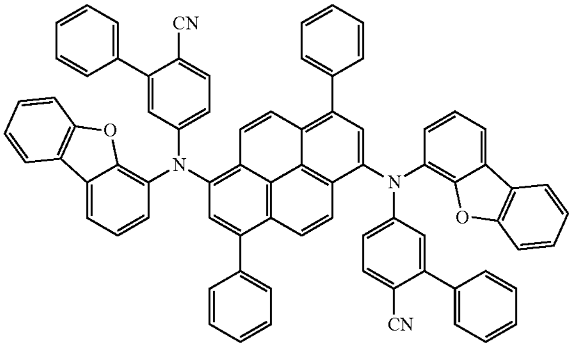
Dopant 48
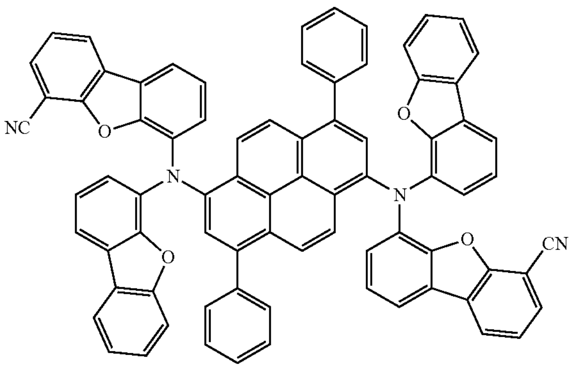

-continued
Dopant 49
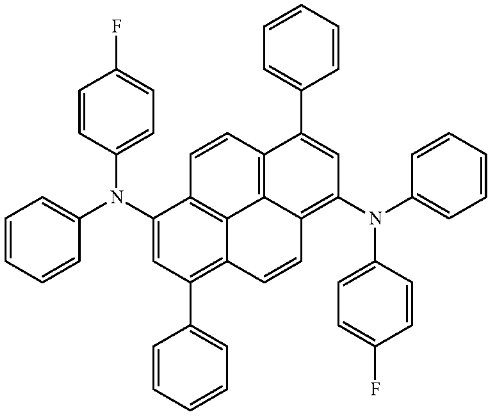
Dopant 50
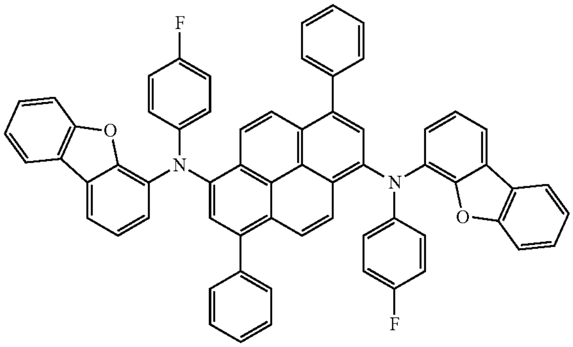
Dopant 51
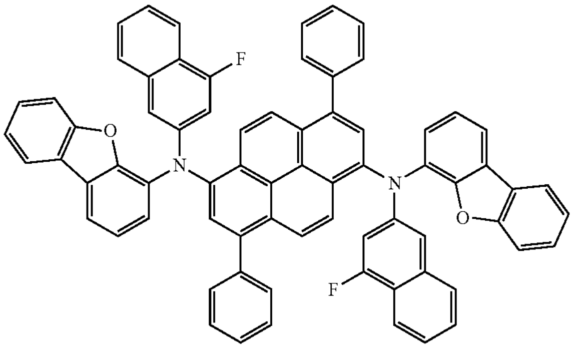
Dopant 52
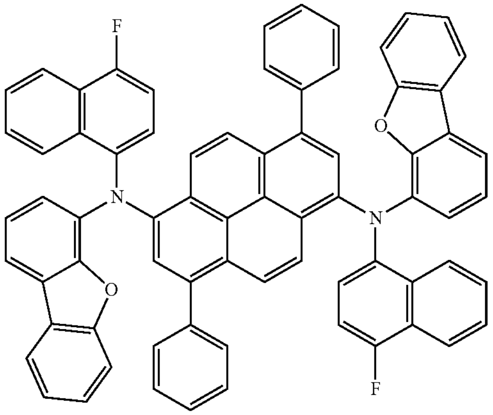
-continued
Dopant 53
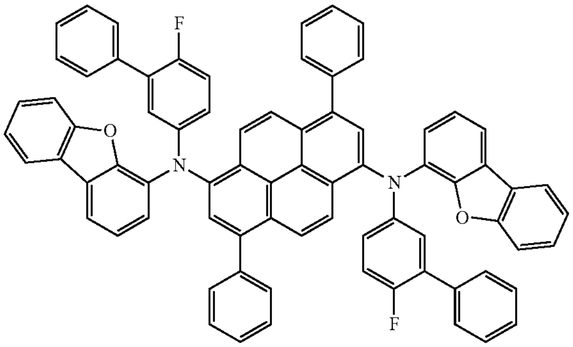
Dopant 54
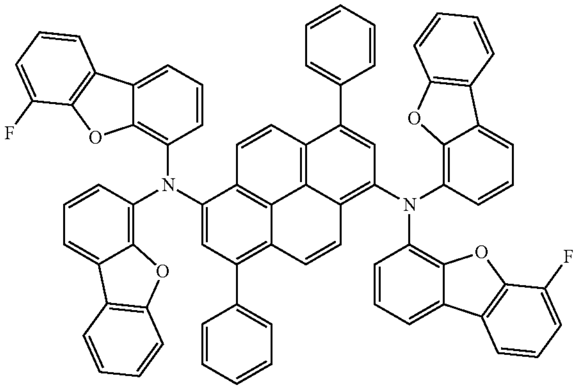
Dopant 55
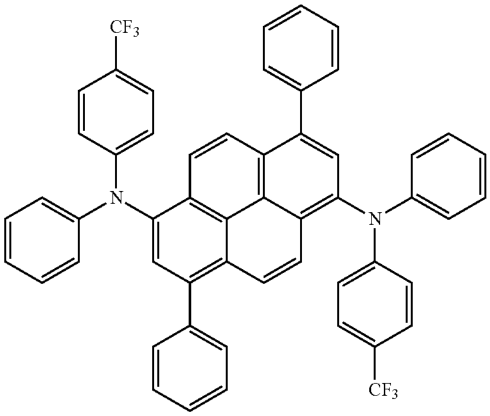
Dopant 56
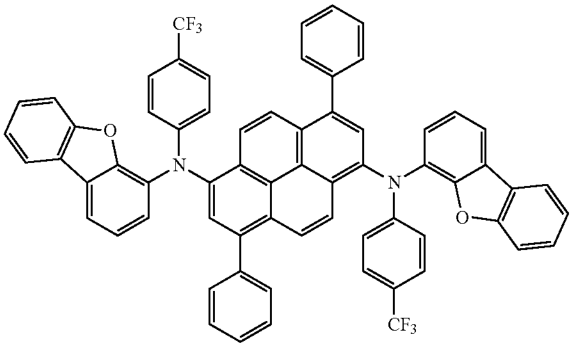

-continued

Dopant 57

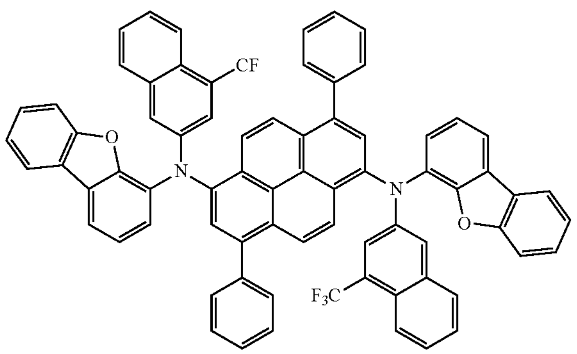

Dopant 58

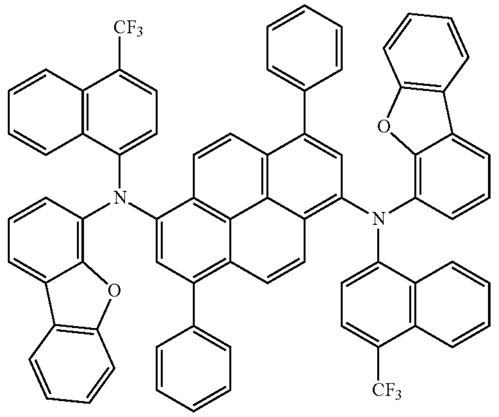

Dopant 59

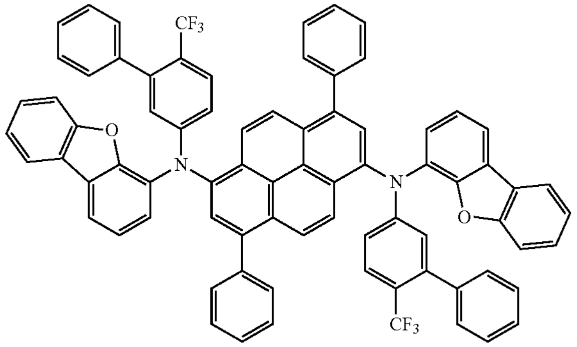

Dopant 60

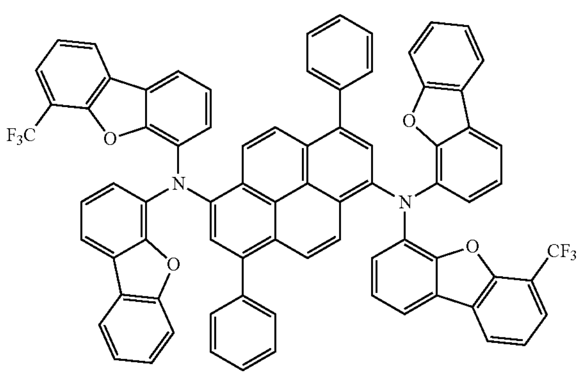

In the OLED D of the present disclosure, a weight % ratio of the first host 242 to the second host 244 may be about 1:9 to about 9:1, preferably about 1:9 to about 7:3. To provide sufficient emitting efficiency and lifespan of the OLED D and the organic light emitting display device, the weight % ratio of the first host 242 to the second host 244 may be about 3:7. On the other hand, to increase the lifespan without decrease of the emitting efficiency, the weight % ratio of the first host 242 to the second host 244 may be about 7:3. The OLED D and the organic light emitting display device of the present disclosure have advantages in the emitting efficiency and the lifespan.

In addition, when the organic emitting layer 162, e.g., the EML 240, includes the blue dopant of Formula 5-1, an image with narrow full width at half maximum (FWHM) and high color purity is provided.

[Synthesis of the First Host]

1. Synthesis of the Compound Host1

[Reaction Formula 1]

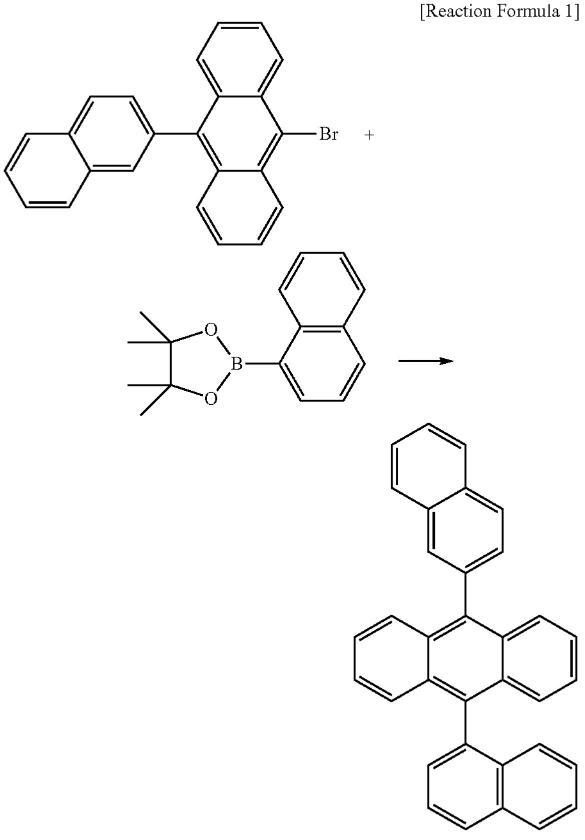

Host 1

10-bromo-9-(naphthalene-3-yl)-anthracene (2.00 g, 5.23 mmol), 4,4,5,5-tetramethyl-2-(naphthlen-1-yl)-1,3,2-dioxaborolane (1.45 g, 5.74 mmol), tris (dibenzylideneacetone) dipalladium(0) ($Pd_2(dba)_3$) (0.24 g, 0.26 mmol) and toluene (50 mL) were added into the flask (250 mL) in the dry box. The reaction flask was removed from the dry box, and sodium carbonate anhydride (20 mL, 2M) was added into the flask. The reactants were stirred and heated at 90° C. overnight with monitoring the reaction by HPLC (high-performance liquid chromatography). The reaction flask was cooled down to the room temperature, and then an organic layer was separated from an aqueous layer. The aqueous layer was washed with dichloromethane (DCM), and the organic layer was concentrated with the rotary vaporizer to obtain a gray powder. The gray power was purified with alumina, precipitated with hexane and performed column chromatography using silica gel to obtain the compound Host1 of white powder (2.00 g, yield: 89%).

2. Synthesis of the Compound Host2

[Reaction Formula 2]

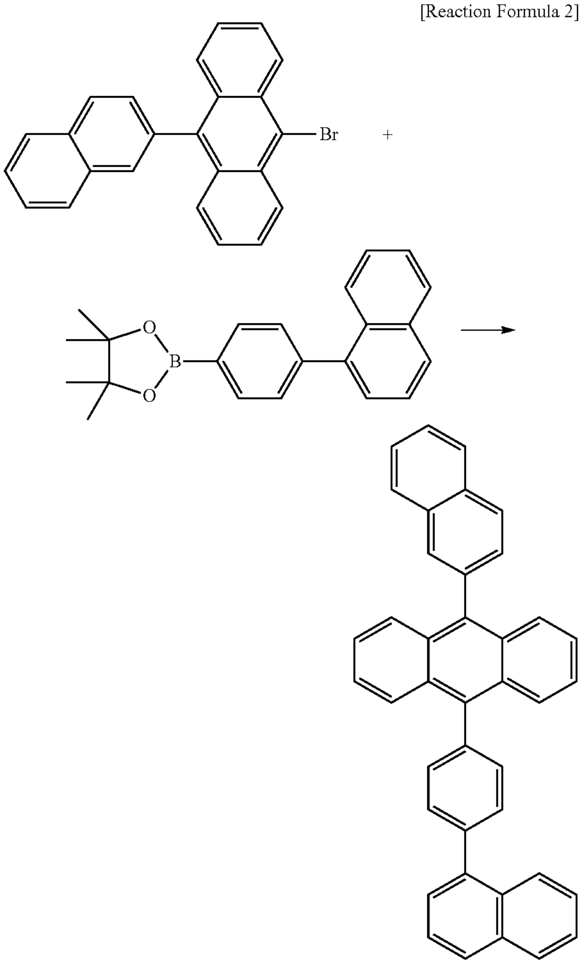

Host 2

10-bromo-9-(naphthalene-3-yl)-anthracene (2.00 g, 5.23 mmol), 4,4,5,5-tetramethyl-2-(4-(naphthlen-4-yl)phenyl)-1,3,2-dioxaborolane (1.90 g, 5.74 mmol), $Pd_2(dba)_3$) (0.24 g, 0.26 mmol) and toluene (50 mL) were added into the flask (250 mL) in the dry box. The reaction flask was removed from the dry box, and sodium carbonate anhydride (20 mL, 2M) was added into the flask. The reactants were stirred and heated at 90° C. overnight with monitoring the reaction by HPLC. The reaction flask was cooled down to the room temperature and then an organic layer was separated from an aqueous layer. The aqueous layer was washed with 10 dichloromethane (DCM) twice and the organic layer was concentrated with the rotary vaporizer to obtain a gray powder. The gray power was purified with alumina, precipitated with hexane and performed column chromatography using silica gel to obtain the compound Host2 of white powder (2.28 g, yield: 86%).

3. Synthesis of the Compound Host3

[Reaction Formula 3]

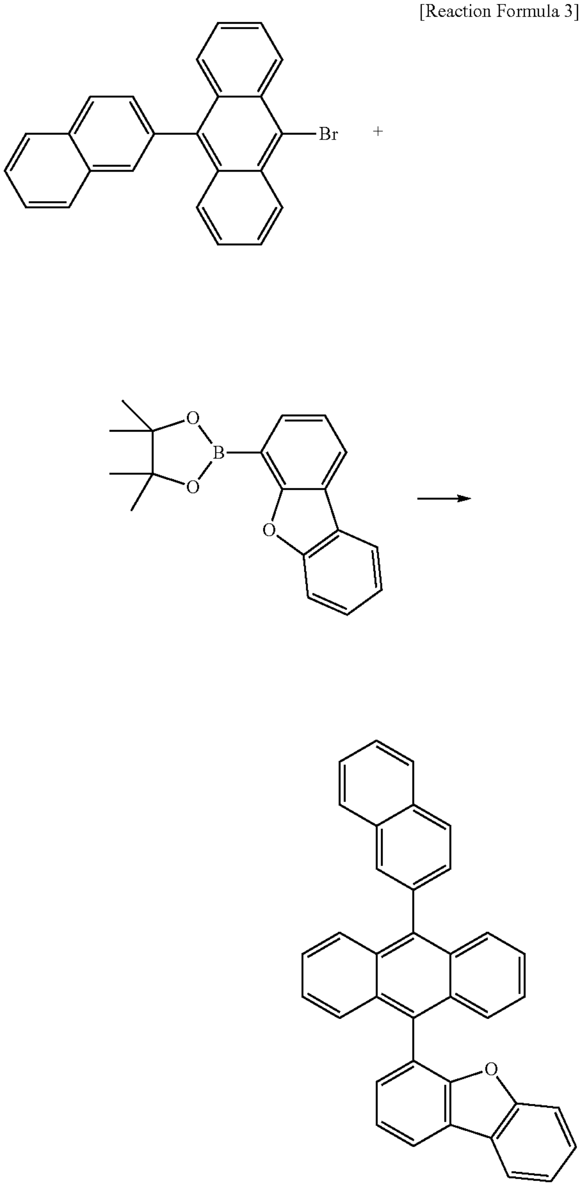

Host 3

10-bromo-9-(naphthalene-3-yl)-anthracene (2.00 g, 5.23 mmol), 4,4,5,5-tetramethyl-2-(dibenzofuran-1-yl)-1,3,2-dioxaborolane (1.69 g, 5.74 mmol), $Pd_2(dba)_3$) (0.24 g, 0.26 mmol) and toluene (50 mL) were added into the flask (250 mL) in the dry box. The reaction flask was removed from the dry box, and sodium carbonate anhydride (20 mL, 2M) was added into the flask. The reactants were stirred and heated at 90° C. overnight with monitoring the reaction by HPLC. The reaction flask was cooled down to the room temperature and then an organic layer was separated from an aqueous layer. The aqueous layer was washed with dichloromethane (DCM) twice and the organic layer was concentrated with the rotary vaporizer to obtain a gray powder. The gray power was purified with alumina, precipitated with hexane and performed column chromatography using silica gel to obtain the compound Host3 of white powder (1.91 g, yield: 78%).

4. Synthesis of the Compound Host4

[Reaction Formula 4]

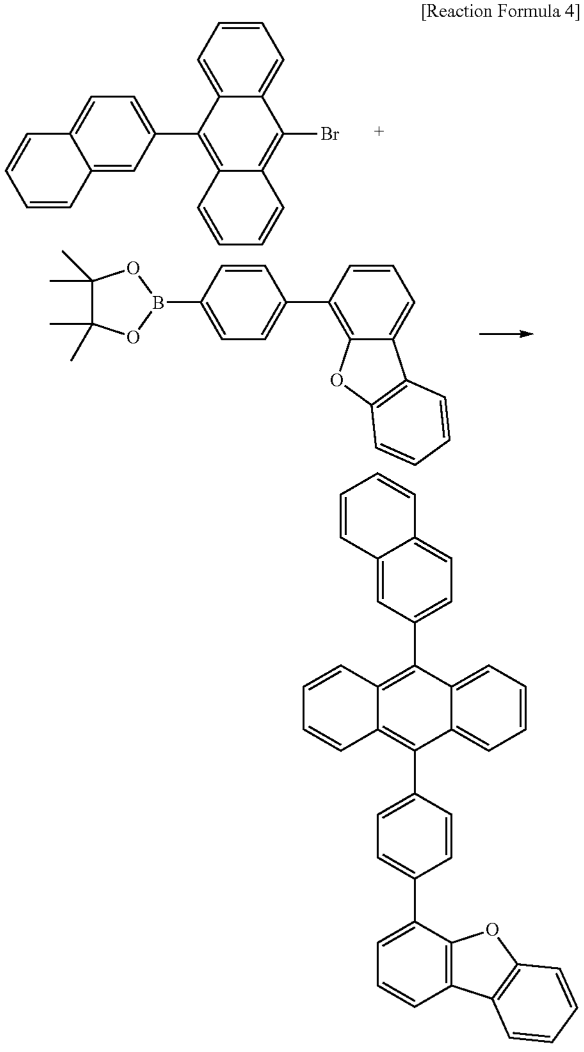

Host 4

10-bromo-9-(naphthalene-3-yl)-anthracene (2.00 g, 5.23 mmol), 4,4,5,5-tetramethyl-2-(dibenzofuran-1-yl)phenyl-1,3,2-dioxaborolane (2.12 g, 5.74 mmol), $Pd_2(dba)_3$) (0.24 g, 0.26 mmol) and toluene (50 mL) were added into the flask (250 mL) in the dry box. The reaction flask was removed from the dry box, and sodium carbonate anhydride (20 mL, 2M) was added into the flask. The reactants were stirred and heated at 90° C. overnight with monitoring the reaction by HPLC. The reaction flask was cooled down to the room temperature and then an organic layer was separated from an aqueous layer. The aqueous layer was washed with 10 dichloromethane (DCM) twice and the organic layer was concentrated with the rotary vaporizer to obtain a gray powder. The gray power was purified with alumina, precipitated with hexane and performed column chromatography using silica gel to obtain the compound Host4 of white powder (2.31 g, yield: 82%).

[Synthesis of the Second Host]

1. Synthesis of the Compound Host32

[Reaction Formula 5]

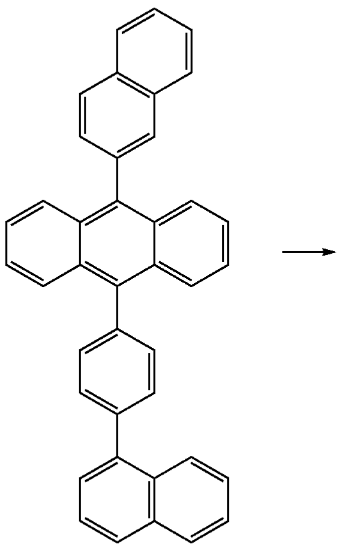

Host 2

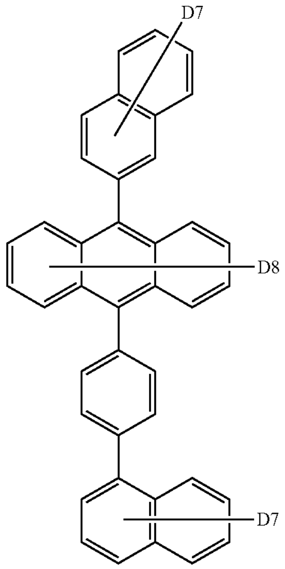

Host 32

Under $N_2$ condition, $AlCl_3$ (0.48 g, 3.6 mmol) was added to perdeuterobenzene solution (100 mL) in which the compound Host2 (5 g, 9.87 mmol) was dissolved. The mixture was stirred under the room temperature for 6 hrs, and $D_2O$ (50 mL) was added. After separating the aqueous layer and the organic layer, the aqueous layer was washed with $CH_2Cl_2$ (30 mL). The obtained organic layer was dried using magnesium sulfate, and the volatiles were removed by rotary evaporation. The crude product was purified by column chromatography to obtain the compound Host32 (4.5 g) of white powder.

2. Synthesis of the Compound Host34

[Reaction Formula 6]

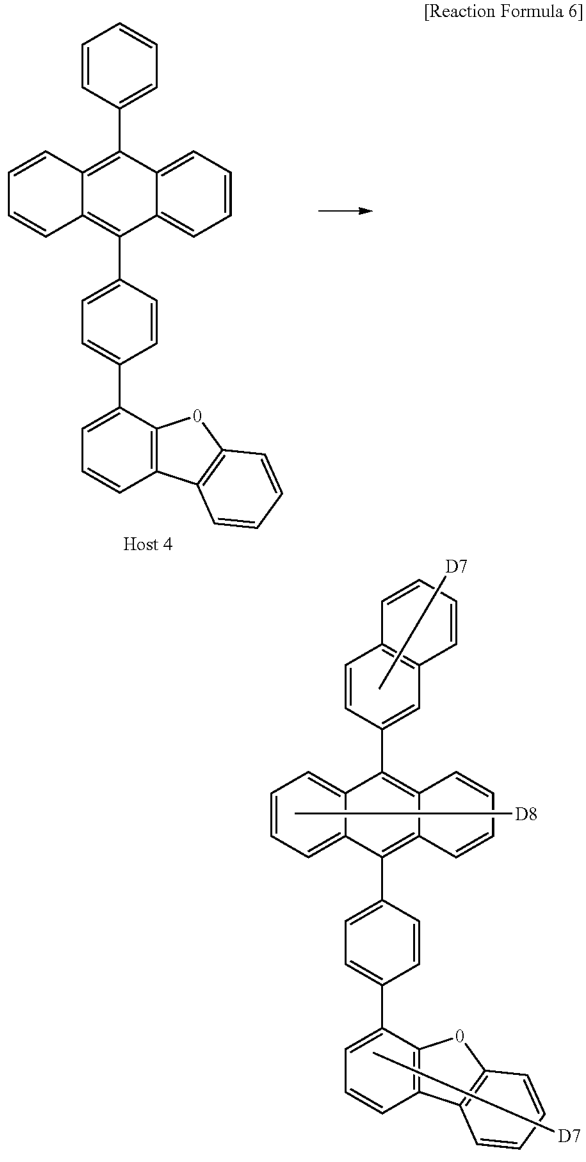

Host 4

Host 32

Under $N_2$ condition, $AlCl_3$ (0.48 g, 3.6 mmol) was added to perdeuterobenzene solution (100 mL) in which the compound Host4 (5 g, 9.15 mmol) was dissolved. The mixture was stirred under the room temperature for 6 hrs, and $D_2O$ (50 mL) was added. After separating the aqueous layer and the organic layer, the aqueous layer was washed with $CH_2Cl_2$ (30 mL). The obtained organic layer was dried using magnesium sulfate, and the volatiles were removed by rotary evaporation. The crude product was purified by column chromatography to obtain the compound Host34 (4.8 g) of white powder.

[Synthesis of the Blue Dopant]

1. Synthesis of the Compound Dopant56

(1) 3-nitro-N, N-diphenylaniline

[Reaction Formula 7-1]

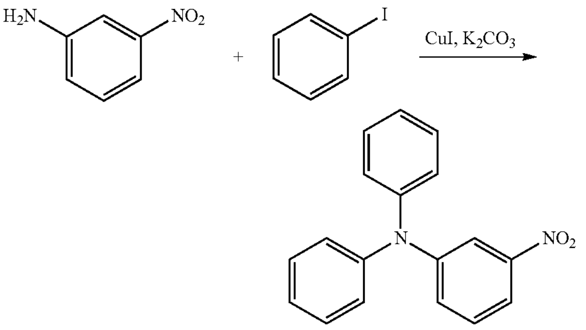

Under $N_2$ condition, the flask containing 3-nitroaniline (25.0 g), iodide benzene (81.0 g), copper iodide (3.5 g), potassium carbonate (100.0 g) and ortho-dichlorobenzene (250 mL) was heated and stirred for 14 hours. The reaction solution was cooled to the room temperature, and ammonia water was added for liquid separation. The resultant was purified by silica gel column chromatography (developing solution: toluene/heptane=3/7 (volume ratio)) to obtain 3-nitro-N, N-diphenylaniline (44.0 g).

(2) N1,N1-diphenylbenzene-1,3-diamine

[Reaction Formula 7-2]

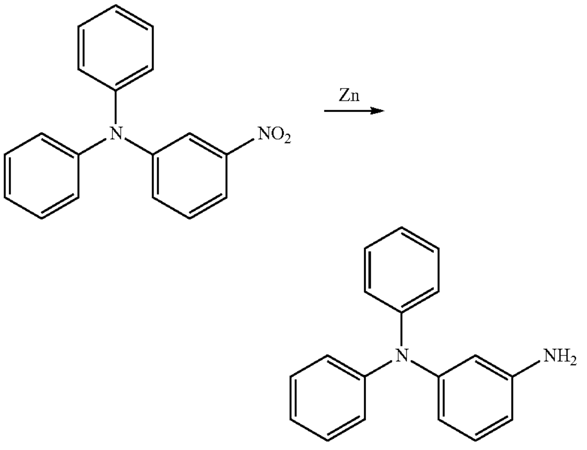

Under $N_2$ condition, acetic acid cooled in the ice-bath was added and stirred. 3-nitro-N,N-diphenylaniline (44.0 g) was dropped into the solution to avoid significant increase the reaction temperature. After the addition was completed, the mixture was stirred at the room temperature for 30 minutes, and the disappearance of the starting materials was checked. After the reaction was completed, a supernatant liquid was collected by decantation, neutralized with sodium carbonate, and extracted with ethyl acetate. The resultant was purified by silica gel column chromatography (developing solution: toluene/heptane=9/1 (volume ratio)). After removing the solvent by distillation under reduced pressure, heptane was added and reprecipitated to obtain N1,N1-diphenylbenzene-1,3-diamine (36.0 g).

(3) N1,N1,N3-triphenylbenzene-1,3-diamine

[Reaction Formula 7-3]

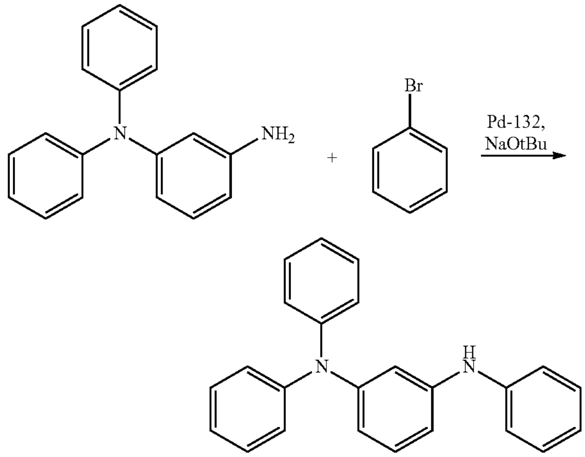

Under $N_2$ condition, the flask containing N1,N1-diphenylbenzene-1,3-diamine (60.0 g), Pd-132 (1.3 g), NaOtBu (33.5 g) and xylene (300 mL) was stirred by heating at 120° C. The solution of xylene (50 ml), in which bromobenzene (36.2 g) was dissolved, was slowly dropped to the solution, and the mixture was heated and stirred for 1 hour after completion of dropping. After cooling the mixture to the room temperature, water and ethyl acetate were added for liquid separation. The resultant was purified by silica gel column chromatography (developing solution: toluene/heptane=5/5 (volume ratio)) to obtain N1,N1,N3-triphenylbenzene-1,3-diamine (73.0 g).

(4) N1,N1'-(2-chloro-1,3-phenylene)bis(N1,N3,N3-triphenylbenzene-1,3-diamine)

[Reaction Formula 7-4]

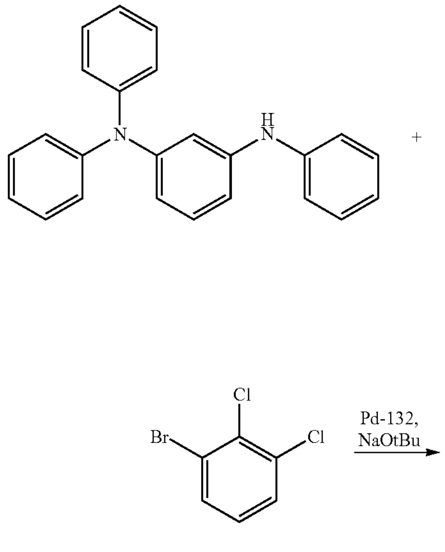

-continued

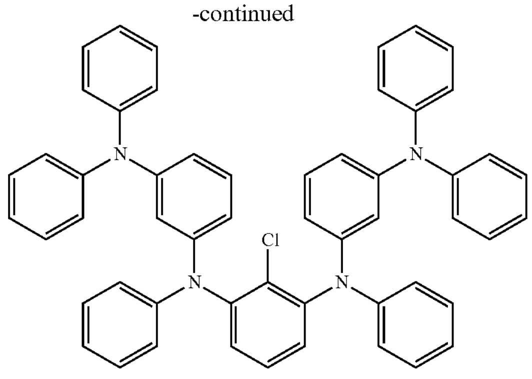

Under $N_2$ condition, the flask containing N1,N1,N3-triphenylbenzene-1,3-diamine (20.0 g), 1-bromo-2,3-dichlorobenzene (6.4 g), Pd-132 (0.2 g), NaOtBu (sodium tert-buthoxide, 6.8 g) and xylene (70 mL) was heated and stirred at 120° C. for 2 hrs. After cooling the mixture to the room temperature, water and ethyl acetate were added for liquid separation. The resultant was purified by silica gel column chromatography (developing solution: toluene/heptane=4/6 (volume ratio)) to obtain N1,N1'-(2-chloro-1,3-phenylene)bis(N1,N3,N3-triphenylbenzene-1,3-diamine) (15.0 g).

(5) Dopant56

[Reaction Formula 7-5]

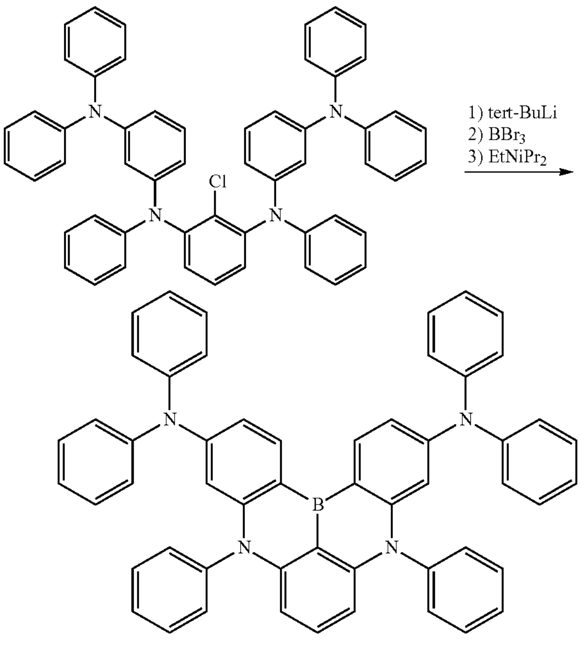

1.7 M tert-butyllithium pentane solution (18.1 ml) was added into the flask containing N1,N1'-(2-chloro-1,3-phenylene)bis(N1,N,N3-triphenylbenzene-1,3-diamine) (12.0 g) and tert-butylbenzene (100 mL) with cooling in the ice bath under $N_2$ condition. After heating up to 60° C. and stirring for 2 hrs, the component having boiling point lower than tert-butylbenzene was distilled off under reduced pressure. The mixture was cooled to −50° C., and boron tribromide (2.9 mL) was added. The mixture was heated up to the room temperature and stirred for 0.5 hour. The mixture was cooled again in the ice bath, and N,N-diisopropylethylamine (5.4 mL) was added. The mixture was stirred at the room temperature until the exotherm was finished. The mixture was heated to the temperature of 120° C. and stirred for 3 hrs. The solution was cooled to the room temperature, and an aqueous sodium acetate solution, which was cooled in the ice bath, and ethyl acetate was sequentially added to the solution. The insoluble solid was filtered and phase-separated. Then, the residue was purified by silica gel column chromatography (developing solution: toluene/heptane=5/5 (volume ratio)). The mixture was washed with heated heptane and ethyl acetate, and then reprecipitated with a mixed solvent of toluene and ethyl acetate to obtain Dopant56 (2.0 g).

2. Synthesis of the Compound Dopant167

(1) 3,3"-((2-bromo-1,3-phenylene)bis(oxy)) di-1,1'-biphenyl

[Reaction Formula 8-1]

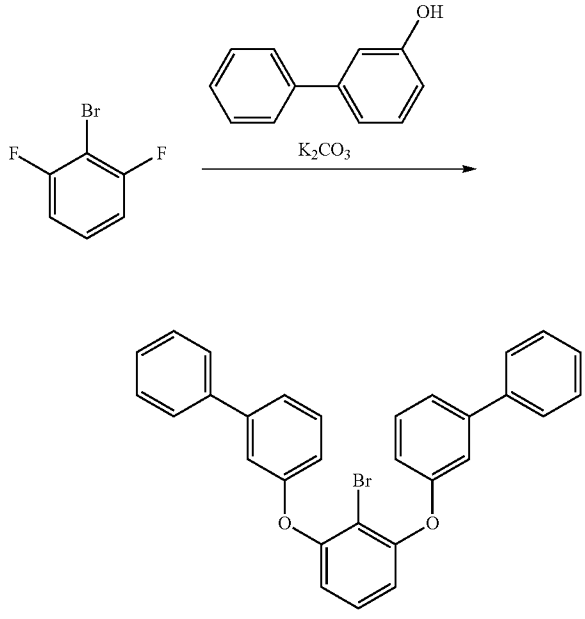

Under $N_2$ condition, the flask containing 2-bromo-1,3-difluorobenzene (12.0 g), [1,1'-biphenyl]-3-ol (23.0 g), potassium carbonate (34.0 g) and NMP (130 mL) was heated and stirred at 170° C. for 10 hrs. After the reaction was stopped, the reaction solution was cooled to the room temperature, and water and toluene were added for liquid separation. The solvent was distilled off under reduced pressure, and the resultant was purified by silica gel column chromatography (developing solution: heptane/toluene=7/3 (volume ratio)) to obtain 3,3"-((2-bromo-1,3-phenylene)bis oxy)) di-1,1'-biphenyl (26.8 g) was obtained.

(2) Dopant167

[Reaction Formula 8-2]

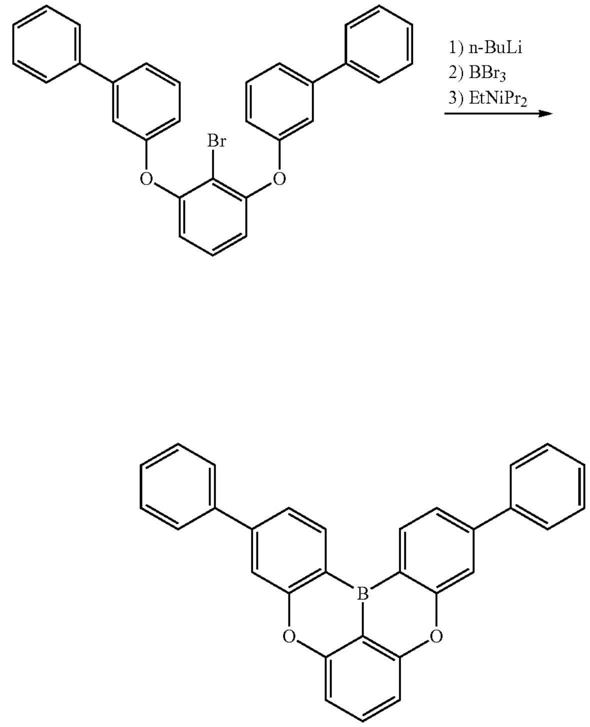

Under $N_2$ condition, the flask containing 3,3"-((2-bromo-1,3-phenylene)bis(oxy))di-1,1'-biphenyl (14.0 g) and xylene (100 mL) was cooled to −40° C., and n-butyllithium hexane solution (2.6 M, 11.5 mL) was dropped. After heating the mixture to the room temperature, the mixture was cooled again to −40° C., and boron tribromide (3.3 mL) was added thereto. The mixture was heated to the room temperature and stirred for 13 hrs. The mixture was cooled to 0° C., and N,N-diisopropylethylamine (9.7 ml) was added. The mixture was heated and stirred at 130° C. for 5 hrs. The reaction solution was cooled to the room temperature, and an aqueous sodium acetate solution cooled in the ice bath was added and stirred. The precipitated solid was collected by suction filtration. The obtained solid was washed with water, methanol and heptane in that order and recrystallized from chlorobenzene to obtain the compound Dopant167 (8.9 g).

[Organic Light Emitting Diode]

The anode (ITO, 50 Å), the HIL (Formula 7 (97 wt %) and Formula 8 (3 wt %), 100 Å), the HTL (Formula 7, 1000 Å), the EBL (Formula 9, 100 Å), the EML (host (98 wt %) and dopant (2 wt %), 200 Å), the HBL (Formula 10, 100 Å), the EIL (Formula 11 (98 wt %) and Li(2 wt %), 200 Å) and the cathode (Al, 500 Å) was sequentially deposited to form the OLED.

[Formula 7]

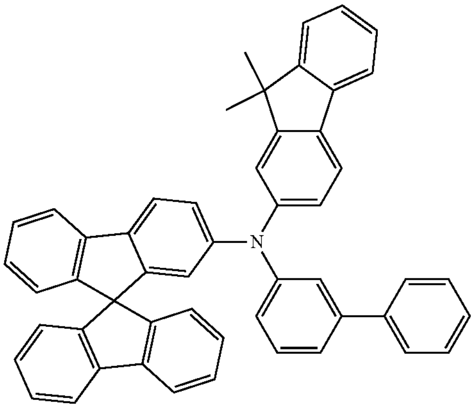

[Formula 8]

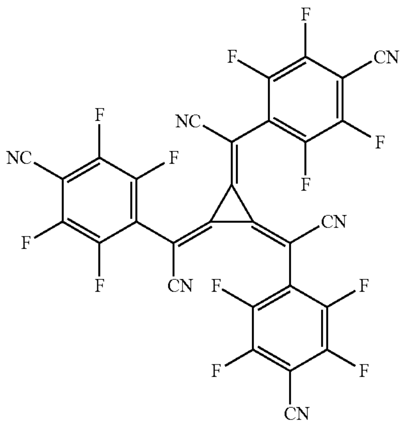

[Formula 9]

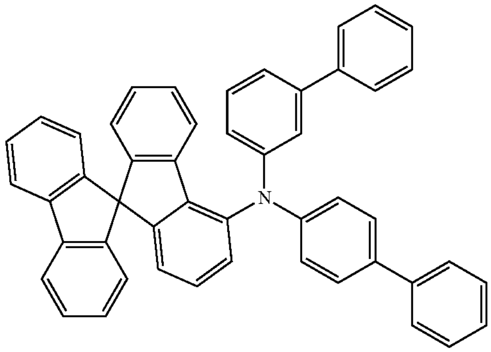

-continued

[Formula 10]

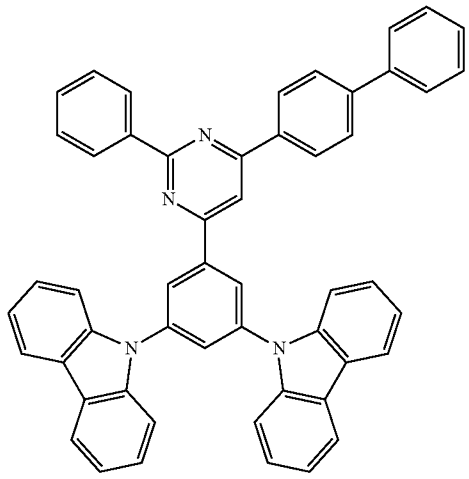

[Formula 11]

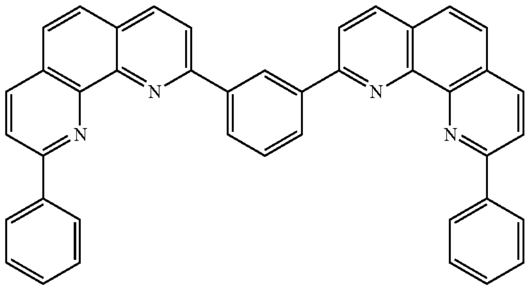

COMPARATIVE EXAMPLES (1) Comparative Example 1 (Ref1)

The compound "Dopant56" in Formula 6-1 is used as the dopant, and the compound "Host2" is used as the host.

(2) Comparative Example 2 (Ref2)

The compound "Dopant1" in Formula 6-2 is used as the dopant, and the compound "Host2" is used as the host.

(3) Comparative Example 3 (Ref3)

The compound "Dopant56" in Formula 6-1 is used as the dopant, and the compound "Host4" is used as the host.

(4) Comparative Example 4 (Ref4)

The compound "Dopant1" in Formula 6-2 is used as the dopant, and the compound "Host4" is used as the host.

(5) Comparative Example 5 (Ref5)

The compound "Dopant56" in Formula 6-1 is used as the dopant, and the compound "Host32" is used as the host.

(6) Comparative Example 6 (Ref6)

The compound "Dopant1" in Formula 6-2 is used as the dopant, and the compound "Host32" is used as the host.

(7) Comparative Example 7 (Ref7)

The compound “Dopant56” in Formula 6-1 is used as the dopant, and the compound “Host34” is used as the host.

(8) Comparative Example 8 (Ref8)

The compound “Dopant1” in Formula 6-2 is used as the dopant, and the compound “Host34” is used as the host.

2. EXAMPLES (1) Example 1 (Ex1)

The compound “Dopant56” in Formula 6-1 is used as the dopant, and the compound “Host2” and the compound “Host32” are used as the host. (“Host2”: “Host32”=9:1 (wt % ratio))

(2) Example 2 (Ex2)

The compound “Dopant56” in Formula 6-1 is used as the dopant, and the compound “Host2” and the compound “Host32” are used as the host. (“Host2”: “Host32”=7:3 (wt % ratio))

(3) Example 3 (Ex3)

The compound “Dopant56” in Formula 6-1 is used as the dopant, and the compound “Host2” and the compound “Host32” are used as the host. (“Host2”: “Host32”=5:5 (wt % ratio))

(4) Example 4 (Ex4)

The compound “Dopant56” in Formula 6-1 is used as the dopant, and the compound “Host2” and the compound “Host32” are used as the host. (“Host2”: “Host32”=3:7 (wt % ratio))

(5) Example 5 (Ex5)

The compound “Dopant56” in Formula 6-1 is used as the dopant, and the compound “Host2” and the compound “Host32” are used as the host. (“Host2”: “Host32”=1:9 (wt % ratio))

(6) Example 6 (Ex6)

The compound “Dopant1” in Formula 6-2 is used as the dopant, and the compound “Host2” and the compound “Host32” are used as the host. (“Host2”: “Host32”=9:1 (wt % ratio))

(7) Example 7 (Ex7)

The compound “Dopant1” in Formula 6-2 is used as the dopant, and the compound “Host2” and the compound “Host32” are used as the host. (“Host2”: “Host32”=7:3 (wt % ratio))

(8) Example 8 (Ex8)

The compound “Dopant1” in Formula 6-2 is used as the dopant, and the compound “Host2” and the compound “Host32” are used as the host. (“Host2”: “Host32”=5:5 (wt % ratio))

(9) Example 9 (Ex9)

The compound “Dopant1” in Formula 6-2 is used as the dopant, and the compound “Host2” and the compound “Host32” are used as the host. (“Host2”: “Host32”=3:7 (wt % ratio))

(10) Example 10 (Ex10)

The compound “Dopant1” in Formula 6-2 is used as the dopant, and the compound “Host2” and the compound “Host32” are used as the host. (“Host2”: “Host32”=1:9 (wt % ratio))

(11) Example 11 (Ex11)

The compound “Dopant56” in Formula 6-1 is used as the dopant, and the compound “Host4” and the compound “Host34” are used as the host. (“Host4”: “Host34”=9:1 (wt % ratio))

(12) Example 12 (Ex12)

The compound “Dopant56” in Formula 6-1 is used as the dopant, and the compound “Host4” and the compound “Host34” are used as the host. (“Host4”: “Host34”=7:3 (wt % ratio))

(13) Example 13 (Ex13)

The compound “Dopant56” in Formula 6-1 is used as the dopant, and the compound “Host4” and the compound “Host34” are used as the host. (“Host4”: “Host34”=5:5 (wt % ratio))

(14) Example 14 (Ex14)

The compound “Dopant56” in Formula 6-1 is used as the dopant, and the compound “Host4” and the compound “Host34” are used as the host. (“Host4”: “Host34”=3:7 (wt % ratio))

(15) Example 15 (Ex15)

The compound “Dopant56” in Formula 6-1 is used as the dopant, and the compound “Host4” and the compound “Host34” are used as the host. (“Host4”: “Host34”=1:9 (wt % ratio))

(16) Example 16 (Ex16)

The compound “Dopant1” in Formula 6-2 is used as the dopant, and the compound “Host4” and the compound “Host34” are used as the host. (“Host4”: “Host34”=9:1 (wt % ratio))

(17) Example 17 (Ex17)

The compound “Dopant1” in Formula 6-2 is used as the dopant, and the compound “Host4” and the compound “Host34” are used as the host. (“Host4”: “Host34”=7:3 (wt % ratio))

(18) Example 18 (Ex18)

The compound "Dopant1" in Formula 6-2 is used as the dopant, and the compound "Host4" and the compound "Host34" are used as the host. ("Host4": "Host34"=5:5 (wt % ratio))

(19) Example 19 (Ex19)

The compound "Dopant1" in Formula 6-2 is used as the dopant, and the compound "Host4" and the compound "Host34" are used as the host. ("Host4": "Host34"=3:7 (wt % ratio))

(20) Example 20 (Ex20)

The compound "Dopant1" in Formula 6-2 is used as the dopant, and the compound "Host4" and the compound "Host34" are used as the host. ("Host4": "Host34"=1:9 (wt % ratio)) The properties, i.e., voltage (V), efficiency (Cd/A), color coordinate (CIE), FWHM and lifespan (T95), of the OLEDs manufactured in Comparative Examples 1 to 8 and Examples 1 to 20 are measured and listed in Tables 1 to 4.

TABLE 1

| | Host ratio | | | | CIE | | | |
|---|---|---|---|---|---|---|---|---|
| | 1st host | 2nd host | V | Cd/A | x | y | FWHM [nm] | T95 [hr] |
| Ref1 | 10 | 0 | 3.77 | 4.78 | 0.1390 | 0.0612 | 26 | 153 |
| Ex1 | 9 | 1 | 3.77 | 4.78 | 0.1390 | 0.0612 | 26 | 168 |
| Ex2 | 7 | 3 | 3.77 | 4.78 | 0.1390 | 0.0611 | 26 | 184 |
| Ex3 | 5 | 5 | 3.78 | 4.73 | 0.1391 | 0.0610 | 26 | 214 |
| Ex4 | 3 | 7 | 3.78 | 4.68 | 0.1392 | 0.0610 | 26 | 275 |
| Ex5 | 1 | 9 | 3.78 | 4.59 | 0.1393 | 0.0605 | 26 | 298 |
| Ref5 | 0 | 10 | 3.78 | 4.55 | 0.1393 | 0.0605 | 26 | 302 |

TABLE 2

| | Host ratio | | | | CIE | | | |
|---|---|---|---|---|---|---|---|---|
| | 1st host | 2nd host | V | Cd/A | x | y | FWHM [nm] | T95 [hr] |
| Ref2 | 10 | 0 | 3.77 | 6.91 | 0.1379 | 0.0974 | 40 | 221 |
| Ex6 | 9 | 1 | 3.77 | 6.91 | 0.1379 | 0.0974 | 40 | 243 |
| Ex7 | 7 | 3 | 3.77 | 6.91 | 0.1379 | 0.0973 | 40 | 265 |
| Ex8 | 5 | 5 | 3.78 | 6.84 | 0.1380 | 0.0972 | 40 | 309 |
| Ex9 | 3 | 7 | 3.78 | 6.77 | 0.1381 | 0.0972 | 40 | 398 |
| Ex10 | 1 | 9 | 3.78 | 6.63 | 0.1382 | 0.0965 | 40 | 431 |
| Ref6 | 0 | 10 | 3.78 | 6.56 | 0.1382 | 0.0965 | 40 | 435 |

TABLE 3

| | Host ratio | | | | CIE | | | |
|---|---|---|---|---|---|---|---|---|
| | 1st host | 2nd host | V | Cd/A | x | y | FWHM [nm] | T95 [hr] |
| Ref3 | 10 | 0 | 3.92 | 4.98 | 0.1378 | 0.0632 | 26 | 141 |
| Ex11 | 9 | 1 | 3.92 | 4.98 | 0.1378 | 0.0632 | 26 | 155 |
| Ex12 | 7 | 3 | 3.92 | 4.98 | 0.1378 | 0.0631 | 26 | 169 |
| Ex13 | 5 | 5 | 3.93 | 4.93 | 0.1379 | 0.0630 | 26 | 197 |
| Ex14 | 3 | 7 | 3.93 | 4.88 | 0.1380 | 0.0630 | 26 | 253 |
| Ex15 | 1 | 9 | 3.93 | 4.79 | 0.1381 | 0.0625 | 26 | 274 |
| Ref7 | 0 | 10 | 3.93 | 4.75 | 0.1381 | 0.0625 | 26 | 278 |

TABLE 4

| | Host ratio | | | | CIE | | | |
|---|---|---|---|---|---|---|---|---|
| | 1st host | 2nd host | V | Cd/A | x | y | FWHM [nm] | T95 [hr] |
| Ref4 | 10 | 0 | 3.92 | 7.11 | 0.1367 | 0.0994 | 40 | 203 |
| Ex16 | 9 | 1 | 3.92 | 7.11 | 0.1367 | 0.0994 | 40 | 224 |
| Ex17 | 7 | 3 | 3.92 | 7.11 | 0.1367 | 0.0993 | 40 | 244 |
| Ex18 | 5 | 5 | 3.93 | 7.04 | 0.1368 | 0.0992 | 40 | 284 |
| Ex19 | 3 | 7 | 3.93 | 6.97 | 0.1369 | 0.0992 | 40 | 366 |
| Ex20 | 1 | 9 | 3.93 | 6.83 | 0.1370 | 0.0985 | 40 | 397 |
| Ref8 | 0 | 10 | 3.93 | 6.76 | 0.1370 | 0.0985 | 40 | 400 |

As shown in Tables 1 to 4, the lifespan of the OLED in Examples 1 to 5 using the first host, which is an anthracene derivative non-substituted with deuterium, and the second host, which is an anthracene derivative substituted with deuterium, is significantly increased in comparison to the OLED in Comparative Example 1 using the first host without the second host.

In addition, in comparison to the OLED in Comparative Example 2 using the second host without the first host, the lifespan of the OLED in Examples 1 to 5 is slightly decreased, but the emitting efficiency of the OLED in Examples 1 to 5 is improved.

Accordingly, in the OLED of the present disclosure, a weight % ratio of the first host to the second host may be about 1:9 to 7:3. To provide sufficient emitting efficiency and lifespan of the OLED and the organic light emitting display device, the weight % ratio of the first host to the second host may be about 3:7. On the other hand, to increase the lifespan without decrease of the emitting efficiency, the weight % ratio of the first host to the second host may be about 7:3.

In the OLED D of the present disclosure, the EML 240 includes the first host 242 being an anthracene derivative and the second host 242 being a deuterated anthracene derivative such that the OLED D and the organic light emitting display device 100 have advantages in the emitting efficiency and the lifespan.

Figure 4:
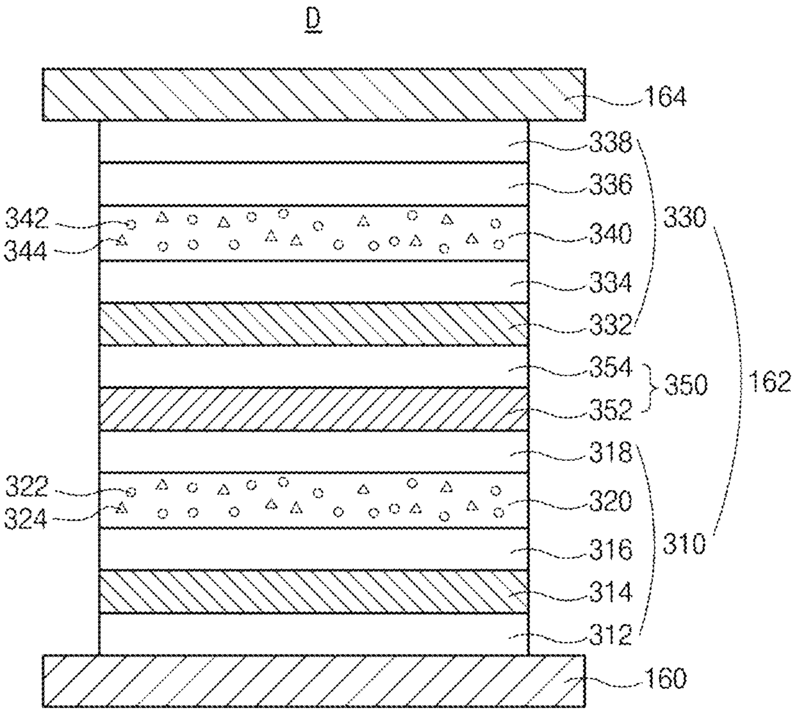
FIG. 4 is a schematic cross-sectional view illustrating an OLED having a tandem structure of two emitting parts according to the first embodiment of the present disclosure.

FIG. 4 is a schematic cross-sectional view illustrating an OLED having a tandem structure of two emitting units according to the first embodiment of the present disclosure.

As shown in FIG. 4, the OLED D includes the first and second electrodes 160 and 164 facing each other and the organic emitting layer 162 between the first and second electrodes 160 and 164. The organic emitting layer 162 includes a first emitting part 310 including a first EML 320, a second emitting part 330 including a second EML 340 and a charge generation layer (CGL) 350 between the first and second emitting parts 310 and 330.

The first electrode 160 may be formed of a conductive material having a relatively high work function to serve as an anode for injecting a hole into the organic emitting layer 162. The second electrode 164 may be formed of a conductive material having a relatively low work function to serve as a cathode for injecting an electron into the organic emitting layer 162.

The CGL 350 is positioned between the first and second emitting parts 310 and 330, and the first emitting part 310, the CGL 350 and the second emitting part 330 are sequentially stacked on the first electrode 160. Namely, the first emitting part 310 is positioned between the first electrode 160 and the CGL 350, and the second emitting part 320 is positioned between the second electrode 160 and the CGL 350.

The first emitting part 310 includes a first EML 320. In addition, the first emitting part 310 may further include a first EBL 316 between the first electrode 160 and the first EML 320 and a first HBL 318 between the first EML 320 and the CGL 350.

In addition, the first emitting part 310 may further include a first HTL 314 between the first electrode 160 and the first EBL 316 and an HIL 312 between the first electrode 160 and the first HTL 314.

The first EML 320 includes a first host 322, which is an anthracene derivative, a second host 324, which is a deuterated anthracene derivative, and a blue dopant (not shown) such that blue light is provided from the first EML 320.

Namely, the first EML 320 may include the compound of Formula 1 as the first host 322, the compound of Formula 3 as the second host 324 and the compound of Formula 5-1 or Formula 5-2 as the blue dopant.

In the first EML 320, a weight % ratio of the first host 322 to the second host 324 may be about 1:9 to about 9:1, preferably about 1:9 to about 7:3. To provide sufficient emitting efficiency and lifespan of the OLED D and the organic light emitting display device, the weight % ratio of the first host 322 to the second host 324 may be about 3:7. On the other hand, to increase the lifespan without decrease of the emitting efficiency, the weight % ratio of the first host 322 to the second host 324 may be about 7:3.

The second emitting part 330 includes the second EML 340. In addition, the second emitting part 330 may further include a second EBL 334 between the CGL 350 and the second EML 340 and a second HBL 336 between the second EML 340 and the second electrode 164.

In addition, the second emitting part 330 may further include a second HTL 332 between the CGL 350 and the second EBL 334 and an EIL 338 between the second HBL 336 and the second electrode 164.

The second EML 340 includes a first host 342, which is an anthracene derivative, a second host 344, which is a deuterated anthracene derivative, and a blue dopant (not shown) such that blue light is provided from the second EML 340.

Namely, the second EML 340 may include the compound of Formula 1 as the first host 342, the compound of Formula 3 as the second host 344 and the compound of Formula 5-1 or Formula 5-2 as the blue dopant.

In the second EML 340, a weight % ratio of the first host 342 to the second host 344 may be about 1:9 to about 9:1, preferably about 1:9 to about 7:3. To provide sufficient emitting efficiency and lifespan of the OLED D and the organic light emitting display device, the weight % ratio of the first host 342 to the second host 344 may be about 3:7. On the other hand, to increase the lifespan without decrease of the emitting efficiency, the weight % ratio of the first host 342 to the second host 344 may be about 7:3.

The first host 342 of the second EML 340 may be same as or different from the first host 322 of the first EML 320, and the second host 344 of the second EML 340 may be same as or different from the second host 324 of the first EML 320. In addition, the blue dopant of the second EML 340 may be same as or different from the blue dopant of the first EML 320.

The CGL 350 is positioned between the first and second emitting parts 310 and 330. Namely, the first and second emitting parts 310 and 330 are connected through the CGL 350. The CGL 350 may be a P-N junction CGL of an N-type CGL 352 and a P-type CGL 354.

The N-type CGL 352 is positioned between the first HBL 318 and the second HTL 332, and the P-type CGL 354 is positioned between the N-type CGL 352 and the second HTL 332.

In the OLED D, since each of the first and second EMLs 320 and 340 includes the first host 322 and 342, each of which is an anthracene derivative, and the second host 324 and 344, each of which is a deuterated anthracene derivative, the OLED D and the organic light emitting display device 100 have advantages in the emitting efficiency and the lifespan.

In addition, since the first and second emitting parts 310 and 330 for emitting blue light are stacked, the organic light emitting display device 100 provides an image having high color temperature.

Figure 5:
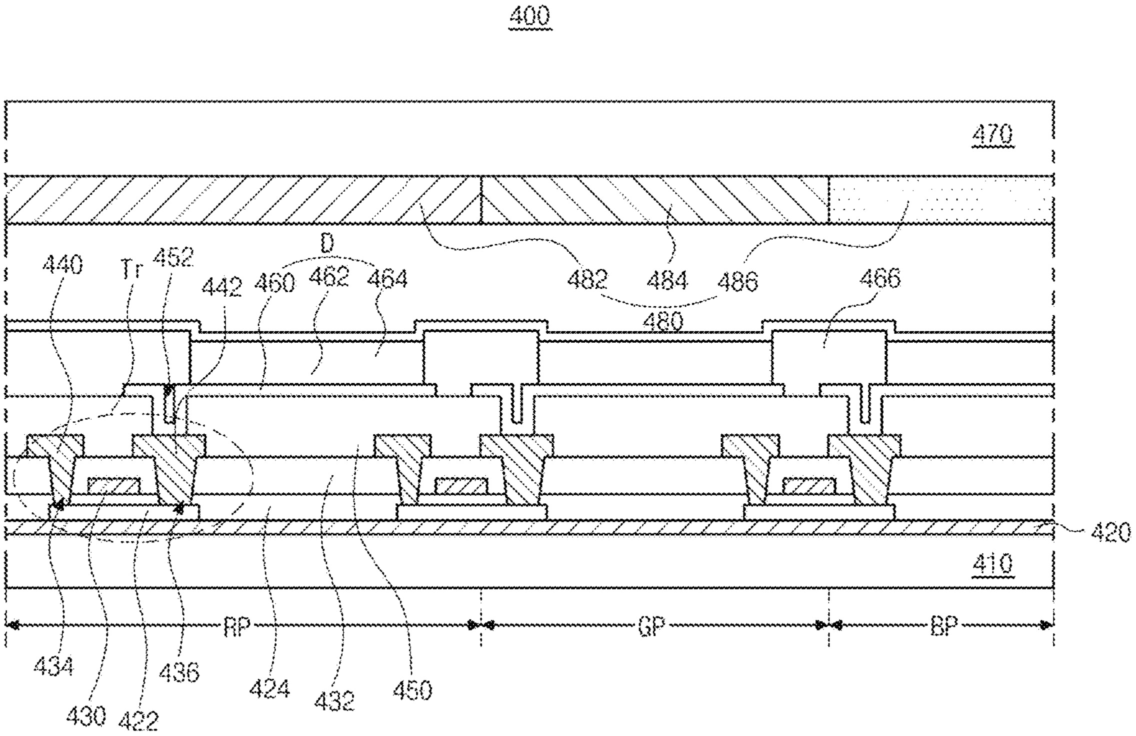
FIG. 5 is a schematic cross-sectional view illustrating an organic light emitting display device according to a second embodiment of the present disclosure.
Figure 6:
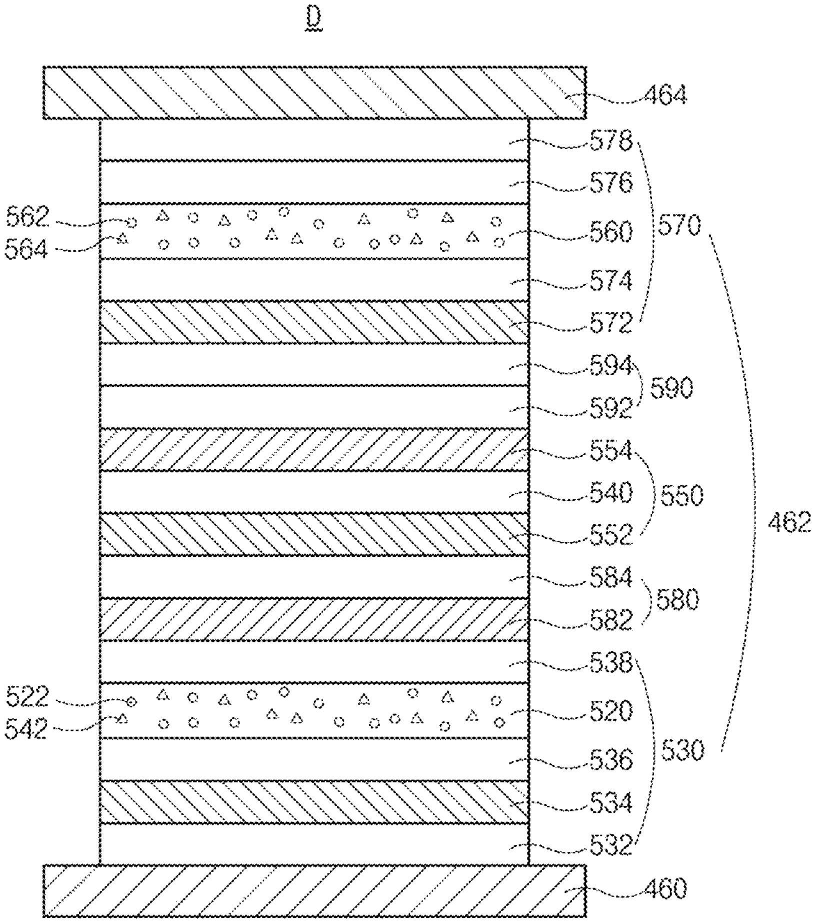
FIG. 6 is a schematic cross-sectional view illustrating an OLED for the organic light emitting display device according to the second embodiment of the present disclosure.

FIG. 5 is a schematic cross-sectional view illustrating an organic light emitting display device according to a second embodiment of the present disclosure, and FIG. 6 is a schematic cross-sectional view illustrating an OLED for the organic light emitting display device according to the second embodiment of the present disclosure.

As shown in FIG. 5, the organic light emitting display device 400 includes a first substrate 410, where a red pixel BP, a green pixel GP and a blue pixel BP are defined, a second substrate 470 facing the first substrate 410, an OLED D, which is positioned between the first and second substrates 410 and 470 and providing white emission, and a color filter layer 480 between the OLED D and the second substrate 470.

Each of the first and second substrates 410 and 470 may be a glass substrate or a plastic substrate. For example, each of the first and second substrates 410 and 470 may be a polyimide substrate.

A buffer layer 420 is formed on the substrate, and the TFT Tr corresponding to each of the red, green and blue pixels RP, GP and BP is formed on the buffer layer 420. The buffer layer 420 may be omitted.

A semiconductor layer 422 is formed on the buffer layer 420. The semiconductor layer 122 may include an oxide semiconductor material or polycrystalline silicon.

A gate insulating layer 424 is formed on the semiconductor layer 422. The gate insulating layer 424 may be formed of an inorganic insulating material such as silicon oxide or silicon nitride.

A gate electrode 430, which is formed of a conductive material, e.g., metal, is formed on the gate insulating layer 424 to correspond to a center of the semiconductor layer 422.

An interlayer insulating layer 432, which is formed of an insulating material, is formed on the gate electrode 430. The interlayer insulating layer 432 may be formed of an inorganic insulating material, e.g., silicon oxide or silicon nitride, or an organic insulating material, e.g., benzocyclobutene or photo-acryl.

The interlayer insulating layer 432 includes first and second contact holes 434 and 436 exposing both sides of the semiconductor layer 422. The first and second contact holes 434 and 436 are positioned at both sides of the gate electrode 430 to be spaced apart from the gate electrode 430.

A source electrode 440 and a drain electrode 442, which are formed of a conductive material, e.g., metal, are formed on the interlayer insulating layer 432.

The source electrode 440 and the drain electrode 442 are spaced apart from each other with respect to the gate electrode 430 and respectively contact both sides of the semiconductor layer 422 through the first and second contact holes 434 and 436.

The semiconductor layer 422, the gate electrode 430, the source electrode 440 and the drain electrode 442 constitute the TFT Tr. The TFT Tr serves as a driving element. Namely, the TFT Tr may correspond to the driving TFT Td (of FIG. 1).

Although not shown, the gate line and the data line cross each other to define the pixel, and the switching TFT is formed to be connected to the gate and data lines. The switching TFT is connected to the TFT Tr as the driving element.

In addition, the power line, which may be formed to be parallel to and spaced apart from one of the gate and data lines, and the storage capacitor for maintaining the voltage of the gate electrode of the TFT Tr in one frame may be further formed.

A passivation layer 450, which includes a drain contact hole 452 exposing the drain electrode 442 of the TFT Tr, is formed to cover the TFT Tr.

A first electrode 460, which is connected to the drain electrode 442 of the TFT Tr through the drain contact hole 452, is separately formed in each pixel. The first electrode 160 may be an anode and may be formed of a conductive material having a relatively high work function. For example, the first electrode 460 may be formed of a transparent conductive material such as indium-tin-oxide (ITO) or indium-zinc-oxide (IZO).

A reflection electrode or a reflection layer may be formed under the first electrode 460. For example, the reflection electrode or the reflection layer may be formed of aluminum-palladium-copper (APC) alloy.

A bank layer 466 is formed on the passivation layer 450 to cover an edge of the first electrode 460. Namely, the bank layer 466 is positioned at a boundary of the pixel and exposes a center of the first electrode 460 in the red, green and blue pixels RP, GP and BP. The bank layer 466 may be omitted.

An organic emitting layer 462 is formed on the first electrode 460.

Referring to FIG. 6, the organic emitting layer 462 includes a first emitting part 530 including a first EML 520, a second emitting part 550 including a second EML 540, a third emitting part 570 including a third EML 560, a first CGL 580 between the first and second emitting parts 530 and 550 and a second CGL 590 between the second and third emitting parts 550 and 570.

The first electrode 460 may be formed of a conductive material having a relatively high work function to serve as an anode for injecting a hole into the organic emitting layer 462. The second electrode 464 may be formed of a conductive material having a relatively low work function to serve as a cathode for injecting an electron into the organic emitting layer 462.

The first CGL 580 is positioned between the first and second emitting parts 530 and 550, and the second CGL 590 is positioned between the second and third emitting parts 550 and 570. Namely, the first emitting part 530, the first CGL 580, the second emitting part 550, the second CGL 590 and the third emitting part 570 are sequentially stacked on the first electrode 460. In other words, the first emitting part 530 is positioned between the first electrode 460 and the first CGL 570, the second emitting part 550 is positioned between the first and second CGLs 580 and 590, and the third emitting part 570 is positioned between the second electrode 460 and the second CGL 590.

The first emitting part 530 may include an HIL 532, a first HTL 534, a first EBL 536, the first EML 520 and a first HBL 538 sequentially stacked on the first electrode 460. Namely, the HIL 532, the first HTL 534 and the first EBL 536 are positioned between the first electrode 460 and the first EML 520, and the first HBL 538 is positioned between the first EML 520 and the first CGL 580.

The first EML 520 includes a first host 522, which is an anthracene derivative, a second host 524, which is a deuterated anthracene derivative, and a blue dopant (not shown) such that blue light is provided from the first EML 520.

Namely, the first EML 520 may include the compound of Formula 1 as the first host 522, the compound of Formula 3 as the second host 524 and the compound of Formula 5-1 or Formula 5-2 as the blue dopant.

In the first EML 520, a weight % ratio of the first host 522 to the second host 524 may be about 1:9 to about 9:1, preferably about 1:9 to about 7:3. To provide sufficient emitting efficiency and lifespan of the OLED D and the organic light emitting display device, the weight % ratio of the first host 522 to the second host 524 may be about 3:7. On the other hand, to increase the lifespan without decrease of the emitting efficiency, the weight % ratio of the first host 522 to the second host 524 may be about 7:3.

The second EML 550 may include a second HTL 552, the second EML 540 and an electron transporting layer (ETL) 554. The second HTL 552 is positioned between the first CGL 580 and the second EML 540, and the ETL 554 is positioned between the second EML 540 and the second CGL 590.

The second EML 540 may be a yellow-green EML. For example, the second EML 540 may include a host and a yellow-green dopant. Alternatively, the second EML 540 may include a host, a red dopant and a green dopant. In this instance, the second EML 540 may include a lower layer including the host and the red dopant (or the green dopant) and an upper layer including the host and the green dopant (or the red dopant).

The third emitting part 570 may include a third HTL 572, a second EBL 574, the third EML 560, a second HBL 576 and an EIL 578. The third EML 560 (or the third emitting part 570) includes a first host 562, which is an anthracene derivative, a second host 564, which is a deuterated anthracene derivative, and a blue dopant (not shown) such that blue light is provided from the third EML 560.

Namely, the third EML 560 may include the compound of Formula 1 as the first host 562, the compound of Formula 3 as the second host 564 and the compound of Formula 5-1 or Formula 5-2 as the blue dopant.

In the third EML 560, a weight % ratio of the first host 562 to the second host 564 may be about 1:9 to about 9:1, preferably about 1:9 to about 7:3. To provide sufficient emitting efficiency and lifespan of the OLED D and the organic light emitting display device, the weight % ratio of the first host 562 to the second host 564 may be about 3:7. On the other hand, to increase the lifespan without decrease of the emitting efficiency, the weight % ratio of the first host 562 to the second host 564 may be about 7:3.

The first host 562 of the third EML 560 may be same as or different from the first host 522 of the first EML 520, and the second host 564 of the third EML 560 may be same as or different from the second host 524 of the first EML 520. In addition, the blue dopant of the third EML 560 may be same as or different from the blue dopant of the first EML 520.

The first CGL 580 is positioned between the first emitting part 530 and the second emitting part 550, and the second CGL 590 is positioned between the second emitting part 550 and the third emitting part 570. Namely, the first and second emitting stacks 530 and 550 are connected through the first CGL 580, and the second and third emitting stacks 550 and 570 are connected through the second CGL 590. The first CGL 580 may be a P-N junction CGL of a first N-type CGL 582 and a first P-type CGL 584, and the second CGL 590 may be a P-N junction CGL of a second N-type CGL 592 and a second P-type CGL 594.

In the first CGL 580, the first N-type CGL 582 is positioned between the first HBL 538 and the second HTL 552, and the first P-type CGL 584 is positioned between the first N-type CGL 582 and the second HTL 552.

In the second CGL 590, the second N-type CGL 592 is positioned between the ETL 554 and the third HTL 572, and the second P-type CGL 594 is positioned between the second N-type CGL 592 and the third HTL 572.

In the OLED D, since each of the first and third EMLs 520 and 560 includes the first host 522 and 562, each of which is an anthracene derivative, the second host 524 and 564, each of which is a deuterated anthracene derivative, and the blue dopant.

Accordingly, the OLED D including the first and third emitting parts 530 and 570 with the second emitting part 550, which emits yellow-green light or red/green light, can emit white light.

In FIG. 6, the OLED D has a triple-stack structure of the first, second and third emitting parts 530, 550 and 570. Alternatively, the OLED D may have a double-stack structure without the first emitting part 530 and the third emitting part 570.

Referring to FIG. 5 again, a second electrode 464 is formed over the substrate 110 where the organic emitting layer 162 is formed.

In the organic light emitting display device 400, since the light emitted from the organic emitting layer 462 is incident to the color filter layer 480 through the second electrode 464, the second electrode 464 has a thin profile for transmitting the light.

The first electrode 460, the organic emitting layer 462 and the second electrode 464 constitute the OLED D.

The color filter layer 480 is positioned over the OLED D and includes a red color filter 482, a green color filter 484 and a blue color filter 486 respectively corresponding to the red, green and blue pixels RP, GP and BP.

Although not shown, the color filter layer 480 may be attached to the OLED D by using an adhesive layer. Alternatively, the color filter layer 480 may be formed directly on the OLED D.

An encapsulation film (not shown) may be formed to prevent penetration of moisture into the OLED D. For example, the encapsulation film may include a first inorganic insulating layer, an organic insulating layer and a second inorganic insulating layer sequentially stacked, but it is not limited thereto. The encapsulation film may be omitted.

A polarization plate (not shown) for reducing an ambient light reflection may be disposed over the top-emission type OLED D. For example, the polarization plate may be a circular polarization plate.

In FIG. 5, the light from the OLED D passes through the second electrode 464, and the color filter layer 480 is disposed on or over the OLED D. Alternatively, when the light from the OLED D passes through the first electrode 460, the color filter layer 480 may be disposed between the OLED D and the first substrate 410.

A color conversion layer (not shown) may be formed between the OLED D and the color filter layer 480. The color conversion layer may include a red color conversion layer, a green color conversion layer and a blue color conversion layer respectively corresponding to the red, green and blue pixels RP, GP and BP. The white light from the OLED D is converted into the red light, the green light and the blue light by the red, green and blue color conversion layer, respectively.

As described above, the white light from the organic light emitting diode D passes through the red color filter 482, the green color filter 484 and the blue color filter 486 in the red pixel RP, the green pixel GP and the blue pixel BP such that the red light, the green light and the blue light are provided from the red pixel RP, the green pixel GP and the blue pixel BP, respectively.

In FIGS. 5 and 6, the OLED D emitting the white light is used for a display device. Alternatively, the OLED D may be formed on an entire surface of a substrate without at least one of the driving element and the color filter layer to be used for a lightening device. The display device and the lightening device each including the OLED D of the present disclosure may be referred to as an organic light emitting device.

Figure 7:
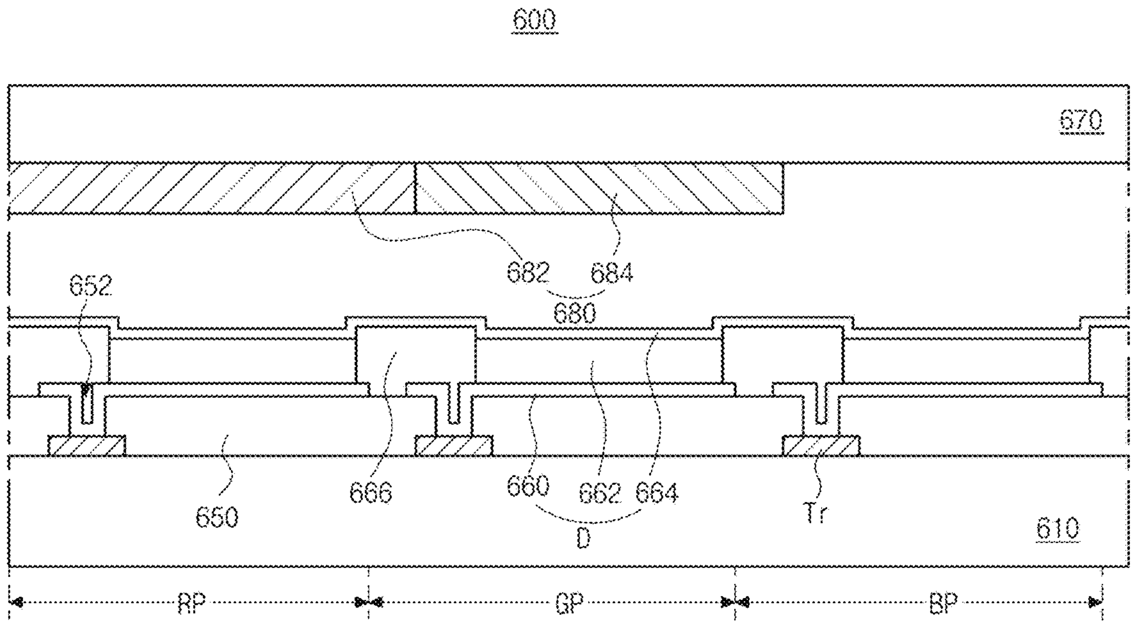
FIG. 7 is a schematic cross-sectional view illustrating an organic light emitting display device according to a third embodiment of the present disclosure.

FIG. 7 is a schematic cross-sectional view illustrating an organic light emitting display device according to a third embodiment of the present disclosure.

As shown in FIG. 7, the organic light emitting display device 600 includes a first substrate 610, where a red pixel BP, a green pixel GP and a blue pixel BP are defined, a second substrate 670 facing the first substrate 610, an OLED D, which is positioned between the first and second substrates 610 and 670 and providing white emission, and a color conversion layer 680 between the OLED D and the second substrate 470.

Although not shown, a color filter may be formed between the second substrate 670 and each color conversion layer 680.

A TFT Tr, which corresponding to each of the red, green and blue pixels RP, GP and BP, is formed on the first substrate 610, and a passivation layer 650, which has a drain contact hole 652 exposing an electrode, e.g., a drain electrode, of the TFT Tr is formed to cover the TFT Tr.

The OLED D including a first electrode 660, an organic emitting layer 662 and a second electrode 664 is formed on the passivation layer 650. In this instance, the first electrode 660 may be connected to the drain electrode of the TFT Tr through the drain contact hole 652.

An bank layer 666 covering an edge of the first electrode 660 is formed at a boundary of the red, green and blue pixel regions RP, GP and BP.

The OLED D emits a blue light and may have a structure shown in FIG. 3 or FIG. 4. Namely, the OLED D is formed in each of the red, green and blue pixels RP, GP and BP and provides the blue light.

The color conversion layer 680 includes a first color conversion layer 682 corresponding to the red pixel RP and a second color conversion layer 684 corresponding to the green pixel GP. For example, the color conversion layer 680 may include an inorganic color conversion material such as a quantum dot.

The blue light from the OLED D is converted into the red light by the first color conversion layer 682 in the red pixel RP, and the blue light from the OLED D is converted into the green light by the second color conversion layer 684 in the green pixel GP.

Accordingly, the organic light emitting display device 600 can display a full-color image.

On the other hand, when the light from the OLED D passes through the first substrate 610, the color conversion layer 680 is disposed between the OLED D and the first substrate 610.

While the present disclosure has been described with reference to exemplary embodiments and examples, these embodiments and examples are not intended to limit the scope of the present disclosure. Rather, it will be apparent to those skilled in the art that various modifications and variations can be made in the present disclosure without departing from the spirit or scope of the invention. Thus, it is intended that the present disclosure cover the modifications and variations of the present disclosure provided they come within the scope of the appended claims and their equivalents.

The various embodiments described above can be combined to provide further embodiments. All of patents, patent application publications, patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting diode (OLED), comprising:

a first electrode;

a second electrode facing the first electrode; and a first emitting material layer including a first host, a second host and a first blue dopant and positioned between the first and second electrodes, wherein the first host is an undeuterated anthracene derivative, and the second host is a deuterated anthracene derivative, wherein the second host is represented by Formula 3:

Formula 3

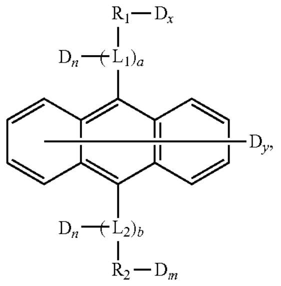

wherein each of $R_1$ and $R_2$ is independently $C_6$~$C_{30}$ aryl group or $C_5$~$C_{30}$ heteroaryl group, and each of $L_1$ and $L_2$ is independently $C_6$~$C_{30}$ arylene group, wherein each of a and b is an integer of 0 or 1, and at least one of a and b is 0, and wherein each of x, y, m and n is independently a positive integer, and a summation of x, y, m and n may be 15 to 29.

2. The OLED of claim 1, wherein in the Formula 3, R1 is phenyl or naphthyl, and R2 is naphthyl, dibenzofuranyl or fused dibenzofuranyl.

3. The OLED of claim 1, wherein in the Formula 3, each of L1 and L2 is independently phenylene.

4. The OLED of claim 1, wherein the second host is one of compounds selected from Formula 4:

Formula 4

Host 31

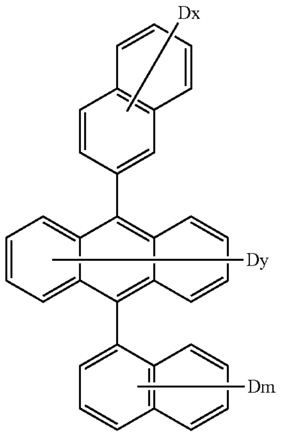

(x + y + m = 20-22)

Host 32

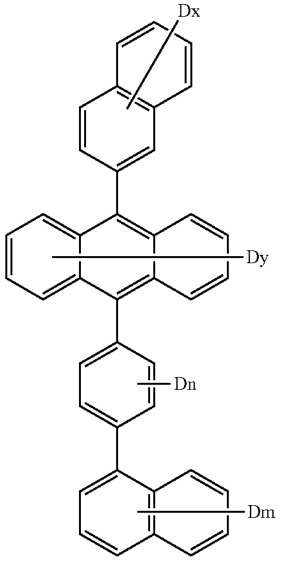

(x + y + n + m = 21-23)

Host 33

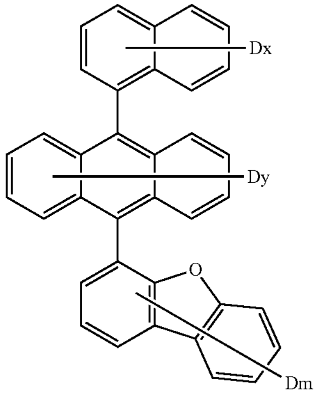

(x + y + m = 20-22)

-continued
Host 34
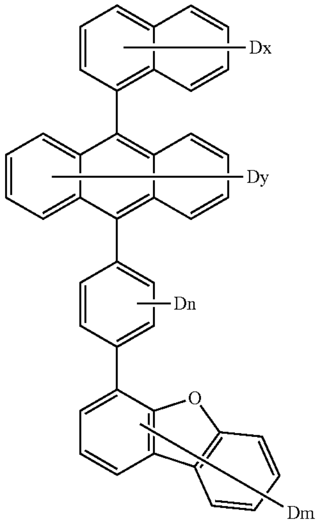
(x + y + n + m = 21-23)
Host 35
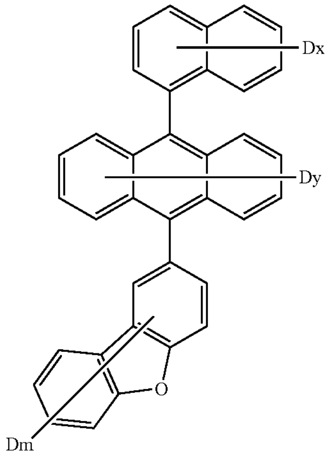
(x + y + m = 20-22)
Host 36
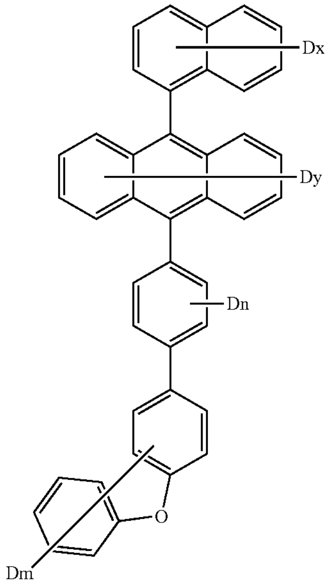
(x + y + n + m = 21-23)
-continued
Host 37
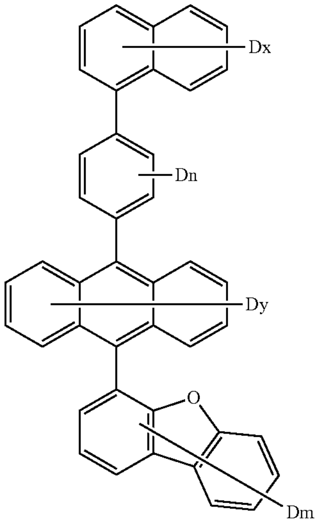
(x + y + n + m = 21-23)
Host 38
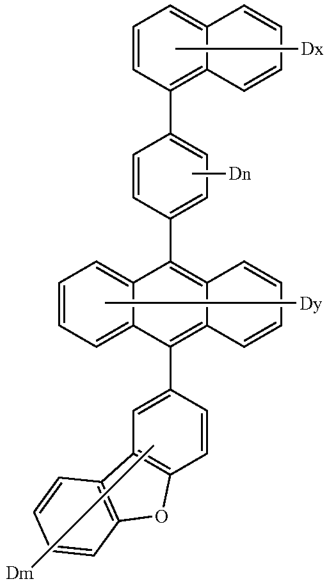
(x + y + n + m = 21-23)

-continued
Host 39
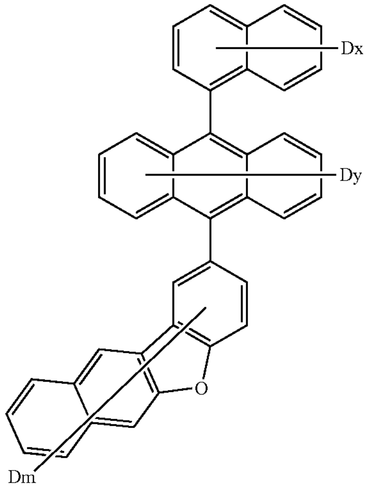
(x + y + m = 22-24)
Host 40
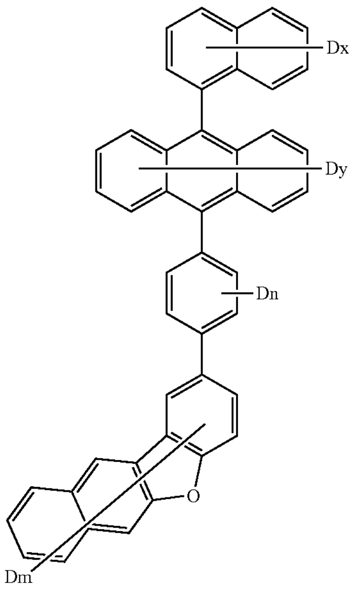
(x + y + n + m = 23-25)
Host 41
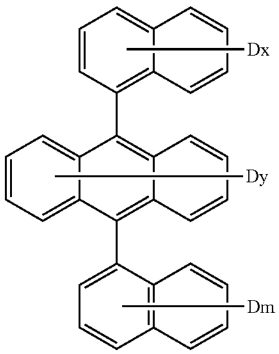
(x + y + m = 20-22)
-continued
Host 42
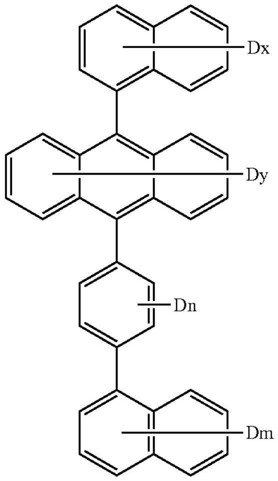
(x + y + n + m = 21-23)
Host 43
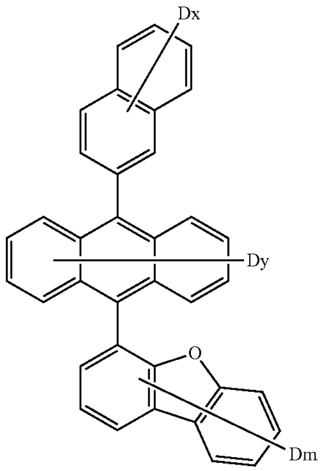
(x + y + m = 20-22)
Host 44
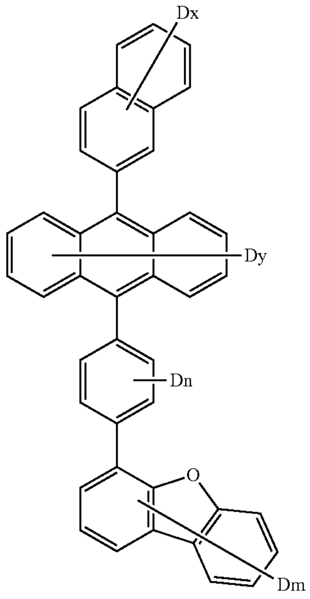
(x + y + n + m = 21-23)

-continued
Host 45
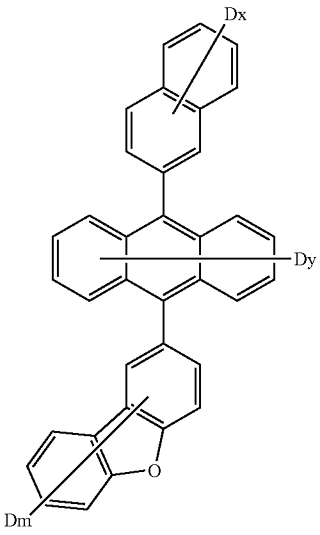
(x + y + m = 20-22)
Host 46
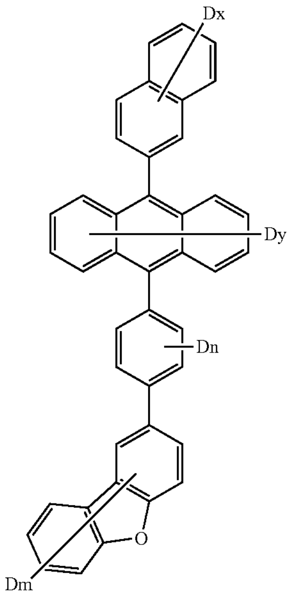
(x + y + n + m = 21-23)
-continued
Host 47
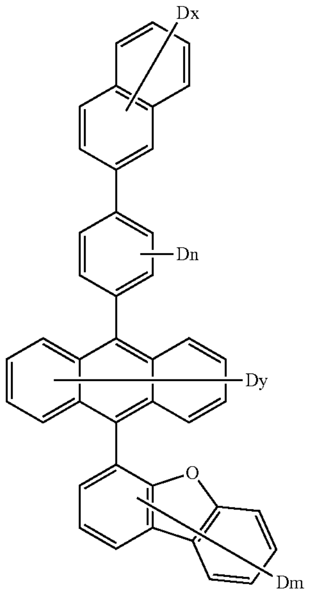
(x + y + n + m = 21-23)
Host 48
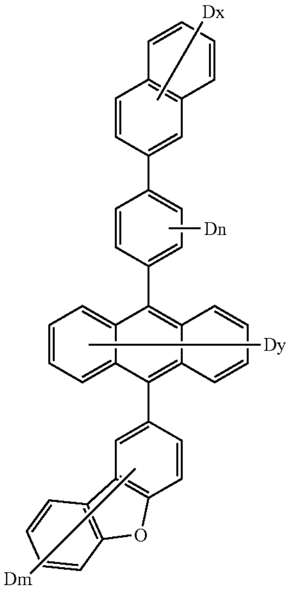
(x + y + n + m = 21-23)

-continued
Host 49
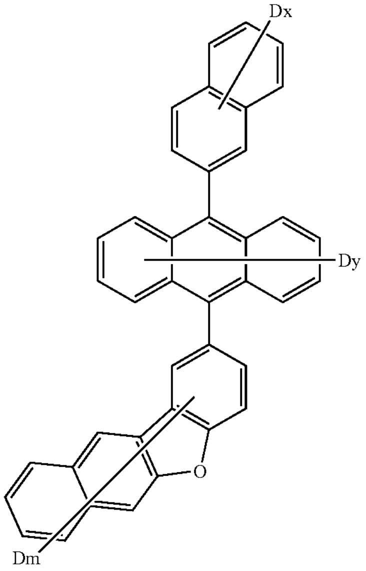
(x + y + m = 22-24)
Host 50
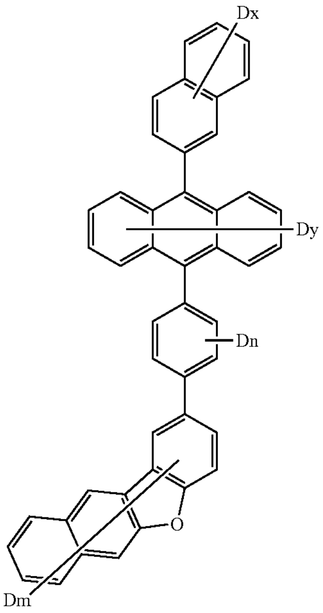
(x + y + n + m = 23-25)
Host 51
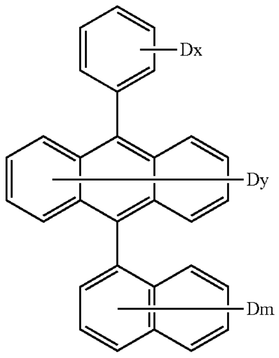
(x + y + m = 18-20)
-continued
Host 52
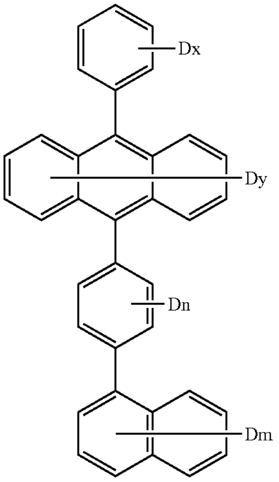
(x + y + n + m = 19-21)
Host 53
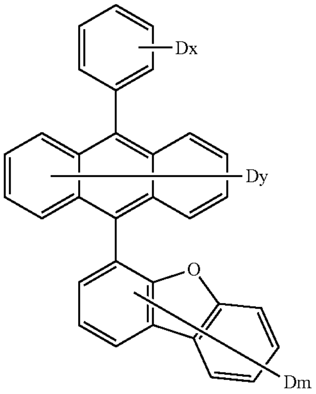
(x + y + m = 18-20)
Host 54
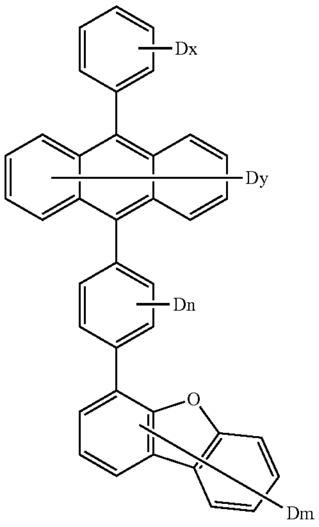
(x + y + n + m = 19-21)

-continued
Host 55
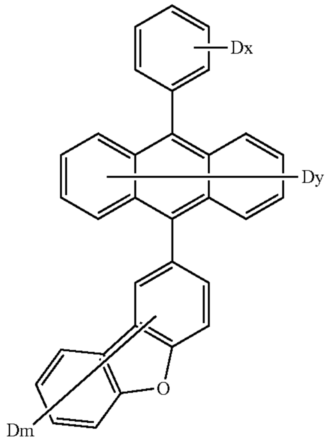
(x + y + m = 18-20)
Host 56
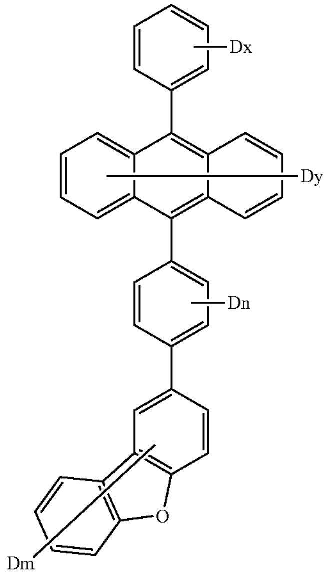
(x + y + n + m = 18-20)
Host 57
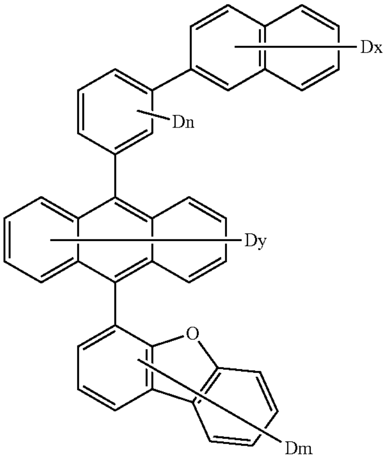
(x + y + n + m = 18-20)
-continued
Host 58
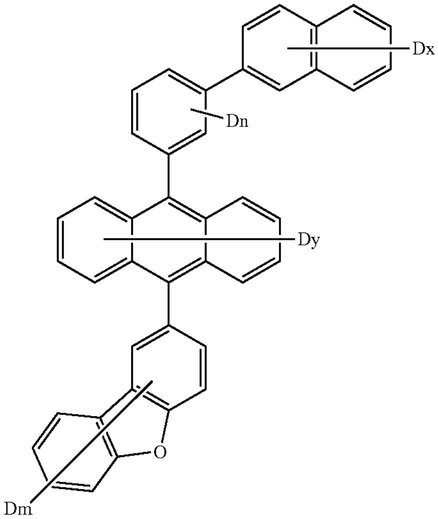
(x + y + n + m = 21-23)
Host 59
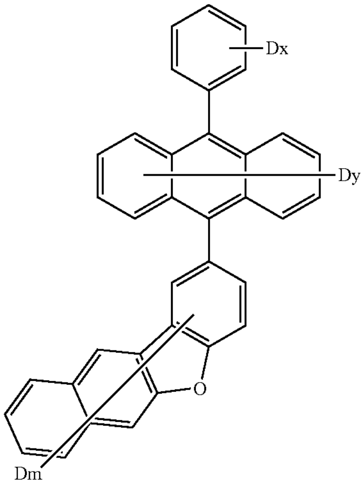
(x + y + m = 20-22)

-continued
Host 60
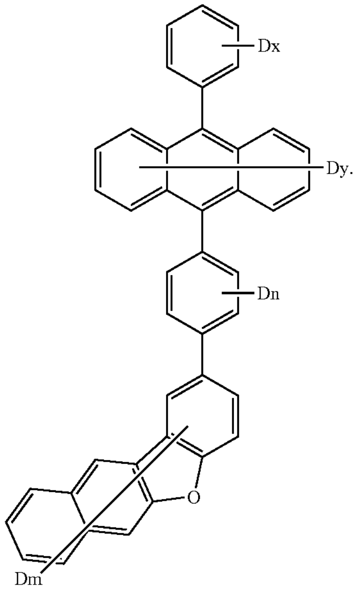
(x + y + n + m = 21-22)
5. The OLED of claim 1, wherein the first host is represented by Formula 1:
Formula 1
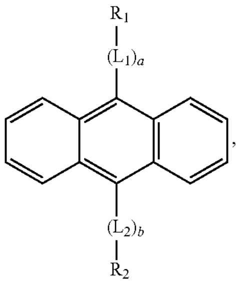
wherein the definition of $R_1$, $R_2$, $L_1$, $L_2$, a and b is a same as the Formula 3.
6. The OLED of claim 2, wherein the first host is one of compounds selected from Formula 2:
Formula 2
Host 1
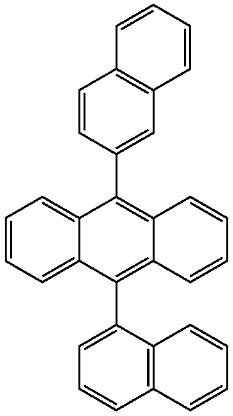
Host 2
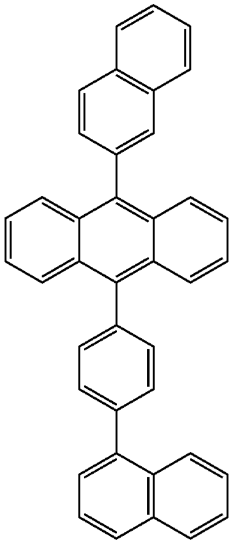
Host 3
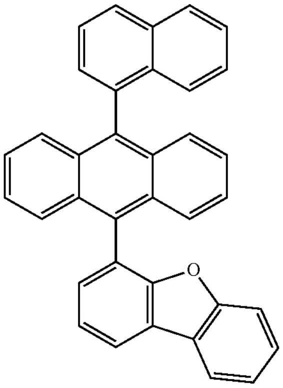

-continued
Host 4
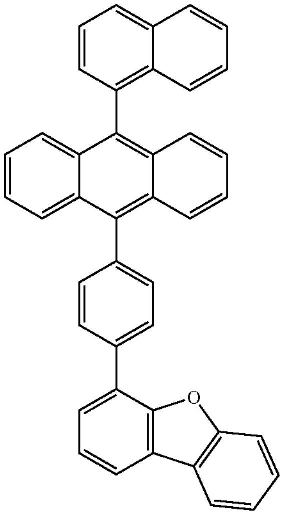
Host 5
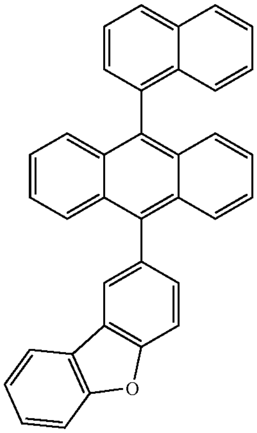
Host 6
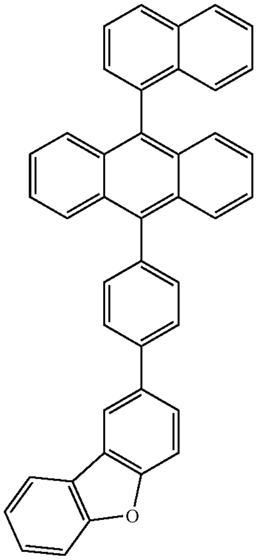
-continued
Host 7
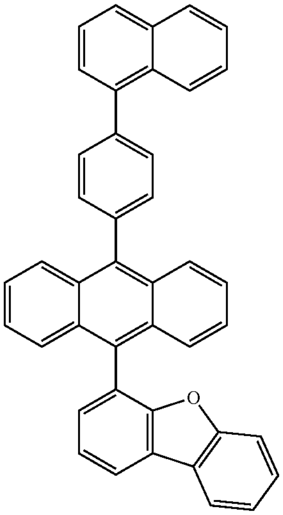
Host 8
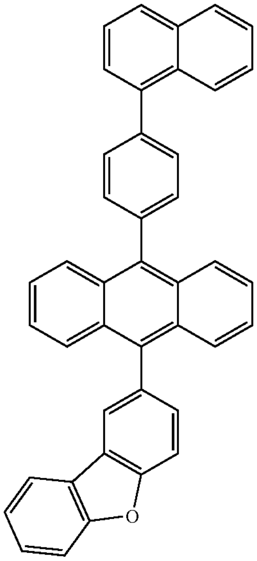
Host 9
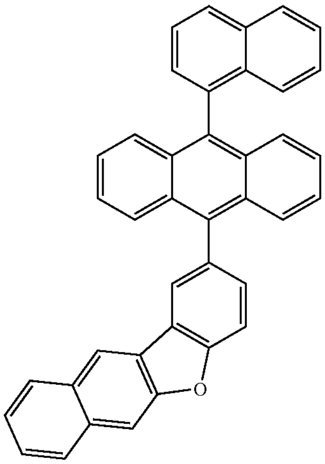

-continued
Host 10
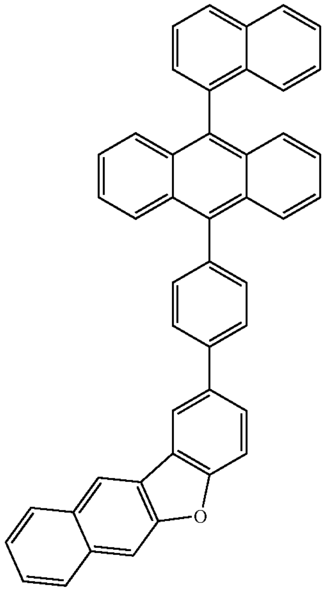
Host 11
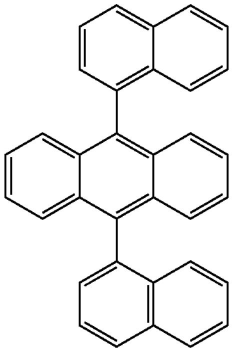
Host 12
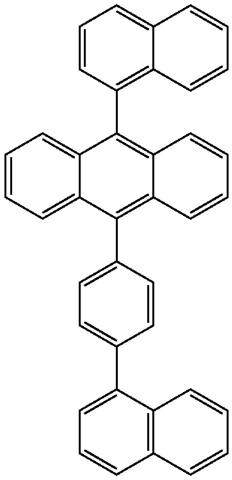
-continued
Host 13
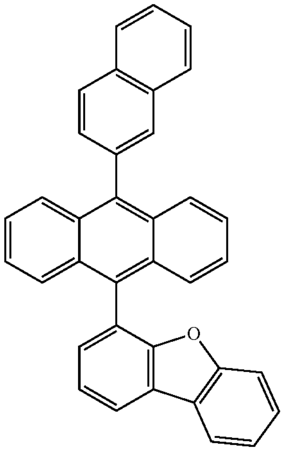
Host 14
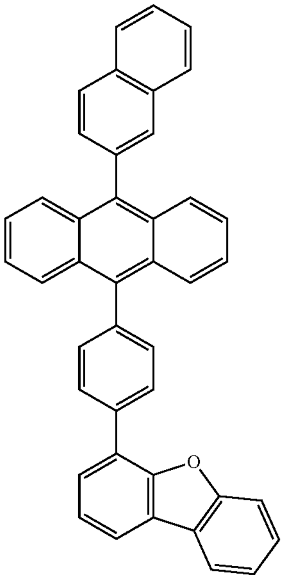
Host 15
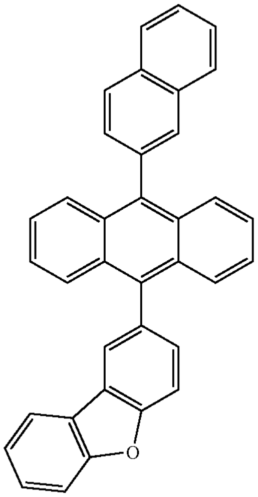

-continued
Host 16
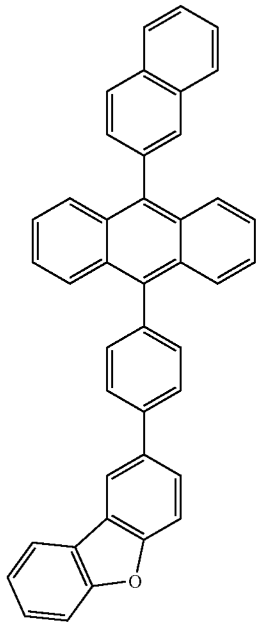
Host 17
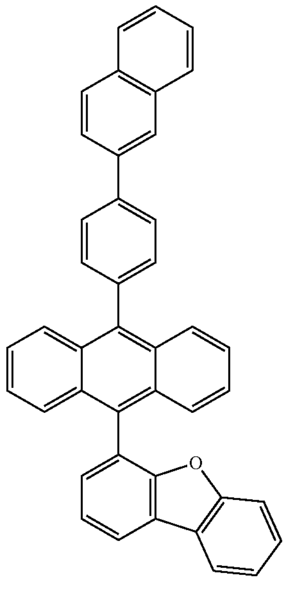
-continued
Host 18
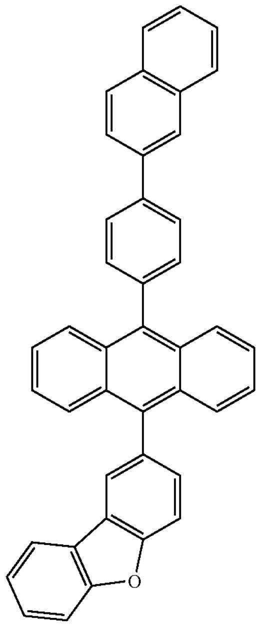
Host 19
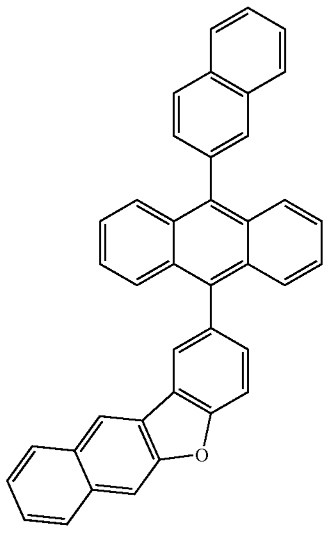

-continued
Host 20
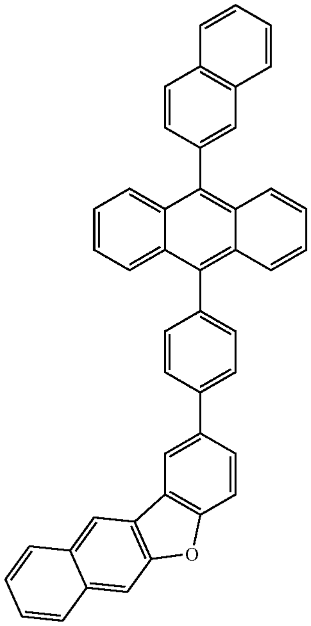
Host 21
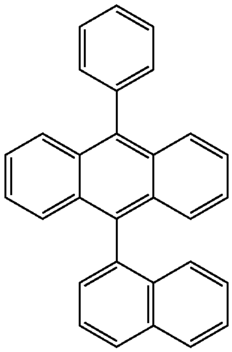
Host 22
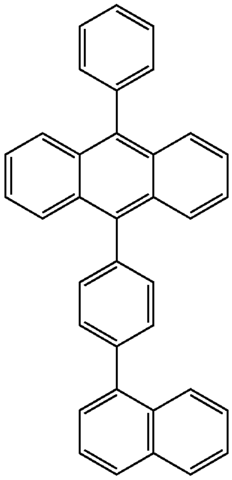
-continued
Host 23
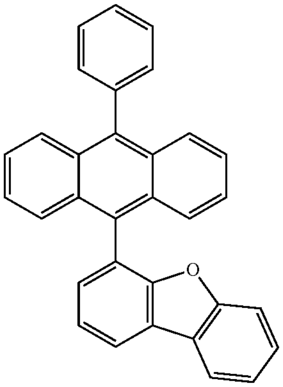
Host 24
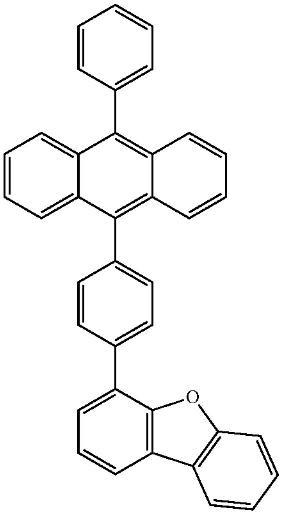
Host 25
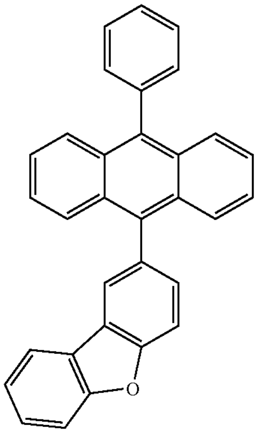

-continued

Host 26

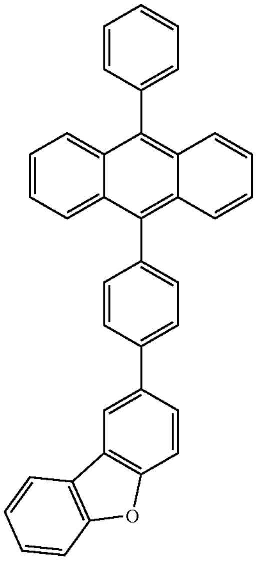

Host 27

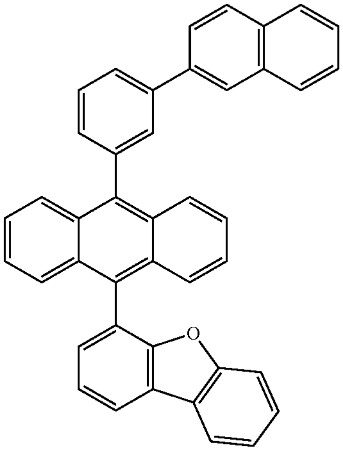

Host 28

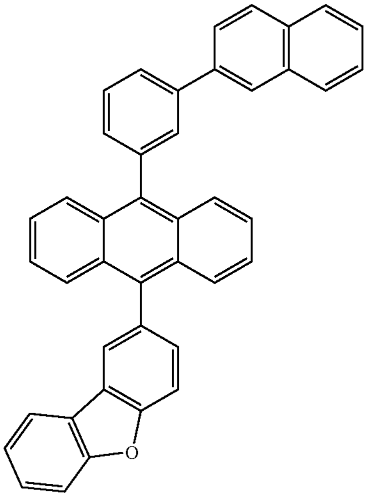

-continued

Host 29

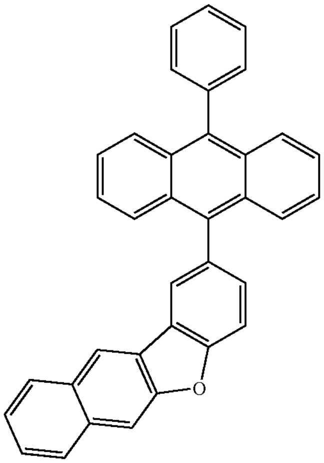

Host 30

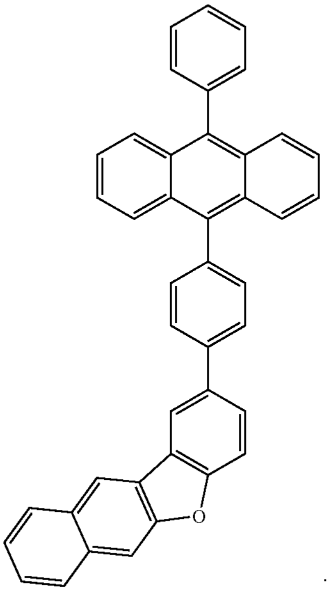

7. The OLED of claim 1, wherein a weight % ratio of the first host to the second host is 1:9 to 9:1.

8. The OLED of claim 6, wherein a weight % ratio of the first host to the second host is 1:9 to 7:3.

9. The OLED of claim 6, wherein a weight % ratio of the first host to the second host is 3:7.

10. The OLED of claim 6, wherein a weight % ratio of the first host to the second host is 7:3.

11. The OLED of claim 1, wherein the second host is a compound in which all or part of hydrogen of the first host is substituted with deuterium.

12. The OLED of claim 1, wherein the first blue dopant is represented by Formula 5-1:

Formula 5-1

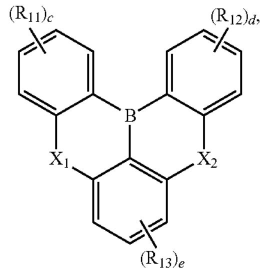

wherein in Formula 5-1, each of c and d is independently an integer of 0 to 4, and e is an integer of 0 to 3, wherein each of $R_{11}$ and $R_{12}$ is independently selected from the group consisting of $C_1$~$C_{20}$ alkyl group, $C_6$~$C_{30}$ aryl group, $C_5$~$C_{30}$ hetero aryl group and $C_6$~$C_{30}$ aryl amino group, or adjacent two among $R_{11}$ or adjacent two among $R_{12}$ form a fused aromatic ring or a hetero-aromatic ring, wherein $R_{13}$ is selected from the group consisting of $C_1$~$C_{10}$ alkyl group, $C_6$~$C_{30}$ aryl group, $C_5$~$C_{30}$ hetero aryl group and $C_5$~$C_{30}$ aromatic amino group, wherein each of $X_1$ and $X_2$ is independently oxygen (O) or $NR_{14}$, and $R_{14}$ is $C_6$~$C_{30}$ aryl group.

13. The OLED of claim 1, wherein the first blue dopant is one of compounds selected from Formula 6:

Formula 6

Dopant 1

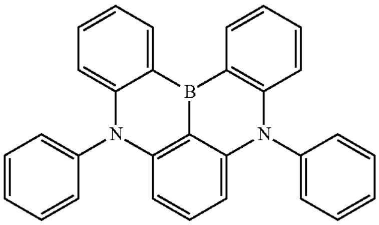

Dopant 2

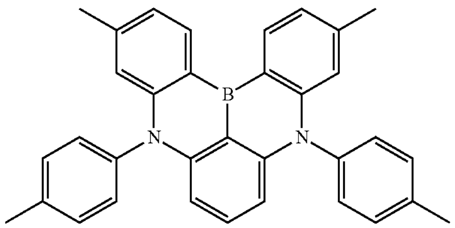

Dopant 3

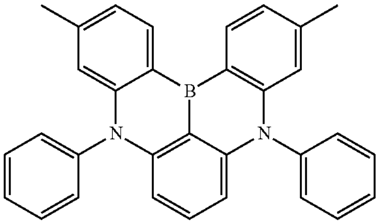

-continued

Dopant 4

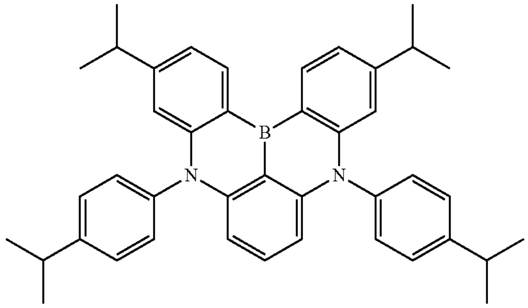

Dopant 5

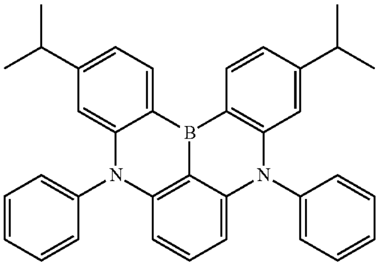

Dopant 6

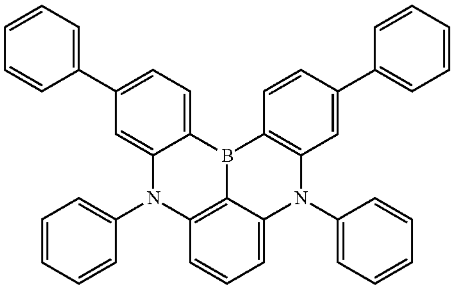

Dopant 7

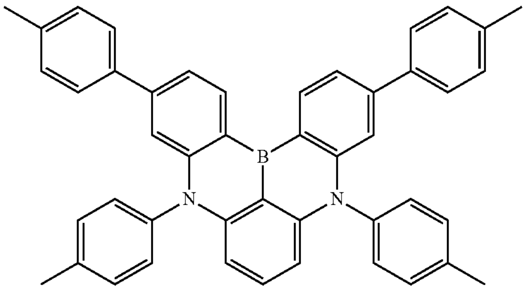

Dopant 8

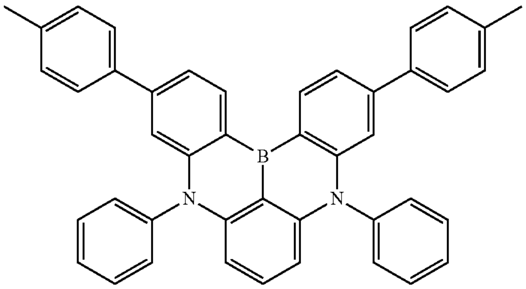

-continued
Dopant 9
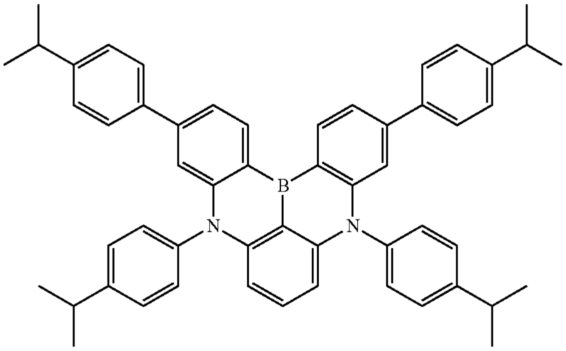
Dopant 10
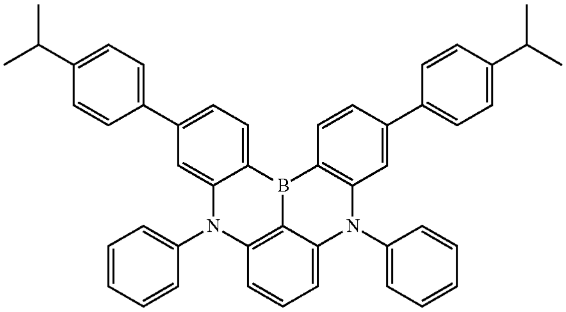
Dopant 11
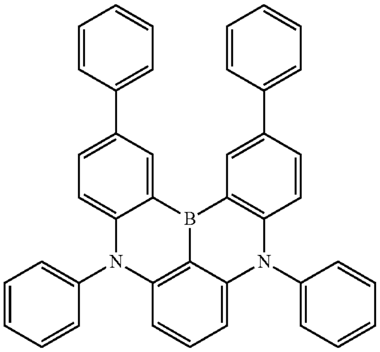
Dopant 12
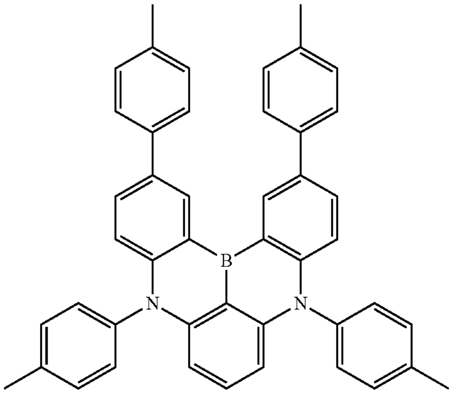
-continued
Dopant 13
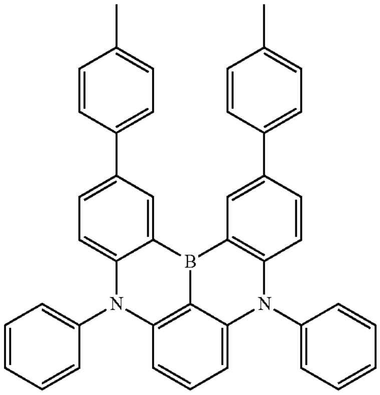
Dopant 14
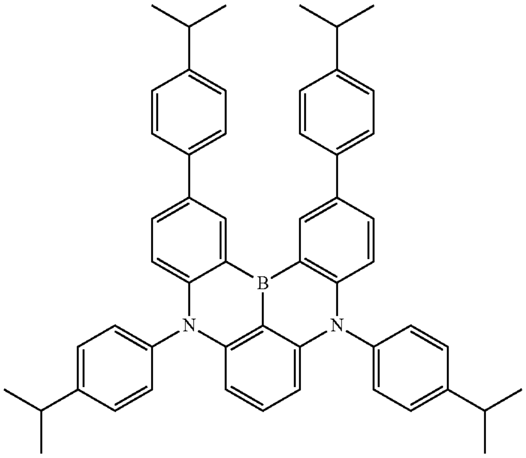
Dopant 15
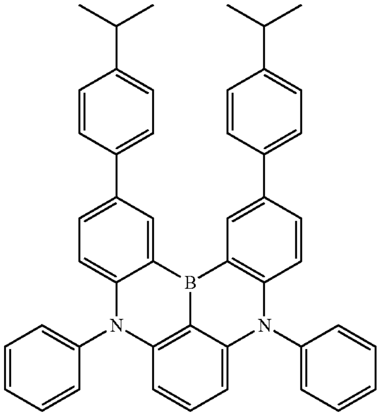
Dopant 16
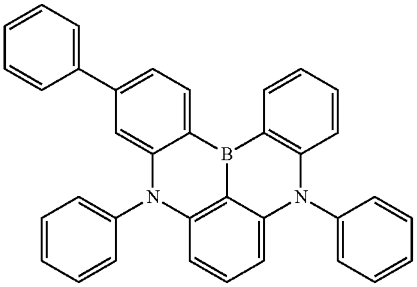

-continued
Dopant 17
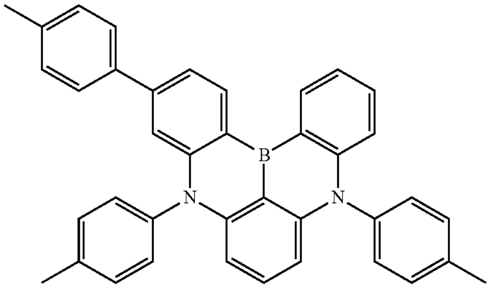
Dopant 18
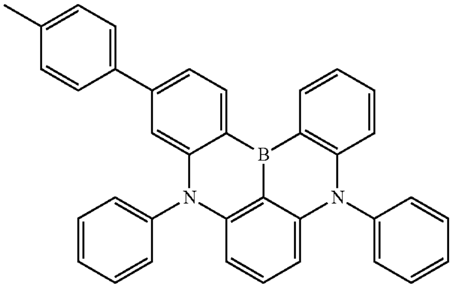
Dopant 19
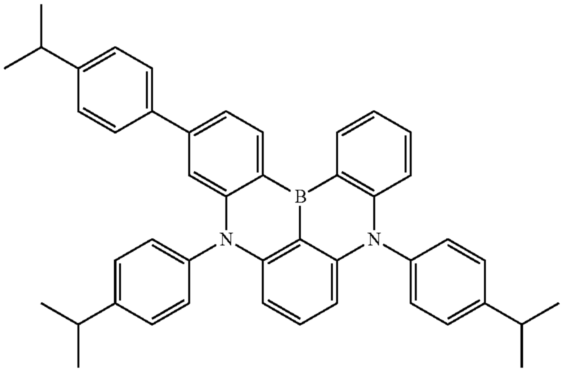
Dopant 20
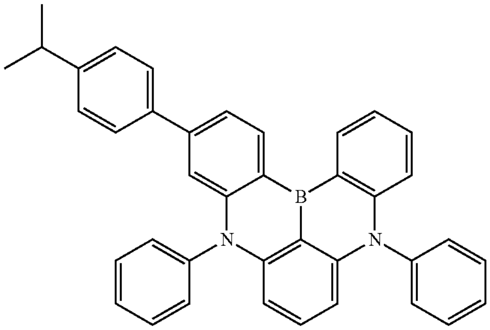
-continued
Dopant 21
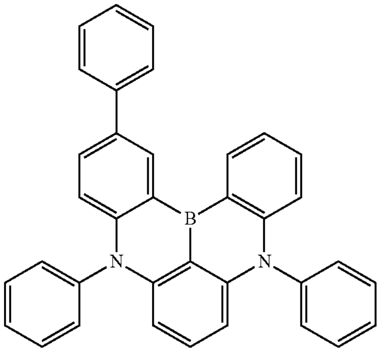
Dopant 22
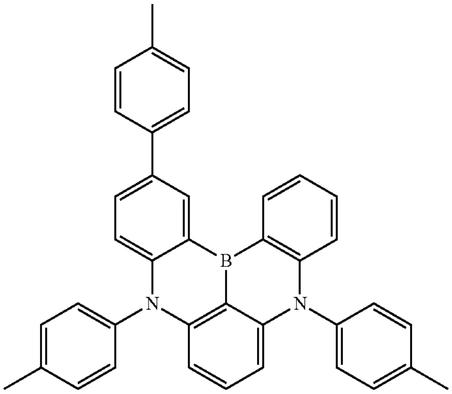
Dopant 23
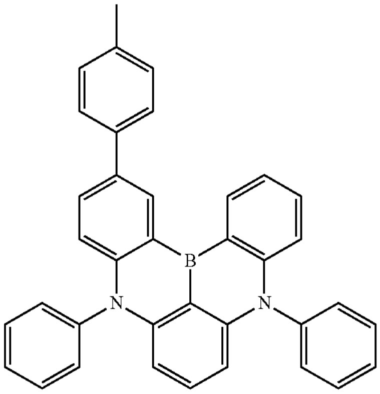
Dopant 24
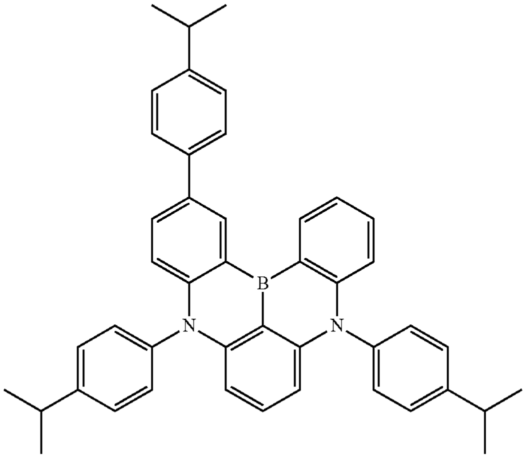

-continued
Dopant 25
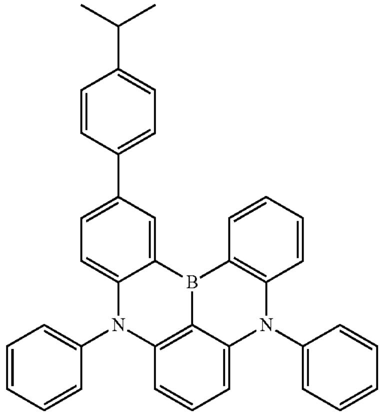
Dopant 26
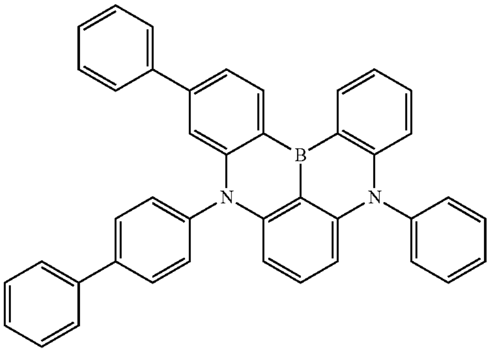
Dopant 27
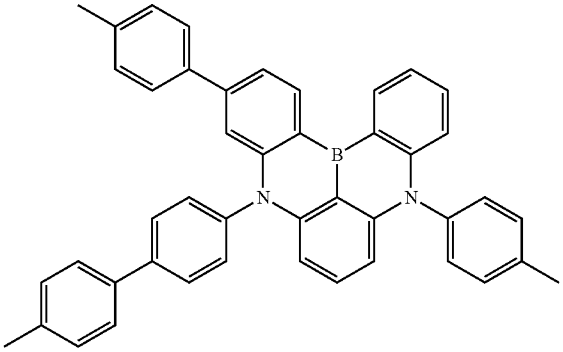
Dopant 28
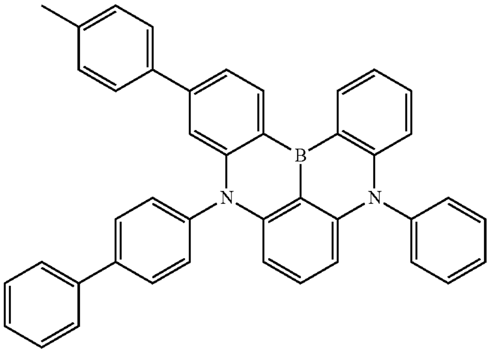
-continued
Dopant 29
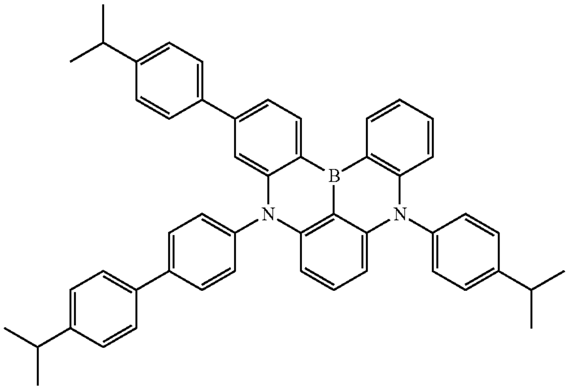
Dopant 30
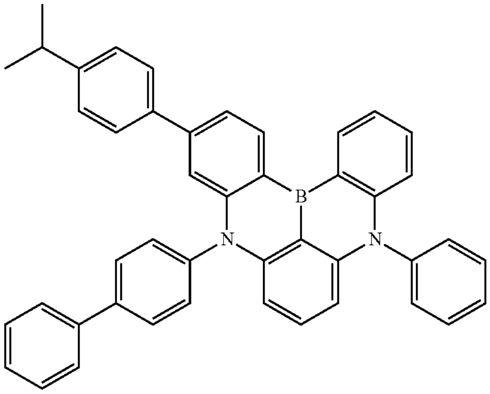
Dopant 31
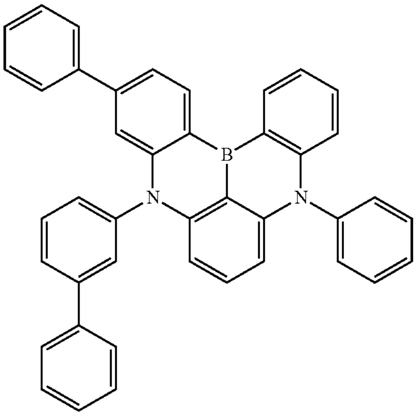

-continued
Dopant 32
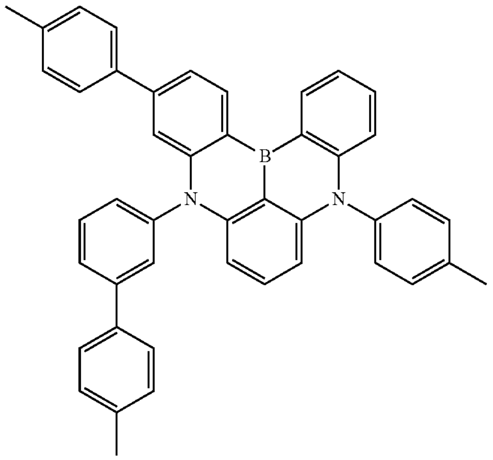
Dopant 33
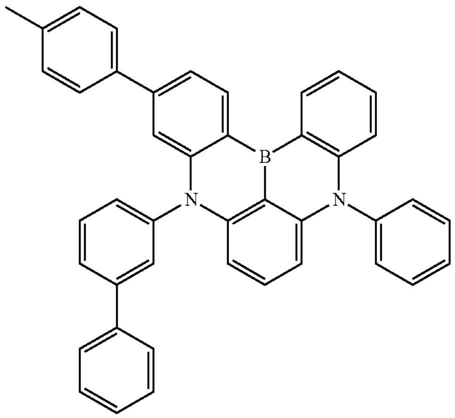
Dopant 34
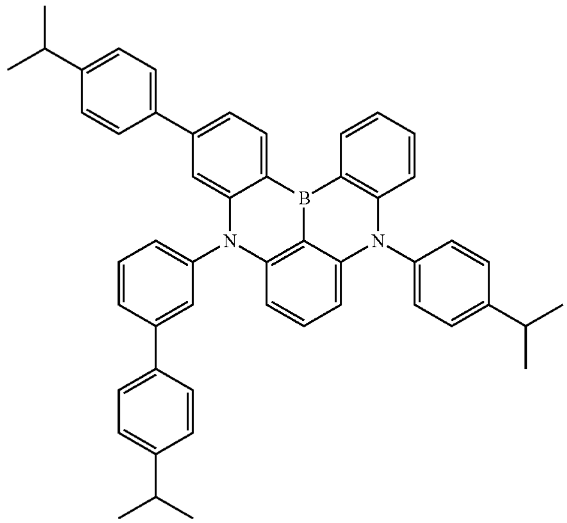
-continued
Dopant 35
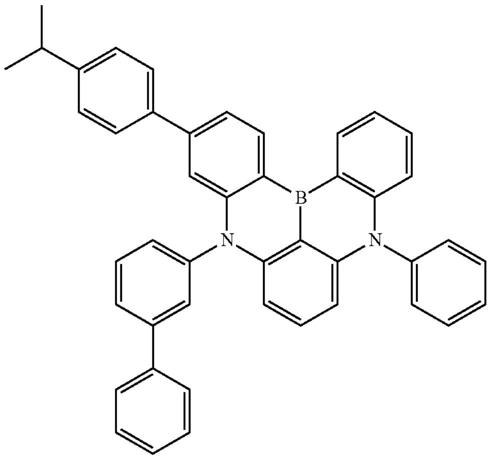
Dopant 36
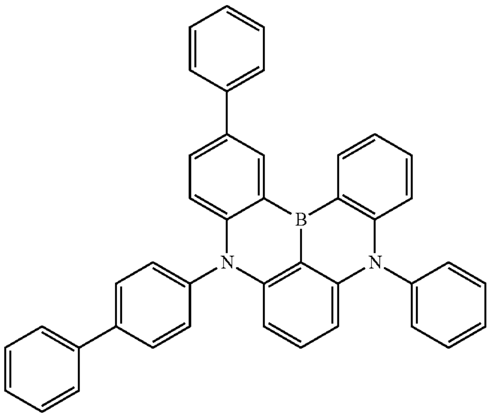
Dopant 37
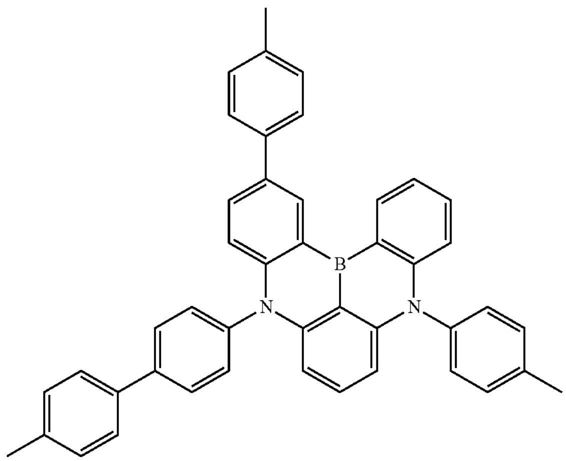

-continued
Dopant 38
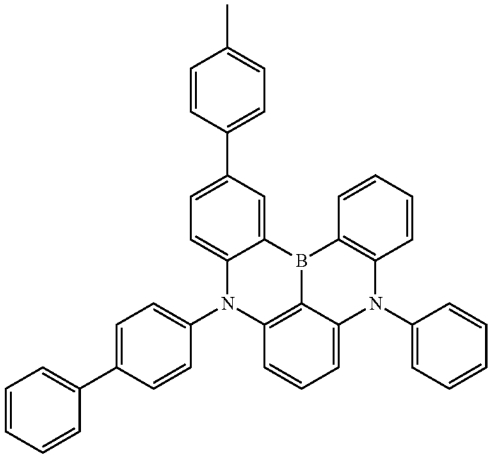
Dopant 39
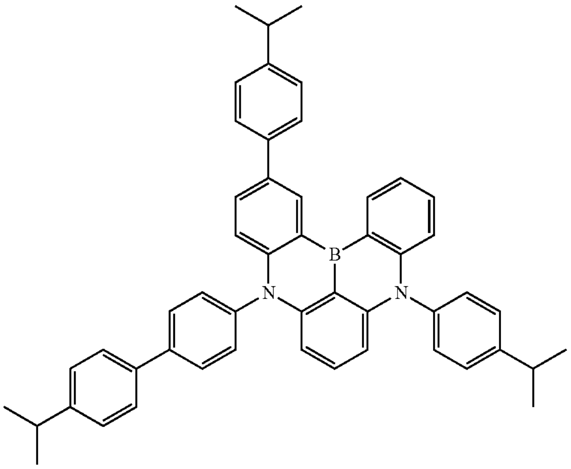
Dopant 40
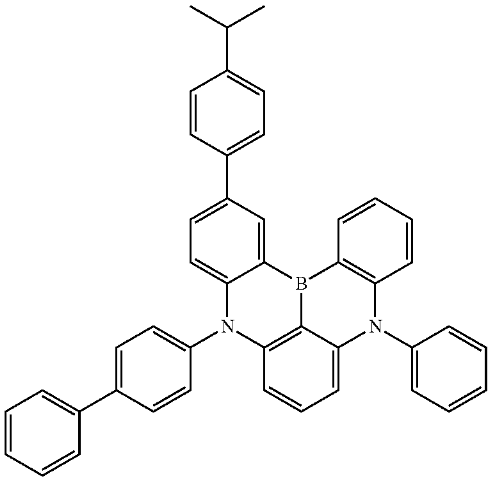
-continued
Dopant 41
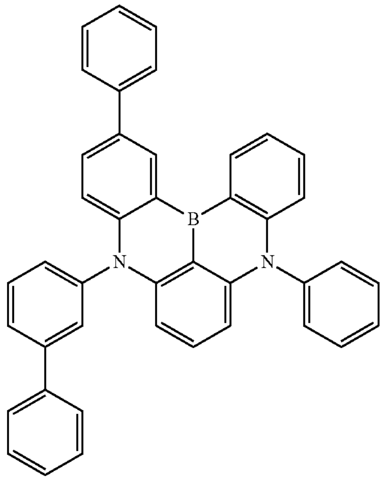
Dopant 42
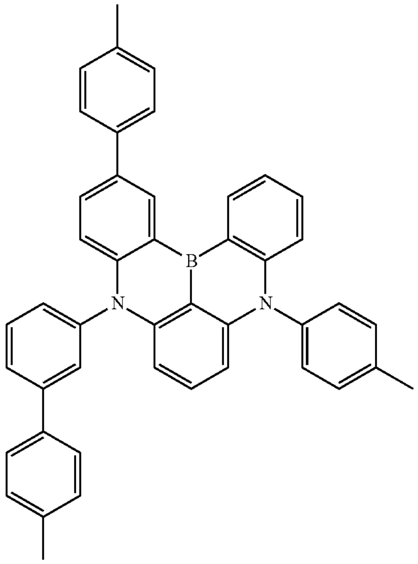
Dopant 43
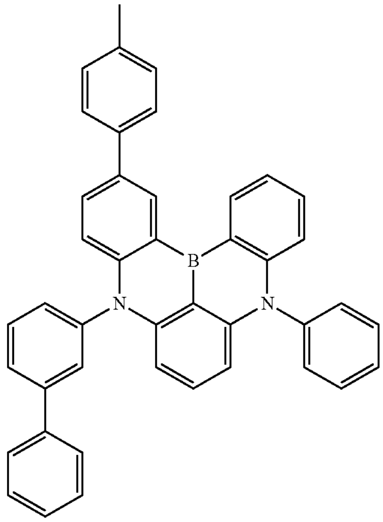

-continued
Dopant 44
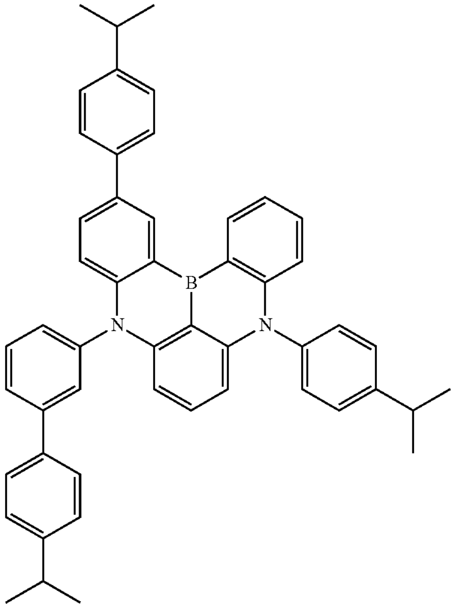
Dopant 45
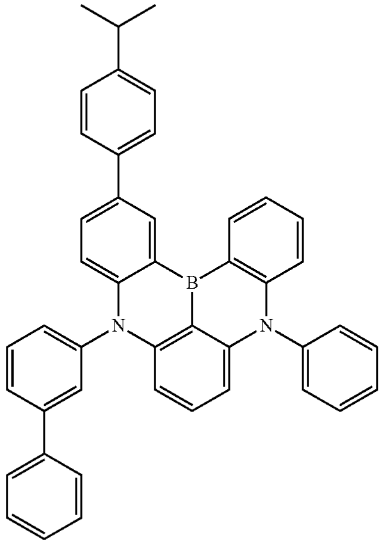
Dopant 46
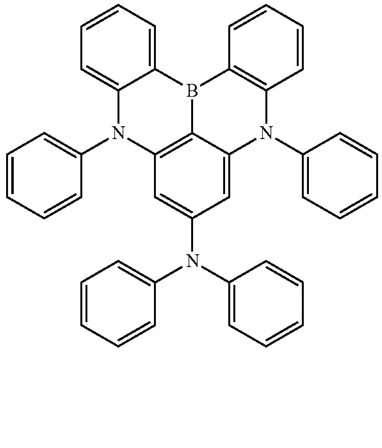
-continued
Dopant 47
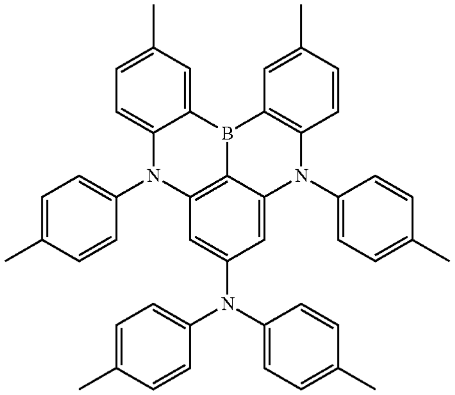
Dopant 48
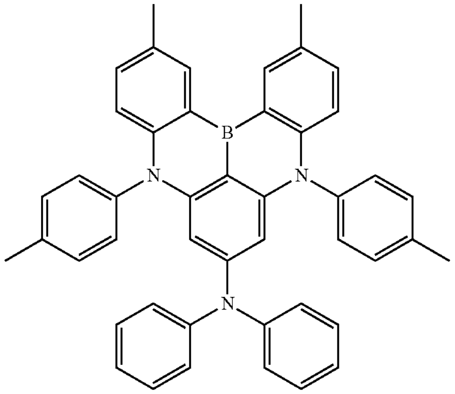
Dopant 49
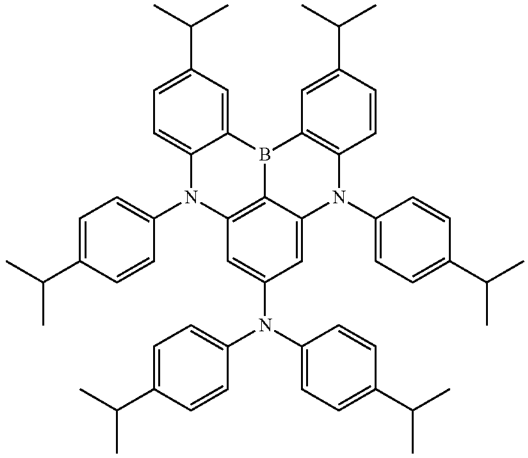

-continued
Dopant 50
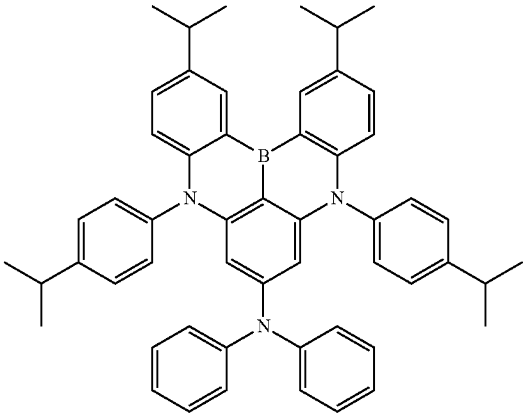
Dopant 51
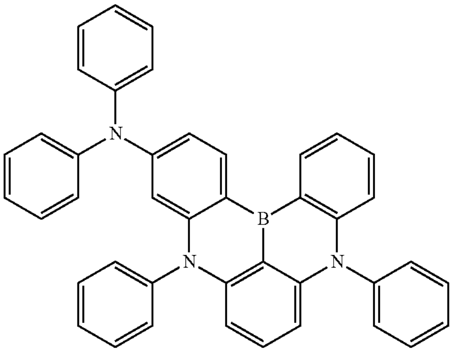
Dopant 52
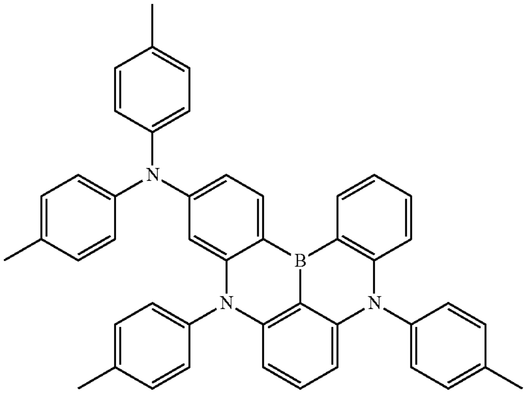
Dopant 53
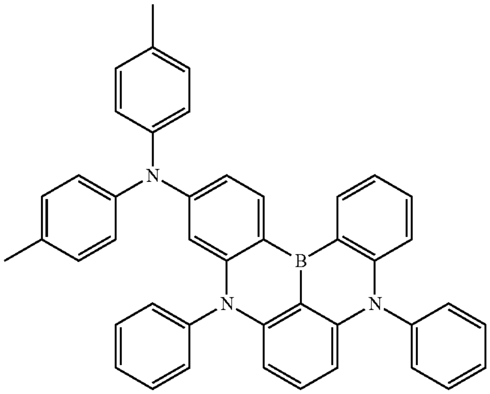
-continued
Dopant 54
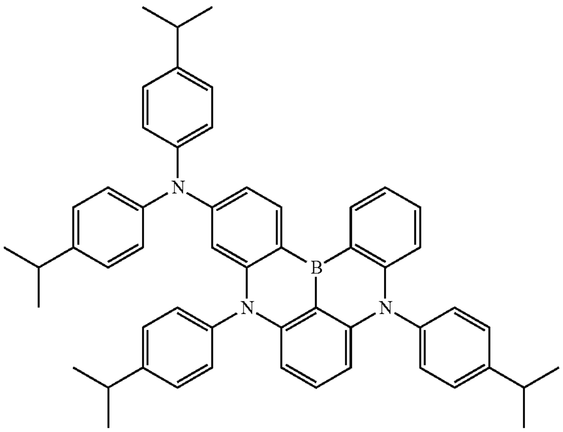
Dopant 55
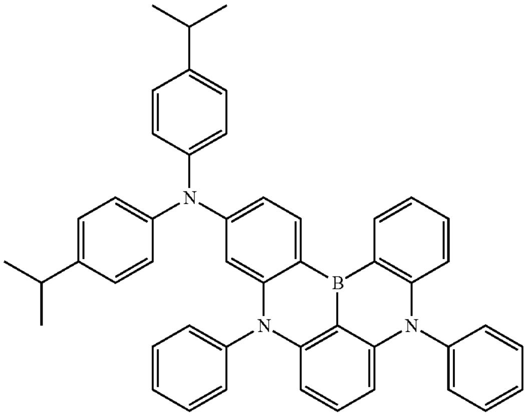
Dopant 56
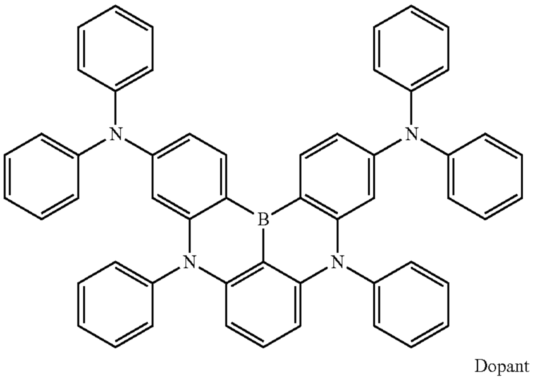
Dopant 57
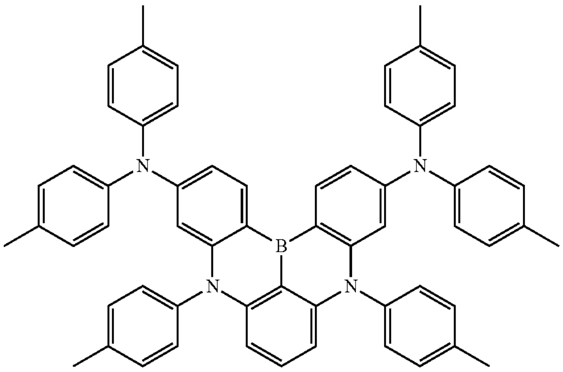

Dopant 58
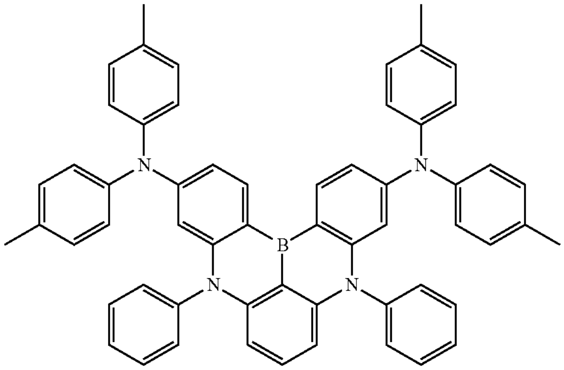
Dopant 59
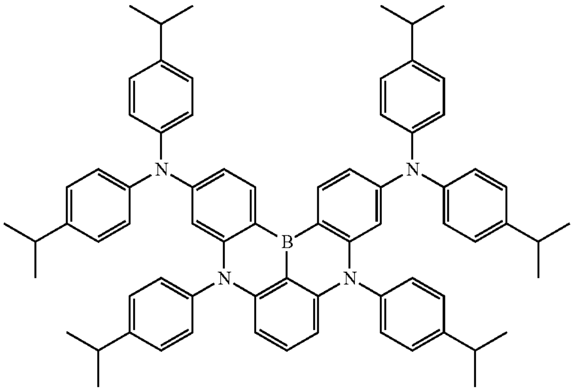
Dopant 60
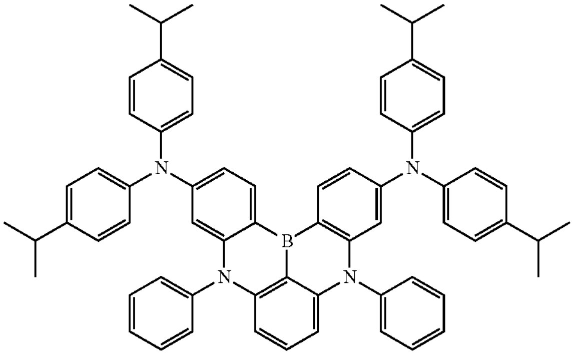
Dopant 61
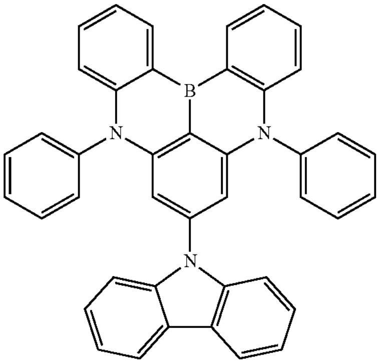
Dopant 62
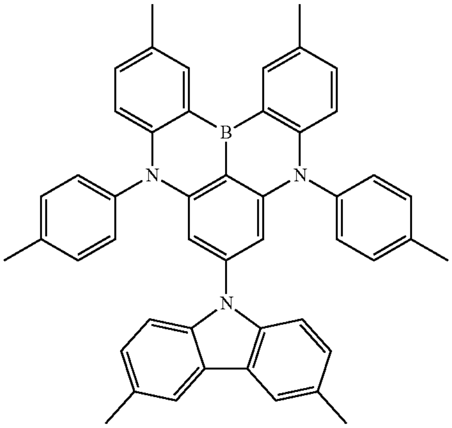
Dopant 63
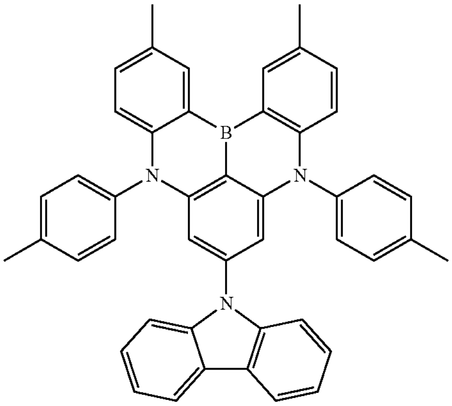
Dopant 64
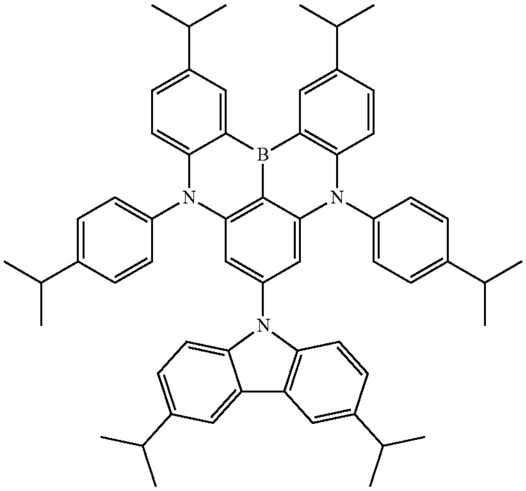

-continued
Dopant 65
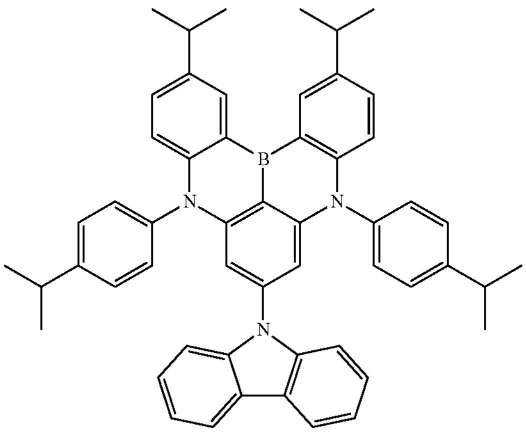
Dopant 66
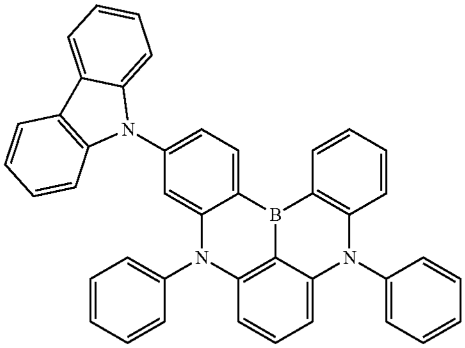
Dopant 67
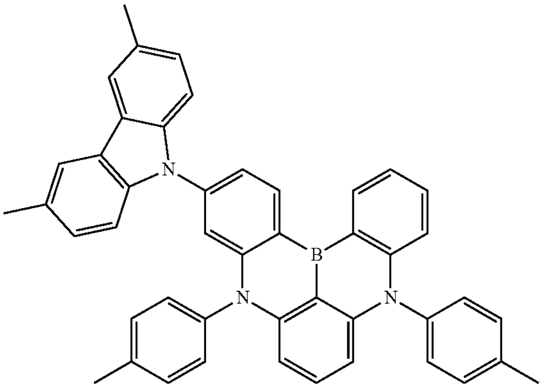
Dopant 68
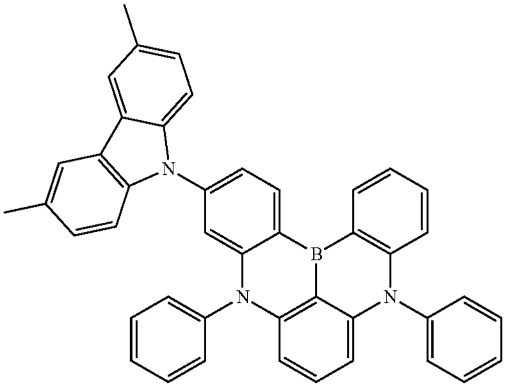
-continued
Dopant 69
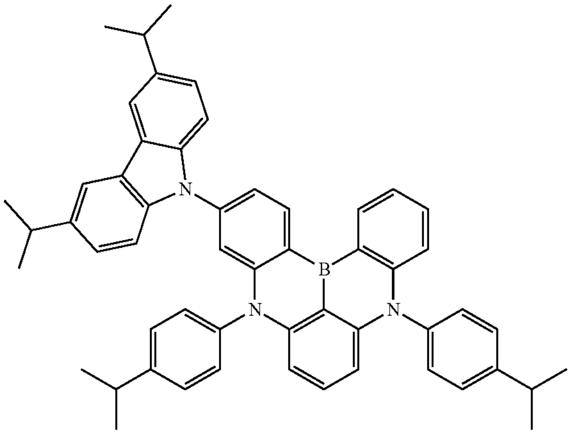
Dopant 70
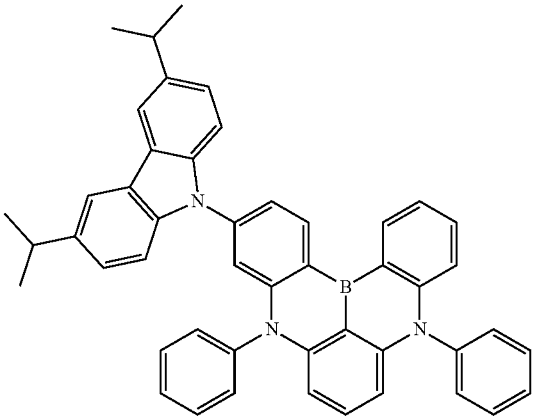
Dopant 71
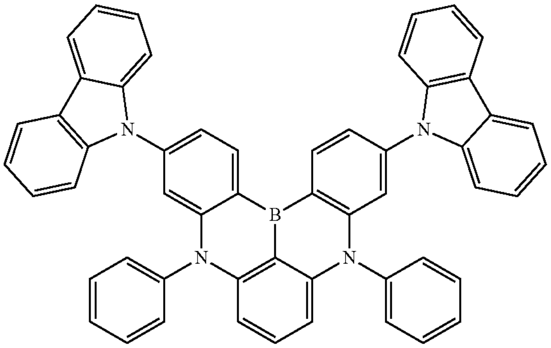
Dopant 72
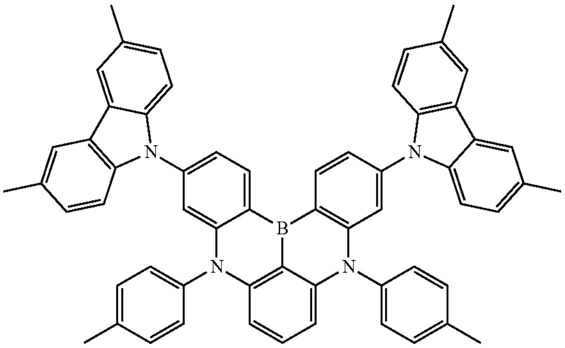

-continued
Dopant 73
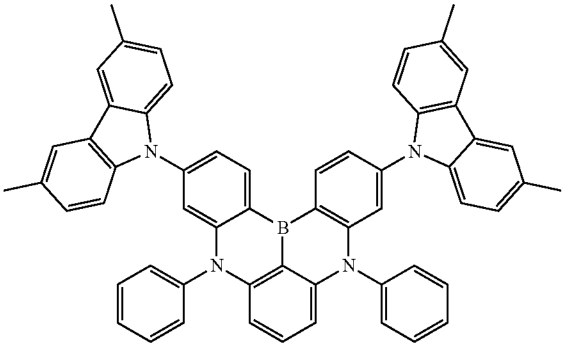
Dopant 74
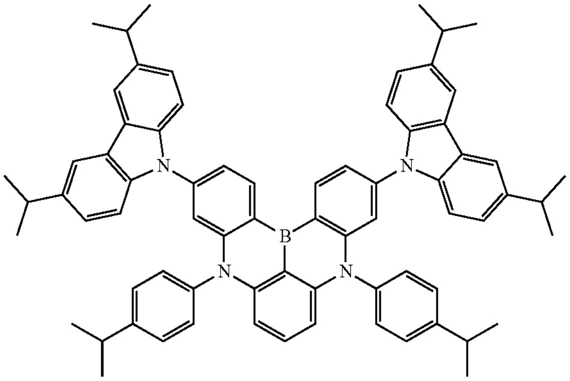
Dopant 75
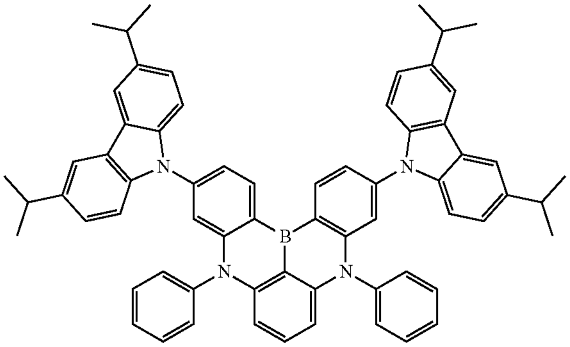
Dopant 76
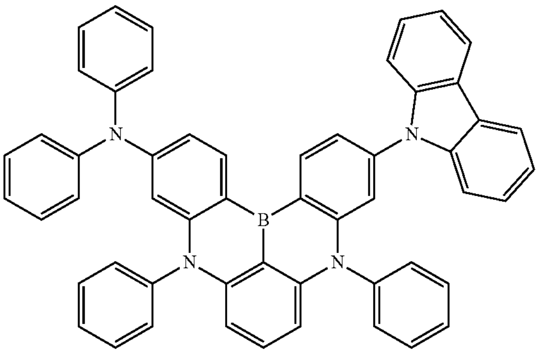
-continued
Dopant 77
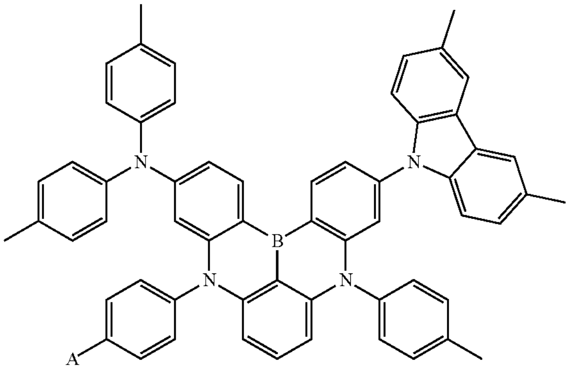
Dopant 78
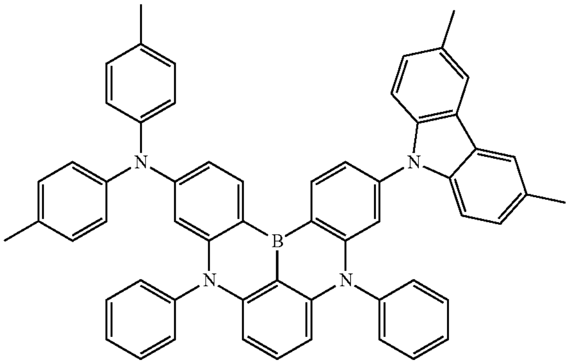
Dopant 79
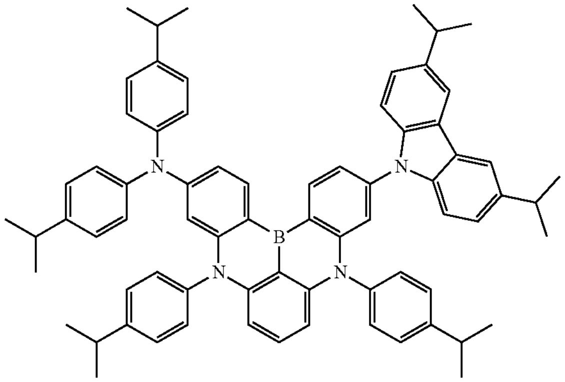
Dopant 80
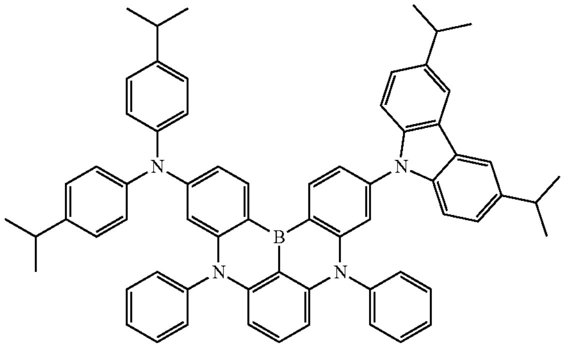

-continued
Dopant 81
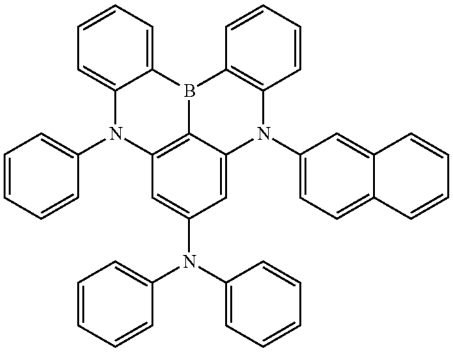
Dopant 82
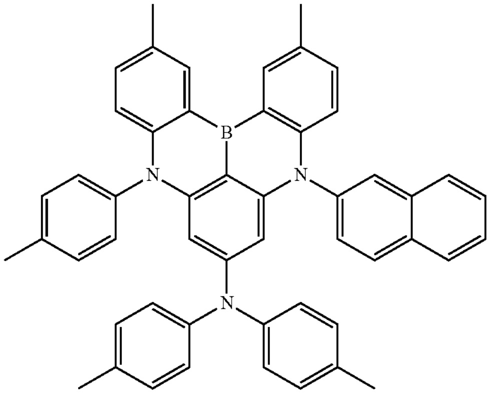
Dopant 83
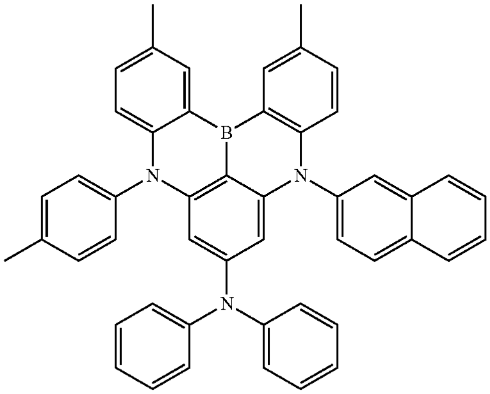
-continued
Dopant 84
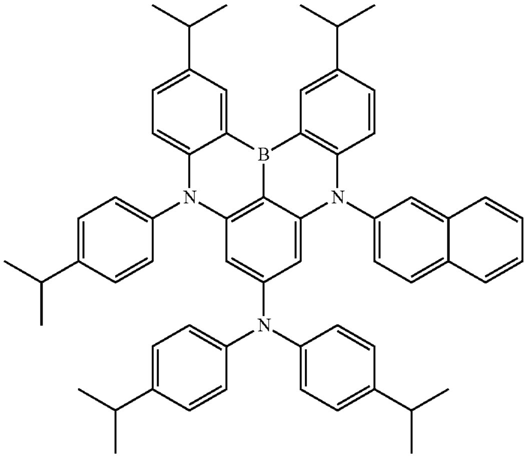
Dopant 85
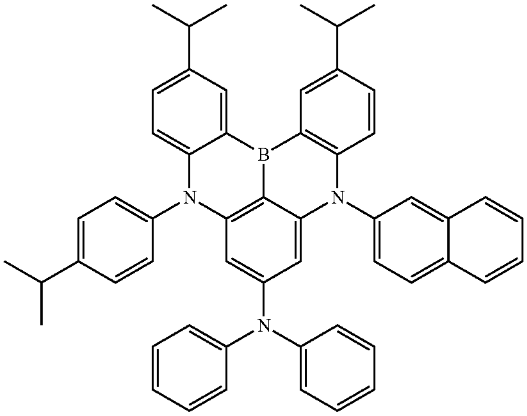
Dopant 86
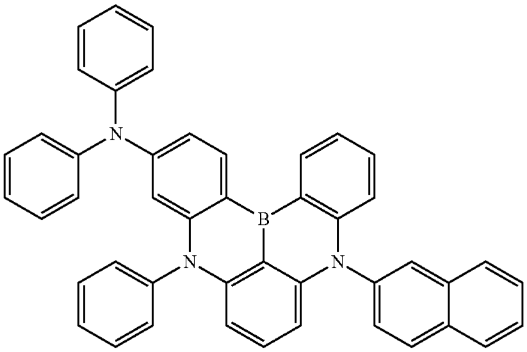

-continued
Dopant 87
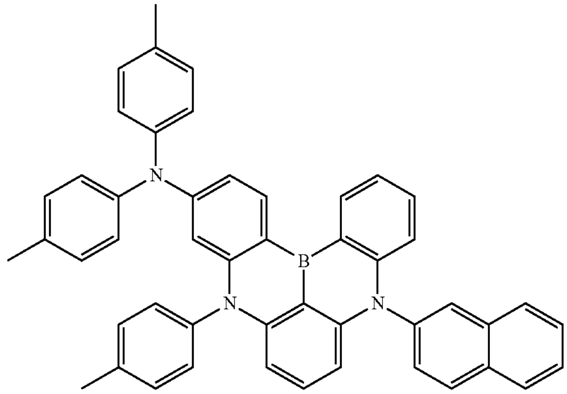
Dopant 88
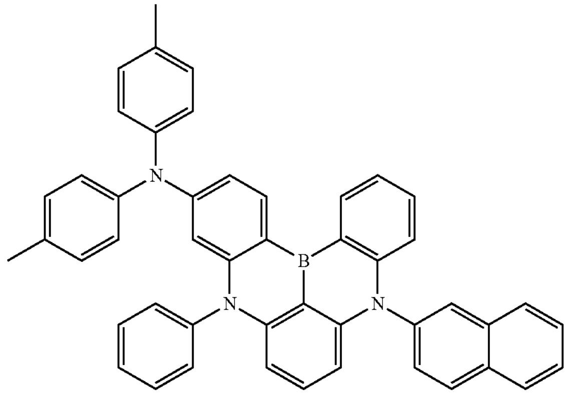
Dopant 89
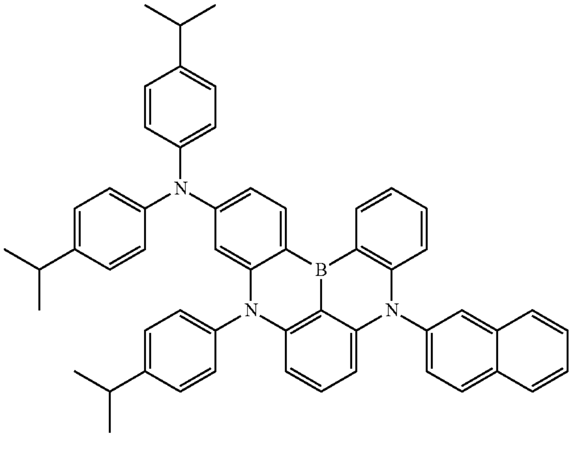
-continued
Dopant 90
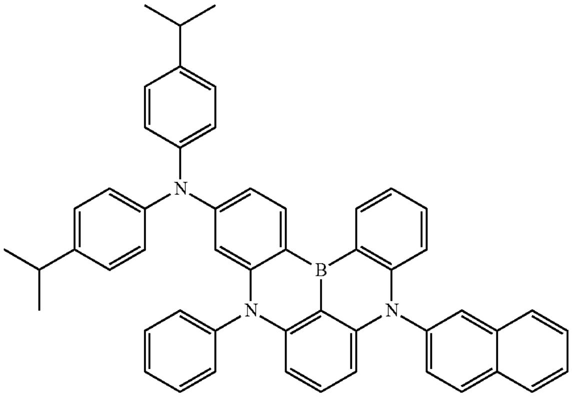
Dopant 91
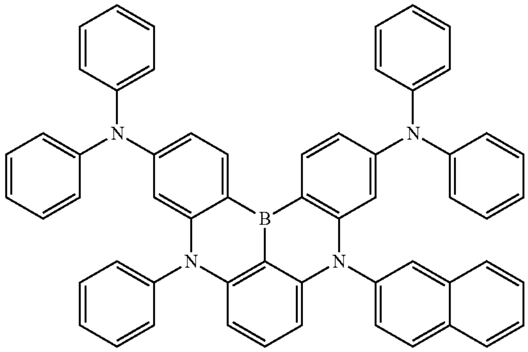
Dopant 92
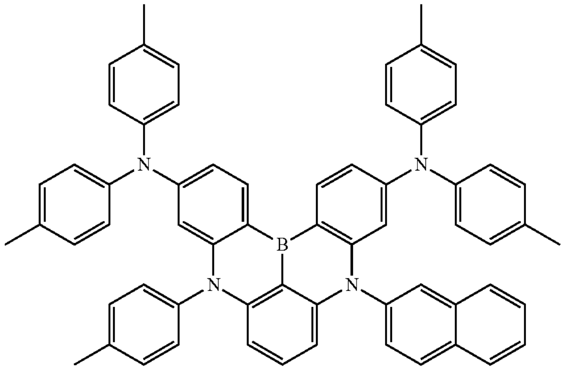
Dopant 93
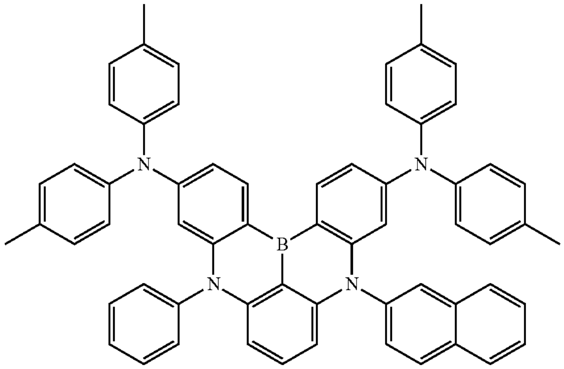

-continued
Dopant 94
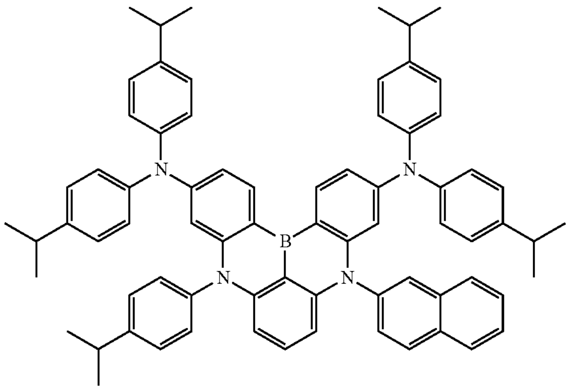
Dopant 95
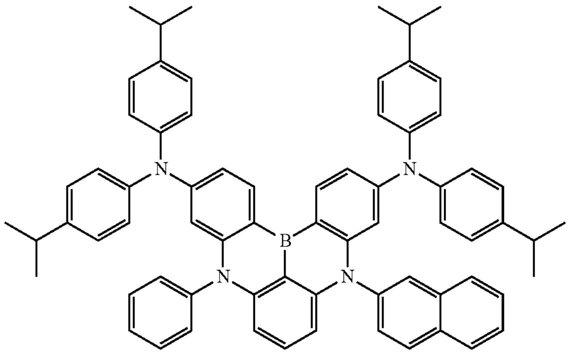
Dopant 96
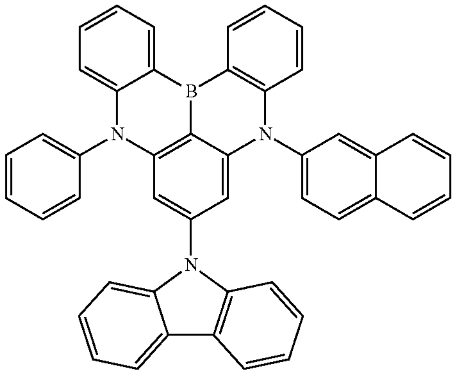
Dopant 97
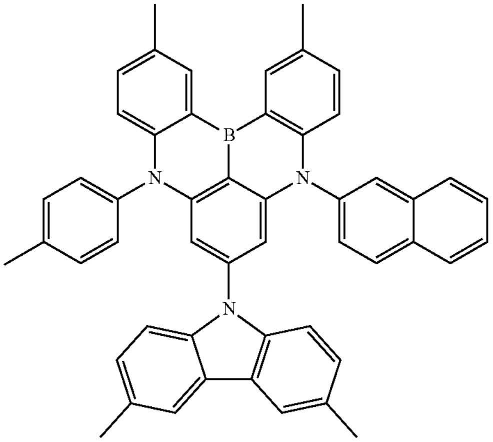
-continued
Dopant 98
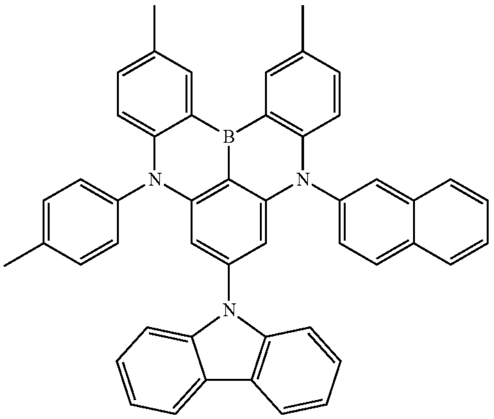
Dopant 99
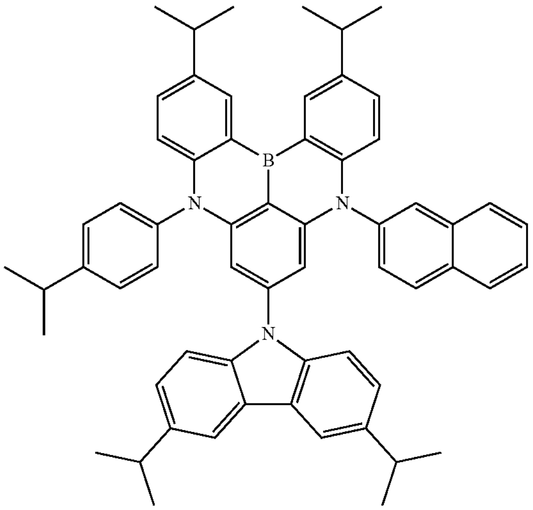
Dopant 100
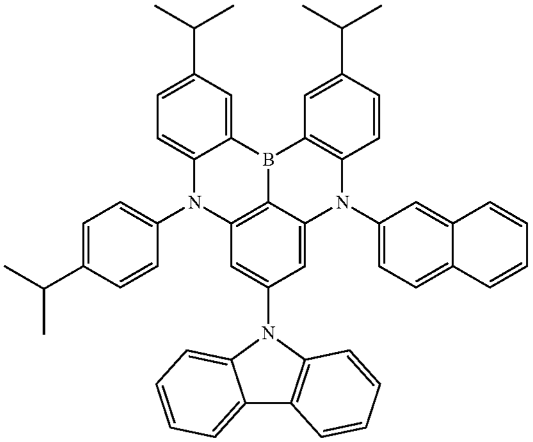

-continued
Dopant 101
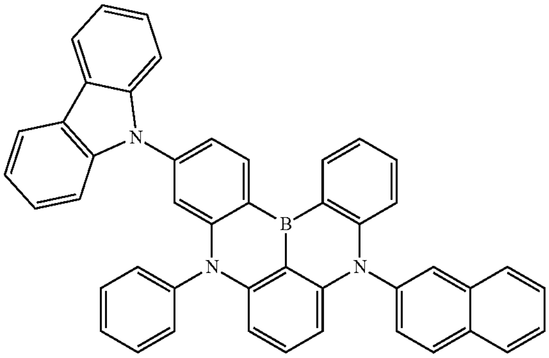
Dopant 102
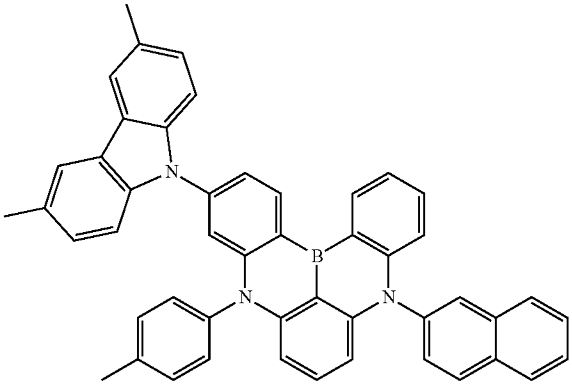
Dopant 103
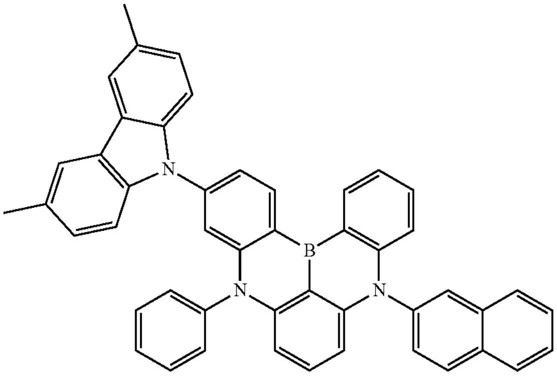
Dopant 104
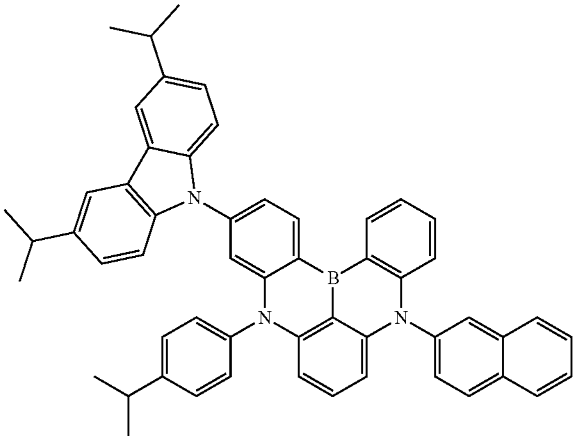
-continued
Dopant 105
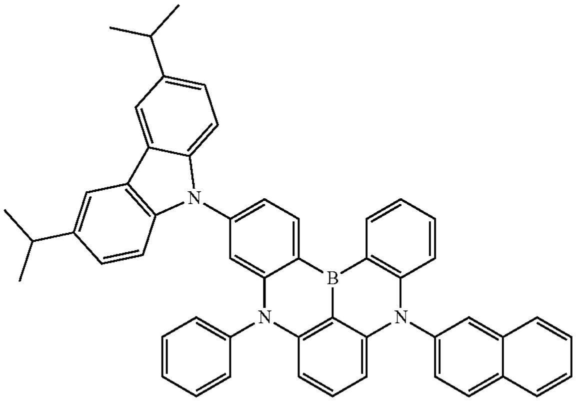
Dopant 106
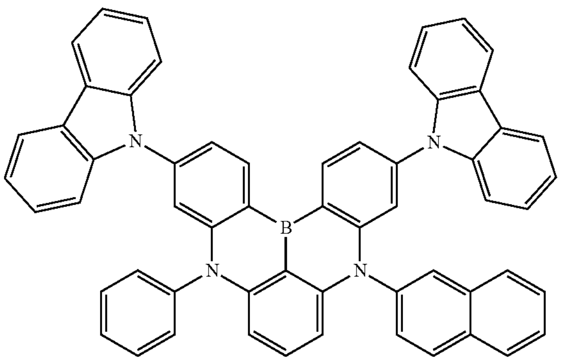
Dopant 107
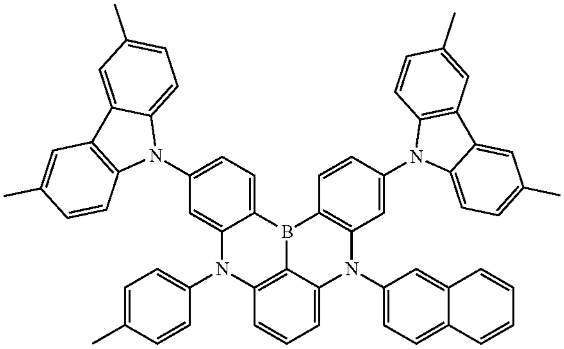
Dopant 108
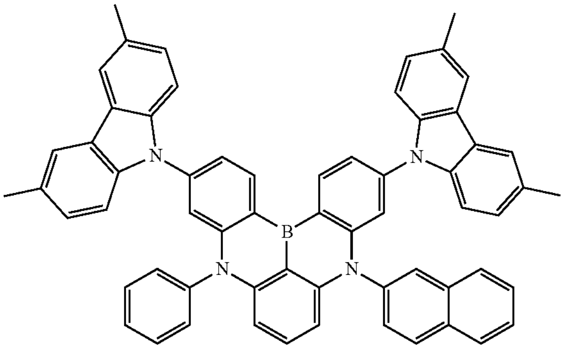

-continued
Dopant 109
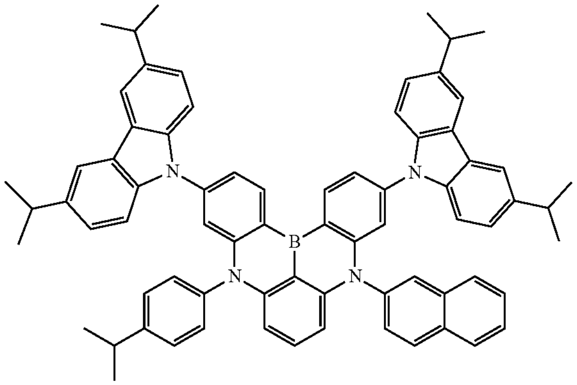
Dopant 110
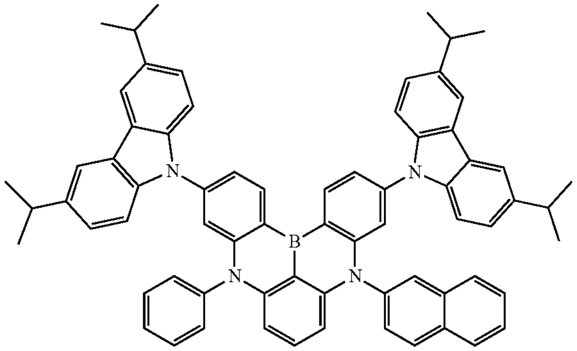
Dopant 111
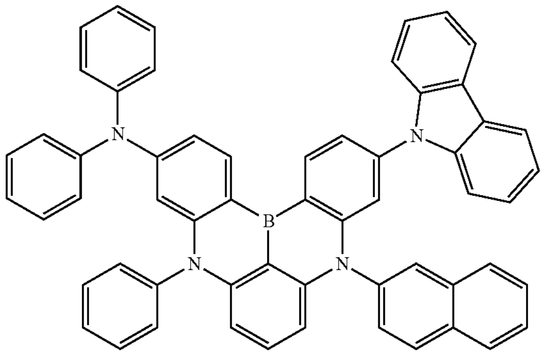
Dopant 112
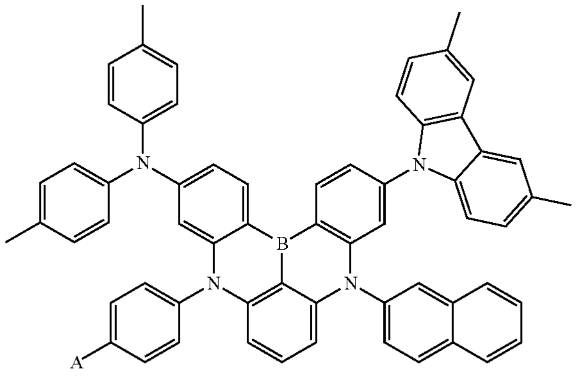
-continued
Dopant 113
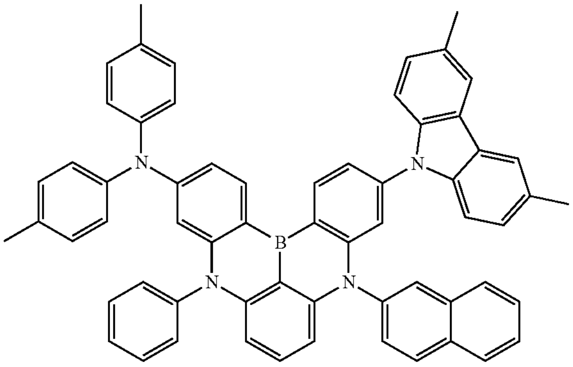
Dopant 114
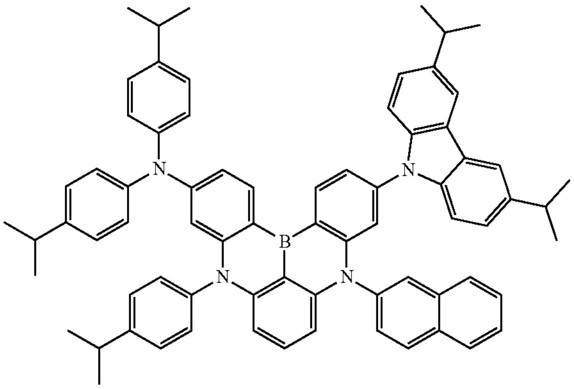
Dopant 115
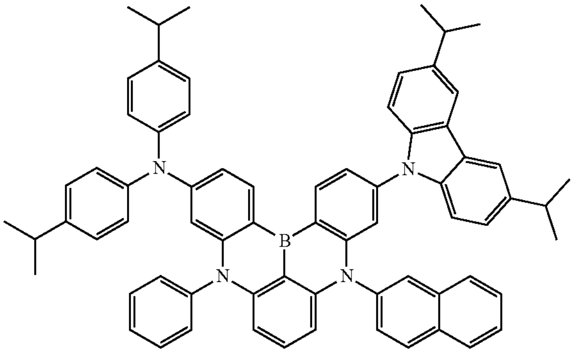

-continued
Dopant 116
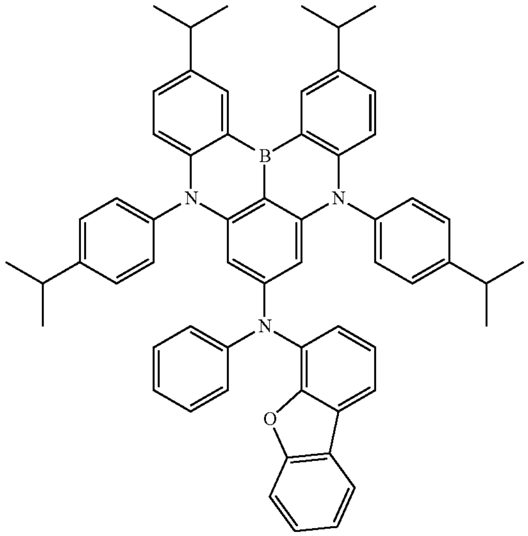
Dopant 117
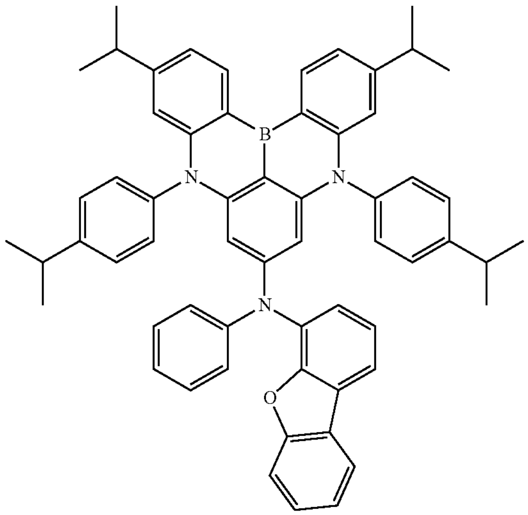
Dopant 118
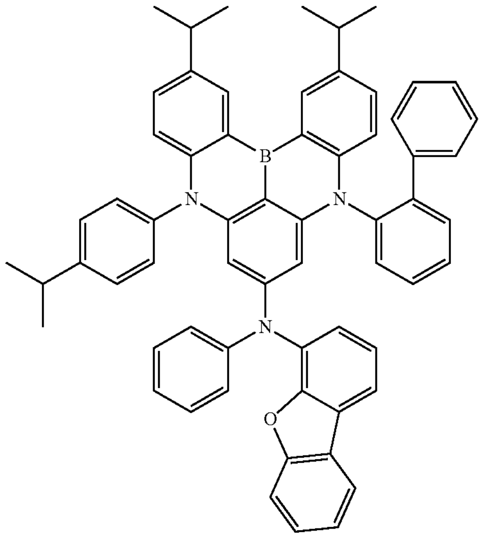
-continued
Dopant 119
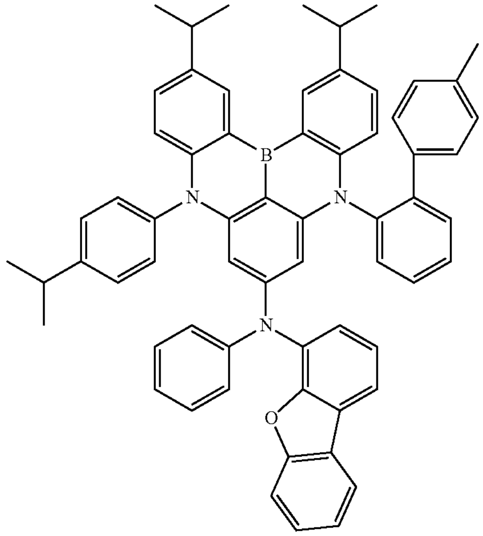
Dopant 120
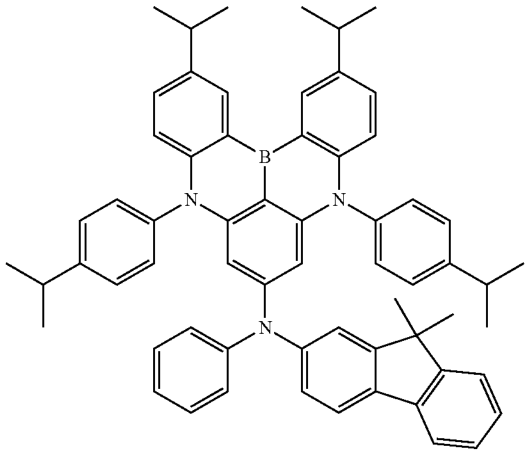
Dopant 121
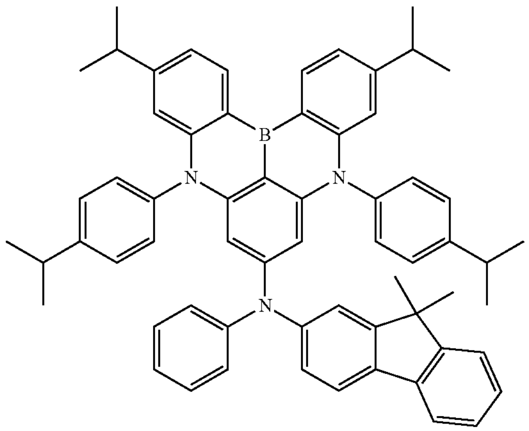

-continued
Dopant 122
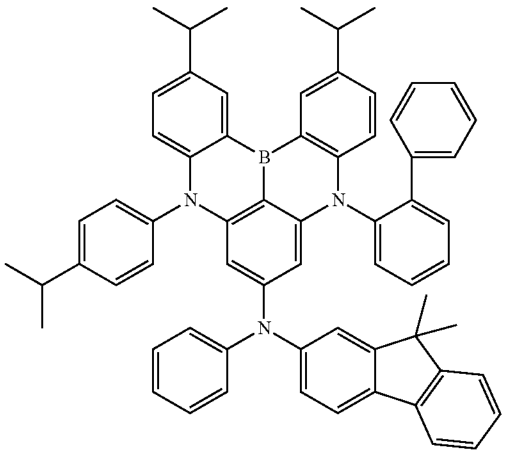
Dopant 123
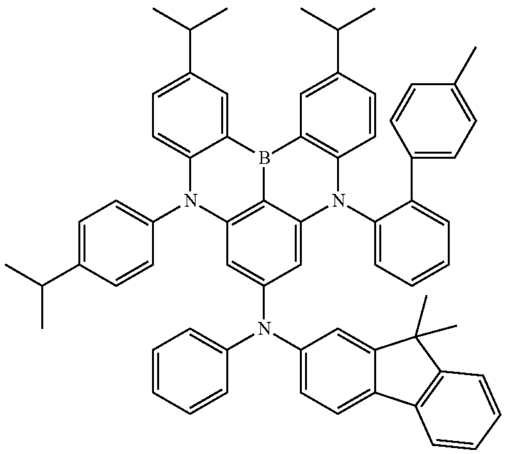
Dopant 124
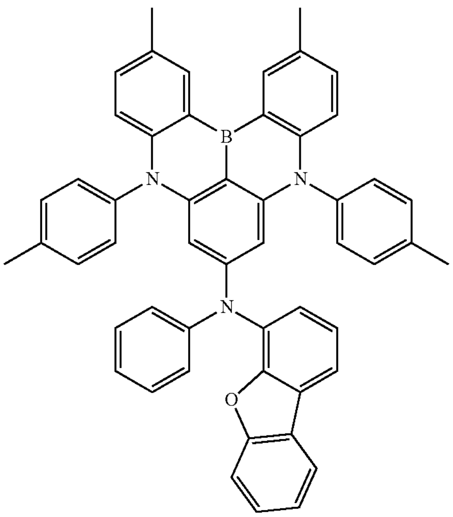
-continued
Dopant 125
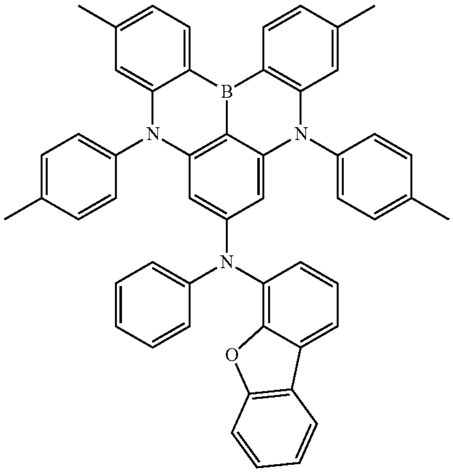
Dopant 126
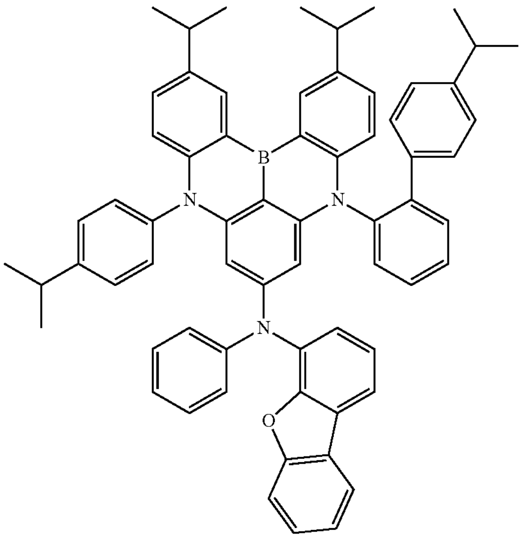
Dopant 127
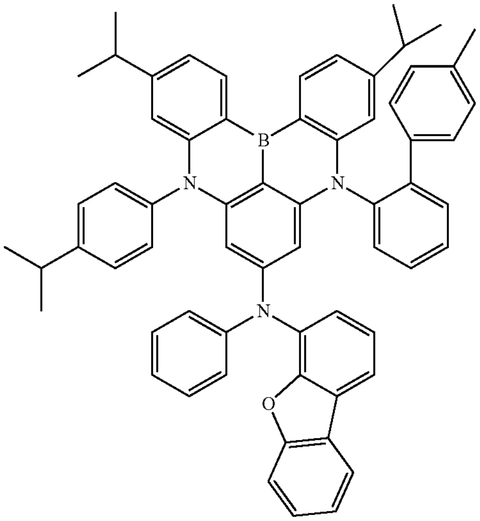

-continued
Dopant 128
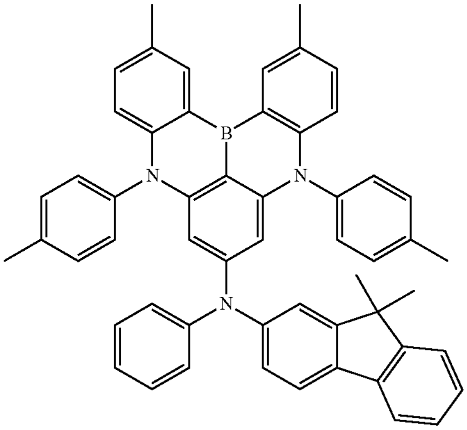
Dopant 129
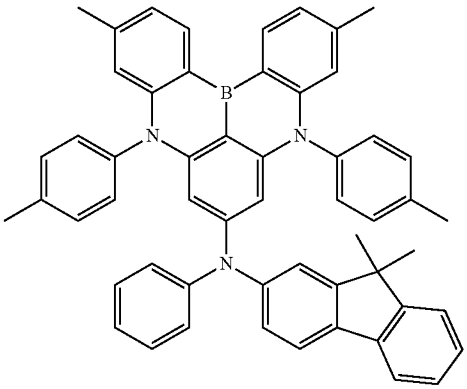
Dopant 130
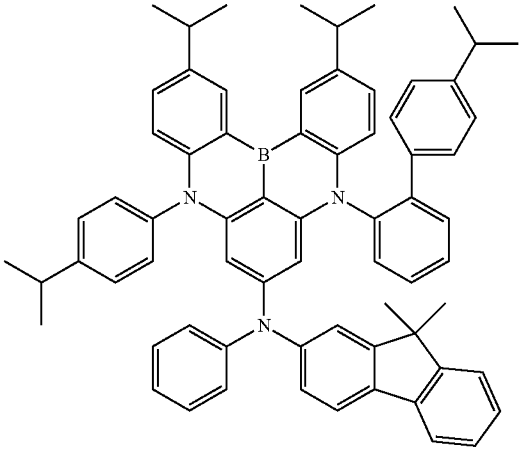
-continued
Dopant 131
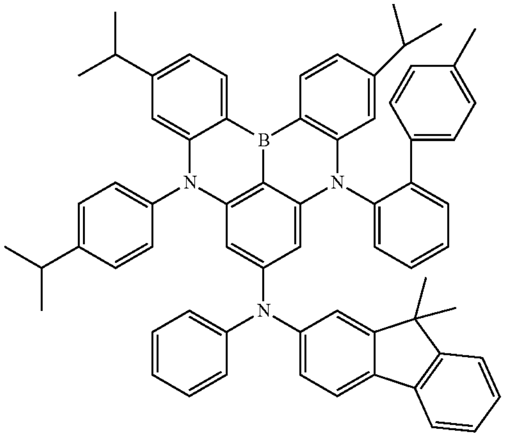
Dopant 132
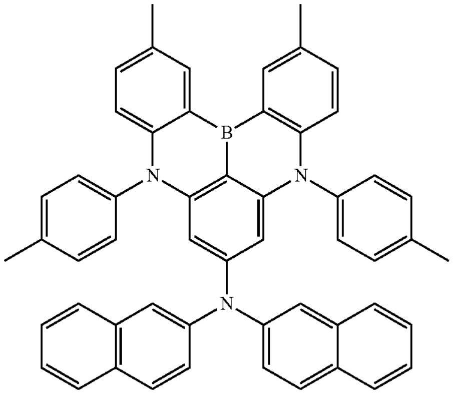
Dopant 133
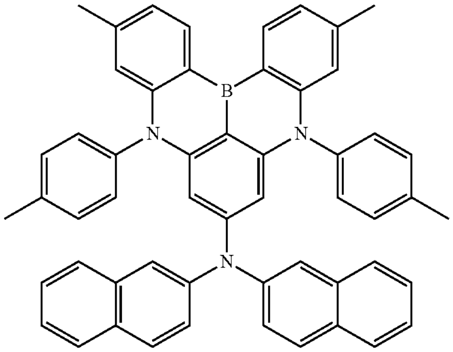

-continued
Dopant 134
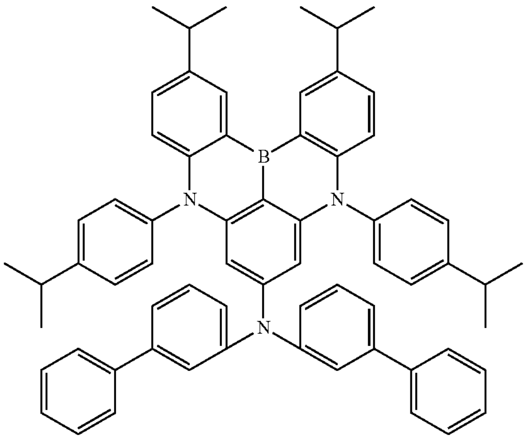
Dopant 135
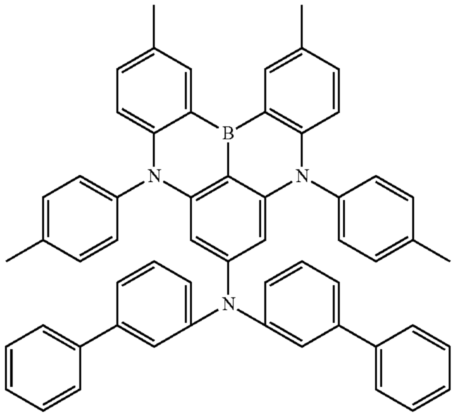
Dopant 136
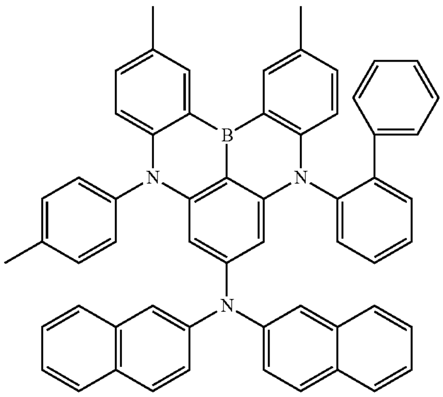
-continued
Dopant 137
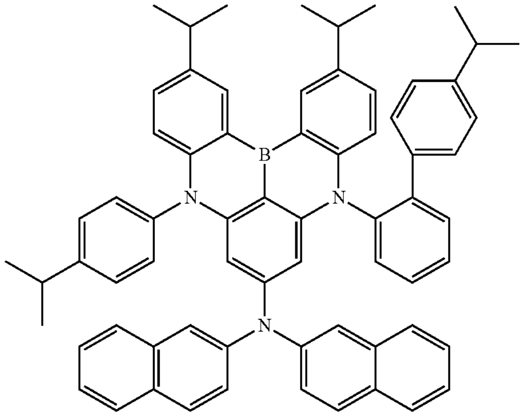
Dopant 138
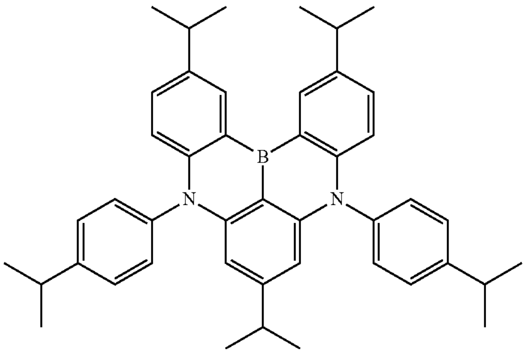
Dopant 139
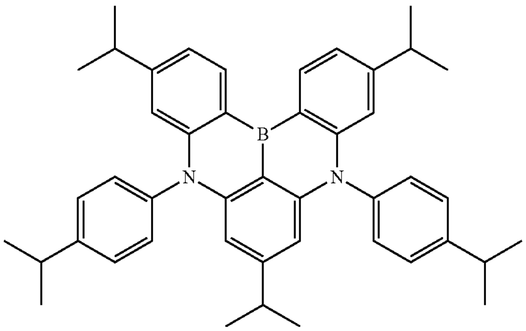
Dopant 140
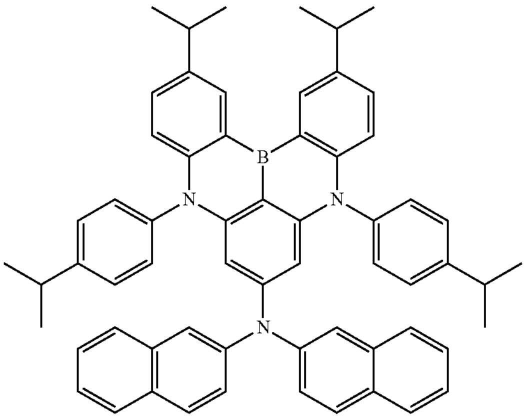

-continued
Dopant 141
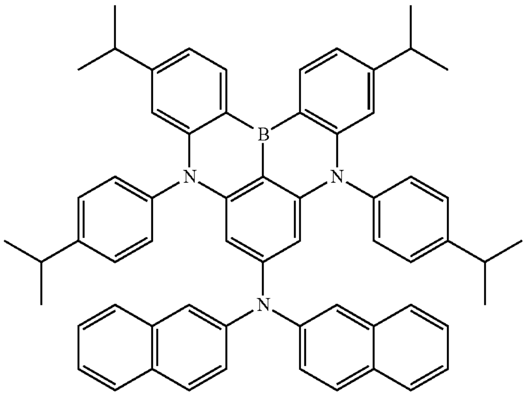
Dopant 142
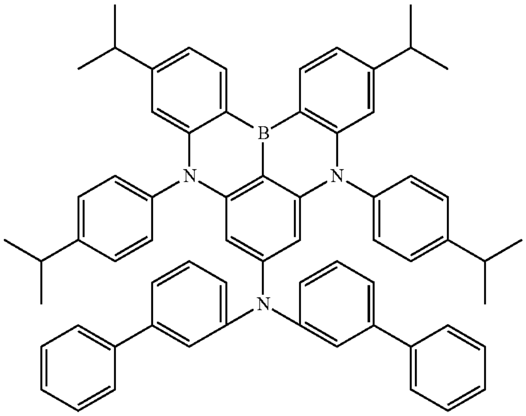
Dopant 143
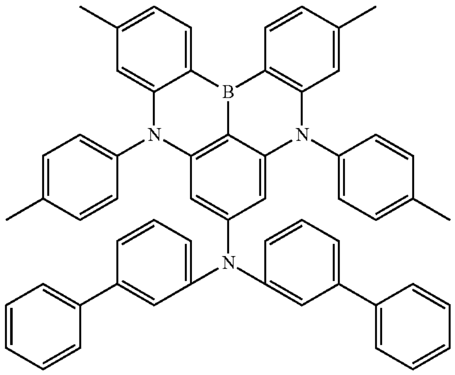
-continued
Dopant 144
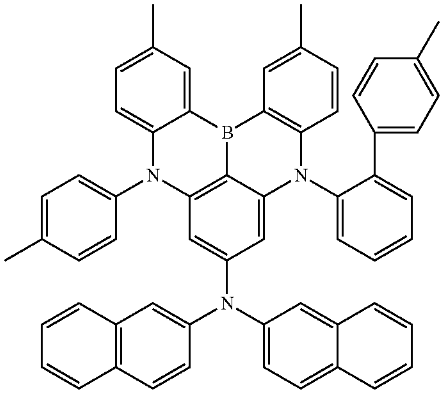
Dopant 145
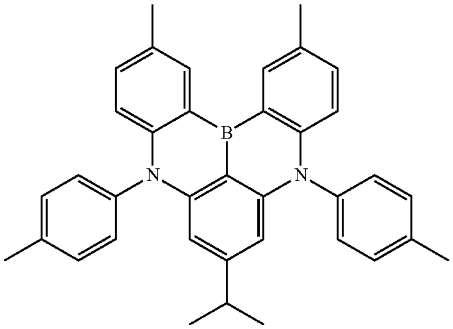
Dopant 146
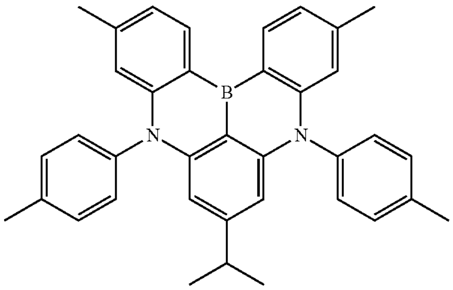
Dopant 147
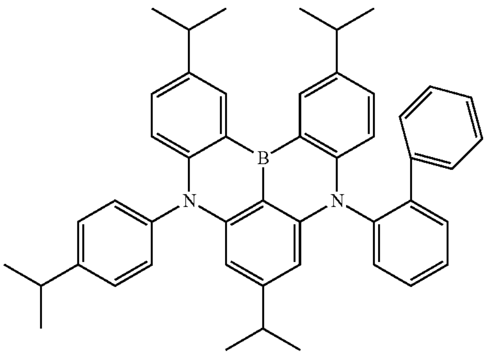

-continued
Dopant 148
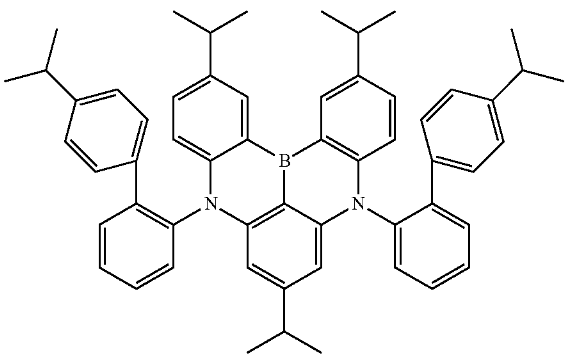
Dopant 149
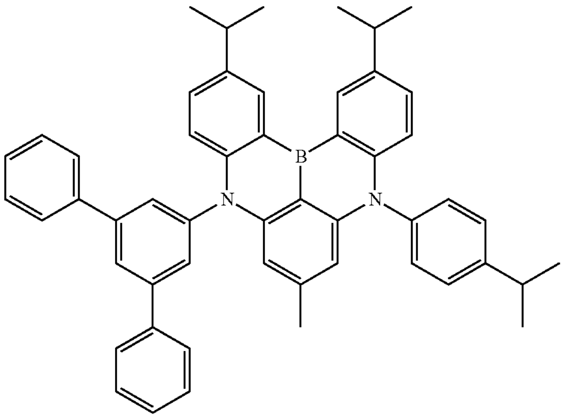
Dopant 150
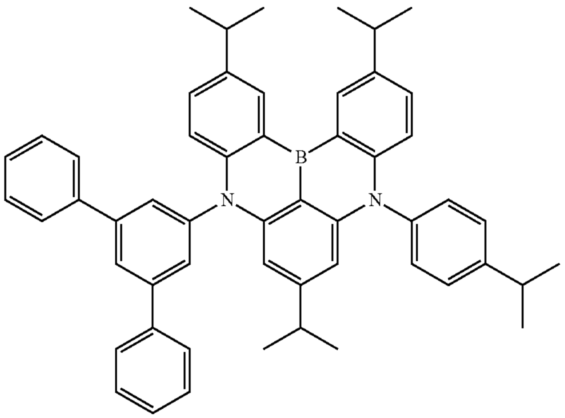
-continued
Dopant 151
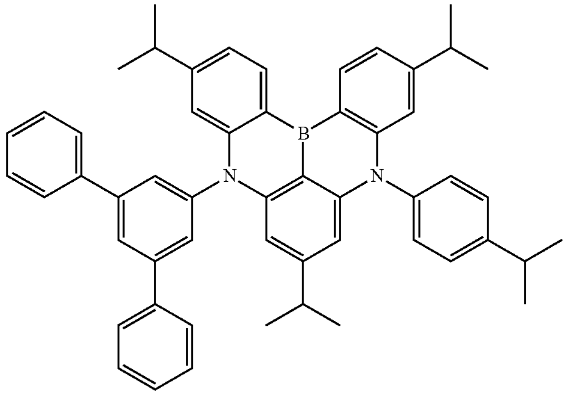
Dopant 152
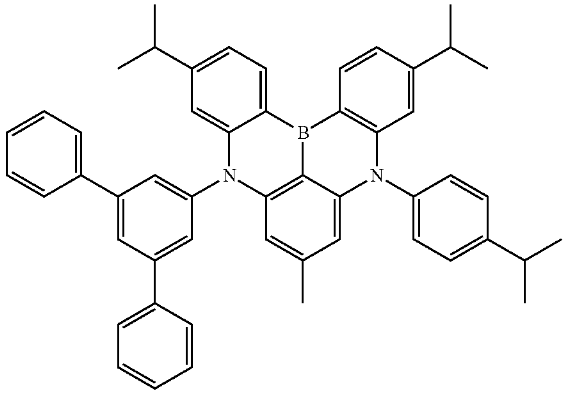
Dopant 153
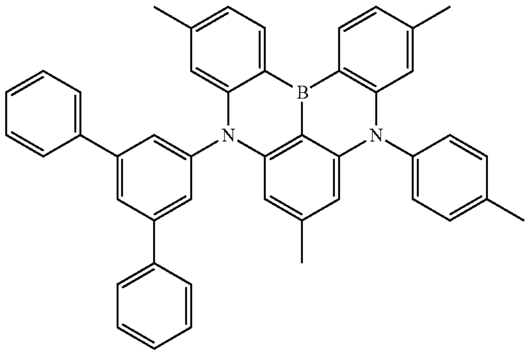
Dopant 154
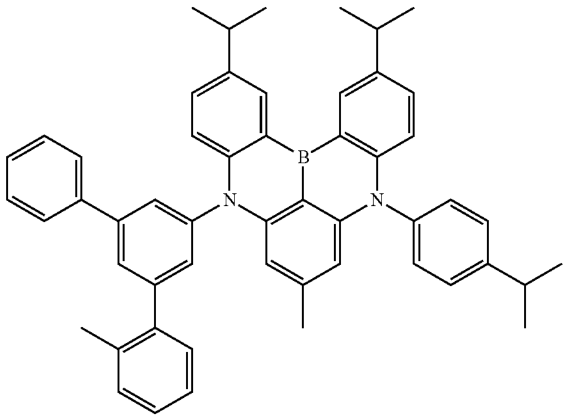

Dopant 155
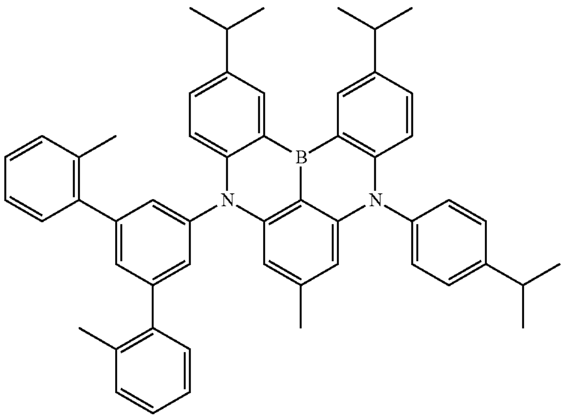
Dopant 156
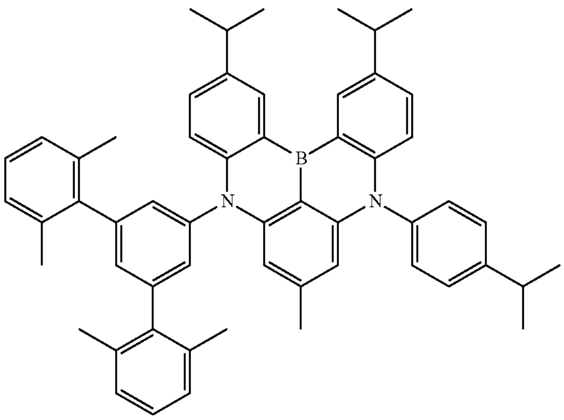
Dopant 157
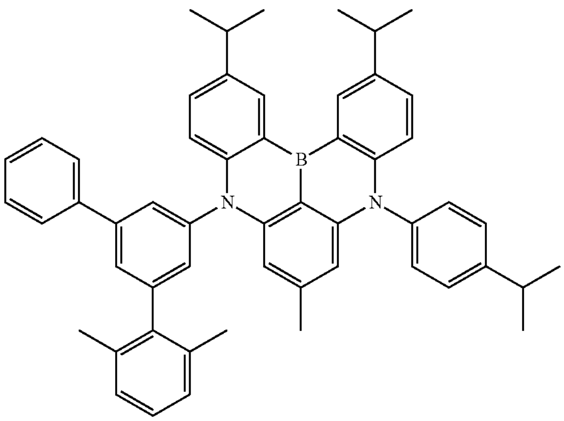
Dopant 158
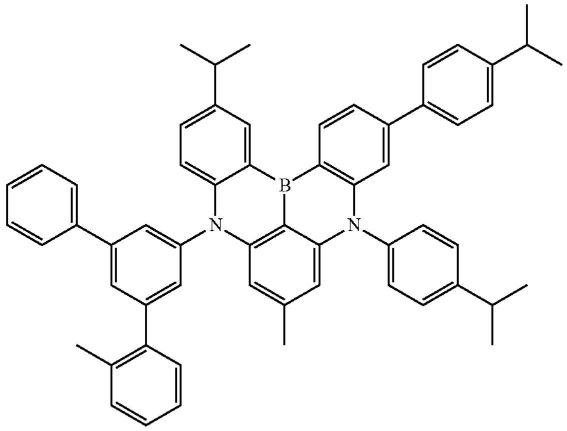
Dopant 159
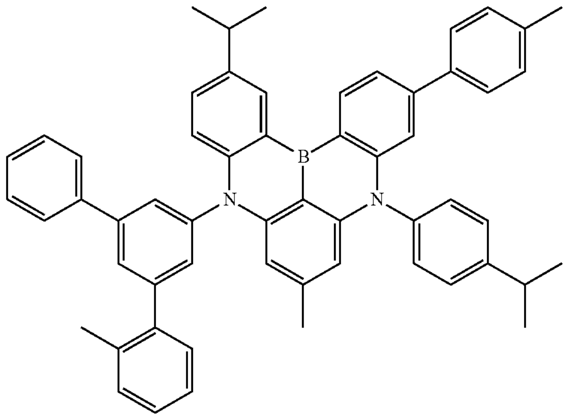
Dopant 160
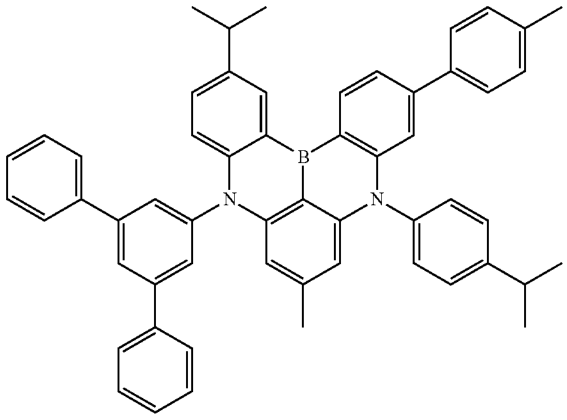

Dopant 161
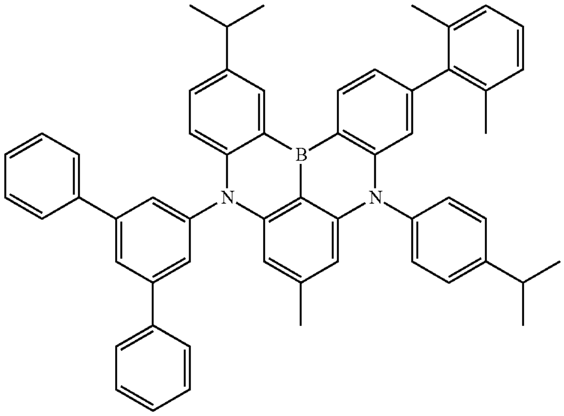
Dopant 162
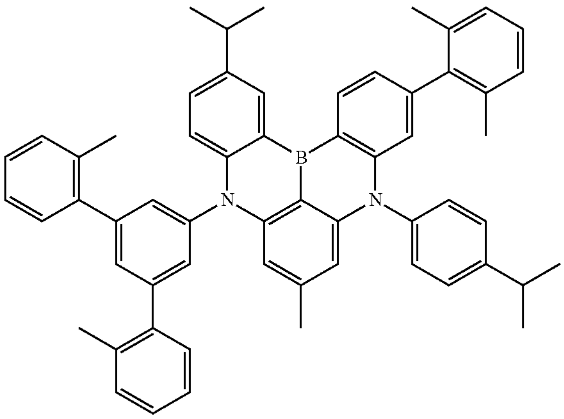
Dopant 163
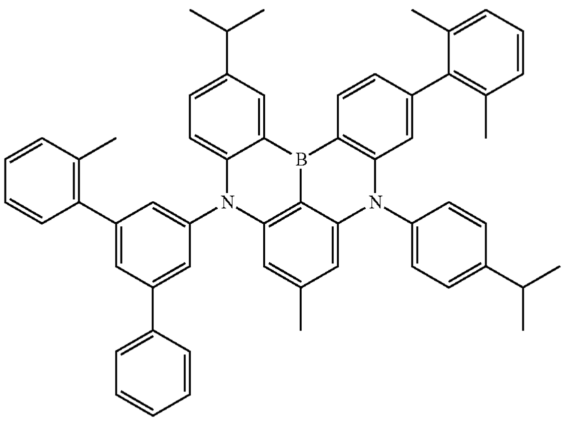
Dopant 164
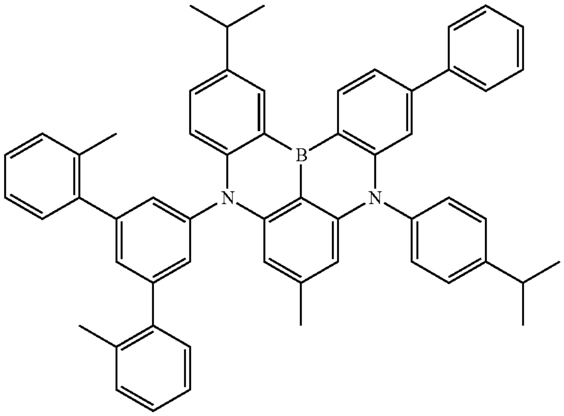
Dopant 165
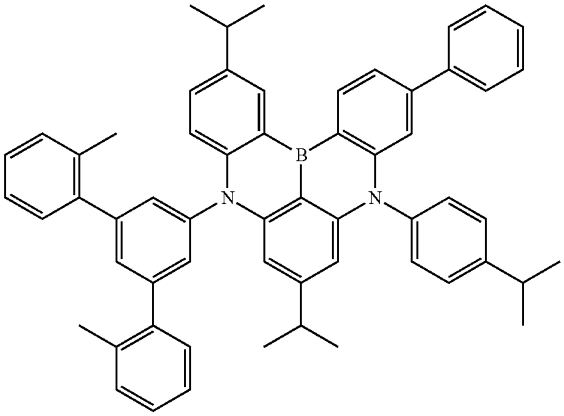
Dopant 166
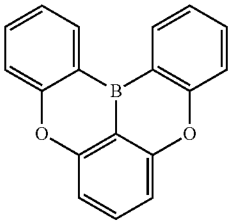
Dopant 167
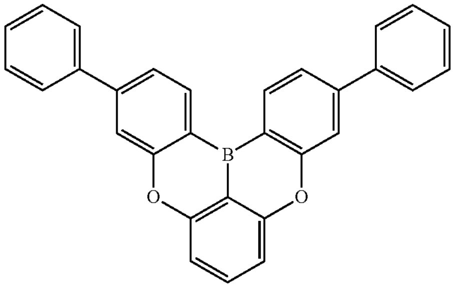

-continued
Dopant 168
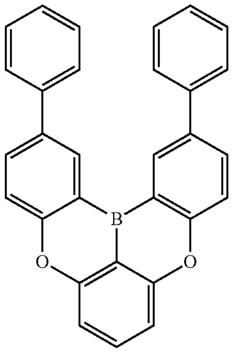
Dopant 169
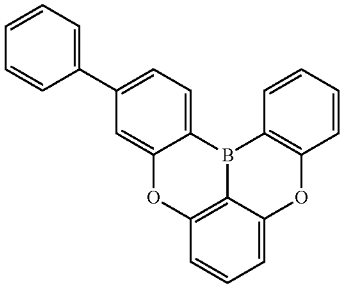
Dopant 170
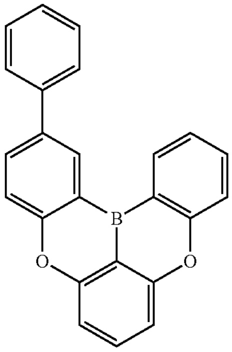
Dopant 171
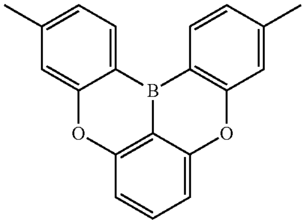
Dopant 172
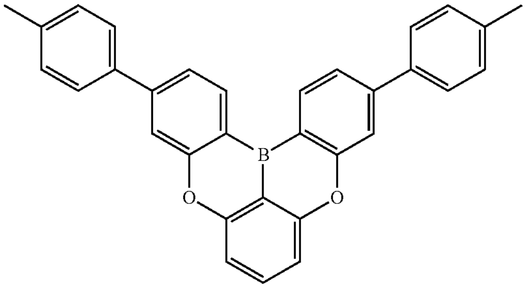
-continued
Dopant 173
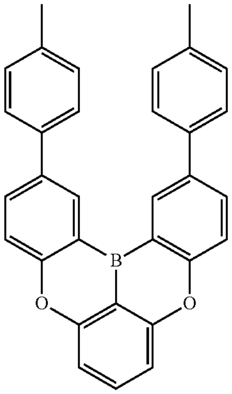
Dopant 174
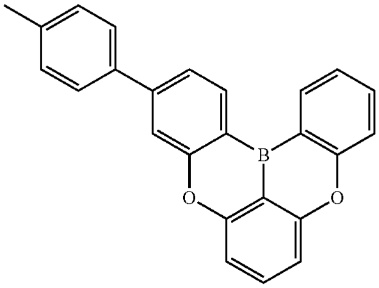
Dopant 175
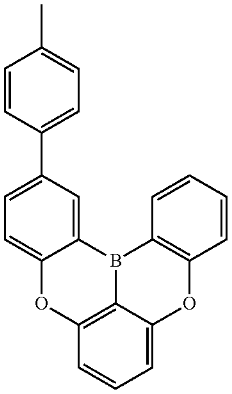
Dopant 176
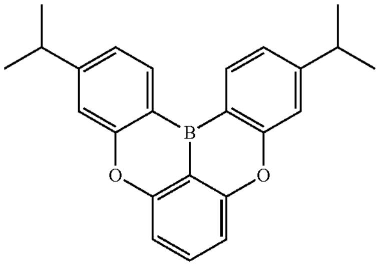

-continued
Dopant 177
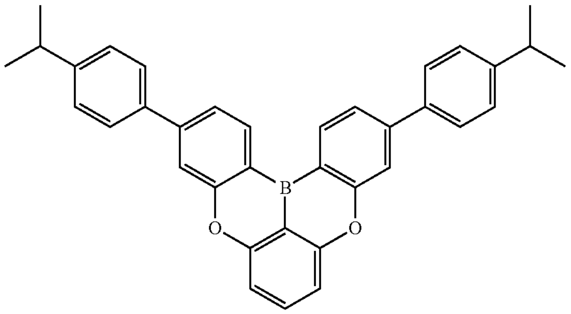
Dopant 178
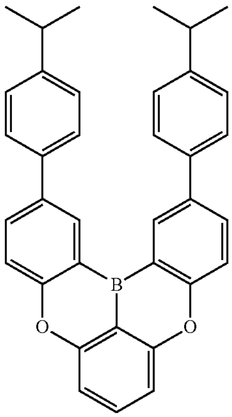
Dopant 179
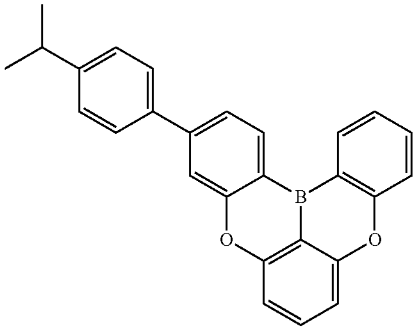
Dopant 180
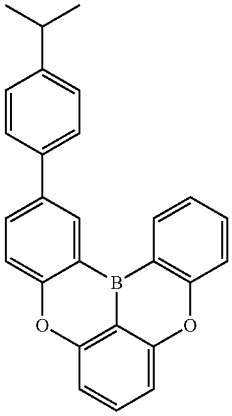
Dopant 181
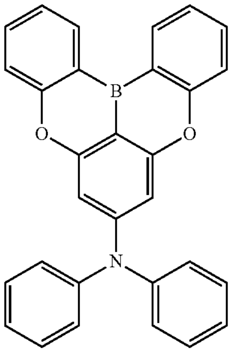
Dopant 182
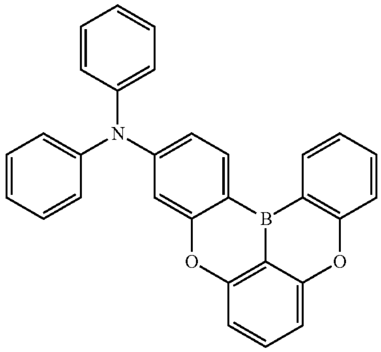
Dopant 183
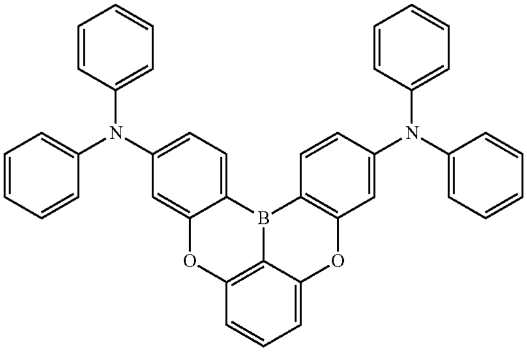
Dopant 184
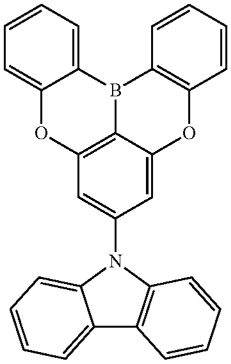

-continued
Dopant 185
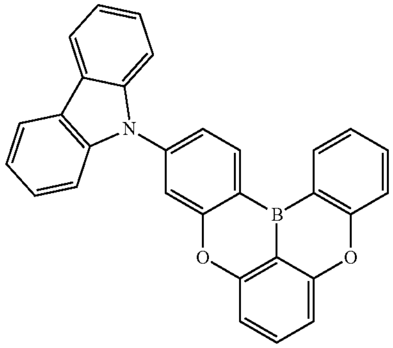
Dopant 186
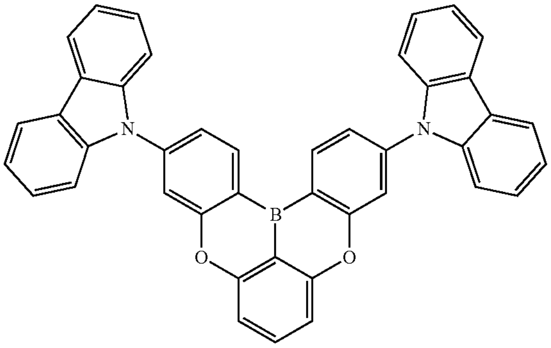
Dopant 187
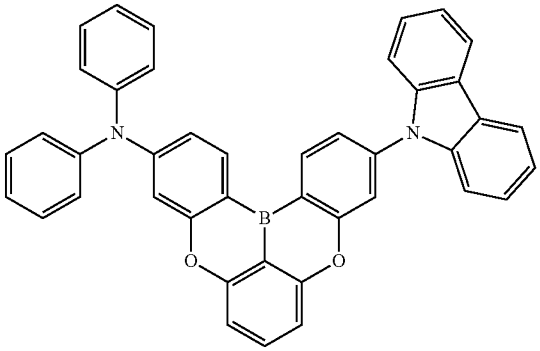
Dopant 188
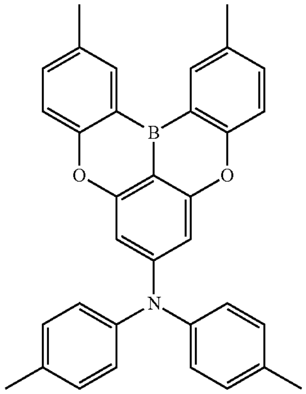
-continued
Dopant 189
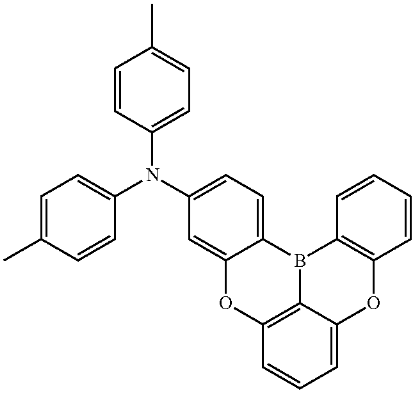
Dopant 190
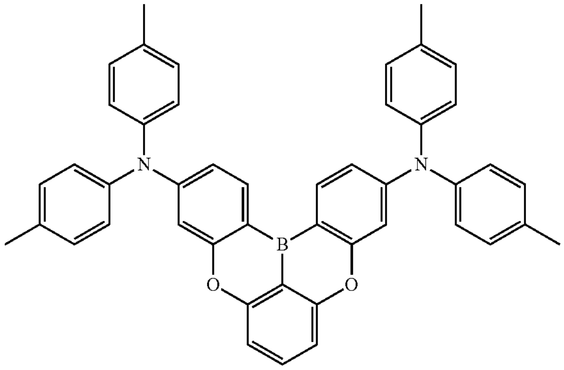
Dopant 191
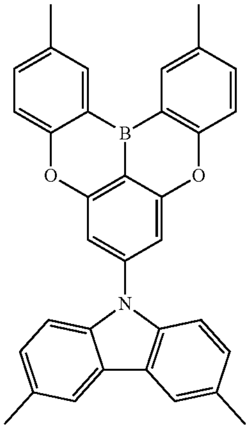
Dopant 192
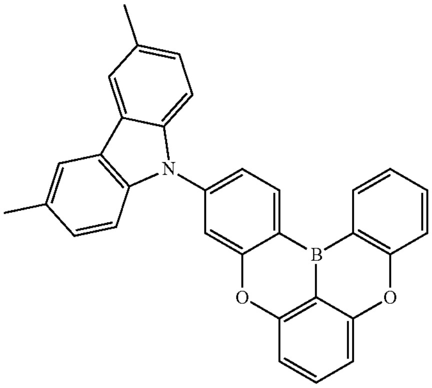

-continued
Dopant 193
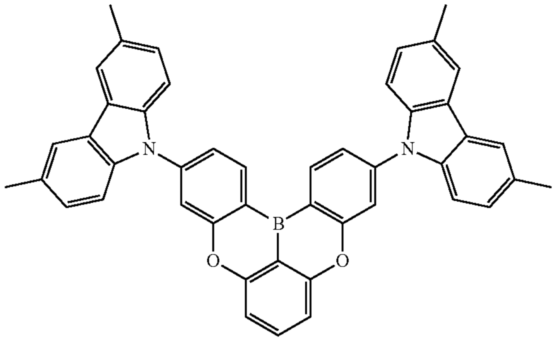
Dopant 194
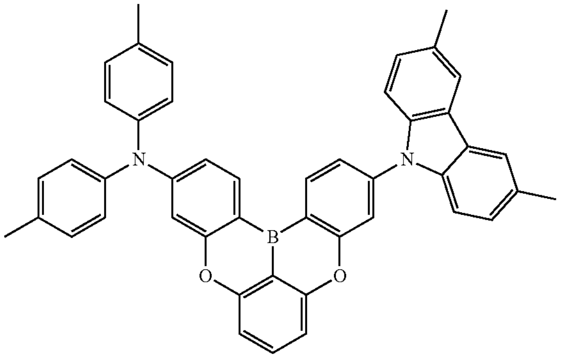
Dopant 195
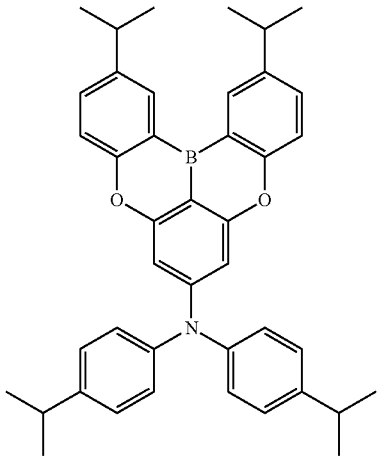
Dopant 196
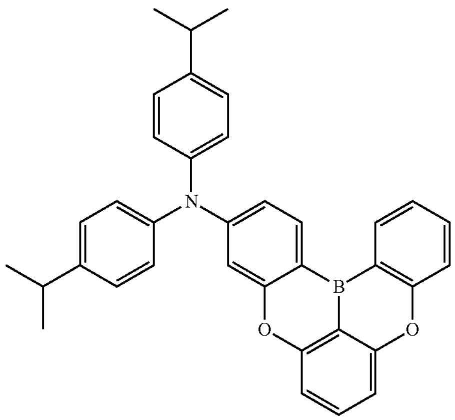
-continued
Dopant 197
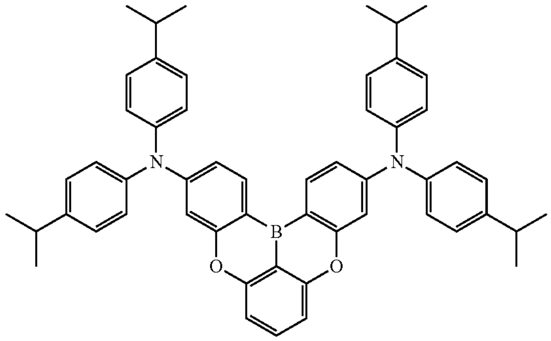
Dopant 198
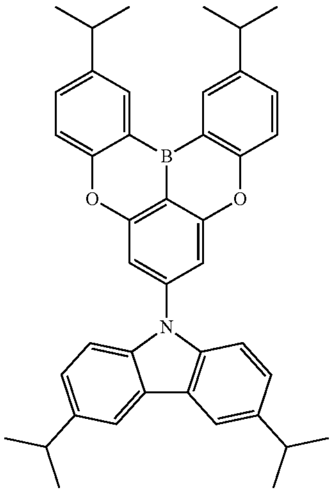
Dopant 199
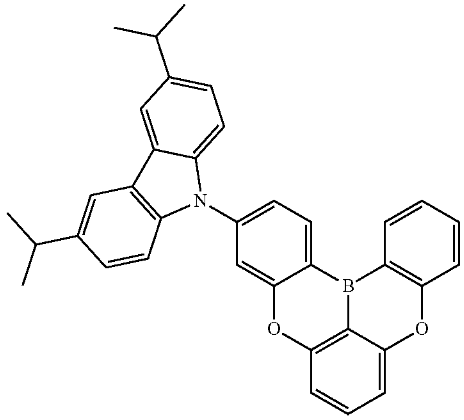

-continued
Dopant 200
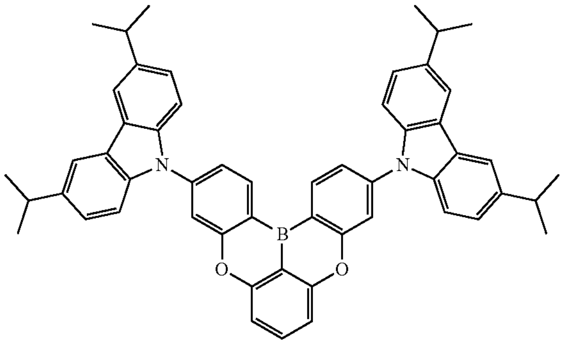
Dopant 201
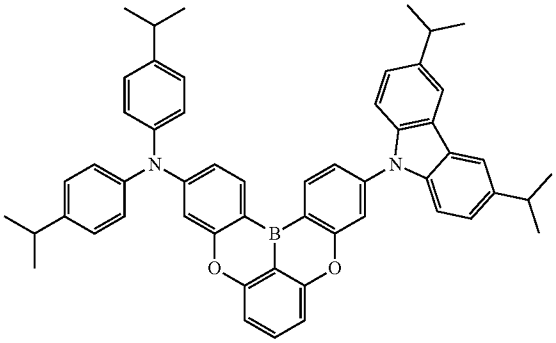
Dopant 202
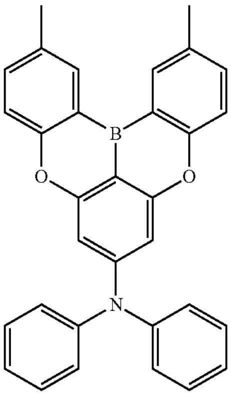
Dopant 203
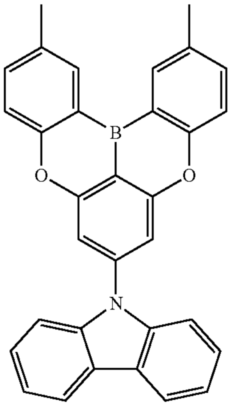
-continued
Dopant 204
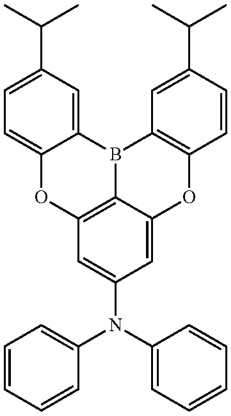
Dopant 205
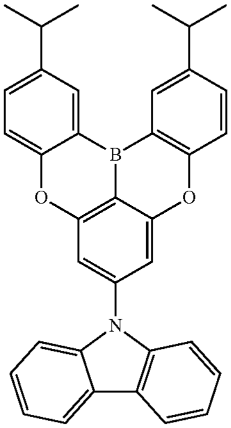
Dopant 206
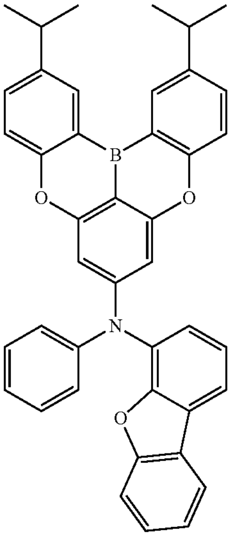

-continued
Dopant 207
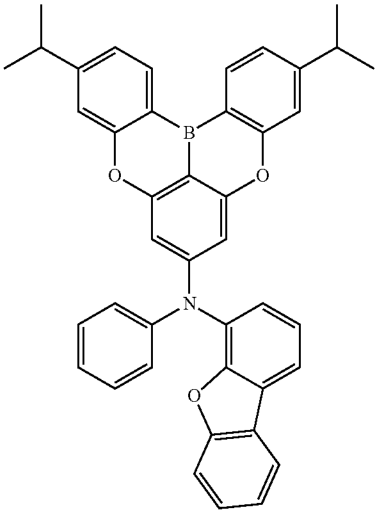
Dopant 208
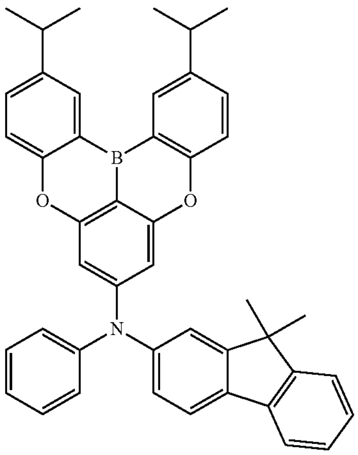
Dopant 209
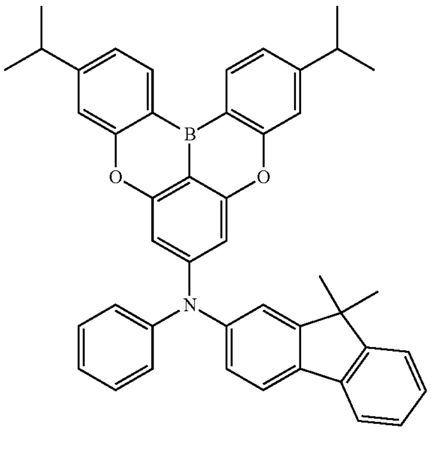
-continued
Dopant 210
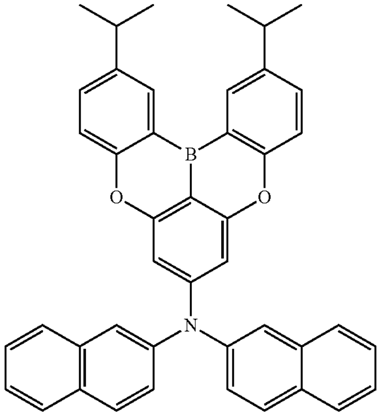
Dopant 211
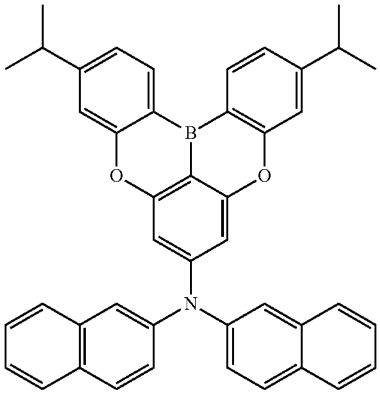
Dopant 212
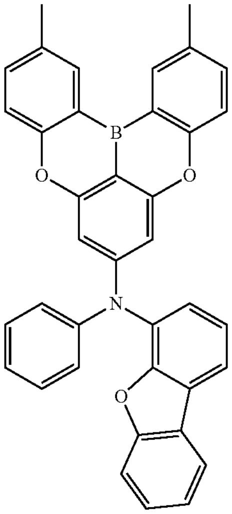

-continued
Dopant 213
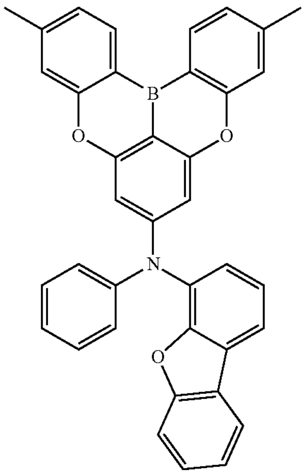
Dopant 214
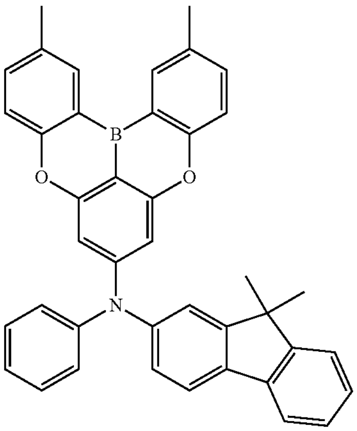
Dopant 215
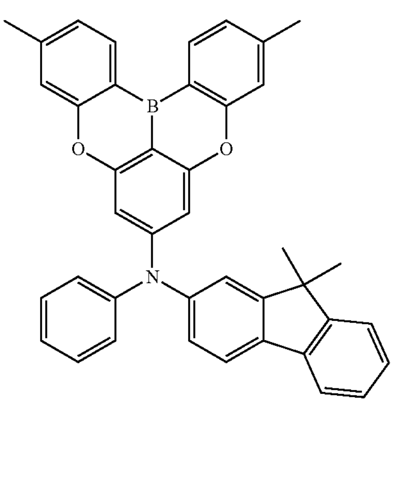
-continued
Dopant 216
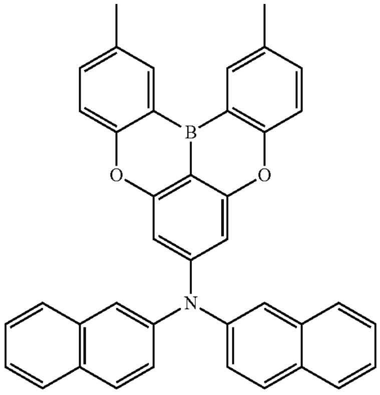
Dopant 217
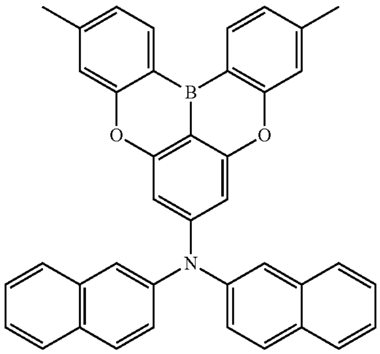
Dopant 218
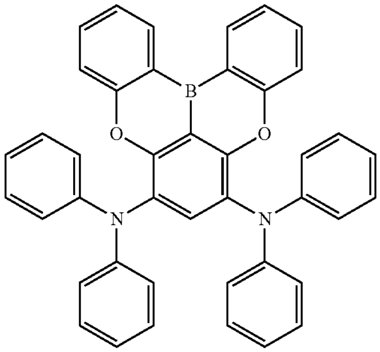
Dopant 219
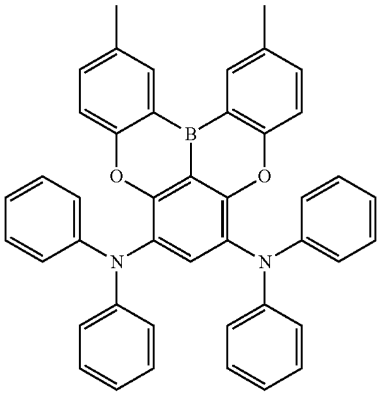

-continued
Dopant 220
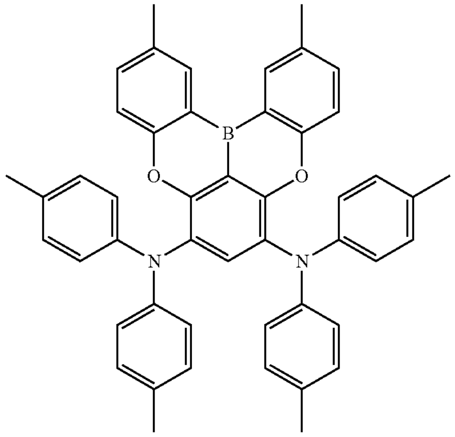
Dopant 221
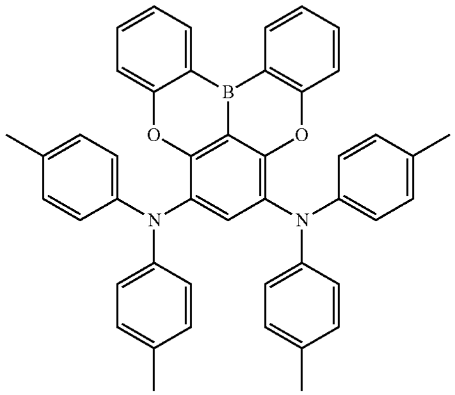
Dopant 222
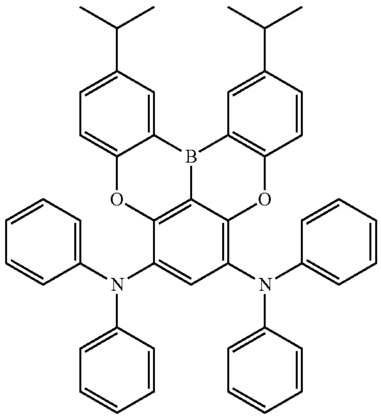
-continued
Dopant 223
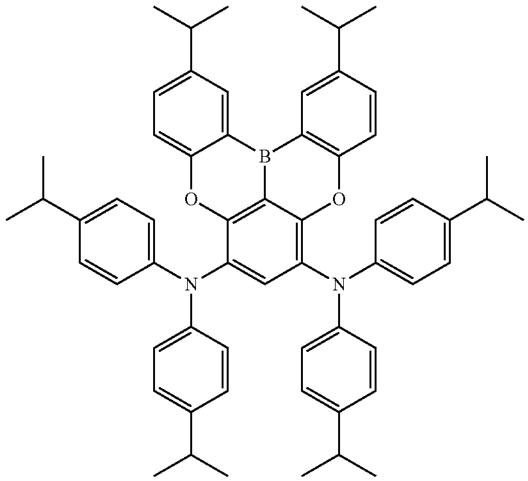
Dopant 224
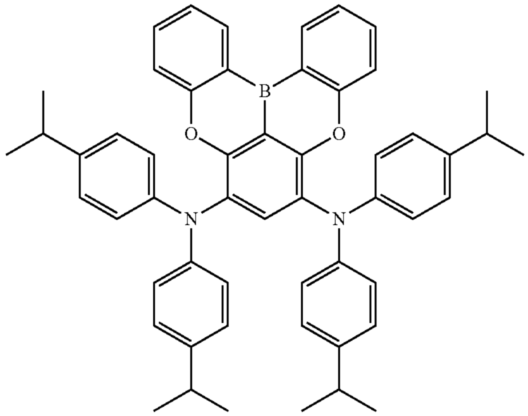
Dopant 225
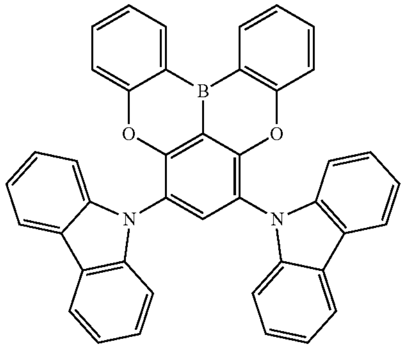

-continued
Dopant 226
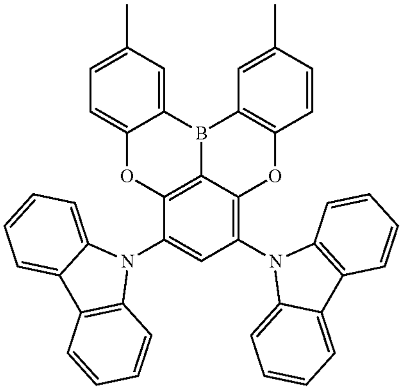
Dopant 227
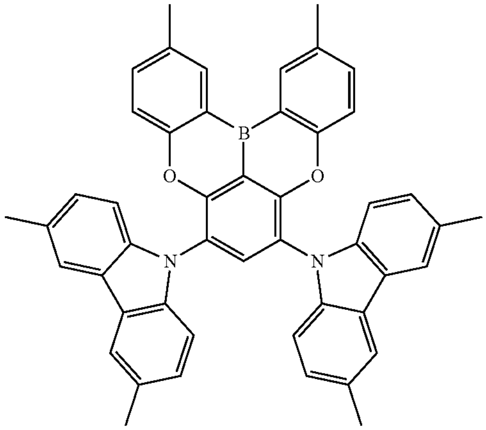
Dopant 228
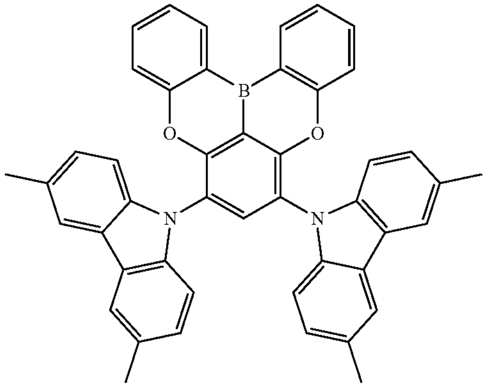
-continued
Dopant 229
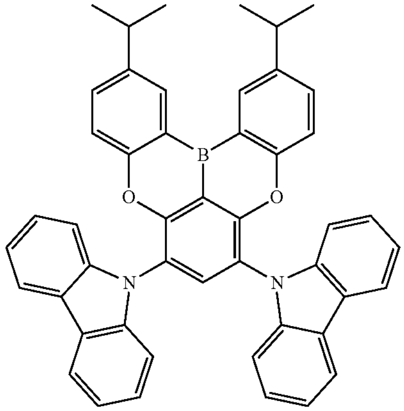
Dopant 230
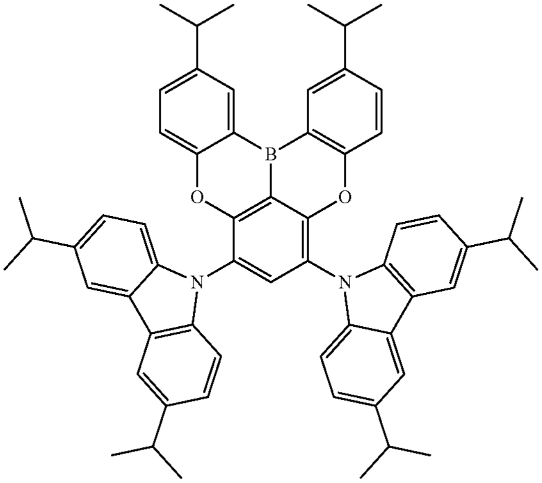
Dopant 231
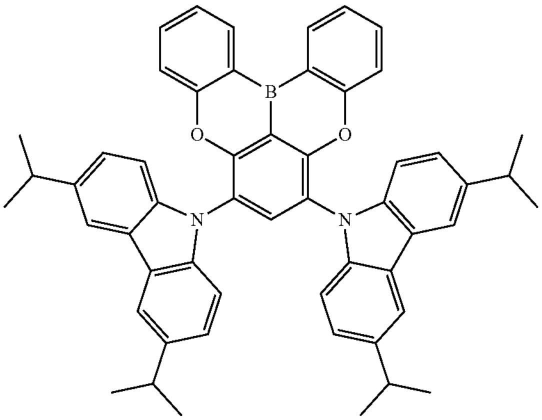
Dopant 232
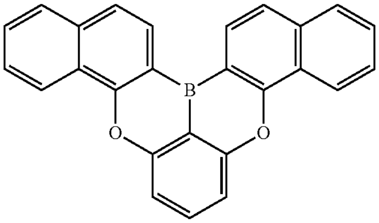

-continued

Dopant 233

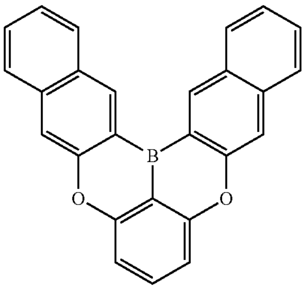

Dopant 234

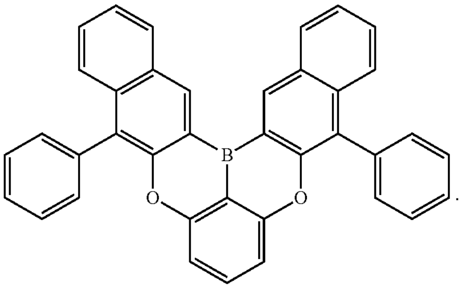

14. The OLED of claim 1, further comprising:

a second emitting material layer including a third host, a fourth host and a second blue dopant and positioned between the first emitting material layer and the second electrode; and a first charge generation layer between the first and second emitting material layers, wherein the third host is an anthracene derivative, and the fourth host is a deuterated anthracene derivative.

15. The OLED of claim 14, further comprising:

a third emitting material layer emitting a yellow-green light and positioned between the first charge generation layer and the second emitting material layer; and a second charge generation layer between the second and third emitting material layers.

16. The OLED of claim 14, further comprising:

a third emitting material layer emitting a red light and a green light and positioned between the first charge generation layer and the second emitting material layer; and a second charge generation layer between the second and third emitting material layers.

17. The OLED of claim 1, wherein in Formula 3, each of $R_1$ and $R_2$ is independently $C_{10}$~$C_{30}$ aryl group or $C_5$~$C_{30}$ heteroaryl group.

18. The OLED of claim 17, wherein the second host is one of compounds selected from Formula 4-1:

Formula 4-1

Host 31

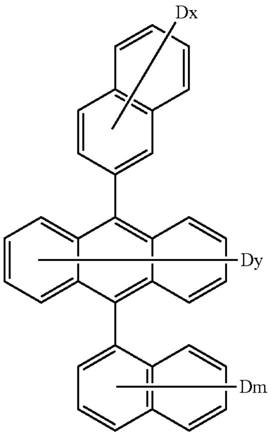

(x + y + m = 20 - 22)

Host 32

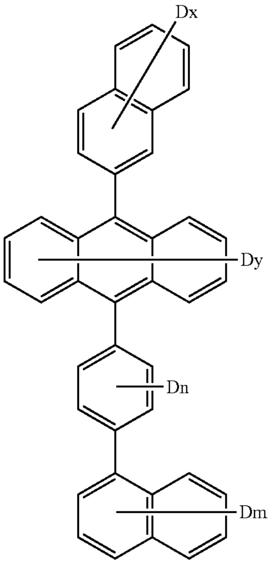

(x + y + n + m = 21 - 23)

Host 33

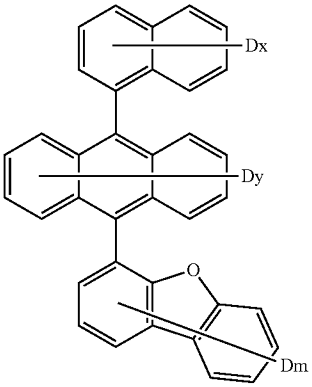

(x + y + m = 20 - 22)

-continued
Host 34
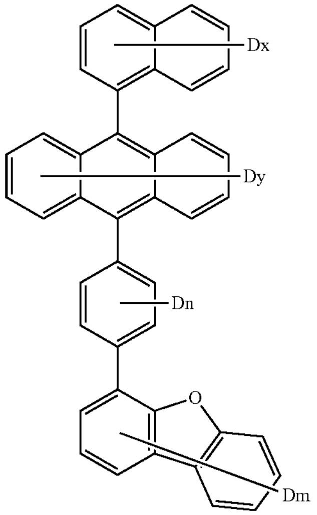
(x + y + n + m = 21 - 23)
Host 35
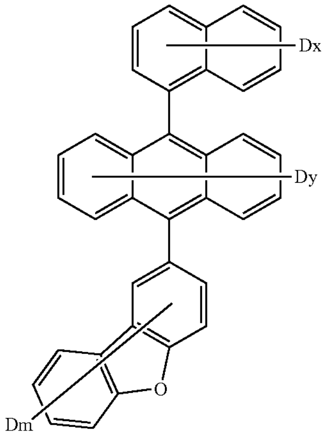
(x + y + m = 20 - 22)
Host 36
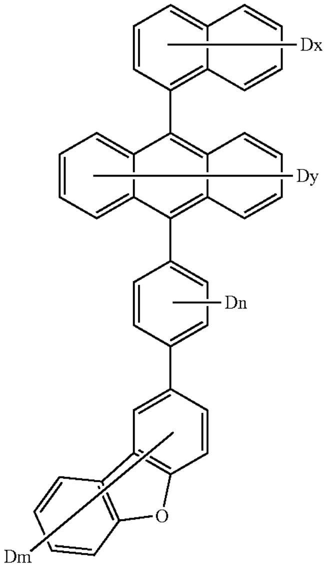
(x + y + n + m = 21 - 23)
-continued
Host 37
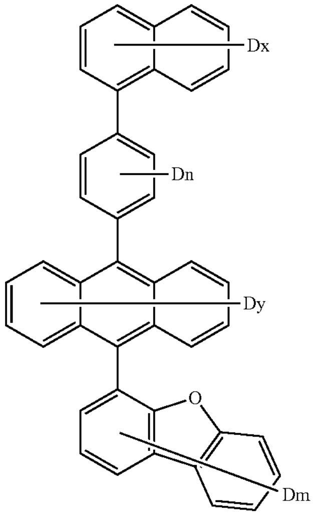
(x + y + n + m = 21 - 23)
Host 38
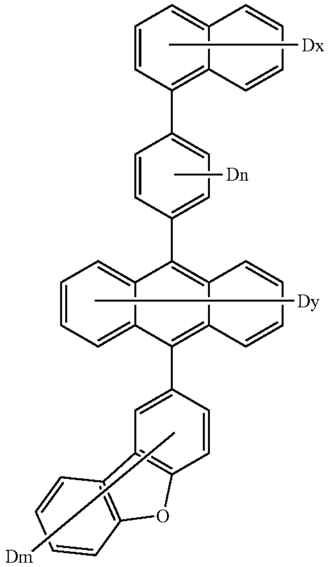
(x + y + n + m = 21 - 23)

-continued
Host 39
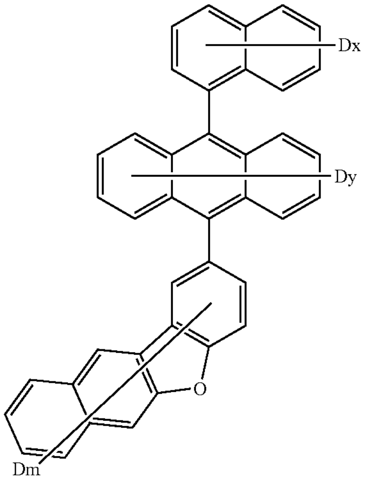
(x + y + m = 22 - 24)
Host 40
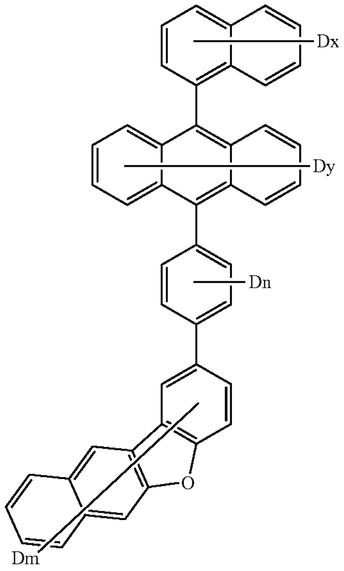
(x + y + n + m = 23 - 25)
Host 41
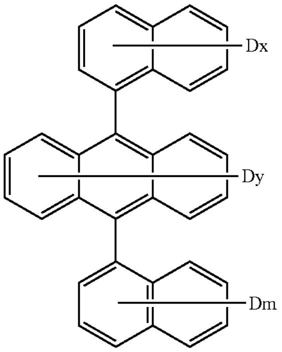
(x + y + m = 20 - 22)
-continued
Host 42
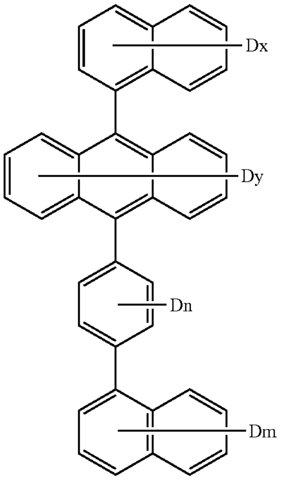
(x + y + n + m = 21 - 23)
Host 43
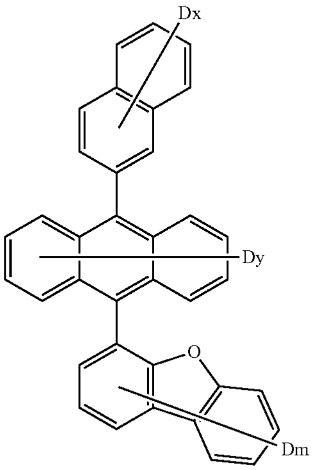
(x + y + m = 20 - 22)
Host 44
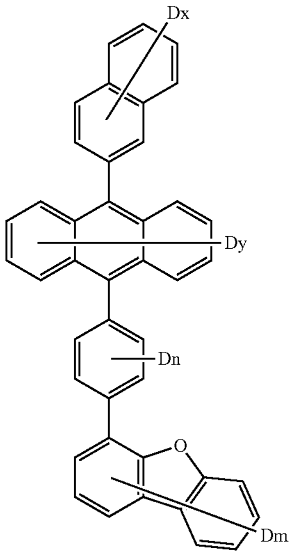
(x + y + n + m = 21 - 23)

-continued
Host 45
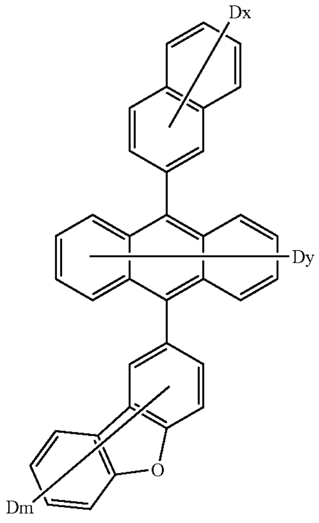
(x + y + m = 20 - 22)
Host 46
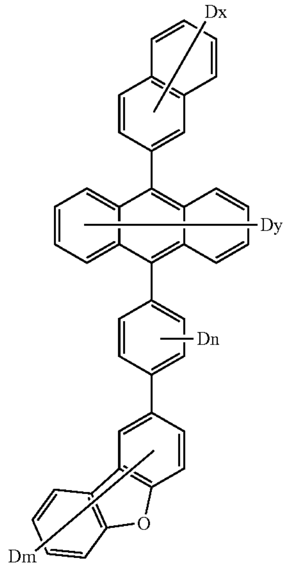
(x + y + n + m = 21 - 23)
-continued
Host 47
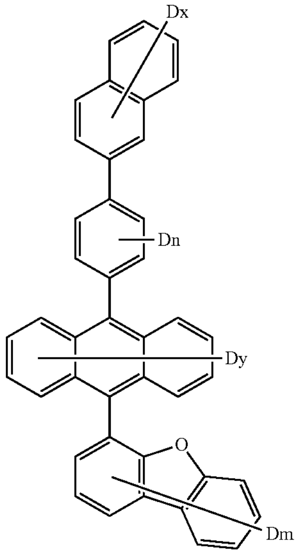
(x + y + n + m = 21 - 23)
Host 48
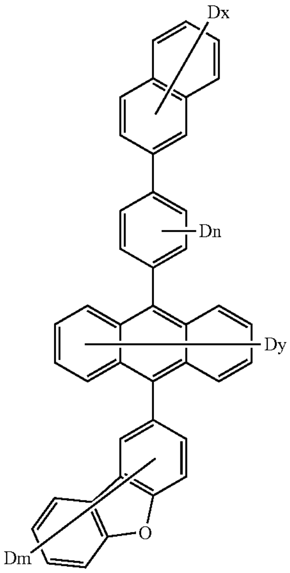
(x + y + n + m = 21 - 23)

-continued
Host 49
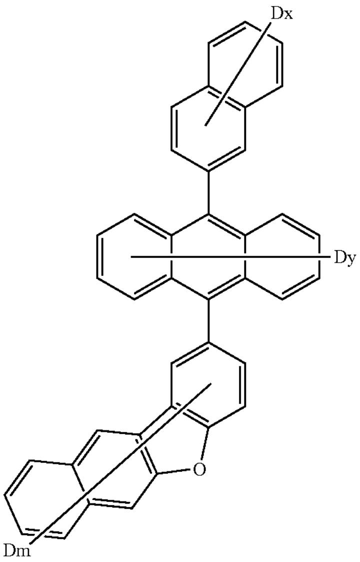
(x + y + m = 22 - 24)
Host 50
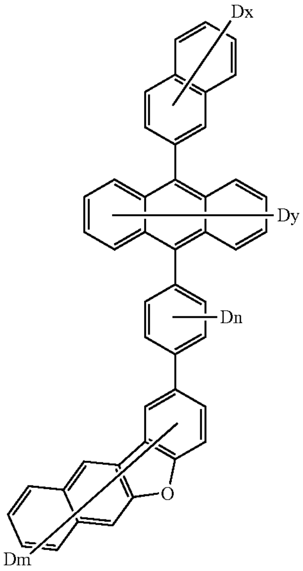
(x + y + n + m = 23 - 25)
-continued
Host 57
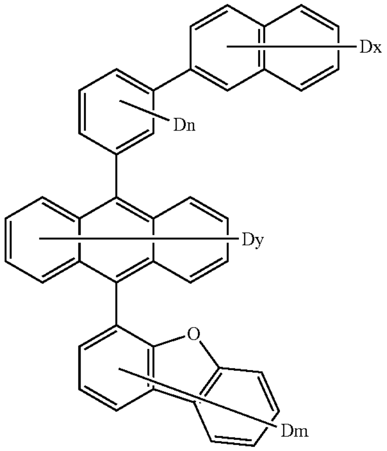
(x + y + n + m = 18 - 20)
Host 58
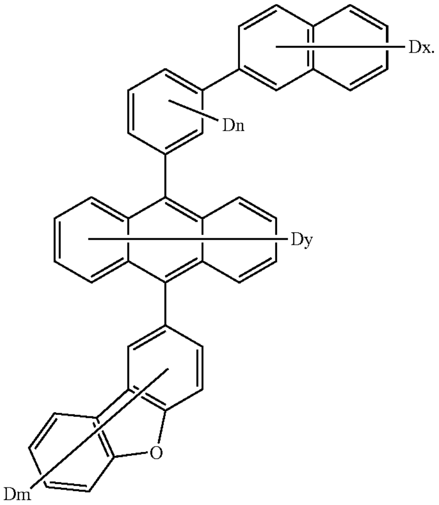
(x + y + n + m = 21 - 23)
* * * * *